United States Patent
Takahara et al.

(10) Patent No.: US 9,959,809 B2
(45) Date of Patent: *May 1, 2018

(54) EL DISPLAY APPARATUS

(71) Applicant: JOLED INC., Tokyo (JP)

(72) Inventors: Hiroshi Takahara, Osaka (JP); Hitoshi Tsuge, Tokyo (JP)

(73) Assignee: JOLED INC., Tokyo (JP)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/492,033

(22) Filed: Apr. 20, 2017

(65) Prior Publication Data

US 2017/0221412 A1 Aug. 3, 2017

Related U.S. Application Data

(63) Continuation of application No. 14/341,620, filed on Jul. 25, 2014, now Pat. No. 9,728,130, which is a (Continued)

(30) Foreign Application Priority Data

Sep. 7, 2001 (JP) .................. 2001-271311
Sep. 25, 2001 (JP) .................. 2001-291598
(Continued)

(51) Int. Cl.
*G09G 3/20* (2006.01)
*G06F 3/03* (2006.01)
(Continued)

(52) U.S. Cl.
CPC ........... *G09G 3/325* (2013.01); *G09G 3/2003* (2013.01); *G09G 3/3233* (2013.01);
(Continued)

(58) Field of Classification Search
None
See application file for complete search history.

(56) References Cited

U.S. PATENT DOCUMENTS 5,194,027 A 3/1993 Kruskopf et al.
5,521,611 A 5/1996 Okada et al.
(Continued)

FOREIGN PATENT DOCUMENTS

CN 1294375 5/2001
EP 0737957 10/1996
(Continued)

OTHER PUBLICATIONS

U.S. Appl. No. 15/335,932 to Hiroshi Takahara et al., filed Oct. 27, 2016.
(Continued)

*Primary Examiner* — Jennifer Mehmood
*Assistant Examiner* — Krishna Neupane
(74) *Attorney, Agent, or Firm* — Greenblum & Bernstein, P.L.C.

(57) ABSTRACT

An EL display apparatus according to the present invention includes an EL device adapted to emit light at a luminance corresponding to a current fed thereto. A source driver outputs a current higher than a current corresponding to an analog video signal to the EL device through a source signal line. This operation charges/discharges a parasitic capacitance present in the source signal line. A second gate driver circuit controls a transistor formed between the EL device and the source driver to operate so that the EL device is fed with the current for only a part of a one-frame period. As a result, the El device emits light for only the part of the period.

22 Claims, 62 Drawing Sheets

Related U.S. Application Data continuation of application No. 10/488,591, filed as application No. PCT/JP02/09111 on Sep. 6, 2002, now Pat. No. 8,823,606.

(30) Foreign Application Priority Data

| Nov. 13, 2001 | (JP) | 2001-347014 |
|---|---|---|
| May 10, 2002 | (JP) | 2002-136117 |

(51) Int. Cl.

| G09G 3/3275 | (2016.01) |
|---|---|
| G09G 3/36 | (2006.01) |
| G09G 3/325 | (2016.01) |
| G09G 3/3233 | (2016.01) |
| G09G 3/3266 | (2016.01) |
| H01L 27/12 | (2006.01) |
| H01L 27/32 | (2006.01) |
| H01L 27/15 | (2006.01) |
| H01L 51/52 | (2006.01) |
| H01L 33/56 | (2010.01) |
| H01L 29/786 | (2006.01) |
| H01L 33/58 | (2010.01) |

(52) U.S. Cl.
CPC ......... *G09G 3/3266* (2013.01); *G09G 3/3275* (2013.01); *H01L 27/124* (2013.01); *H01L 27/127* (2013.01); *H01L 27/1251* (2013.01); *G09G 2300/0413* (2013.01); *G09G 2300/0809* (2013.01); *G09G 2310/0251* (2013.01); *G09G 2310/0289* (2013.01); *G09G 2320/0646* (2013.01); *H01L 27/156* (2013.01); *H01L 27/3216* (2013.01); *H01L 27/3262* (2013.01); *H01L 29/78645* (2013.01); *H01L 29/78672* (2013.01); *H01L 33/56* (2013.01); *H01L 33/58* (2013.01); *H01L 51/5253* (2013.01); *H01L 51/5259* (2013.01); *H01L 51/5281* (2013.01)

(56) References Cited

U.S. PATENT DOCUMENTS

| 5,748,164 | A | 5/1998 | Handschy et al. |
| 5,861,862 | A * | 1/1999 | Akiyama ............... G09G 3/367 |
| | | | 345/96 |
| 5,870,049 | A | 2/1999 | Huang et al. |
| 5,959,602 | A | 9/1999 | Welzen |
| 6,091,203 | A | 7/2000 | Kawashima et al. |
| 6,208,083 | B1 | 3/2001 | Suzuki et al. |
| 6,229,506 | B1 | 5/2001 | Dawson et al. |
| 6,232,943 | B1 * | 5/2001 | Tagawa ................ G09G 3/3637 |
| | | | 345/89 |
| 6,236,394 | B1 | 5/2001 | Ikeda |
| 6,246,180 | B1 | 6/2001 | Nishigaki |
| 6,348,906 | B1 | 2/2002 | Dawson et al. |
| 6,362,798 | B1 | 3/2002 | Kimura et al. |
| 6,366,025 | B1 * | 4/2002 | Yamada ............... H01L 27/3246 |
| | | | 313/498 |
| 6,373,454 | B1 | 4/2002 | Knapp et al. |
| 6,469,686 | B1 | 10/2002 | Koyama et al. |
| 6,525,704 | B1 | 2/2003 | Kondo et al. |
| 6,583,775 | B1 | 6/2003 | Sekiya et al. |
| 6,624,798 | B1 | 9/2003 | Aoki et al. |
| 6,633,134 | B1 | 10/2003 | Kondo et al. |
| 6,872,973 | B1 | 3/2005 | Koyama et al. |
| 6,943,759 | B2 * | 9/2005 | Tam ....................... G09G 3/325 |
| | | | 315/169.3 |
| 2001/0002703 | A1 * | 6/2001 | Koyama ............... G09G 3/3275 |
| | | | 257/40 |
| 2001/0017372 | A1 * | 8/2001 | Koyama ........... G02F 1/136286 |
| | | | 257/72 |
| 2001/0020922 | A1 * | 9/2001 | Yamazaki ............ G09G 3/3233 |
| | | | 345/45 |
| 2001/0038098 | A1 | 11/2001 | Yamazaki et al. |
| 2001/0038367 | A1 | 11/2001 | Inukai |
| 2001/0050662 | A1 | 12/2001 | Kota et al. |
| 2001/0055384 | A1 * | 12/2001 | Yamazaki ............. G06F 3/0202 |
| | | | 379/419 |
| 2002/0000576 | A1 | 1/2002 | Inukai |
| 2002/0003522 | A1 | 1/2002 | Baba et al. |
| 2002/0011796 | A1 | 1/2002 | Koyama |
| 2002/0013018 | A1 * | 1/2002 | Tanaka ................. G09G 3/3688 |
| | | | 438/142 |
| 2002/0021096 | A1 | 2/2002 | Komiya |
| 2002/0036603 | A1 | 3/2002 | Nagakubo et al. |
| 2003/0214506 | A1 | 11/2003 | Koselj et al. |
| 2004/0239655 | A1 | 12/2004 | Tani et al. |

FOREIGN PATENT DOCUMENTS

| EP | 0821490 | 1/1998 |
| EP | 1034529 | 9/2000 |
| EP | 1061497 | 12/2000 |
| EP | 1061499 | 12/2000 |
| EP | 1130565 | 9/2001 |
| JP | 63-290413 | 11/1988 |
| JP | 11-003048 | 1/1999 |
| JP | 11-265162 | 9/1999 |
| JP | 2001-060076 | 3/2001 |
| JP | 2001-092370 | 4/2001 |
| JP | 2001-109432 | 4/2001 |
| JP | 2001-147675 | 5/2001 |
| JP | 2001-306031 | 11/2001 |
| JP | 2002-189448 | 7/2002 |
| JP | 2002-215096 | 7/2002 |
| JP | 2002-287682 | 10/2002 |
| WO | 99/38148 | 7/1997 |
| WO | 98/48403 | 10/1998 |
| WO | 99/48078 | 9/1999 |
| WO | 99/50817 | 10/1999 |
| WO | 99/65011 | 12/1999 |
| WO | 99/65012 | 12/1999 |
| WO | 01/06484 | 1/2001 |

OTHER PUBLICATIONS

U.S. Appl. No. 15/335,901 to Hiroshi Takahara et al., filed Oct. 27, 2016.
U.S. Appl. No. 15/335,919 to Hiroshi Takahara et al., filed Oct. 27, 2016.
Supplemental European Search Report issued in European Patent Application No. EP 02798041, dated Feb. 9, 2009.
Japanese Office Action issued in Japanese Patent Application No. JP 2003-527716 dated Oct. 7, 2008.
Chinese Office Action issued in corresponding Chinese Patent Application No. CN 028175107, dated Sep. 22, 2006.
Nose et al., "35.3 A Black Stripe Driving Scheme for Displaying Motion Pictures on LCDs," 2001 SID International Symposium—Jun. 3-8, 2001, San Jose Convention Center, California, vol. XXXII, Jun. 3, 2001, pp. 994-997, XP007007722.
Supplementary European Search Report issued in European Patent Application No. EP 02 79 8040 dated Mar. 30, 2009.
Office Action from United States Patent and Trademark Office (USPTO) in U.S. Appl. No. 15/335,919, dated Dec. 30, 2016.
Office Action from United States Patent and Trademark Office (USPTO) in U.S. Appl. No. 15/335,932, dated Dec. 30, 2016.
Office Action from United States Patent and Trademark Office (USPTO) in U.S. Appl. No. 15/335,901, dated Jan. 27, 2017.
Office Action from United States Patent and Trademark Office (USPTO) in U.S. Appl. No. 15/335,932, dated Jun. 28, 2017.

\* cited by examiner

601 BODY
602 SHOOTING SECTION
603 SHUTTER SWITCH

EL DISPLAY APPARATUS

RELATED APPLICATIONS

This application is a Continuation of U.S. patent application Ser. No. 14/341,620, filed on Jul. 25, 2014, which is a Continuation of U.S. patent application Ser. No. 10/488,591, filed on Sep. 17, 2004 and now U.S. Pat. No. 8,823,606 issued on Sep. 2, 2014, which is a U.S. National Phase under 35 U.S.C. § 371 of International Application No. PCT/JP2002/009111, filed on Sep. 6, 2002, which in turn claims the benefit of Japanese Application Nos.: 2002-136117, filed on May 10, 2002; 2001-347014, filed on Nov. 13, 2001; 2001-291598, filed on Sep. 25, 2001; and 2001-271311, filed on Sep. 7, 2001, the entire disclosures of which Applications are incorporated by reference herein.

TECHNICAL FIELD

The present invention relates to an EL display apparatus employing an organic or inorganic electroluminescence (EL) device and, more particularly, to an EL display apparatus capable of feeding an EL device with a desired current, a method of driving the same, and an electronic apparatus provided with such an EL display apparatus.

BACKGROUND ART

In general, an active-matrix display apparatus has a multiplicity of pixels arranged in matrix and displays an image by controlling the intensity of light pixel by pixel in accordance with image signals given. When, for example, liquid crystal is used as an electro-optic substance, the transmittance of each pixel varies in accordance with the voltage applied to the pixel. The basic operation an active-matrix image display apparatus employing an organic electroluminescence (EL) material as an electro-optic converting substance is the same as in the case where liquid crystal is used.

A liquid crystal display panel has pixels each functioning as a shutter and displays an image by turning on/off light from a back light with such a shutter, or a pixel. An organic EL display panel is a display panel of the self-luminescence type having a light-emitting device in each pixel. Such a self-luminescence type display panel has advantages over liquid crystal display panels, including higher image visibility, no need for a back light, and higher response speed.

The organic EL display panel controls the luminance of each light-emitting device (pixel) based on the amount of current. Thus, the organic EL display panel is largely different from the liquid crystal display panel in that its luminescent devices are of the current-driven type or the current-controlled type.

Like the liquid crystal display panel, the organic EL display panel can have any one of a simple-matrix configuration and an active-matrix configuration. Though the former configuration is simple in structure, it has a difficulty in realizing a large-scale and high-definition display panel. However, it is inexpensive. The latter configuration can realize a large-scale and high-definition display panel. However, it has problems of a technical difficulty in control and of a relatively high price. Presently, organic EL display panels of the active-matrix configuration are being developed intensively. Such an active-matrix EL panel controls electric current passing through the light-emitting device provided in each pixel by means of a thin film transistor (TFT) located inside the pixel.

An organic EL display panel of such an active-matrix configuration is disclosed in Japanese Patent Laid-Open Publication No. HEI 8-234683 for example. FIG. 62 shows an equivalent circuit of one pixel portion of this display panel. Pixel 216 comprises an EL device 215 as a light-emitting device, a first transistor 211a, a second transistor 211b, and a storage capacitor 219. Here, the EL device 215 is an organic electroluminescence (EL) device.

In the present description, a transistor for feeding (controlling) current to an EL device is referred to as a driving transistor, while a transistor operating as a switch like the transistor 211b in FIG. 62 referred to as a switching transistor.

EL device 215 has a rectification property in many cases and hence is called OLED (Organic Light-Emitting Diode) as the case may be. For this reason, the EL device 215 in FIG. 62 is regarded as an OLED and represented by the symbol of a diode.

In the example shown in FIG. 62, the source terminal (S) of p-channel transistor 211a is connected to Vdd (power source potential), while the cathode (negative electrode) of the EL device 215 connected to ground potential (Vk). On the other hand, the anode (positive electrode) is connected to the drain terminal (D) of the transistor 211b. The gate terminal of the p-channel transistor 211b is connected to a gate signal line 217a, the source terminal connected to a source signal line 218, and the drain terminal connected to the storage capacitor 219 and the gate terminal (G) of the transistor 211a.

In order to operate the pixel 216, first, the source signal line 218 is applied with an image signal indicative of luminance information with the gate signal line 217a turned into a selected state. Then, the transistor 211b becomes conducting and the storage capacitor 219 is charged or discharged, so that the gate potential of the transistor 211a becomes equal to the potential of the image signal. When the gate signal line 217a is turned into an unselected state, the transistor 211a is turned off, so that the transistor 211a is electrically disconnected from the source signal line 218. However, the gate potential of the transistor 211a is stably maintained by means of the storage capacitor 219. The current passing through the EL device 215 via the transistor 211a comes to assume a value corresponding to voltage Vgs across the gate and the source terminals of the transistor 11a, with the result that the EL device 215 keeps on emitting light at a luminance corresponding to the amount of current fed thereto through the transistor 211a.

As described above, according to the prior art configuration shown in FIG. 62, one pixel comprises one selecting transistor (switching device) and one driving transistor. Another prior art configuration is disclosed in Japanese Patent Laid-Open Publication No. HEI 11-327637 for example. This publication describes an embodiment in which a pixel comprises a current mirror circuit.

Meanwhile, the organic EL display panel is usually manufactured using a low temperature polysilicon transistor array. Since organic EL devices emit light based on current, the organic EL display panel involves a problem that display irregularities occur if there are variations in transistor characteristics.

Further, a conventional EL display panel cannot sufficiently charge/discharge the parasitic capacitance which is present in the source signal line 18. For this reason there arises a problem that in some cases a desired current cannot be fed to pixel 16.

DISCLOSURE OF INVENTION

The present invention has been made in view of the foregoing circumstances. It is an object of the present invention to provide an EL display apparatus which is capable of realizing satisfactory image display by sufficiently charging/discharging the parasitic capacitance present in the source signal line.

In order to attain this object, an EL display apparatus according to the present invention comprises: a plurality of gate signal lines and a plurality of source signal lines, which are arranged to intersect each other; EL devices arranged in a matrix pattern, each of the EL devices being operative to emit light at a luminance corresponding to a current fed thereto; a gate driver operative to output a gate signal to each of the gate signal lines; a source driver operative to output to each of the source signal lines a current which is higher than a current corresponding to an image signal inputted from outside; a transistor, provided for each of the EL devices, for outputting the current outputted from the source driver to the EL device; and a first switching device capable of feeding the current outputted from the source driver to the EL device by switching to bring the EL device and the transistor into and out of conduction thereacross in accordance with the gate signal fed thereto through the gate signal line, wherein the gate driver is configured to output the gate signal to the gate signal line in a manner to bring the EL device and the transistor into and out of conduction thereacross at least once in a one-frame period.

With this construction, the source driver outputs a higher current than the current corresponding to the image signal to the source signal line and, hence, even if a parasitic capacitance is present in the source signal line, the parasitic capacitance can be charged/discharged. When such a high current is fed to the EL device, the EL device emits light at a higher luminance than a luminance corresponding to the image signal. By making the duration of current feed to the EL device shorter than the one-frame period, the time period for which the EL device emits light can be shortened, with the result that image display at a luminance equivalent to the luminance corresponding to the image signal is realized.

In the EL display apparatus according to the above-described invention, the gate driver may be configured to output the gate signal to the gate signal line in a manner to bring the ET, device and the transistor into and out of conduction thereacross plural times periodically in the one-frame period.

With this feature, the so-called interlaced driving can be realized, which can provide for more satisfactory image display.

The EL display apparatus according to the above-described invention may further comprise a second switching device capable of feeding the current outputted from the source driver to the transistor by switching to bring the source driver and the transistor into and out of conduction thereacross in accordance with the gate signal fed thereto through the gate signal line, wherein the gate driver is configured to bring the source driver and the transistor into conduction thereacross to program the transistor with the current outputted from the source driver while the EL device and the transistor are out of conduction thereacross and then output the gate signal to the gate signal line in a manner to bring the EL device and the transistor into and out of conduction thereacross at least once in the one-frame period.

With this feature, display irregularities due to variations in transistor characteristics can be prevented, whereby satisfactory image display can be realized.

In the EL display apparatus according to the above-described invention, the gate driver and the transistor may be formed in a same process. Specifically, the gate driver and the driver [sic] may be formed using the low temperature polysilicon technology for example. The formation of these components in this manner makes it possible to narrow the frame.

In the EL display apparatus according to the above-described invention, the source driver may comprise a semiconductor chip.

According to the present invention, there is also provided an EL display apparatus comprising: a plurality of gate signal lines and a plurality of source signal lines, which are arranged to intersect each other; EL devices arranged in a matrix pattern, each of the EL devices being operative to emit light at a luminance corresponding to a current fed thereto; a gate driver operative to output a gate signal to each of the gate signal lines; a source driver operative to output to each of the source signal lines a current which is higher than a current corresponding to an image signal inputted from outside; a switching device provided for each of the EL devices and capable of feeding the ET, device with a current fed through the source signal line by switching to bring the EL device and the source signal line into and out of conduction thereacross in accordance with the gate signal fed thereto through the gate signal line; a plurality of dummy devices located in a region different from a region where the EL devices are formed, the dummy devices being of substantially no use in image display; and a second switching device provided for each of the dummy devices and capable of feeding the dummy device with the current fed through the source signal line by switching to bring the dummy device and the source signal line into and out of conduction thereacross in accordance with the gate signal supplied thereto through the gate signal line, wherein the gate driver is configured to output gate signals to the gate signal line associated with the EL device and the gate signal line associated with the dummy device at substantially the same timing, whereby the EL device and the dummy device are fed with the current fed through the source signal line dividedly therebetween.

With this construction, the source driver outputs a higher current than the current corresponding to the image signal to the source signal line and, hence, even if a parasitic capacitance is present in the source signal line, the parasitic capacitance can be charged/discharged. Even when the source driver outputs the higher current than the current corresponding to the image signal to the source signal line, the EL device can be prevented from emitting light at a higher luminance than necessary because the current outputted from the source driver is divided into shares which are fed to the EL device and the dummy device, respectively.

The EL display apparatus according to the above-described invention may have an arrangement wherein: the gate signal line associated with the dummy device is formed to extend adjacent the gate signal line associated with EL devices in a first or final row; and the gate driver is configured to output gate signals to gate signal lines associated with a series of adjacent rows at substantially the same timing series by series sequentially, whereby plural EL devices or the pair of the EL device and the dummy device are fed with the current fed through the source signal line dividedly therebetween.

According to the present invention, there is also provided a method of driving an EL display apparatus having an EL device which is operative to emit light at a luminance corresponding to a current fed thereto, and a source driver operative to output a current to the EL device through a source signal line, the method comprising the steps of: causing the source driver to output to the source signal line a current higher than a current corresponding to an image signal inputted from outside; and feeding the EL device with the current outputted to the source signal line for a part of a one-frame period to cause the EL device to emit light at a luminance corresponding to the current outputted to the source signal line for the part of the one-frame period.

In the method of driving an EL display apparatus according to the above-described invention, the part of the one-frame period may be divided into plural periods.

An electronic apparatus according to the present invention comprises an EL display apparatus as recited in claim 1 and an arrangement for outputting an image signal to the El display apparatus.

According to the present invention, there is also provided an EL display apparatus comprising: EL devices arranged in a matrix pattern; a driving transistor operative to feed a current to each of the EL devices; a first switching device disposed between the EL device and the driving transistor; and a gate driver operative to on-off control the first switching device, wherein the gate driver is configured to control the first switching device in a manner to turn the first switching device off at least once within a one-frame period.

In the EL display apparatus according to the above-described invention, the first switching device may be controlled in a manner to turn off plural times periodically within the one-frame period.

According to the present invention, there is also provided an EL display apparatus comprising: a source driver circuit operative to output a programming current; EL devices arranged in a matrix pattern; a driving transistor operative to feed a current to each of the EL devices; a first switching device disposed between the EL device and the driving transistor; a second switching device forming a path for transmitting the programming current to the driving transistor; and a gate driver circuit operative to on-off control the first and second switching devices, wherein the gate driver is configured to control the first switching device in a manner to turn the first switching device on at least once and off at least once within a one-frame period.

In the EL display apparatus according to the above-described invention, it is possible that the gate driver and the driving transistors are formed in a same process, while the source driver comprises a semiconductor chip.

According to the present invention, there is also provided an EL display apparatus comprising: gate signal lines; source signal lines; a source driver operative to output a programming current; a gate driver; EL devices arranged in a matrix pattern; a driving transistor operative to feed a current to each of the EL devices; a first transistor disposed between the EL device and the driving transistor; and a second transistor forming a path for transmitting the programming current to the driving transistor, wherein: the source driver is operative to output the programming current to each of the source signal lines; the gate driver is connected to each of the gate signal lines; the second transistor has a gate terminal connected to the gate signal line, a source terminal connected to the source signal line, and a drain terminal connected to the drain terminal of the driving transistor; and the gate driver is configured to select plural ones of the gate signal lines to feed the programming current to the driving transistor of each of plural pixels and control the first transistor in a manner to turn the first transistor on at least once and off at least once within a one-frame period.

In the EL display apparatus according to the above-described invention, it is possible that the gate driver and the driving transistors are formed in a same process, while the source driver comprises a semiconductor chip.

According to the present invention, there is also provided an EL display apparatus comprising: a display region including I pixel rows (I is an integer not less than 2) and J pixel columns (J is an integer not less than 2); a source driver operative to apply video signals to source signal lines in the display region; a gate driver operative to apply on-voltage or off-voltage to gate signal lines in the display region; and a dummy pixel row formed in a region other than the display region, wherein the display region is formed with EL devices arranged in a matrix pattern, each of which is operative to emit light in accordance with the video signals from the source driver, while the dummy pixel row is configured such that the dummy pixel row fails to emit light or its light-emitting state is not recognized visually.

In the EL display apparatus according to the above-described invention, the gate driver may be configured to select plural pixel rows at a time for the pixel rows selected to be applied with the video signals from the source driver in a manner that the dummy pixel row is selected when the first pixel row or the $I^{th}$ pixel row is selected.

According to the present invention, there is also provided a method of driving an EL display apparatus characterized by: feeding the EL device with a current that causes the EL device to emit light at a luminance higher than a predetermined luminance; and causing the EL device to emit light for a 1/N part of a one-frame period (N is less than 1).

In the method of driving an EL display apparatus according to the above-described invention, the 1/N part of the one-frame period may be divided into plural periods.

According to the present invention, there is also provided a method of driving an EL display apparatus adapted for programming of a current to pass through an EL device based on a current, characterized by: causing the EL device to emit light at a luminance higher than a predetermined luminance to provide a display in a 1/N (N>1) portion of a display region; and sequentially shifting the 1/N portion of the display region to another thereby causing the whole display region to display.

According to the present invention, there is further provided an electronic apparatus characterized by comprising: an EL display apparatus as recited in claim 11, a receiver, and a speaker.

The foregoing and other objects, features and advantages of the present invention will become apparent from the following detailed description of the preferred embodiments with reference to the accompanying drawings.

BEST MODE FOR CARRYING OUT THE INVENTION

Figure 1:
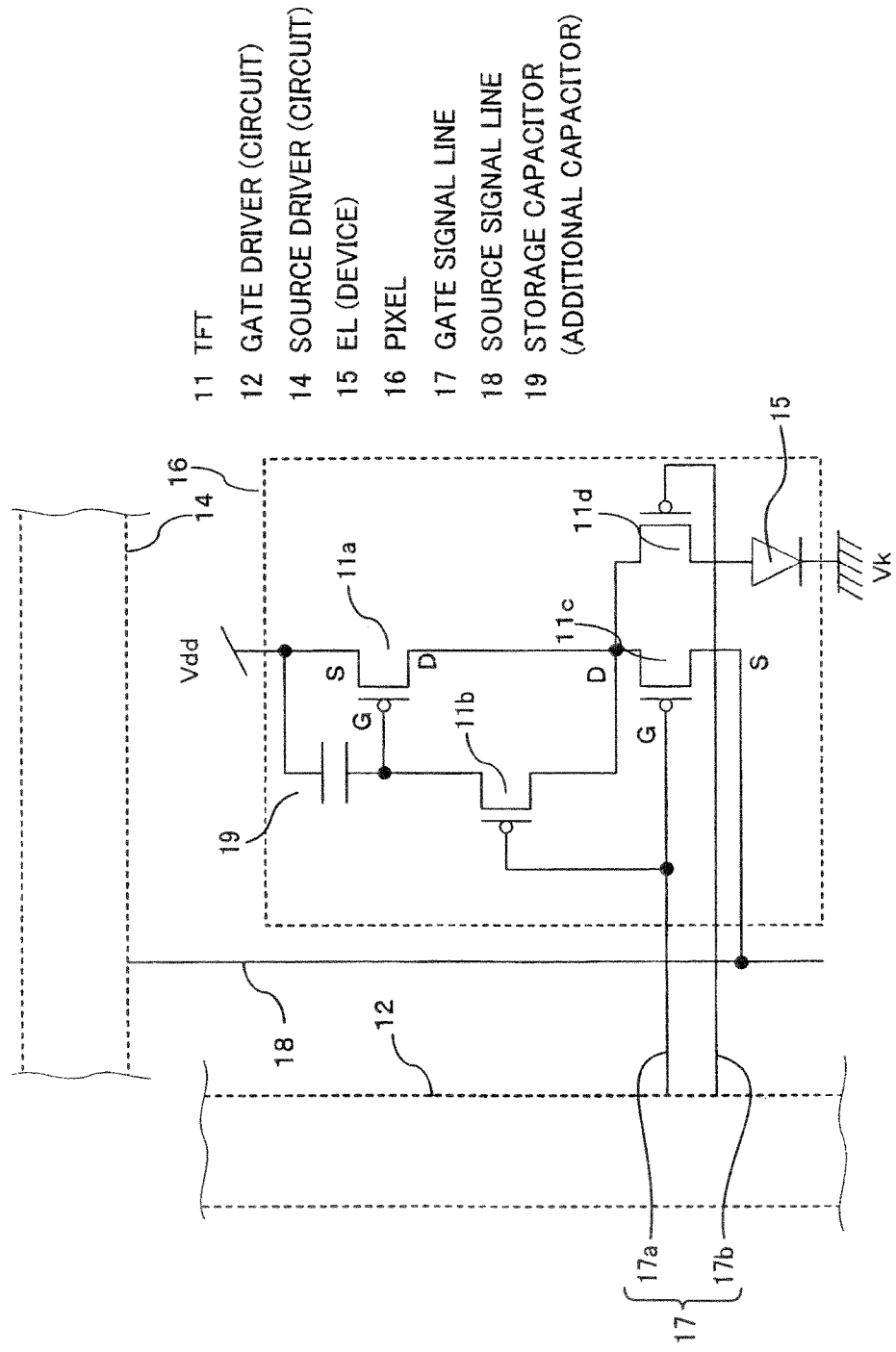
FIG. 1 is a diagram illustrating a pixel configuration of an EL display panel according to the present invention.

Hereinafter, embodiments of the present invention will be described with reference to the drawings.

For easy understanding and/or illustration, each of the drawings in this description may have portions omitted and/or enlarged/reduced. For example, an encapsulating film 111 and the like are shown to be quite thick in the sectional view of a display panel at FIG. 11. On the other hand, an encapsulating cover 85 is shown to be thin in FIG. 10. There are omitted portions. For example, a display panel or the like according to the present invention needs to have a phase film such as a circularly polarizing plate for antireflection. However, such a phase film is omitted from the drawings used in this description. This holds true for other drawings. Like numerals, characters or the like designate parts having identical or similar forms, materials, functions or operations.

It is to be noted that the details to be described with reference to the drawings may be combined with other embodiments and the like. For example, a touch panel or the like may be added to a display panel shown in FIG. 8 to form an information display apparatus illustrated in any one of FIGS. 19 and 59 to 61. Alternatively, a magnifying lens 582 may be attached to the display panel to form a view finder (see FIG. 58) for use in a video camera (see FIG. 59 and the like). Any one of the driving methods to be described with reference to FIGS. 4, 15, 18, 21 and 23 and like figures is applicable to any one of display apparatus or display panels according to the present invention.

While driving transistors 11 and switching transistors 11 will be described to be thin film transistors in this description, they are not limited to thin film transistors. Each of the transistors 11 may comprise a thin film diode (TFD), ring diode, or the like. Further, each transistor 11 is not limited to such a thin film device but may comprise a device formed on a silicon wafer. Of course, any one of FET, MOS-FET, MOS transistors and a bipolar transistor can serve the purpose. These are basically thin film transistors. It is needless to say that other devices such as a varistor, thyristor, ring diode, photodiode, phototransistor, and PLZT device can serve the purpose. That is, each of the switching devices 11 and driving devices 11 may comprise any one of the devices mentioned above.

Figure 10:
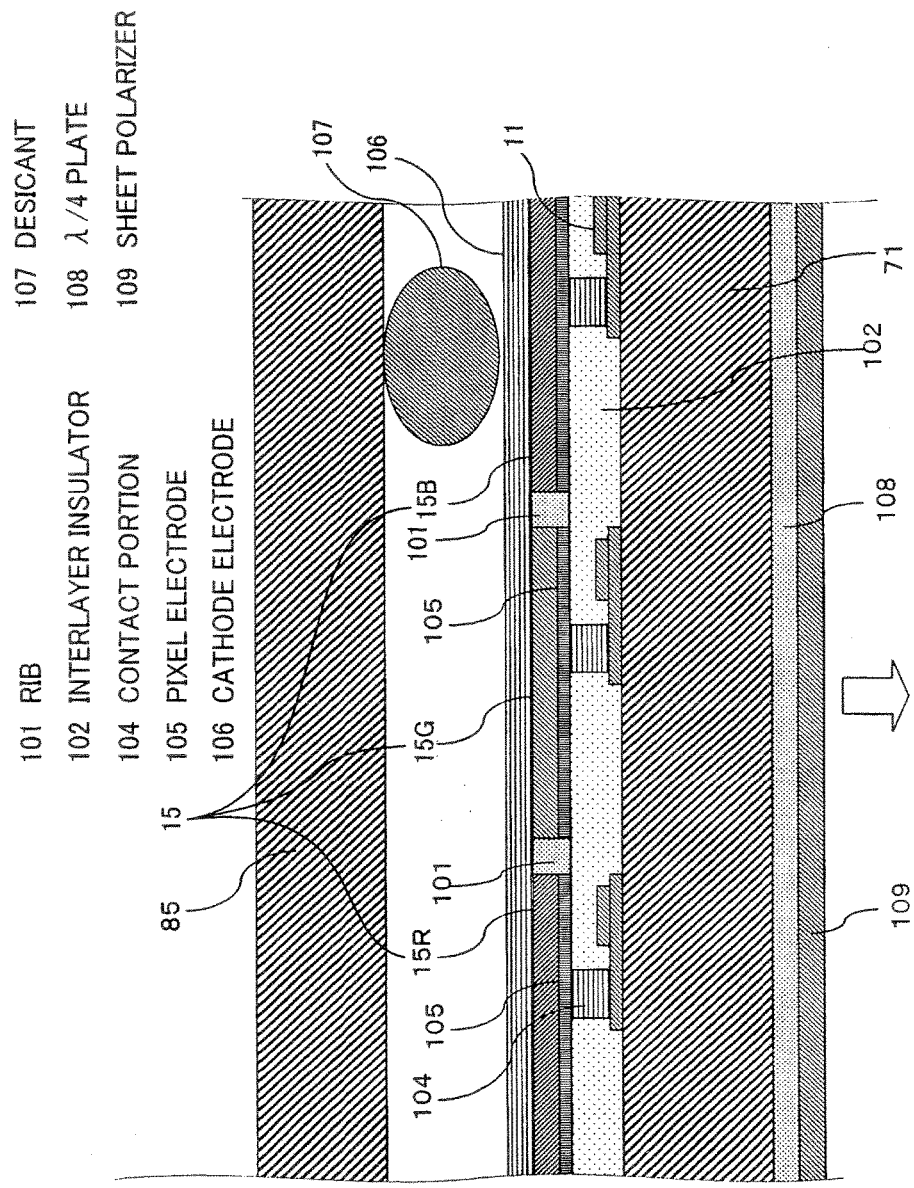
FIG. 10 is a sectional view of an EL display panel according to the present invention.

As shown in FIG. 10, an organic EL display panel includes at least one organic functional layer (ET, layer) 15 (15R, 15G and 15B) comprising an electron transport layer, a luminescent layer, hole transport layer and the like, and a metal electrode (reflective film) (cathode) 106, which are stacked on a glass plate 71 (array substrate) formed with a transparent electrode 105 as a pixel electrode. The organic functional layer (EL layer) 15 is caused to emit light by applying the anode consisting of the transparent electrode (pixel electrode) 105 and the cathode consisting of the metal electrode (reflective electrode) 106 with a positive voltage and a negative voltage, respectively; stated otherwise, by applying direct current across the transparent electrode 105 and the metal electrode 106.

Figure 8:
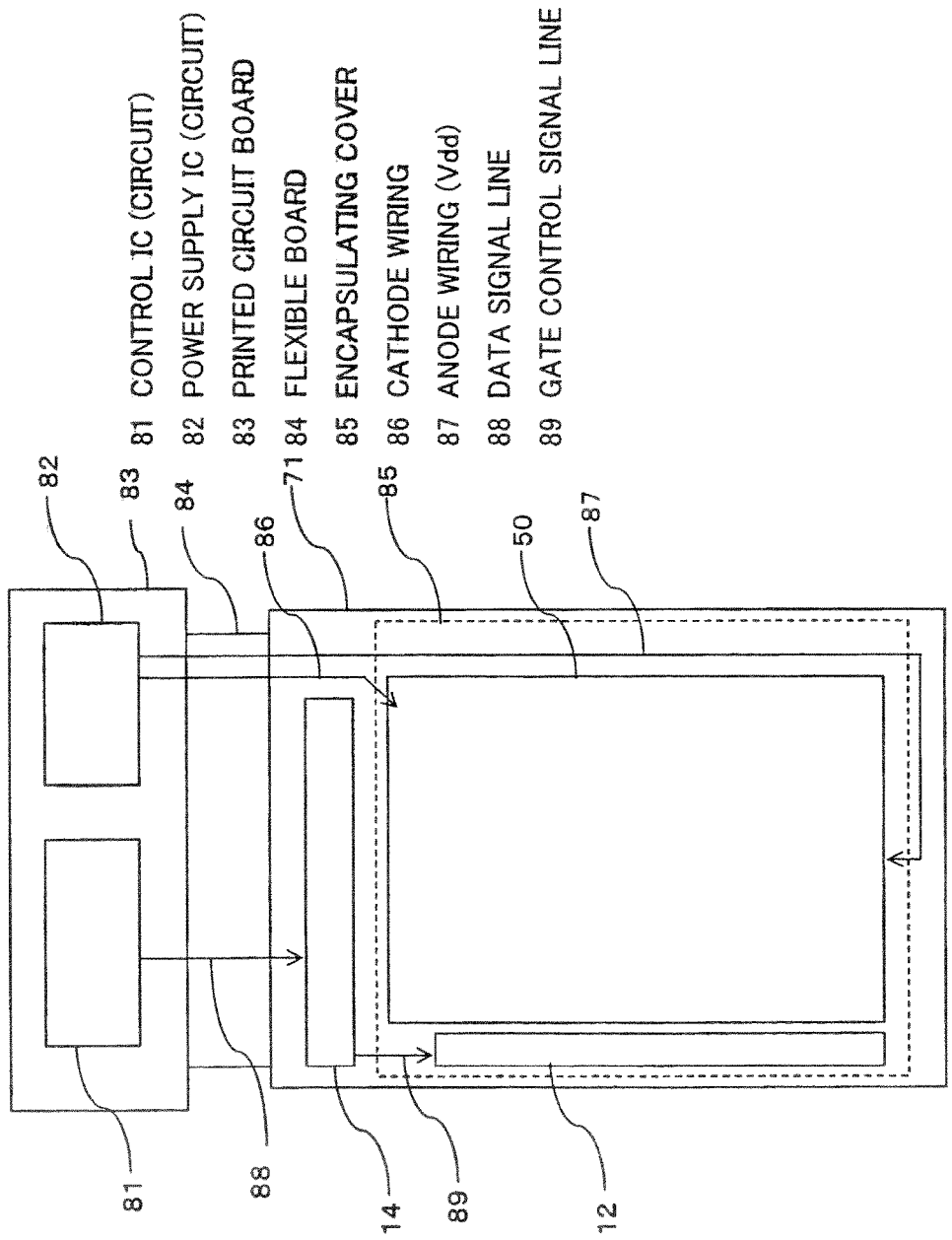
FIG. 8 is a diagram illustrating a configuration of an EL display apparatus according to the present invention.

A high current passes through wiring for feeding current to the anode or the cathode (cathode wiring 86 or anode wiring 87 in FIG. 8). When the screen size of an EL display apparatus is 40 inches for example, a current of about 100 A passes therethrough. Therefore, such wiring needs to have a sufficiently low value of resistance. To solve this problem, the present invention firstly forms thin film wiring to the anode or the like (wiring for feeding EL devices with a luminescence-causing current). The thin film wiring is then thickened with an electrolytic plating technique or an electroless plating technique.

Examples of metals for use in plating include chromium, nickel, gold, copper, and aluminum, or alloys, amalgams or laminated structures thereof. As the need arises, the wiring is added with identical wiring or metal wiring comprising wiring and copper foil. Alternatively, the wiring is thickened to have decreased wiring resistance by screen printing over the wiring with copper paste or the like to stack the paste or the like thereon. The wiring may be reinforced by superposition of additional wiring thereon using a bonding technique. As needs dictate, a grand pattern may be formed over the wiring to form a capacitor therebetween.

To feed the anode or cathode wiring with a high current, a power wire for supply of a power having a low current and a high voltage is routed from current feeding means to a location in the vicinity of the anode wiring or the like and the power is converted into a power having a low voltage and a high current with a DCDC converter or the like before being fed to the anode wiring or the like. That is, a high-voltage and low-current wire is routed from the power source to a power-consuming target and the power fed therethrough is converted into a high-current and low-voltage power at a location short of reaching the power-consuming target. Examples of such converter means include a DCDC converter, and a transformer.

Preferable materials for the metal electrode 106 include lithium, silver, aluminum, magnesium, indium and copper, or their respective alloys or like materials having low work functions. Particularly preferable is an Al—Li alloy for example. On the other hand, the transparent electrode 105 may comprise a conductor material having a high work function, such as ITO, or gold or the like. If gold is used as the electrode material, the resulting electrode is translucent. ITO may be substituted with another material such as IZO. This holds true for other pixel electrodes 105.

In the vapor deposition of a thin film over the pixel electrode 105 or the like, it is convenient to form organic EL film 15 in an argon atmosphere. By forming a carbon film having a thickness not less than 20 nm and not more than 50 nm over ITO as the pixel electrode 105, an organic EL film can be formed which exhibits improved interface stability and satisfactory luminance and efficiency of luminescence. The process for forming the EL film 15 is not limited to vapor deposition. It is needless to say that the EL film 15 may be formed using an ink jet process.

A desiccant 107 is placed in the space defined between the encapsulating cover 85 and the array substrate 71. This is because the organic EL film 15 is easily affected by humidity. The desiccant 107 absorbs moisture permeating through sealant thereby preventing the organic EL film 15 from deteriorating.

Figure 11:
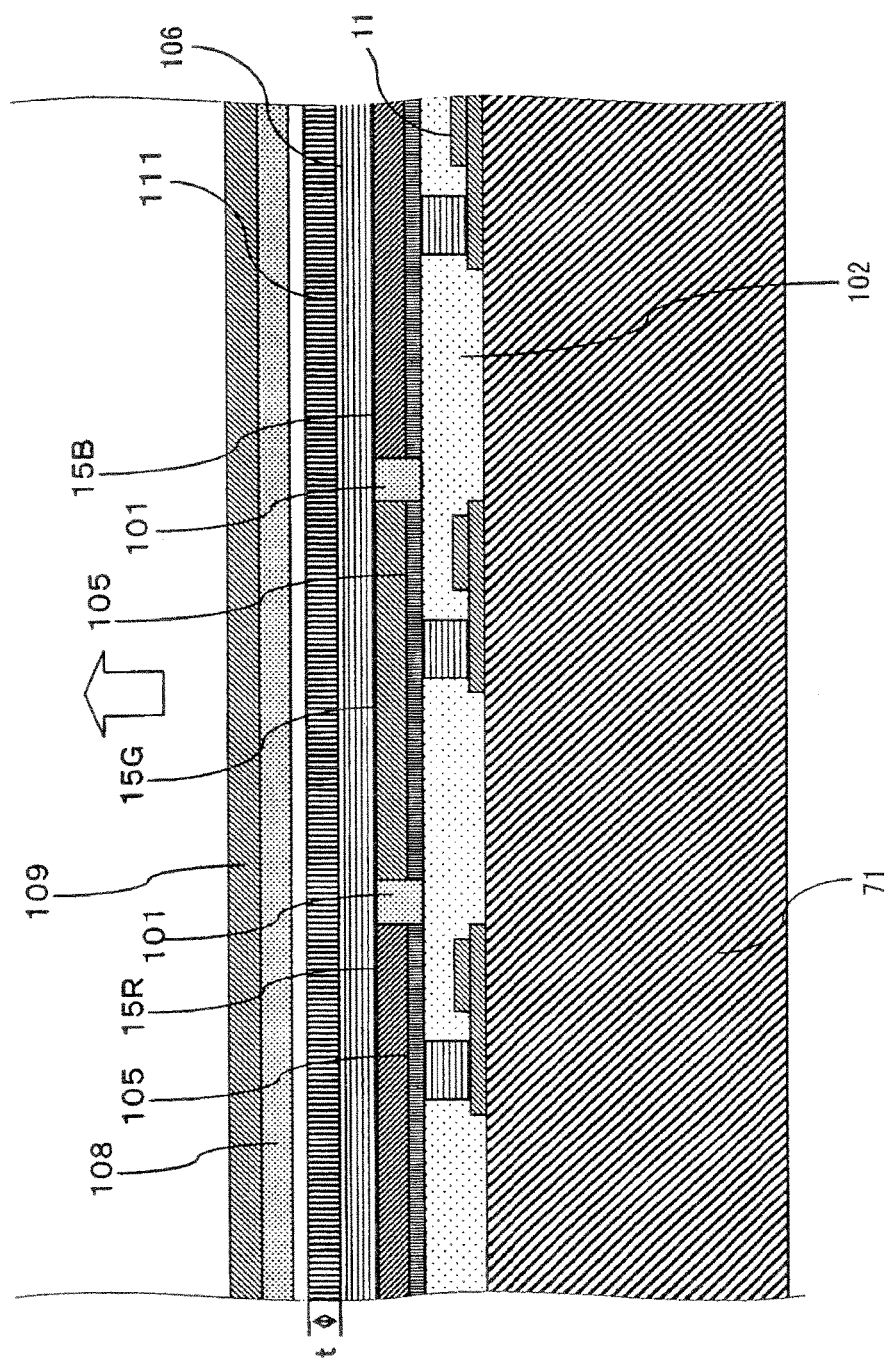
FIG. 11 is a sectional view of an EL display panel according to the present invention.

FIG. 10 shows an arrangement of encapsulation with cover 85 of glass. Encapsulation may be achieved using a film (which may be a thin film, i.e., encapsulating thin film) 111 as shown in FIG. 11. An example of such an encapsulating film (encapsulating thin film) 111 is a film formed by vapor deposition of DLC (diamond-like carbon) on a film for use in electrolytic capacitors. This film has very poor water permeability (i.e. high moistureproofness) and hence is used as the encapsulating film 111. It is needless to say that an arrangement in which a DLC film or the like is vapor-deposited directly over the electrode 106 can serve the purpose. Alternatively, the encapsulating thin film may comprise a multi-layered film formed by stacking a resin thin film and a metal thin film on the other.

The thickness of the thin film is preferably established so that n·d is not more than the dominant wavelength λ of light emitted from the EL device 15, wherein n represents the refractive index of the thin film (if plural thin films are stacked on each other, calculation is made with their respective refractive indexes totalized (n·d is calculated for each thin film), and d represents the thickness of the thin film (if plural thin films are stacked on each other, calculation is made with their respective refractive indexes totalized.) With this condition being satisfied, the efficiency in taking light out of EL device 15 is twice or more as high as that of the case where encapsulation is made with a glass substrate. An alloy, mixture or stack of aluminum and silver may be formed as the encapsulating thin film.

Such encapsulation with encapsulating film 111 and without cover 85 as described above is referred to as thin film encapsulation. In the thin film encapsulation to be applied to the case where light is taken out from the substrate 71 side, which is referred to as downward takeout (see FIG. 10 in which the arrow indicates the light takeout direction), an aluminum film to be used as the cathode is formed over the EL film formed in advance. Subsequently, a resin layer to serve as a buffer layer is formed over the aluminum film. Examples of materials for the buffer layer include organic materials such as acrylic resin and epoxy resin. The thickness of the buffer layer is suitably not less than 1 μm and not more than 10 μm, more preferably not less than 2 μm and not more than 6 μm. Further, encapsulating film 74 is formed over the buffer film. Without the buffer layer, the structure of the EL film would collapse, causing streak-like defects to occur. As described above, the encapsulating film 111 comprises, for example, DLC (diamond-like carbon) or a layered structure for electrolytic capacitors (a multi-layered structure in which a dielectric thin film and an aluminum thin film are formed alternately by vapor deposition.)

In the thin film encapsulation to be applied to the case where light is taken out from the EL layer 15 side, which is referred to as upward takeout (see FIG. 10 in which the arrow indicates the light takeout direction), an Ag—Mg film to be used as the cathode (or the anode) is formed to a thickness not less than 20 angstroms and not more than 300 angstroms over the EL film formed in advance. Subsequently, a transparent electrode comprising ITO or the like is formed over the AG-Mg film to lower the resistance, followed by the formation of a resin film as a buffer layer over the electrode film. Further, encapsulating film 111 is formed over the buffer film.

A half of the amount of light emitted from the organic EL layer 15 is reflected by reflective film 106, passes through the array substrate 71, and is then emitted from the panel. However, undesired reflection occurs due to the reflective film 106 reflecting extraneous light, causing the display contrast to lower. As the measures to avoid this inconvenience, a λ/4 plate 108 and a sheet polarizer (polarizing film) 109 are disposed at the array substrate 71. These are generally called a circularly polarizing plate (circularly polarizing sheet).

If the pixels comprise a reflective electrode, light generated from the EL layer 15 is emitted upward. It is therefore needless to say that the phase plate 108 and the sheet polarizer 109 are disposed on the light-emitting side in this case. Such reflective-type pixels can be obtained by forming pixel electrode 105 of aluminum, chromium, silver or the like. If the surface of the pixel electrode 105 is provided with projections (or projections and depressions), the interface with the organic EL layer 15 is enlarged, which increases the light-emitting area and improves the luminescence efficiency. It should be noted that when it is possible to form a reflective film to serve as cathode 106 (or anode 105) on a transparent electrode or reduce the reflectance to 30% or lower, the circularly polarizing plate is unnecessary. This is because undesired reflection of extraneous light is reduced to a large extent. Further, such an arrangement reduces interference of light and hence is desirable.

Preferably, each transistor 11 employs a LDD (lightly doped drain) structure. Though the organic EL device (which is variously abbreviated as OEL, PEL, PLED, OLED or the like) 15 is exemplified as the EL device in this description, it is needless to say that an inorganic EL device is applicable to the present invention without limitation to the organic EL device.

The active-matrix configuration used for the organic EL display panel has to satisfy the following two conditions:
(1) the active-matrix configuration is capable of selecting a specified pixel and giving the pixel required information; and
(2) the active-matrix configuration is capable of passing a current through each EL device throughout a one-frame period.

Figure 62:
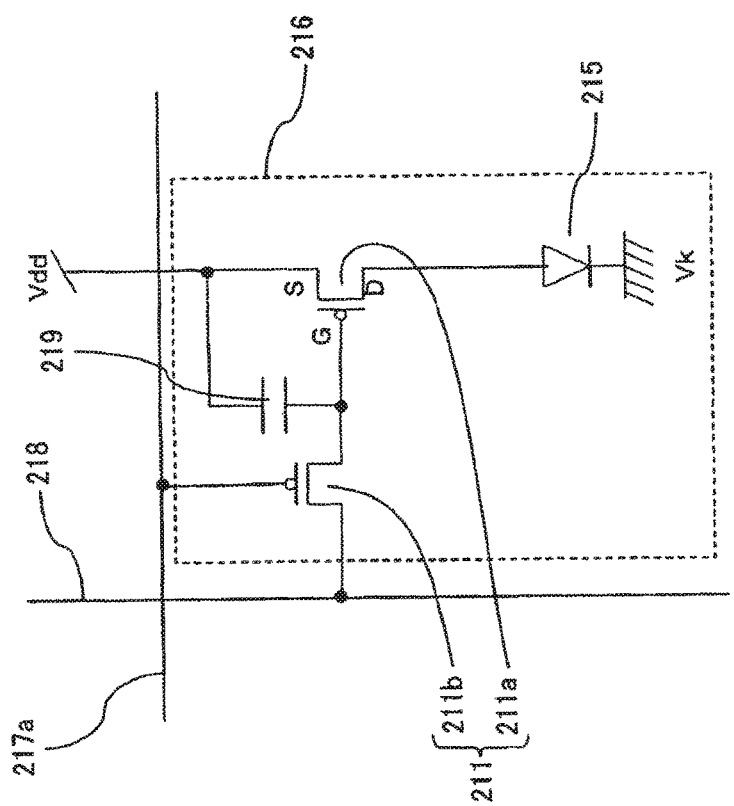
FIG. 62 is a diagram illustrating a pixel configuration of a conventional EL display panel.

To satisfy these two conditions, the pixel configuration of the conventional organic EL device shown in FIG. 62 uses first transistor 211*b* as a switching transistor for pixel selection and second transistor 211*a* as a driving transistor for feeding EL device (EL film) 215 with current.

In causing this configuration to realize gray-scale display the driving transistor 211*a* needs to be applied a voltage corresponding to a level of gray as a gate voltage. Accordingly, fluctuations of on-current in the driving transistor 211*a* are directly reflected in image display.

The on-current in a transistor formed of single crystal is extremely invariant, whereas a low-temperature polycrystalline transistor, which is formed by the low temperature polysilicon technology which enables the formation of a transistor on an inexpensive glass substrate at 450° C. or lower, has a threshold voltage varying in the range from ±0.2 V to ±0.5 V. For this reason, the on-current passing through the driving transistor 211*a* fluctuates with variations in threshold voltage, resulting in display irregularities. Such irregularities occur due not only to variations in threshold voltage but also to variations in the mobility, gate insulator thickness or the like of the transistor. Also, the characteristics of the transistor 211 vary as the transistor 211 deteriorates.

This phenomenon is possible to occur not only with the low temperature polysilicon technology but also with other technology including the high temperature polysilicon technology using a processing temperature of 450° C. or higher and the technology of forming a transistor using a semiconductor film resulting from solid phase (CGS) growth. As well, the phenomenon occurs with organic transistors and amorphous silicon transistors. Therefore, the present invention to be described below is directed to configurations or methods capable of taking measures depending on those technologies. In this description, however, transistors of the type formed by the low temperature polysilicon technology are described mainly.

With the method of gray scale display by writing with voltage as shown in FIG. 62, device characteristics need to be controlled precisely for providing an invariant display. With the low temperature polysilicon transistor or the like presently available, however, the requirement of controlling variations in device characteristics to within predetermined ranges cannot be satisfied.

In the pixel structure of the EL display apparatus according to the present invention, a unit pixel comprises four transistors 11 and an EL device, as specifically shown in FIG. 1. The pixel electrode is formed as overlapping the source signal lines. More specifically, source signal lines 18 are insulated by the formation of an insulating film or a planarizing film comprising an acrylic material over the source signal lines 18, and then pixel electrode 105 is formed on the insulating film. Such a structure that a pixel electrode overlaps at least a part of source signal lines is called a high aperture (HA) structure. This structure can be expected to reduce useless interference light and ensure favorable luminescence.

When gate signal line (first scanning line) 17a is rendered active (applied with on-voltage) by outputting of a gate signal thereto, the source driver 14 feeds EL device 15 with a current having a value required by EL device 15 through driving transistor 11a and switching transistor 11c associated with the EL device 15. By rendering gate signal line 17a inactive (applying the gate signal line with on-voltage) in a manner to shortcircuit the gate and the drain of the transistor 11a, the transistor 11b is opened and, at the same time, the gate voltage (or the drain voltage) of the transistor 11a is stored in capacitor (storage capacitor or additional capacitor) 19 connected between the gate and the source of the transistor 11a (see FIG. 3(a).)

The capacitor 19 intermediate the source (S) and the gate (G) of the transistor 11a preferably has a capacitance of 0.2 pF or more. A structure having capacitor 19 formed separately is exemplified as another structure. That is, the structure has a storage capacitor comprising a capacitor electrode layer, a gate insulator and gate metal. Such a separately-formed capacitor is preferable from the viewpoints of preventing a decrease in luminance due to leakage from the transistor 11c and stabilizing the display operation.

The capacitor (storage capacitor) 19 preferably has a capacitance not less than 0.2 pF and not more than 2 pF, particularly preferably not less than 0.4 pF and not more than 1.2 pF. The capacitance of the capacitor 19 is determined in view of a pixel size. Assuming that Cs (pF) is the capacitance required for one pixel and Sp (square μm) is the area occupied by one pixel (not the effective aperture ratio), Cs and Sp preferably satisfy $500/Sp \leq Cs \leq 20000/Sp$, more preferably $1000/Sp \leq Cs \leq 10000/Sp$. Since the capacitance of the gate of the transistor is small enough, Q used here is the capacitance of the storage capacitor (capacitor) 19 alone.

Preferably, the capacitor 19 is formed substantially in a non-display region located intermediate adjacent pixels. Generally, in the formation of full color organic EL devices 15, misalignment of a mask causes misregistration of organic EL layers to occur since the EL layers are formed using a vapor deposition process with a metal mask. Such misregistration might cause organic EL layers 15 (15R, 15G and 15B) for respective colors to overlap each other. For this reason, adjacent pixels for respective colors have to be spaced 10μ or more by the non-display region. This region does not contribute to luminescence. Therefore, the formation of storage capacitor 19 in this region is also effective means for improving the effective aperture ratio.

Subsequently, gate signal line 17a is rendered inactive (applied with off-current) and gate signal line 17b rendered active, so that the current path is switched to the path including EL device 15 and transistor 11d connected to the first transistor 11a and the EL device 15, thereby causing the current stored in the aforementioned manner to pass through the EL device 15 (see FIG. 3(b).)

This circuit has four transistors 11 in one pixel, the transistor 11a having its gate connected to the source of the transistor 11b. The gates of the respective transistors 11b and 11c are connected to gate signal line 17a. The drain of the transistor 11b is connected to the drain of the transistor 11c as well as the source of the transistor 11d. The source of the transistor 11c is connected to source signal line 18. The gate of the transistor 11d is connected to gate signal line 17b, while the drain of the transistor 11d connected to the anode of the EL device 15.

All the transistors shown in FIG. 1 are p-channel transistors. The p-channel transistor is preferable because it has a high breakdown voltage and is hard to deteriorate, though the p-channel transistor exhibits slightly lower mobility than the n-channel transistor. However, the present invention does not limit the transistors used in the EL device configuration to p-channel transistors. It is possible to form the EL device configuration using the n-channel transistor exclusively. The EL device configuration may be formed using the n-channel transistor and the p-channel transistor both.

In FIG. 1, it is preferable that the transistors 11c and 11b have the same polarity and are of the p-channel type while the transistors 11a and 11d are of the n-channel type. Generally, the p-channel transistor is characterized in the features including higher reliability and less occurrence of kink current than the n-channel transistor. Therefore, use is very effective of the p-channel transistor as the transistor 11a associated with EL device 15 which is designed to obtain a desired intensity of luminescence by current control.

Most preferably, all the transistors forming a pixel as well as incorporated gate driver 12 are of the p-channel type. By thus forming the array with exclusive use of p-channel transistors, the number of masks to be used is reduced to five, which can make the cost lower and the yield higher.

For easy understanding of the present invention, description will be made of the EL device configuration according to the present invention with reference to FIG. 3. The EL device configuration of the present invention is controlled with two timings. The first timing is timing for storing a required current value. When transistors 11b and 11c are turned on at this timing, the equivalent circuit of the EL device configuration assumes the state shown in FIG. 3(a). Here, a predetermined current Iw is written through a signal line. By so doing, transistor 11a is turned into a state where the gate and the drain are connected to each other and current Iw passes through the transistor 11a and transistor 11c. Accordingly, the voltage across the gate-source of transistor 11a assumes a value such as to cause current Iw to pass.

The second timing is timing for closing transistors 11b and 11c and opening transistor 11d. At this time, the equivalent circuit of the EL device configuration assumes the state shown in FIG. 3(b). The voltage across the source-gate of transistor 11a is held as it is. In this case transistor 11a operates within a saturation region at all times and, hence, the value of current assumes Iw constantly.

Figure 5:
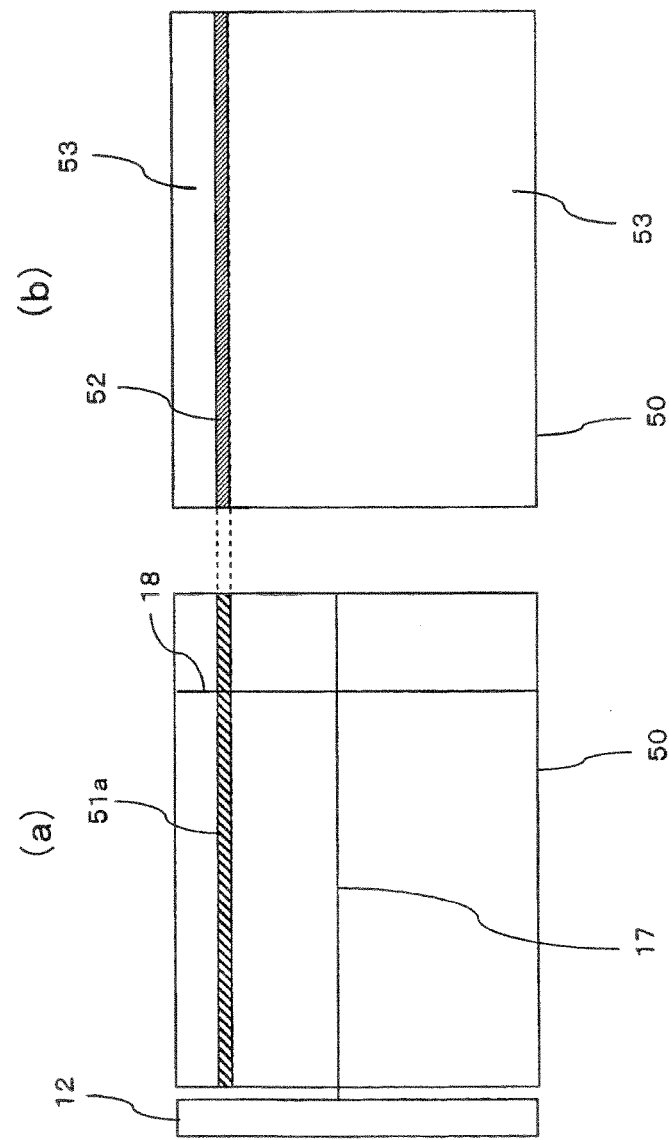
FIG. 5 is an explanatory view illustrating a method of driving an EL display apparatus according to the present invention.

These operations cause the display apparatus to be driven as shown in FIG. 5. Reference character 51a in FIG. 5(a) designates a pixel (row) of display screen 50 programmed with current at a certain time point (written pixel (row).) This pixel (row) 51a is a non-lighting (non-display) pixel row as shown in FIG. 5(b). Other pixels (rows) are display pixels (rows) 53. (That is, current is passing through EL devices 15 of the display pixels (rows) 53 and the EL devices 15 are emitting light.)

In the case of the pixel configuration shown in FIG. 1, programming current Iw passes through source signal line 18 at the time of current-based programming. The current Iw passes through transistor 11*a* to make voltage setting (programming) of the capacitor 19 so that a voltage such as to cause the current Iw to pass is held. At this time transistor 11*d* is open (in off-state).

Figure 3:
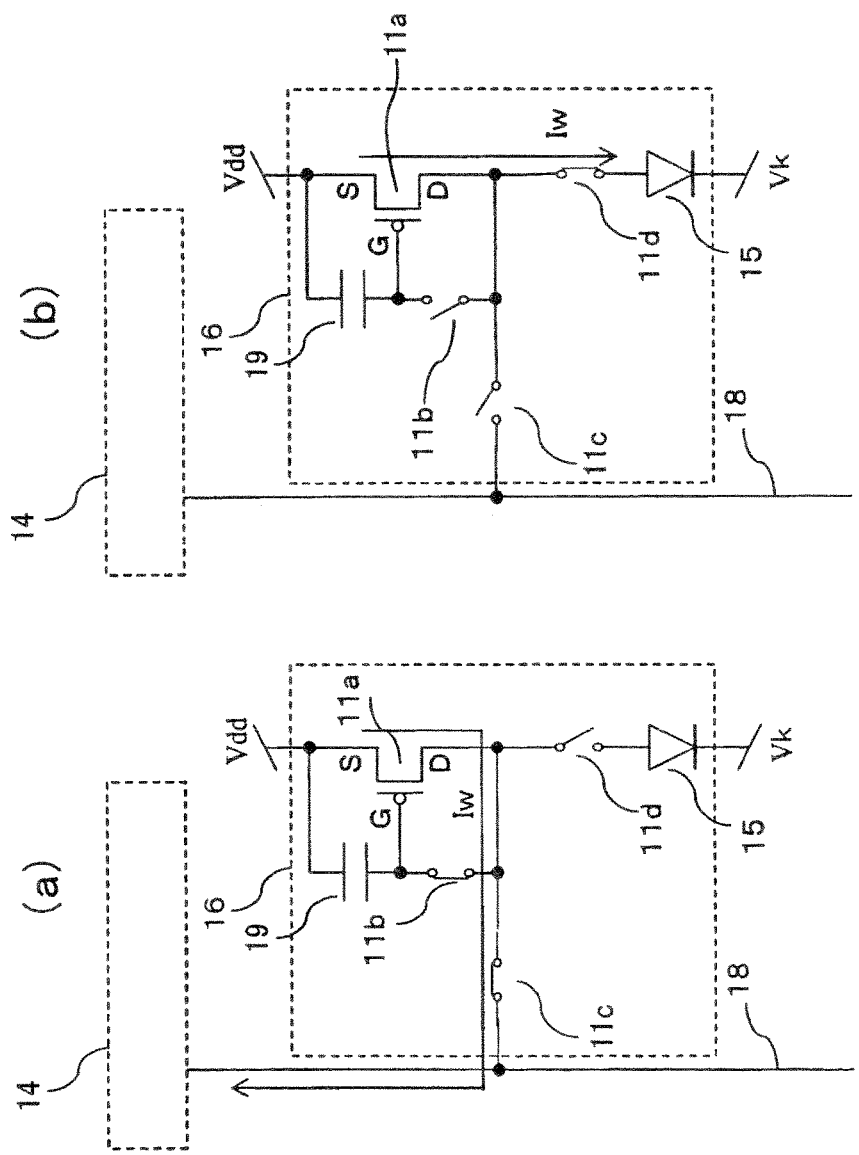
FIG. 3 is an explanatory diagram illustrating an operation of an EL display panel according to the present invention.

In a period for allowing current to pass through EL device 15, transistors 11*c* and 11*b* are turned off while transistor 11*d* turned on, as shown in FIG. 3(*b*). Specifically, off-voltage (Vgh) is applied to gate signal line 17*a* to turn transistors 11*b* and 11*c* off. On the other hand, on-voltage (Vgl) is applied to gate signal line 17*d* to turn transistor 11*d* on.

Figure 4:
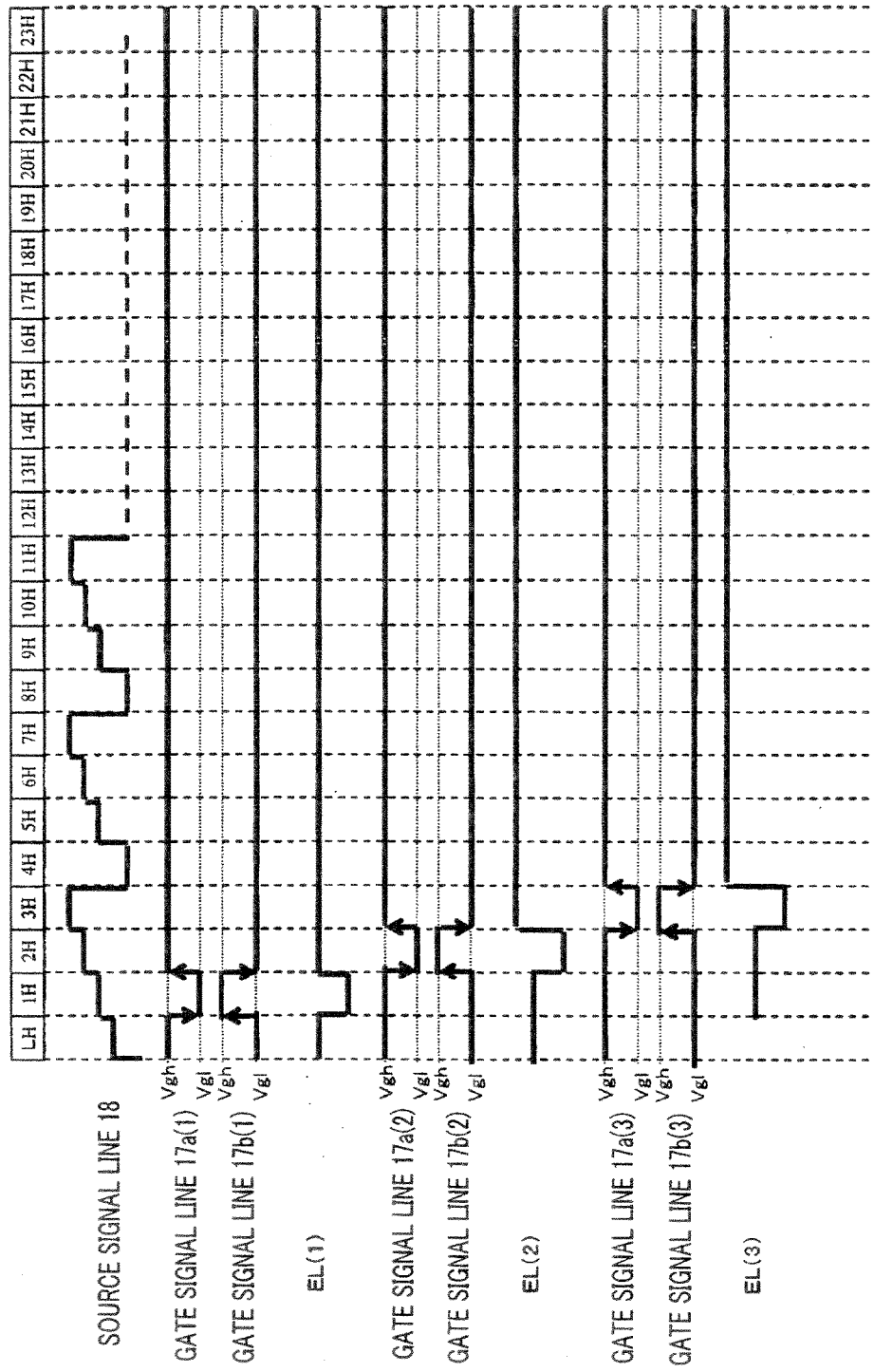
FIG. 4 is an explanatory chart illustrating an operation of an EL display panel according to the present invention.

The chart of such timing is shown in FIG. 4. In FIG. 4 and the like, a parenthesized additional numeral (for example, (1)) indicates a row number given to a pixel row. Specifically, gate signal line 17*a*(1) indicates the gate signal line 17*a* of pixel row (1). *H ("*" represents any character or numeral indicative of the number of a horizontal scanning line), which appears in the uppermost section of FIG. 4, represents a horizontal scanning period. Specifically, 1H represents the first horizontal scanning period. These matters are for easy description and do not limit the number and the period of a one-H period, the sequence of pixel rows, and the like.

As seen from FIG. 4, in each pixel row selected (the period for which the pixel row is in the selected state is 1H), gate signal line 17*b* is applied with off-voltage, while gate signal line 17*a* applied with on-voltage. In this period current does not pass through EL devices 15; that is, the EL devices 15 are in the non-lighting state. In each pixel row unselected, on the other hand, gate signal line 17*a* is applied with off-voltage, while gate signal line 17*b* applied with on-voltage. In this period current passes through EL devices 15; that is, the ET, devices 15 are in the lighting state.

The gate of transistor 11*b* and that of transistor 11*c* are connected to the same gate signal line 17*a*. However, they may be connected to different gate signal lines (the gate signal lines 17*a* and 17*c* in FIG. 32). In this case, the number of gate signal lines associated with one pixel is three. (The configuration shown in FIG. 1 has two gate signal lines for one pixel.) By individually controlling the on-off timing for the gate of transistor 11*b* and that for the gate of transistor 11*c*, fluctuations in the value of current passing through EL devices 15 due to variations in the characteristics of transistor 11*a* can further be reduced.

If gate signal lines 17*a* and 17*b* formed into a common line and transistors 11*c* and 11*d* are rendered different from each other in conductivity type (i.e., n-channel type and p-channel type), it is possible to simplify the driving circuit and improve the effective aperture ratio of pixels.

With such a configuration, the writing path from a relevant signal line becomes off at the operation timing according to present invention. If the path allowing current to pass therethrough is branched when a predetermined value of current is to be written, the value of current is not exactly stored in the capacitor located intermediate the source (S) and the gate (G) of transistor 11*a*. Where transistors 11*c* and 11*d* are rendered different in conductivity type from each other, an operation becomes possible such that transistor 11*d* is necessarily turned on after transistor 11*c* has been turned off at timing at which a scanning line is switched to another if each other's threshold value is controlled.

Figure 2:
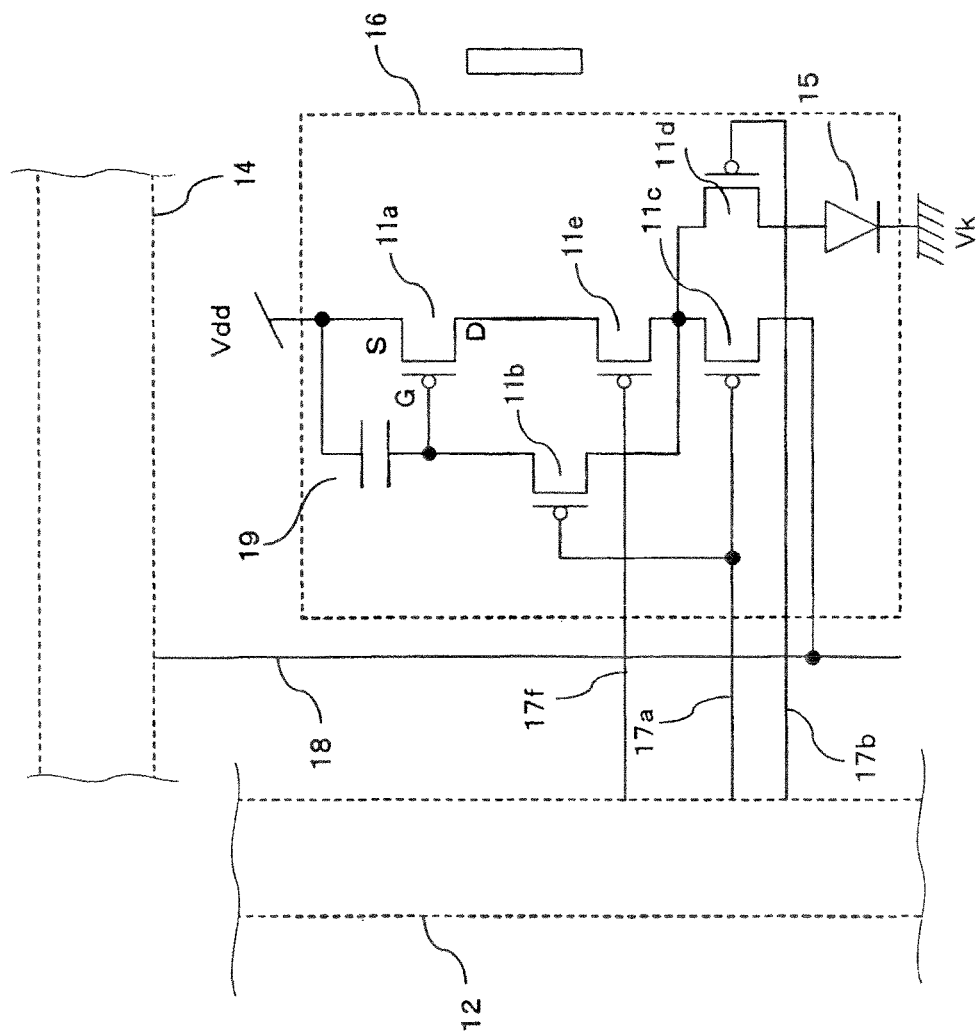
FIG. 2 is a diagram illustrating a pixel configuration of an EL display panel according to the present invention.

Since the transistors require that each other's threshold value be controlled accurately in this case, sufficient care is necessary in the manufacturing process. Though the above-described circuit is feasible with at least four transistors, a configuration having more than four transistors in which transistor 11*e* is provided as cascade-connected as shown in FIG. 2 operates based on the same operating principle described above. Such a configuration with additional transistor 11*e* can cause a current as exact as programmed through transistor 11*c* to pass through EL device 15.

Variations in the characteristics of transistor 11*a* are correlated with the size of the transistor 11*a*. For reduction of such variations in characteristics, the channel length of the first transistor 11*a* is preferably not less than 5 μm and not more than 100 μm, more preferably not less than 10 μm and not more than 50 μm. This is because when the channel length L is made longer, the grain boundary contained in the channel increases, which is presumed to relax the electric field and hence lower the kink effect.

It is preferable that each of the transistors 11 forming a pixel comprises a polysilicon transistor formed through the laser recrystallization method (laser annealing) and the channels of all the transistors extend in the same direction with respect to the laser irradiation direction. Further, it is preferable that the laser scans the same portion twice or more to form a semiconductor film.

An object of the present invention is to propose a circuit configuration which prevents variations in transistor characteristics from affecting image display. To attain this object, four or more transistors are necessary. In determining a circuit constant from the characteristics of these transistors, it is difficult to determine a suitable circuit constant unless the four transistors are made uniform in characteristics. A transistor having a channel formed to extend in a horizontal direction with respect to the longitudinal axis of laser irradiation is different in such transistor characteristics as threshold value and mobility from a transistor having a channel formed to extend in a vertical direction with respect to the longitudinal axis of laser irradiation. The extent of variations in one case is the same as that in the other. The transistor having the channel extending in the horizontal direction and the transistor having the channel extending in the vertical direction are different from each other in a mean value of mobility and a mean value of threshold. Thus, it is desirable that the channel directions of all the transistors forming a pixel be the same.

Assuming that the capacitance of storage capacitor 19 is Cs(pF) and the value of off-current applied to the second transistor 11*b* is Ioff(pA), Cs and Ioff preferably satisfy the formula: $3 < Cs/Ioff < 24$.

More preferably, they satisfy the formula: $6 < Cs/Ioff < 18$.

The variation in the value of current passing through EL devices can be reduced to 2% or less by adjusting off-current Ioff of transistor 11*b* to 5 pA or lower. This is because charge stored between the gate and the source (opposite ends of the capacitor) cannot be maintained for a one-field period when voltage is not written. Therefore, with increasing storage capacitance of the capacitor 19, allowable off-current increases. The variation in the value of current passing through adjacent pixels can be reduced to 2% or less by satisfying the aforementioned formula.

It is preferable that each of the transistors forming the active-matrix configuration comprises a p-channel polysilicon thin film transistor and transistor 11*b* has a multi-gated structure having at least dual gate. Since transistor 11*b* acts as a switch intermediate the source and the drain of transistor 11*a*, the highest possible on/off ratio is required of transistor 11*b*. By employing such a multi-gated structure having at least dual gate for the gate structure of transistor 11*b*, a high on/off ratio characteristic can be realized.

It is a general practice to form a semiconductor film constituting transistors 11 of pixels 16 through low temperature polysilicon technology with laser annealing. Variations in laser annealing conditions result in variations in the characteristics of transistors 11. However, if there is uniformity in the characteristics of respective transistors 11 in one pixel, a configuration adapted for current-based programming as shown in FIG. 1 or the like is capable of operating so that a predetermined current may pass through EL device 15. This feature is an advantage which a voltage-based programming configuration does not have. The laser for use here is preferably an excimer laser.

In the present invention, the process used to form the semiconductor film is not limited to the laser annealing process but may be a thermal annealing process or a process based on solid phase (CGS) growth. It is needless to say that the present invention can use not only the low temperature polysilicon technology but also the high temperature polysilicon technology.

In order to solve the problem described above, annealing is performed in a manner that a laser irradiation spot (laser irradiation range) 72 extending parallel with source signal line 18 is irradiated with laser light. Further, the laser irradiation spot 72 is moved so as to coincide with one pixel column. Of course, there is no limitation to one pixel column. One pixel unit 16 comprising R, G and B may be irradiated with laser light (in this case three pixel columns are irradiated). It is possible to irradiate plural pixels at a time. It is needless to say that the laser irradiation range may be moved in an overlapping fashion. (Usually, moving laser irradiation range overlaps the preceding laser irradiation spot.)

Three pixels for R, G and B are formed to constitute a square shape. Accordingly, each of the pixels for R, G and B is vertically elongated. Thus, annealing with vertically elongated laser irradiation spot 72 makes it possible to avoid the occurrence of variations in the characteristics of transistors 11 in one pixel. Further, the transistors 11 connected to one source signal line 18 can be rendered uniform in characteristics (mobility, Vt, S value and the like.) (That is, the transistors 11 connected to one source line 18 can be made substantially to agree to each other in characteristics, though there may be a case where the transistors 11 connected to one source signal line 18 are different in characteristics from those connected to an adjacent signal line 18.)

Generally, the length of laser irradiation spot 72 is a fixed value, for example 10 inches. Since laser irradiation spot 72 moves, the panel needs to be positioned so that one laser irradiation spot 72 can move within a range allowing laser irradiation spot 72 to move therein. (That is, the panel needs to be positioned so as to prevent laser irradiation spots 72 from overlapping each other in a central portion of display region 50 of the panel.)

Figure 7:
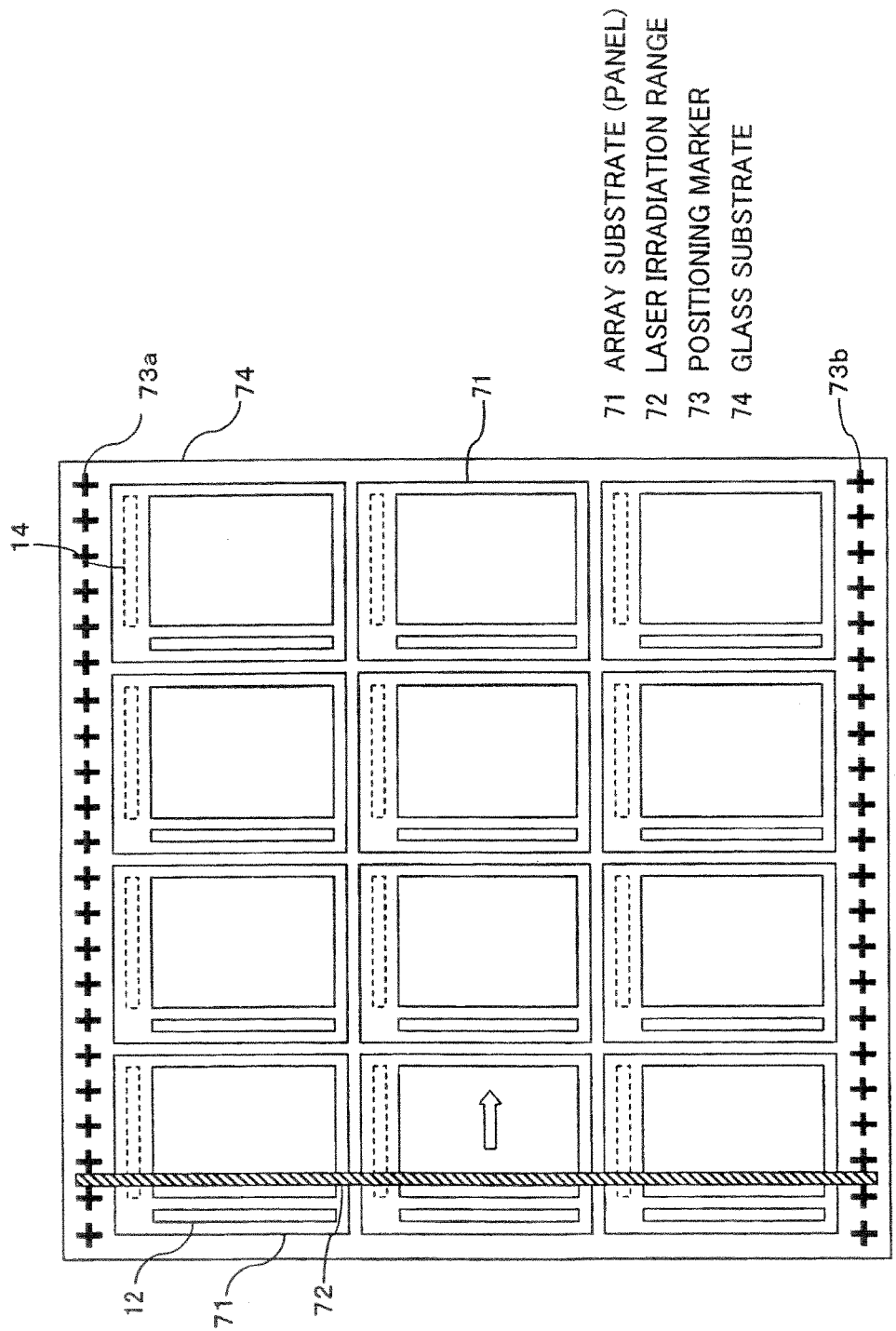
FIG. 7 is an explanatory view illustrating a method of manufacturing an EL display panel according to the present invention.

In the arrangement shown in FIG. 7, three panels are formed as arranged vertically within a range corresponding to the length of laser irradiation spot 72. An annealing apparatus for irradiation of laser irradiation spot 72 recognizes positioning markers 73*a* and 73*b* provided on glass substrate 74 (automatic positioning based on pattern recognition) and moves laser irradiation spot 72. The positioning markers 73 are recognized by means of a pattern recognition device. The annealing apparatus recognizes the positioning markers 73 to find the position of a pixel column. (That is, the apparatus makes laser irradiation range 72 parallel with source signal line 18.) Sequential annealing is performed through irradiation of laser irradiation spot 72 positioned coinciding with the position of each pixel column.

Use of the laser annealing method (of the type adapted for irradiation of a linear laser spot extending parallel with source signal line 18) described with reference to FIG. 7 is preferable particularly in manufacturing an organic EL display panel of the current-based programming type. This is because transistors 11 arranged parallel with a source signal line are uniform in characteristics. (That is, the characteristics of one pixel transistor are approximate to those of a vertically adjacent pixel transistor.) For this reason fluctuations in the voltage level of a source signal line which occur in current-based driving are small and, hence, insufficient writing with current is not likely to occur.

Figure 38:
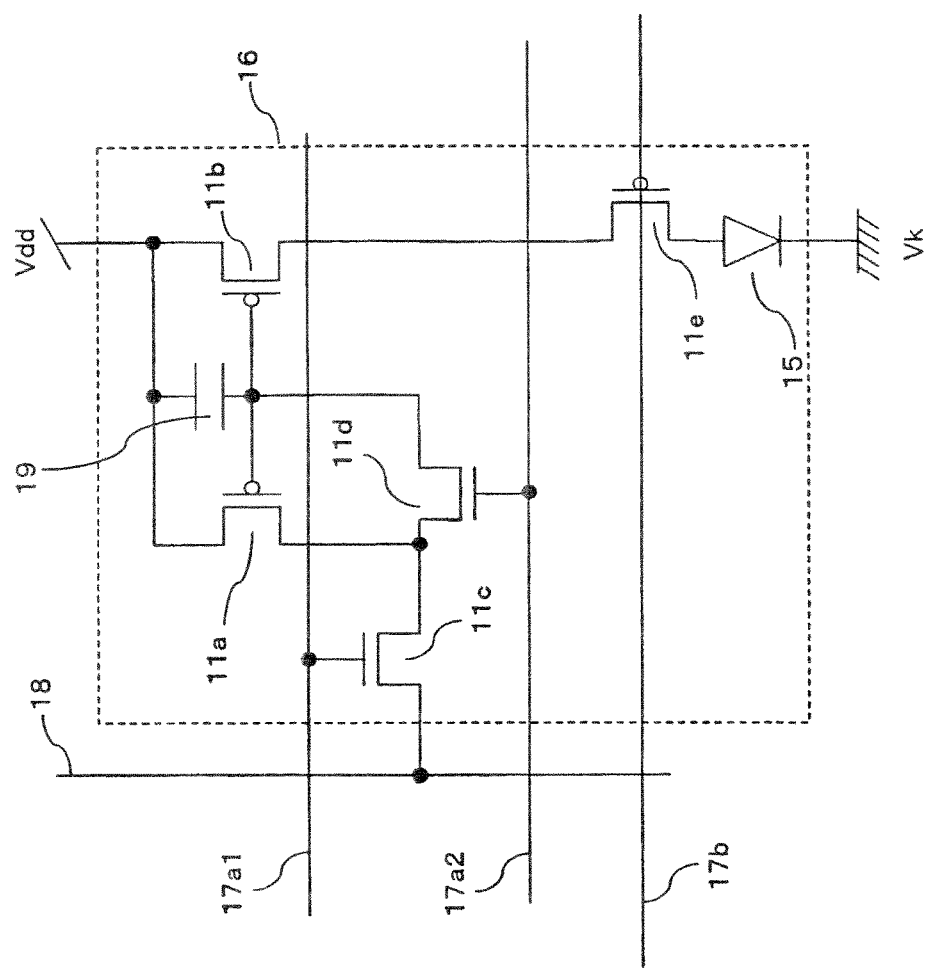
FIG. 38 is a diagram illustrating a configuration of an EL display apparatus according to the present invention.

In the case of white raster display for example, a current to be passed through transistor 11*a* of one pixel is substantially equal to a current to be passed through transistor 11*a* of an adjacent pixel and, therefore, the amplitude of a current outputted from source driver 14 varies little. If transistors 11*a* in FIG. 1 are uniform in characteristics and the values of currents for programming pixels of a pixel column are equal to each other, fluctuations in the potential of source signal line 18 do not occur. Accordingly, if the transistors 11*a* connected to one source signal line 18 are substantially uniform in characteristics, fluctuations in the potential of the source signal line 18 are small. This also holds true for other pixel configurations of the current-based programming type as shown in FIG. 38 and the like. (This means that use of the manufacturing method illustrated in FIG. 7 is preferable.)

Uniform image display can also be realized by a configuration of the type adapted for writing to plural pixel rows at a time to be described with reference to FIG. 27 or 30 or the like. This is mainly because display irregularities due to variations in transistor characteristics are not likely to occur. Since the configuration shown in FIG. 27 or the like selects plural pixel rows at a time, driver circuit 14 can accommodate variations in the characteristics of transistors arranged vertically if the transistors of adjacent pixel rows are uniform.

Though the source driver 14 is formed as comprising an IC chip as shown in FIG. 7, the formation of source driver 14 is not limited thereto. It is needless to say that source driver 14 may be formed together with pixels 16 in the same process.

In the present invention, particularly, the threshold voltage Vth2 of transistor 11*b* is established so as not to be lower than the threshold voltage Vth1 of transistor 11*a* associated with transistor 11*b* in one pixel. For example, the gate length L2 of transistor 11*b* is made longer than the gate length L1 of transistor 11*a* so that Vth2 may not become lower than Vth1 even when the process parameters of these thin film transistors vary. By so doing, faint leakage current can be inhibited to occur.

The above-described features are also applicable to the current mirror pixel configuration shown in FIG. 38. The configuration shown in FIG. 38 comprises driving transistor 11*a* allowing signal current to pass therethrough, driving transistor 11*b* for controlling driving current to be passed through a light-emitting device comprising EL device 15 or the like, take-in transistor 11*c* for connecting or disconnecting the pixel circuit to or from a data line (data) by control over gate signal line 17*a*1, switching transistor 11*d* for shortcircuiting the gate and the drain of transistor 11*a* during a writing period by control over gate signal line 17*a*2, storage capacitor 19 for holding a voltage across the gate and the source of transistor 11a even after completion of writing of the voltage, and EL device 15 as a light-emitting device.

Though transistors 11c and 11d are n-channel transistors while other transistors are p-channel transistors in FIG. 38, this feature is a mere example and the configuration need not necessarily have this feature. Though the storage capacitor 19 has one terminal connected to the gate of transistor 11a and the other terminal connected to Vdd (power supply potential), the storage capacitor 19 may be connected to any fixed potential instead of Vdd. The cathode (negative electrode) of EL device 15 is connected to the ground potential.

Figure 6:
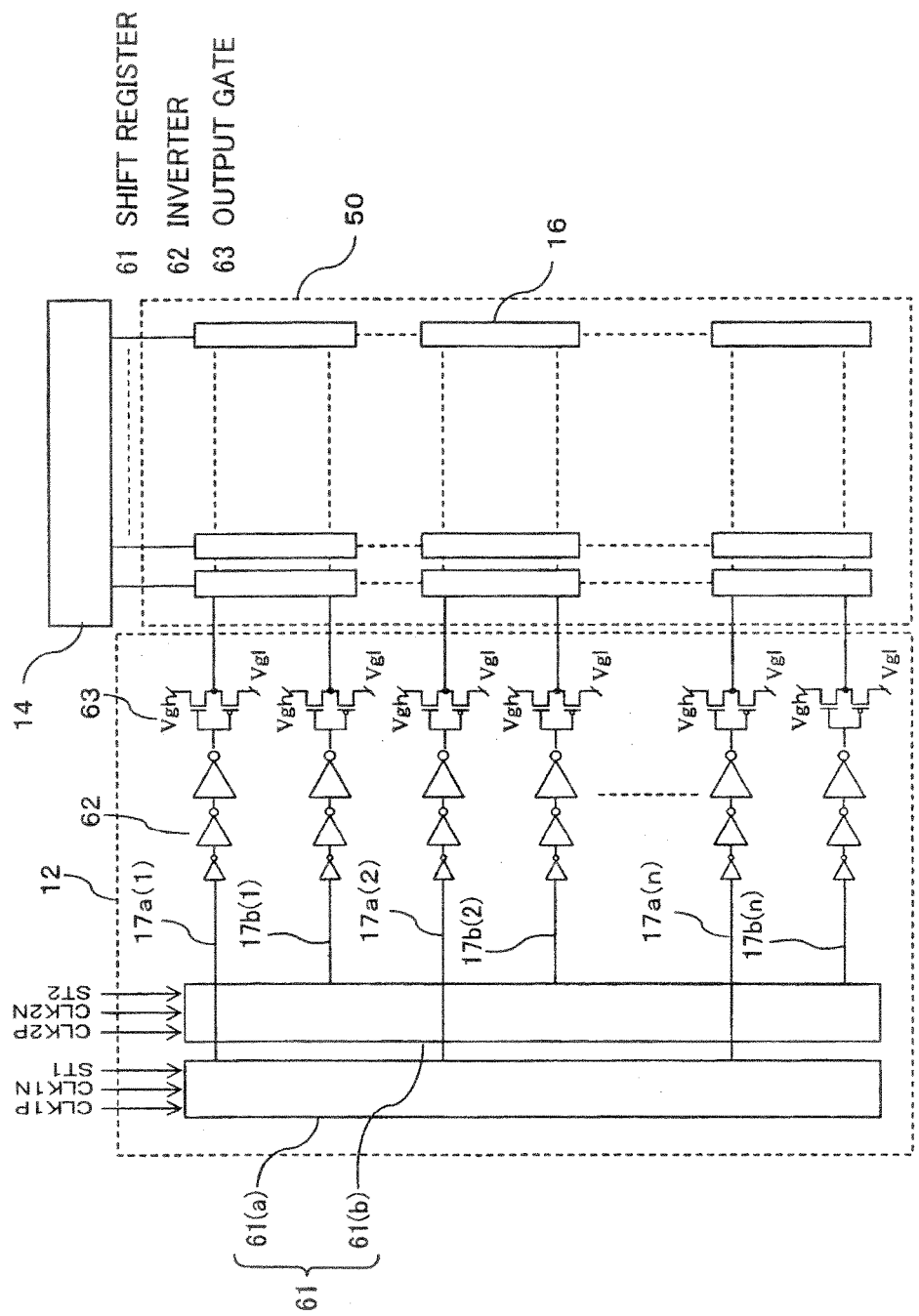
FIG. 6 is a diagram illustrating a configuration of an EL display apparatus according to the present invention.

Description will be made of an EL display panel and an EL display apparatus according to the present invention. FIG. 6 is an explanatory diagram mainly illustrating the circuit of the EL display apparatus. Pixels 16 are arranged or formed in a matrix pattern. Each pixel 16 is connected to source driver 14 adapted to output a current for current-based programming of each pixel 16. The source driver 14 has an outputting section formed with current mirror circuits corresponding to the number of bits of an image signal as gray scale data, as will be described later. For example, if there are 64 gray-levels, each source signal line is formed with 63 current mirror circuits. The source driver 14 is configured to be capable of applying a desired current to source signal line 18 by selecting a current mirror circuits count.

The minimum output current of one current mirror circuit is set to be not more than 10 nA and not less than 50 nA. It is particularly preferable to set the minimum output current of one current mirror circuit to be not more than 15 nA and not less than 35 nA. This is because such setting can ensure correct functioning of the transistors forming the current mirror circuits in the source driver 14.

The source driver 14 incorporates a precharge or discharge circuit for forcibly charging or discharging source signal line 18. The precharge or discharge circuit for forcibly charging or discharging source signal line 18 is preferably configured to be capable of setting output voltage (current) values for respective of R, G and B independently. This is because EL devices 15 for R, G and B have different threshold values.

Organic EL devices are known to have high temperature dependence. In order to control variations in luminance intensity due to such temperature dependence, the current mirror circuits are provided with a nonlinear device, such as thermistor or posister, for varying the output current. A reference current is generated in an analog fashion by adjusting variations due to the temperature dependence by means of the thermistor or the like.

In the present invention, source driver 14 comprises a semiconductor chip and is connected to terminals of source signal lines 18 on substrate 71 by the Chip On Glass (COG) technology. Metal wires of chromium, aluminum, silver or the like are used for wiring of signal lines including source signal lines 18. This is because such a wire offers a low resistance with a small wiring width. In the case where the pixels are of the reflection type, it is preferable that such wiring is made of the same material as the reflective film of the pixels and formed at the same time with the formation of the reflective film. By so doing, the process can be simplified.

The technology for use in mounting source driver 14 is not limited to the COG technology. It is possible that the source driver 14 is mounted by the Chip On Film (COF) technology and connected to signal lines of the display panel. A drive IC may comprise three chips, with a power supply IC 82 being formed separately.

On the other hand, the gate driver 12 is formed by the low temperature polysilicon technology. This means that the gate driver 12 is formed along with the transistors of the pixels by the same process. This is because the gate driver 12 has a simple internal structure and a low working frequency as compared to the source driver 14. Therefore, the gate driver 12 can be formed easily even by the low temperature polysilicon technology, which leads to the frame made narrower. Of course, it is needless to say that the gate driver 12 may comprise a silicon chip and may be mounted on the substrate 71 by utilizing the COG technology. The gate driver, switching devices including a pixel transistor, and like components may be formed by the high temperature polysilicon technology, or they may be formed using an organic material (organic transistor).

The gate driver 12 incorporates a shift register circuit 61a for gate signal line 17a, and a shift register circuit 61b for gate signal line 17b. Each shift register 61 is controlled using clock signals of positive and negative phases (CLKxP and CLKxN) and start pulse (STx). Preferably, there are additionally used an enable signal (ENABL) for controlling outputting/non-outputting from gate signal lines and an up-down (UPDOWN) signal for reversing the shifting direction up and down. It is also preferable to provide an output terminal or the like for checking whether the start pulse has been shifted by the shift register and outputted therefrom. The timing for shifting by the shift register is controlled using a control signal from control IC 81. The gate driver 12 further incorporates a level shifting circuit for shifting an extraneous data level, and an inspection circuit.

Since the shift register circuit 61 has a low buffer capacity, the shift register circuit 61 cannot directly drive gate signal lines 17. For this reason, at least two inverter circuits 62 are formed between the output of the shift register 61 and an associated output gate 63 adapted to drive gate signal line 17.

Similarly, in the case where the source driver 14 is formed directly on the substrate 71 by such polysilicon technology as the low temperature polysilicon technology, plural inverter circuits are formed between an analog switch gate such as a transfer gate for driving source signal line 18 and a shift register of the source driver 14. The source driver and the gate driver share the following feature (i.e., the feature related to an inverter circuit provided between the output of a shift register and an outputting section (including an output gate or a transfer gate)) adapted to drive signal lines.

Though an output of the source driver 14 is shown to connect directly to source signal line 18 in FIG. 6 for example, actually the output of the shift register of the source driver is connected to multiple inverter circuits, the outputs of which are connected to analog switch gates such as transfer gates.

Each inverter circuit 62 comprises a p-channel MOS transistor and an n-channel MOS transistor. As described above, an output terminal of shift register 61 of the gate driver 12 is connected to multiple inverter circuits 62 and the output of the final inverter circuit is connected to associated output gate circuit 63. Each inverter circuit 62 may comprise transistors of p-channel type only. In this case, inverter circuit 62 may serve as a mere gate circuit but not as an inverter.

FIG. 8 is a diagram illustrating an arrangement for supply of signals and voltage in the display apparatus or the configuration of the display apparatus according to the present invention. Signals from control IC 81 are fed to source driver 14a (power supply wiring, data wiring or the like) through flexible board 84.

In FIG. 8, control signals for gate driver 12 are generated at control IC 81, level-shifted at source driver 14 and then applied to gate driver 12. Since the driving voltage of source driver 14 ranges from 4 to 8 (V), a control signal having an amplitude of 3.3 (V) can be converted into a signal having an amplitude of 5 (V), which can be received by gate driver 12.

Source driver 14 is preferably provided therein with image memory. The image memory may store image data previously subjected to an error diffusion process or a dither process. Such an error diffusion process or dither process can convert 260,000-color display data into, for example, 4096-color display data, thereby contributing to a reduction in the capacity of the image memory. The error diffusion process or the like can be achieved with error diffusion controller 81. Image data may be subjected to the dither process and then further subjected to the error diffusion process. The matter described above holds true for a reverse error diffusion process.

Though the component 14 in FIG. 8 or the like is referred to as the source driver, the component 14 may incorporate not only a mere driver circuit but also a power supply circuit, buffer circuit (including such a circuit as a shift register), data converter circuit, latch circuit, command decoder, shift circuit, address translator circuit, image memory or the like. It is needless to say that a three-side-free arrangement (structure) and a driving method, which will be described with reference to FIG. 9 and the like, are applicable to the configuration described with reference to FIG. 8.

For the display panel to be used in an information display apparatus such as a mobile phone, it is preferable that source driver (circuit) 14 and gate driver (circuit) 12 are mounted (formed) on one side of the display panel. (It should be noted that an arrangement such that driver ICs (circuits) are mounted (formed) on one side of a panel is referred to as a three-side-free arrangement (structure). It has been a conventional practice to mount gate driver 12 and source driver 14 on X-side and Y-side, respectively, of a display region.) The three-side-free arrangement allows the center line of screen 50 to coincide with the center line of the display apparatus easily and makes the mounting of driver ICs easy. The gate driver may be formed in a three-side-free arrangement by the high temperature or low temperature polysilicon technology. (That is, at least one of source driver 14 and gate driver 12 shown in FIG. 9 is formed directly on substrate 71 by the polysilicon technology.)

The term "three-side-free arrangement" is meant to include not only an arrangement having ICs mounted or formed directly on substrate 71 but also an arrangement in which a film attached with source driver (circuit) 14, gate driver (circuit) 12 and the like (by TCP or TAB technology) is bonded to one side (or essentially one side) of substrate 71. That is, the term "three-side-free arrangement" is meant to include any arrangement or disposition having two sides on which any IC is not mounted or fitted as well as all arrangements similar thereto.

Figure 9:
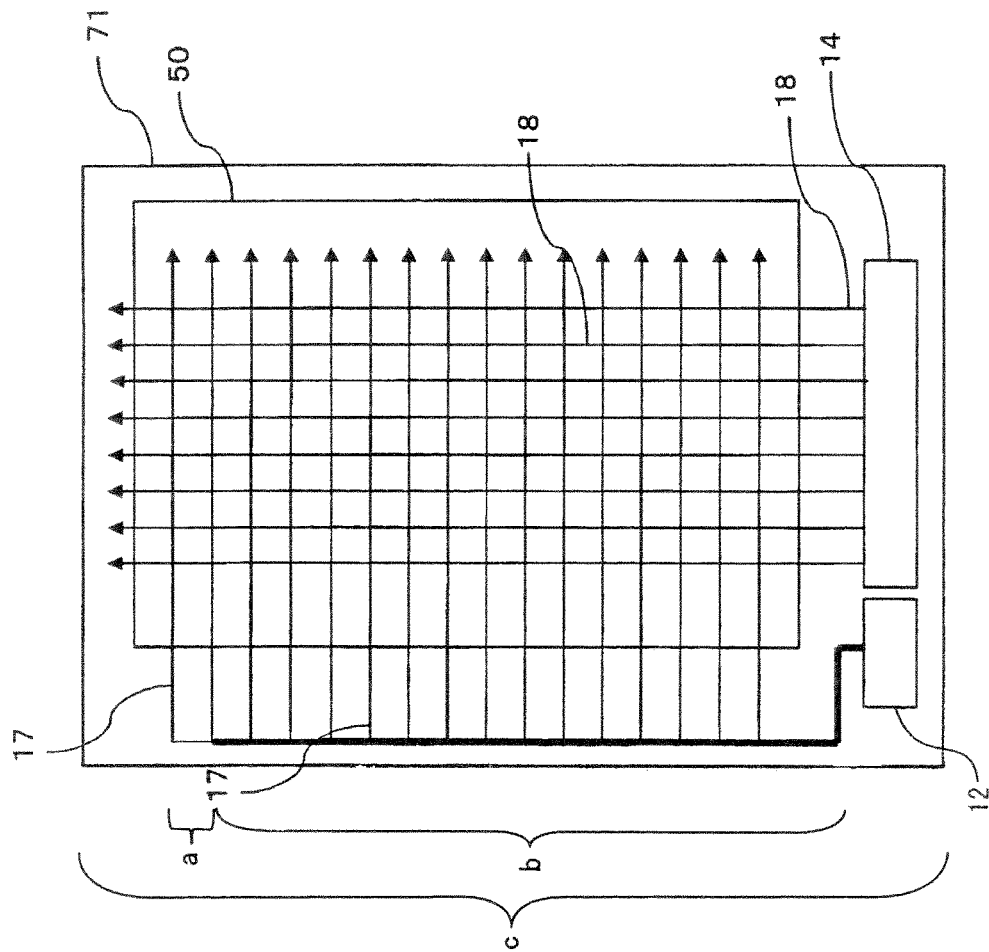
FIG. 9 is a diagram illustrating a configuration of an EL display apparatus according to the present invention.

When gate driver 12 is disposed beside source driver 14 as shown in FIG. 9, gate signal lines 17 need to be arranged along side C.

The portion indicated by thick solid line in FIG. 9 and the like is a portion in which gate signal lines are formed side by side. Accordingly, the portion designated by reference character b (lower portion in the figure) is formed with parallel gate signal lines 17 in the number shown, while the portion designated by reference character a (an upper portion in the figure) is formed with one gate signal line 17.

The pitch at which gate signal lines 17 are formed on C side is not less than 5 μm and not more than 12 μm. If the pitch is less than 5 μm, noise occurs at an adjacent gate signal line by the influence of parasitic capacitance. According to an experiment, the influence of parasitic capacitance becomes significant when the pitch is 7 μm or less. When the pitch further decreases to a value less than 5 μm, image noise such as beat noise occurs vigorously on the display screen. Particularly, noise occurs differently between the right-hand side and the left-hand side of the screen and it is difficult to reduce such image noise as beat noise. On the other hand, if the pitch exceeds 12 μm, the frame width D of the display panel becomes so large that the display panel cannot be put to practical use.

The aforementioned image noise can be reduced by providing a ground pattern (which is a conductive pattern set to have a fixed voltage or a stabilized potential as a whole) as a layer underlying or overlying the portion formed with gate signal lines 17. Alternatively, a separately-formed shielding plate or foil (which is a conductive pattern set to have a fixed voltage or a stabilized potential as a whole) should be placed over gate signal lines 17.

Though the gate signal lines 17 formed on side C in FIG. 9 may comprise an ITO electrode each, each of them preferably comprise a stack of ITO film and metal thin film so as to have decreased resistance. Alternatively, each gate signal line preferably comprises a metal film. In stacking metal thin film on ITO, a titanium film is formed over ITO and then a thin film of aluminum or of alloy comprising aluminum and molybdenum is formed over the titanium film. Alternatively, a chromium film is formed over ITO. In the case where each gate signal line comprises metal film, the metal film comprises an aluminum thin film or a chromium thin film. The matters described above hold true for other embodiments of the present invention.

There is no limitation to the arrangement shown in FIG. 9 or the like in which gate signal lines 19 are disposed (or formed) on one side of display region 50. Gate signal lines 19 may be disposed (or formed) on opposite sides of display region 50. For example, it is possible that gate signal lines 17a are disposed (or formed) on the right-hand side of display region 50 while gate signal lines 17b disposed (or formed) on the left-hand side of display region 50. The matter thus described hold true for other embodiments.

Source driver 14 and gate driver 12 may be formed into a single chip. With such a single chip, it is sufficient to mount a single IC chip on the display panel. Accordingly, the mounting cost can be reduced. In addition, different voltages to be used in the single chip driver IC can be generated at a time.

There is no limitation to the above-described feature that source driver 14 and gate driver 12 are each formed from a semiconductor wafer such as silicon and then mounted on the display panel. It is needless to say that they may be formed directly on display panel 82 by the low temperature polysilicon technology or the high temperature polysilicon technology.

In the configuration shown in FIG. 1 or the like, EL device 15 is connected to Vdd potential through transistor 11a. Such a configuration, however, involves a problem of different driving voltages to be applied to organic EL devices for developing respective colors. For example, when a current of 0.01 (A) is allowed to pass per unit $cm^2$, the terminal voltage of EL device for blue (B) assumes 5 (V) while that of each of EL devices green (G) and red (R) assumes 9 (V). That is, G and R are different from B in terminal voltage. Therefore, B is different from G and R in the source-drain voltage (SD voltage) of transistor 11a to be held. For this reason, the transistors associated with respective color EL devices have different off-leak currents due to different source-drain voltages (SD voltages). When such off-leak currents occur with a difference in off-leak characteristic between EL devices for respective colors, a complicated display state results where flicker occurs with the colors being out of balance and the gamma characteristic deviates in accordance with the correlation with the color of emitted light.

To deal with this problem, an arrangement is employed such that the potential at the cathode of at least one of R, G and B devices is made different from that at the cathode of each of the other devices. Alternatively, another arrangement may be employed such that the Vdd potential of at least one of R, G and B devices is made different from that of each of the other devices.

It is needless to say that terminal voltages of EL devices for R, G and B are preferably made as equal to each other as possible. Materials and structures needs to be selected so that the terminal voltages of R, G and B devices assume respective values not higher than 10 (V) on condition that the devices each exhibits a white peak luminance and the color temperatures of the respective devices are in the range not lower than 7000 K and not higher than 12,000 K. Further, the difference between the maximum terminal voltage and the minimum terminal voltage of the EL devices for R, G and B need be not more than 2.5 (V), preferably not more than 1.5 (V). While the foregoing embodiment uses the colors of R, G and B, there is no limitation to these colors. This will be described later.

While the pixels are adapted to develop the three primary colors, namely R, G and B, they may be adapted to develop three colors, namely cyan, yellow and magenta. It is possible to use two colors, namely B and yellow. Of course, it is possible to use a monochromatic color. It is possible to use six colors, namely R, G, B, cyan, yellow and magenta. It is also possible to use five colors, namely R, G and B, cyan and magenta. These colors offer widened color reproducible ranges of natural colors and hence are capable of realizing favorable display. Another possible combination of colors includes four colors, namely R, G, B and white. Yet another possible combination of colors includes seven colors, namely R, G, B, cyan, yellow, magenta, black and white. It is possible that white light emitting pixels are formed (or made) throughout display region 50 and R, G and B color filters are provided on the pixels to realize a three-primary-color display. In this case it is sufficient to stack light-emitting materials for respective colors on EL layers. Alternatively, each pixel is dividedlly painted with B and yellow for example. As described above, the El display apparatus according to the present invention is not limited to color display based on the R, G and B three primary colors.

Three major methods can be used in causing an organic EL display panel to realize color display, and the color conversion method is one of them. According to this method, it is sufficient to form a single luminescent layer for blue and the other colors, namely green and red, required for full color display are produced by color conversion from blue light. Accordingly, there is no need to provide layers painted into R, G and B separately. This method has an advantage that there is no need to provide a set of organic EL materials for respective of R, G and B. The color conversion method is free of a decrease in production yield, which is essential to the separately painting method. Either method is applicable to the EL display panel and the like according to the present invention.

In addition to the pixels for the three primary colors, white-light-emitting pixels may be formed. Such a white-light-emitting pixel can be realized by stacking light-emitting structures for R, G and B on each other. A set of pixels comprises pixels for the R, G and B three primary colors and a white-light-emitting pixel 16W. The formation of such a white-light-emitting pixel makes it easy to develop a white light peak luminance. Thus, brilliant image display can be realized.

In forming a set of pixels for the R, G and B three primary colors or like colors, the pixels for the respective colors are preferably made to have respective pixel electrodes having different areas. Of course, the pixel electrodes may have equal areas if the emission efficiencies of the respective colors are well-balanced and the color purities of the respective colors are also well-balanced. If one or plural colors are ill-balanced, it is preferable to adjust the light-emitting surface areas of the respective pixel electrodes. The light-emitting surface areas of the pixel electrodes for the respective colors should be determined based on their current densities. Specifically, on condition that white balance is adjusted in a state where the color temperatures are within the range not lower than 7000 K (Kelvin) and not higher than 12,000 K, the difference in current density between the pixel electrodes for the respective colors is adjusted to within ±30%, preferably ±15%. If the current density of the pixel electrode for one color is 100 A/m$^2$ for example, the current density of the pixel electrode for any one of the three primary colors is made to assume a value not less than 70 A/m$^2$ and not more than 130 A/m$^2$, more preferably not less than 85 A/m$^2$ and not more than 115 A/m$^2$.

Organic EL device 15 is a self-luminescent device. When light of luminescence becomes incident on a transistor serving as a switching device, a photoconductor phenomenon occurs. The photoconductor phenomenon is a phenomenon that leakage at a switching device, such as a transistor, in an off state (off-leak) increases due to optical excitation.

To deal with this problem, the present invention forms a light-shielding film underlying gate driver 12 (source driver 14 in some cases) and pixel transistors 11. The light-shielding film comprises a metal thin film such as chromium and has a thickness not less than 50 nm and not more than 150 nm. If the film thickness is too small, the film has a poor light-shielding effect. On the other hand, if the film thickness is too large, unevenness occurs, which makes the patterning of overlying transistors 11a difficult.

A planarization film having a thickness not less than 20 nm and not more than 100 nm, which comprises an inorganic material, is formed over the light-shielding film. One electrode of storage capacitor 19 may be formed using the layer of this light-shielding film. In this case the planarization film is preferably made as thin as possible so that the storage capacitor has a larger capacitance. Alternatively, it is possible that the light-shielding film is formed from aluminum and a silicon oxide film is formed over the surface of the light-shielding film by utilizing the anodic oxidation technique for use as a dielectric film of storage capacitor 19. On the planarization film are formed pixel electrodes of a high aperture (HA) structure.

The driver circuit 12 and the like should inhibit penetration of light not only from the reverse side but also from the obverse side. This is because malfunction of such a circuit is caused by the influence of the photoconductor phenomenon. For this reason, in the present invention, when the cathode comprises a metal film, the drivers 12 and the like are formed with such a cathode electrode covering the surface thereof to serve as the light-shielding film.

However, the formation of such a cathode over the drivers 12 possibly causes a malfunction of the drivers due to an electric field produced from the cathode or an electric contact between the cathode and the driver circuit. To deal with this problem, the present invention forms at least one organic EL film layer, preferably a plurality of organic EL film layers over the driver circuits 12 and the like at the same time with the formation of the organic EL film over pixel electrodes.

Since such an organic EL film is basically an insulator, the formation of the organic EL film over the drivers isolates the drivers from the cathode, thus overcoming the aforementioned problem.

When shortcircuiting occurs between terminals of one or more transistors 11 or between a signal line and a transistor 11, EL device 15 associated therewith lights constantly and such a pixel may become a luminescent spot. Since this luminescent spot is visually prominent, the luminescent spot needs to be turned into a black spot (or turned into the non-lighting state.) The pixel 16 constituting such a luminescent spot is detected and then the capacitor 19 of the pixel 16 is irradiated with laser light so that the terminals thereof are shortcircuited. By so doing, the capacitor 19 becomes incapable of holding charge and, hence, the transistor 11a cannot allow current to pass therethrough any more.

It is desirable that the cathode film situated in a region to be irradiated with laser light be removed in advance in order to prevent a terminal electrode of the capacitor 19 from shortcircuiting with the cathode film.

Figure 56:
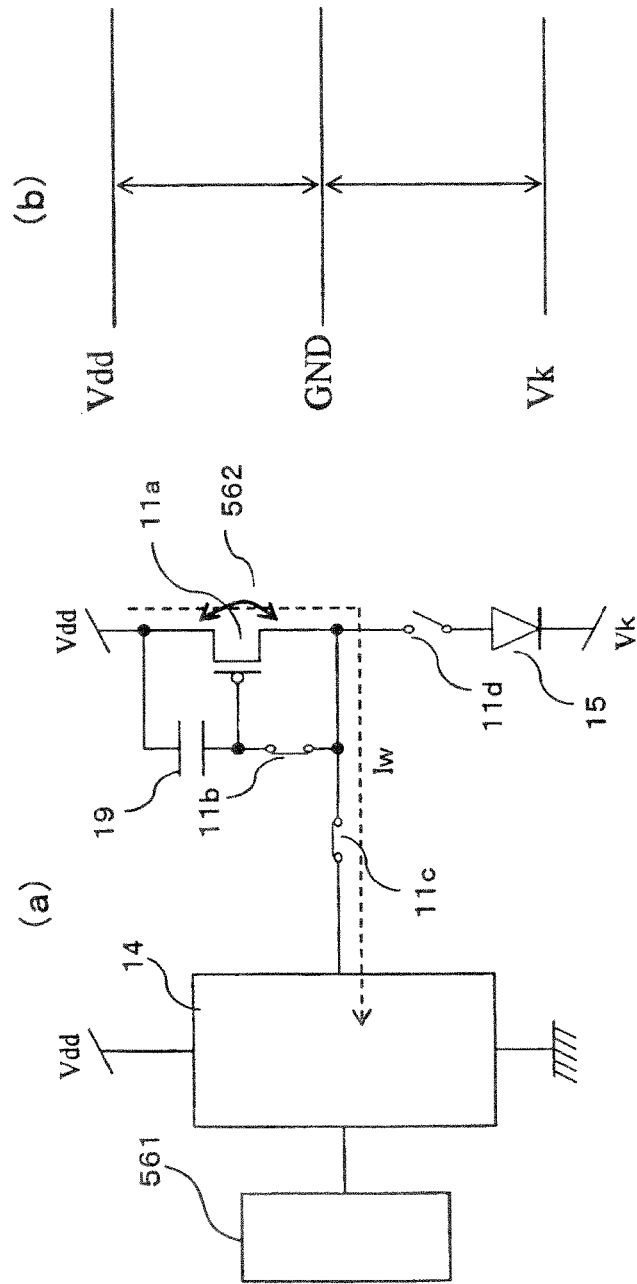
FIG. 56 is an explanatory diagram illustrating a method of driving an EL display apparatus according to the present invention.

A defect of transistor 11 of pixel 16 affects the driver circuit 14 or the like. For example, when a source-drain (SD) shortcircuit 562 occurs at driving transistor 11a as shown in FIG. 56, the source driver 14 is applied with Vdd voltage of the panel. For this reason, the supply voltage of the source driver 14 is preferably set equal to or higher than the supply voltage Vdd of the panel. It is preferable to employ an arrangement capable of controlling the reference current to be used in the source driver 14 by means of an electron volume 561.

When SD shorcircuit 562 occurs at transistor 11a, an excessive current passes through EL device 15. This causes the EL device 15 to light constantly (to become a luminescent spot). Such a luminescent spot is visually prominent as a defect. In FIG. 56 for example, when a source-drain (SD) shortcircuit occurs at transistor 11a, current from the Vdd voltage keeps on passing through the EL device 15 (while the transistor 11d is on.) Accordingly, the EL device 15 becomes a luminescent spot.

Further, such a SD shorcircuit at the transistor 11a causes the Vdd voltage to be applied to source signal line 14, hence, to the source driver 14 while the transistor 11c is on. If the supply voltage of the source driver 14 is lower than Vdd, the source driver 14 might be broken down due to a voltage exceeding the withstand voltage. For this reason, the supply voltage of the source driver 14 is preferably set equal to or higher than the Vdd voltage (which is the higher voltage applied to the panel.)

The SD shortcircuit or a like defect at transistor 11a may result in the breakdown of the source driver of the panel as well as a spot defect. A luminescent spot, which is visually prominent, makes the panel faulty. For this reason, it is necessary to turn such a luminescent spot into a black defect by cutting off the wiring interconnecting transistor 11a and EL device 15. Optical means such as laser light may be used to cut off the wiring.

Though wiring is cut off in the above embodiment, the means for changing a luminescent spot into a black display spot is not limited thereto. As can be understood from FIG. 1 for example, a modification may be made so that the supply voltage Vdd for transistor 11a is constantly applied to the gate (G) terminal of the transistor 11a. For example, if the opposite terminals of the capacitor 19 are short-circuited, the Vdd voltage is applied to the gate (G) terminal of transistor 11a. Accordingly, the transistor 11a is kept in complete off-state and hence does not allow current to pass through the ET, device 15 any more. This can be easily realized through laser irradiation of capacitor 19, which can shortcircuit the capacitor electrodes.

Further, since the Vdd wiring actually underlies the pixel electrode, the display condition of the pixel can be controlled (or modified) through irradiation of the Vdd wiring and the pixel electrode with laser light.

Additionally, turning a luminescent spot into a black defect can also be realized by making open the channel between the source and the drain of the transistor 11a. Briefly, the transistor 11a is irradiated with laser light to make the channel thereof open. Similarly, the channel of the transistor 11d may be opened. When the channel of the transistor 11b is opened, the associated pixel 16 cannot be selected and hence becomes a black display.

In order to turn pixel 16 into a black display, the EL device 15 may be deteriorated. For example, laser light is applied to the EL layer 15 to deteriorate the EL layer physically or chemically, thereby making the EL layer 15 incapable of luminescence (constant black display.) Irradiation with laser light can heat the EL layer 15 thereby deteriorating it easily. Use of an excimer laser can cause a chemical change of the EL layer 15 to take place easily.

Figure 51:
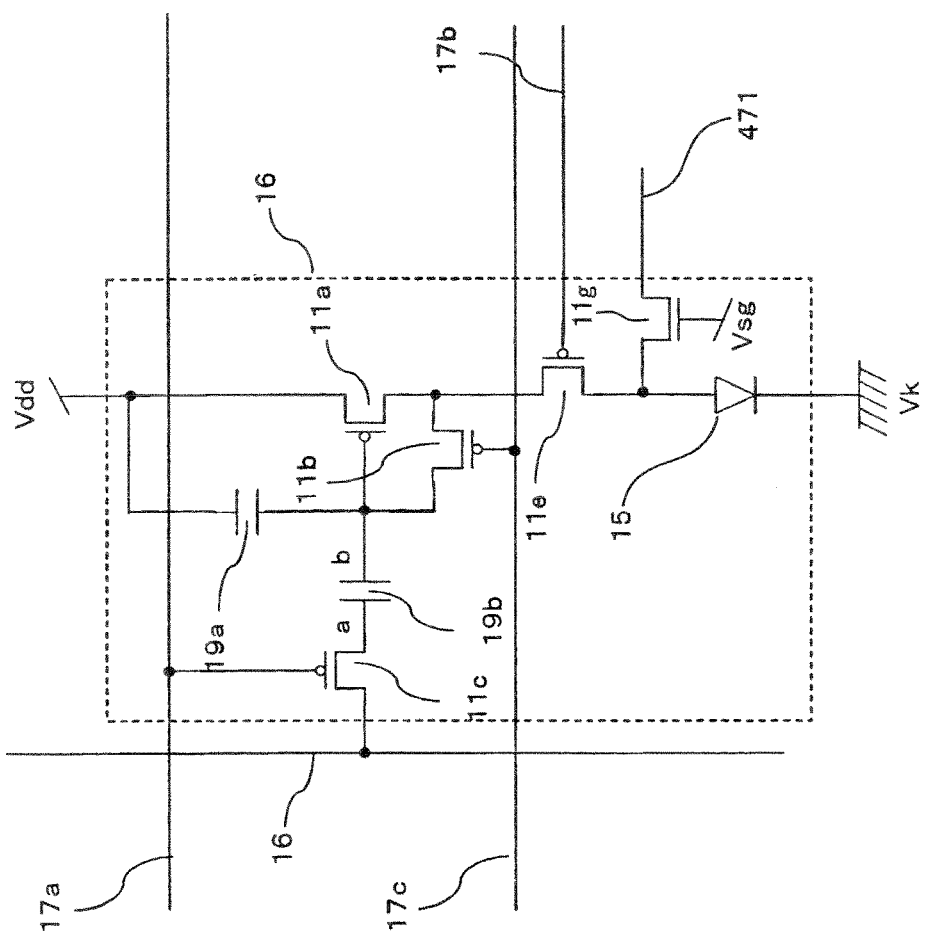
FIG. 51 is a diagram illustrating a pixel of an EL display panel according to the present invention.

While the pixel configuration shown in FIG. 1 is exemplified in the above-described embodiment, the present invention is not limited thereto. It is needless to say that the art of making wiring or electrodes open or shortcircuited by the use of laser light is applicable to other current-driven pixel configurations such as a current mirror circuit configuration and voltage-driven pixel configurations as shown in FIG. 62 or 51 or the like.

A method of driving the pixel configuration shown in FIG. 1 will be described below. As shown in FIG. 1, gate signal line 17a assumes a conducting state during a row selecting period, while gate signal line 17b assumes a conducting state during an unselecting period. (Here, application of a low-level voltage causes gate signal line 17 to assume the conducting state since the transistors 11 in FIG. 1 are p-channel transistors.)

Parasitic capacitance (not shown) is present in source signal line 18. Such parasitic capacitance is produced due to a capacitance at each of the intersections of source signal line 18 and gate signal lines 17, a channel capacitance at each of transistors 11b and 11c, or the like.

Time t required for the value of current at source signal line 18 to vary is found from the equation: $t = C \cdot V/I$, where C represents the value of parasitic capacitance, V represents a voltage applied to source signal line 18 and I represents a current passing through source signal line 18. Accordingly, the time t required for the value of current to vary can be shortened to nearly $1/10$ by increasing current to a 10-fold value. The equation also indicates that even when the parasitic capacitance in source signal line 18 increases to a 10-fold value, the value of current can be varied to a predetermined value. Therefore, increasing the value of current is effective in writing a predetermined current value within a short horizontal scanning period.

In order to charge/discharge the parasitic capacitance of source signal line 18, a current having value I satisfying the formula: I>(C·V)/t should be passed through source signal line 18.

If the input current is increased 10 times, the output current is also increased 10 times. In this case the luminance of the EL device is also raised 10 times, which means that a predetermined luminance cannot be obtained. In this respect, the present invention realizes the predetermined luminance by providing settings such that the conducting period of transistor 17*d* in FIG. 1 is set to ¹/₁₀ of the conventional conducting period and the light-emitting period of EL device 15 set to ¹/₁₀ of the conventional light-emitting period.

That is, in order to program transistor 11*a* of pixel 16 with a predetermined current value after sufficient charge/discharge of the parasitic capacitance of source signal line 18, source driver 14 needs to output a relatively high current. However, when such a high current is passed through source signal line 18, the pixel is programmed with the value of this current undesirably, with the result that the EL device 15 is fed with a higher current than the predetermined current. For example, if programming is made with a 10-fold current, naturally a 10-fold current passes through EL device 15, thus causing the EL device 15 to emit light at a 10-fold luminance. To obtain the predetermined luminance of emission, the time period for which the ET, device 15 is fed with the current should be shortened to ¹/₁₀. Such a driving method is capable of sufficiently charging/discharging the parasitic capacitance of source signal line 18 and obtaining the predetermined luminance of emission.

The above-described feature that a 10-fold current value is written to transistor 11*a* of a pixel (more exactly, the terminal voltage of capacitor 19 is set to a predetermined value) and the on-time of EL device 15 is shortened to ¹/₁₀, is an mere example. In some cases it is possible that a 10-fold current value is written to transistor 11*a* of a pixel and the on-time of EL device 15 is shortened to ⅕. Alternatively, as the case may be, it is possible that a 10-fold current value is written to transistor 11*a* of a pixel and the on-time of EL device 15 is shortened to ½.

The present invention is characterized by a driving method in which a current to be written to a pixel is set to have a value different from the predetermined value while EL device 15 is fed with a current intermittently. For easy explanation, the driving method is herein described as having a feature that a current N times as high as the predetermined current is written to transistor 11 of a pixel while the on-time of EL device 15 is set 1/N times the predetermined time period. However, the present invention is not limited to this feature. It is needless to say that it is possible that an N fold current is written to transistor 11 of a pixel while the on-time of EL device 15 is 1/N2 times as large as the predetermined time period, (where N and N2 are different from each other.)

The "predetermined current", as used herein, means a current required to realize a gray scale display corresponding to an image signal. The predetermined current has a current value varying depending on the specifications of the EL display apparatus. For example, the current value ranges from about 0.25 µA to about 0.75 µA when a luminance of 150 nt is to be realized. Therefore, if N=4, a current value of from about 1 µA to about 3 µA is to be written to transistor 11. Similarly, if N=8, the current value to be written ranges from about 2 µA to about 6 µA. If N=2, the current value to be written ranges from about 0.5 µA to about 1.5 µA.

The intervals at which the intermittent passage of current is performed are not limited to equal intervals. For example, random intervals are possible (provided the display period or the non-display period, as a whole, has a predetermined value (fixed ratio).) The intervals may differ depending on R, G and B. That is, each of R, G and B display periods or non-display periods should be adjusted to a predetermined value (fixed ratio) so as to optimize the white balance.

For easy explanation, the on-time is described to be 1/N of 1F (one field or one frame period), 1F being used as a reference. However, a time period required for selection of one pixel row and programming with a current value (which is usually one horizontal scanning period) should be taken into account. In addition, errors may occur depending on the scanning conditions. Thus, the above description is merely provided for convenience in making the explanation easy and there is no limitation thereto.

For example, it is possible that pixel 16 is programmed with a 10-fold current (N=10) and EL device is caused to light for a ⅕ period. In this case EL device 15 lights at a two-fold luminance (10/5=2). Alternatively, it is possible that pixel 16 is programmed with a two-fold current (N=2) and EL device 15 is caused to light for a ¼ period. In this case EL device 15 lights at a 0.5-fold luminance (2/4=0.5). That is, according to the present invention, a pixel is programmed with an N-fold current (N is not equal to 1) and a display which is not in a constant lighting state (i.e. 1/1, which does not means intermittent driving) is realized. In a wider sense, the present invention provides a driving method which includes cutting off feeding of current to EL device 15 at least once in a one-frame (or one-field) period. The present invention also provides a driving method which includes programming pixel 16 with a current higher than the predetermined value while performing intermittent display necessarily.

Organic (or inorganic) EL display apparatus involve a problem essential to their display method which is basically different from the display method applied to such display apparatus as a CRT adapted to display an image as an aggregate of line displays provided by means of an electron gun. Since such an EL display apparatus is configured to hold a current (or a voltage) written to a pixel for a one-F (one-field or one-frame) period. This configuration gives rise to a problem of a blurred outline of an image if it is displayed in a motion picture display state.

According to the present invention, EL device 15 is fed with a current for only a 1F/N period of a one-frame period and is not fed with a current for the rest of the frame period (1F(N−1)/N). Consideration is given to the case where one spot of the screen driven according to this driving method is observed. In this display state, a display based on image data and a black display (non-lighting state) alternate with each other on a 1F basis. That is, such a display based on image data appears at time intervals (intermittent display). When a display based on motion picture data is realized by such intermittent display driving, the image has no blurred outline, which means that a display of high quality is realized. Thus, the intermittent display method can realize a motion picture display close to that realized by a CRT. Further, since the main clock used in the circuit is a conventional one in spite of intermittent display, no increase occurs in the power consumption of the circuit.

In the case of a liquid crystal display panel, image data (voltage) based on which light modulation is performed is held in the liquid crystal layer. Therefore, data applied to the liquid crystal layer needs to be rewritten in order to insert a black display. For this reason, it is required that the value of the clock for operating source driver 14 be made higher while source signal line 18 applied with image data and black display data alternately. Accordingly, the value of the main clock of the circuit needs to be raised in order to realize insertion of black (intermittent display of a black display or the like.) In addition, image memory for extending the time axis is also needed.

In a pixel configuration of the EL display panel of the present invention as shown in FIG. 1, 2 or 38 or the like, image data is held in the capacitor 19. A current corresponding to the terminal voltage of this capacitor 19 is passed through EL device 15. Thus, image data is not held in a light modulation layer as in the liquid crystal display panel.

According to the present invention, the current to be passed through EL device 15 is controlled by merely turning on/off switching transistor 11d or 11e or the like. That is, even when the current Iw passing through EL device 15 is cut off, image data is held as it is in the capacitor 19. Therefore, when the switching device 11d or the like is turned off at the next timing to feed EL device 15 with a current, this current has a current value equal to that of the current passed just before. The present invention does not need to raise the main clock of the circuit even when insertion of black (intermittent display of a black display or the like) is to be made. Nor does the present invention need to extend the time axis and, hence, image memory therefor is not needed either. Organic EL device 15 requires a shortened time for the device 15 to emit light from the time when it is fed with current and hence is responsive at a high speed. For this reason, the present invention is suitable for motion picture display and is capable of solving the motion picture display problem which is essential to display panels of the conventional data holding type (liquid crystal display panel, EL display panel, and the like) by intermittent display.

In the case of a large-sized display apparatus having an increased source capacitance, the source current should be increased 10 times or more. Generally, when the source current value is increased N times, it is sufficient to set the conducting period for gate signal line 17b (transistor 11d) to 1F/N. By so doing, the present invention is applicable to television sets, monitoring display apparatus, and the like.

The driving method according to the present invention will be described more specifically with reference to the drawings. The parasitic capacitance of source signal line 18 is produced due to the coupling capacitance between adjacent source signal lines 18, the capacitance of the buffer output of source driver IC (circuit), the capacitance at a crossing point between gate signal line 17 and source signal line 18, and the like. Such a parasitic capacitance is usually 10 pF or more. In the case of voltage-based driving, driver IC 14 applies a voltage to source signal line 18 with a low impedance and, hence, some increase in the parasitic capacitance does not raise any driving problem.

However, in the case of current-based driving, image display of a black level, in particular, requires programming of capacitor 19 of a pixel with a faint current of 20 nA or lower. For this reason, when the parasitic capacitance takes place as having a value more than a predetermined value, the parasitic capacitance cannot be charged/discharged within the time required for one pixel row to be programmed. (The time required is usually a 1H period or shorter but is not limited thereto since two pixel rows may be programmed at a time.) If charge/discharge is impossible within a 1H period, writing to a pixel is insufficient and, hence, display with a desired resolution cannot be realized.

In the case of the pixel configuration shown in FIG. 1, a programming current Iw passes through source signal line 18 during current-based programming as shown in FIG. 3(a). The current Iw is passed through transistor 11a to set (program) a voltage of capacitor 19 so that the voltage for causing the current Iw to pass is held. At this time transistor 11d is in an open state (off state).

In turn, transistors 11c and 11b are turned off and transistor 11d operates in the period for feeding EL device 15 with a current as shown in FIG. 3(b). Specifically, off-voltage (Vgh) is applied to gate signal line 17a to turn transistors 11b and 11c off. On the other hand, on-voltage (Vgl) is applied to gate signal line 17b to turn transistor 11d off.

Figure 12:
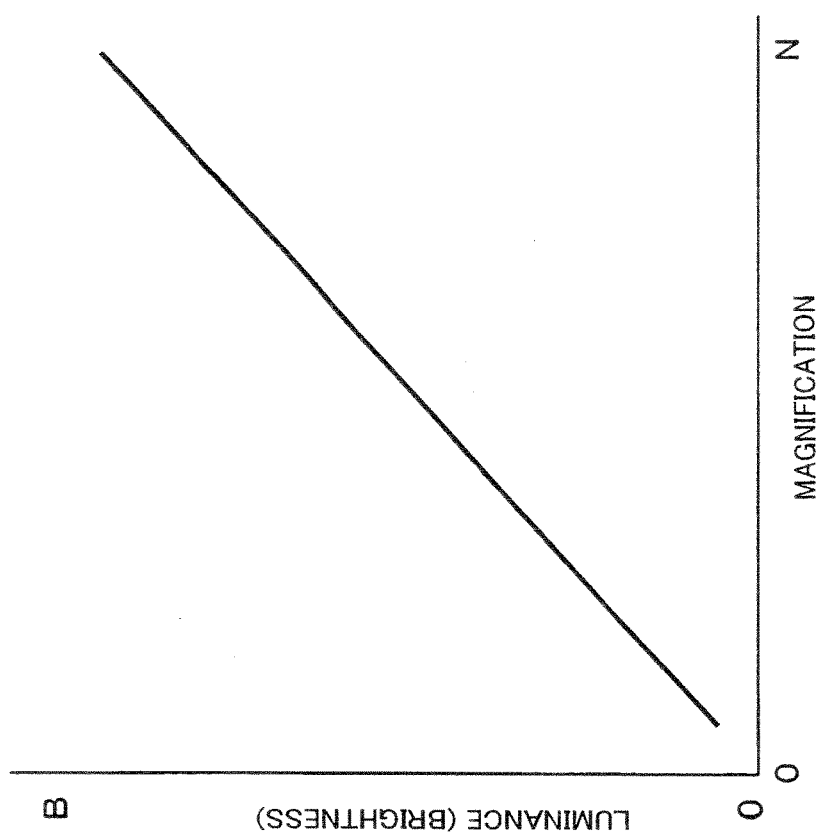
FIG. 12 is an explanatory chart illustrating an EL display panel according to the present invention.

Now, assuming that the current Iw is 10 times as high as a current (of a predetermined value) to be passed conventionally, a current passing through EL device 15 in FIG. 3(b) is also 10 times as high as the predetermined value. Accordingly, EL device 15 emits light at a luminance 10 times as high as a predetermined value. That is, the display luminance B of the display panel becomes higher with increasing magnification N, as shown in FIG. 12. Therefore, the luminance and the magnification are proportional to each other. With 1/N driving, on the other hand, the luminance and the magnification are inverse proportion to each other.

If transistor 11d is caused to assume on-state for only 1/N of the time period for which transistor 11 assumes on-state conventionally and to assume off state for the rest ((N−1)/N) of the time period, the mean luminance throughout 1F becomes a predetermined luminance. This display state is close to a display state of a screen scanned with an electron gun in a CRT. The difference therebetween resides in that the region displaying an image or the lighting region is 1/N of the whole screen (which is equal to 1.) (The lighting region in the CRT corresponds to one pixel row (one pixel in a strict sense).)

In the present invention, 1F/N image display region 53 shifts from the upper side to the lower side of screen 50, as shown in FIG. 13(b). EL device 15 is fed with current for only a 1F/N period and is not fed with current for the rest (1F·(N−1)/N) of the period. Therefore, each pixel displays intermittently. However, the image is seen to be retained at human eyes through afterimage and, hence, the whole screen is seen to display uniformly.

Figure 13:
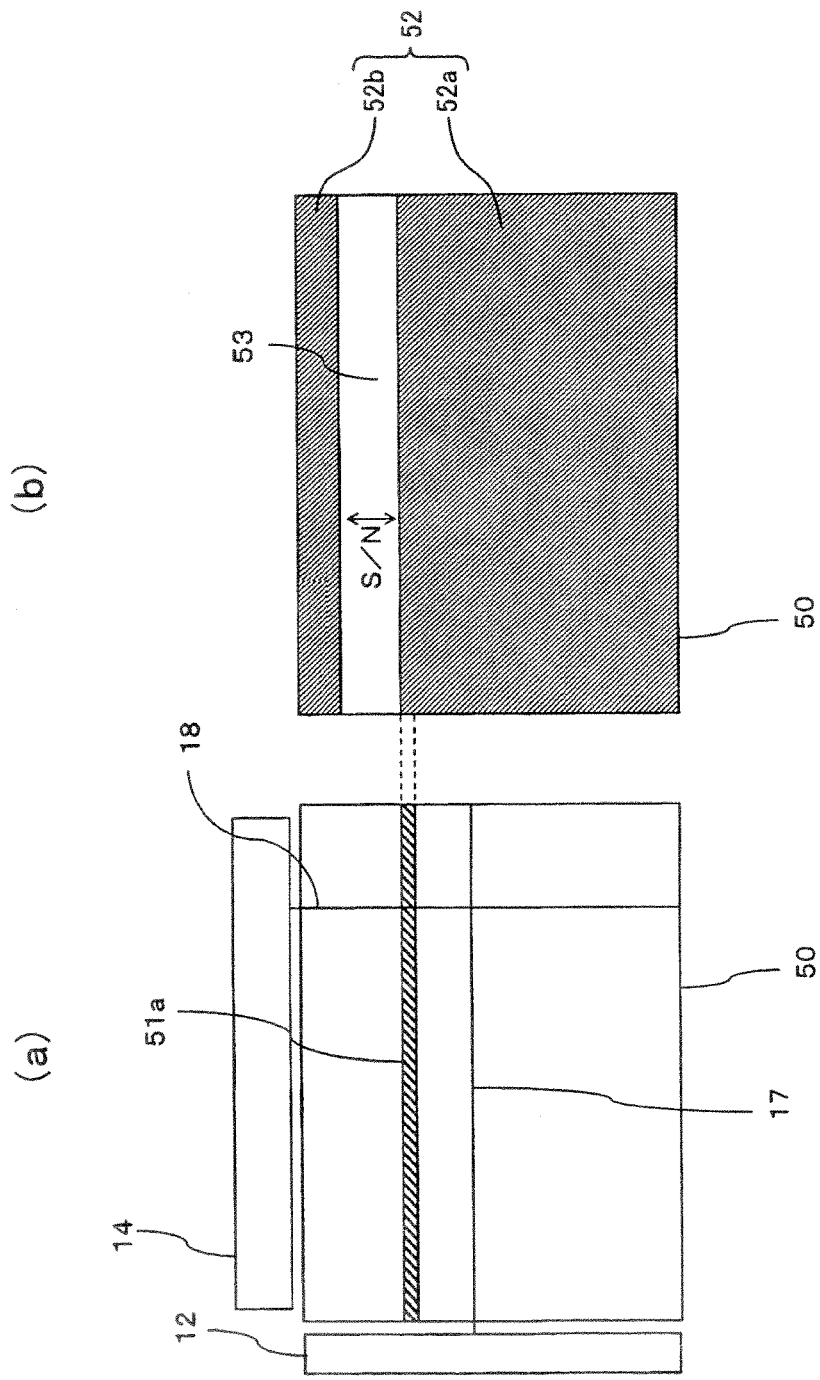
FIG. 13 is an explanatory view illustrating a method of driving an EL display apparatus according to the present invention.

It should be noted that written pixel row 51a forms a non-lighting display 52a, as shown in FIG. 13. However, this occurs in the pixel configurations shown in FIGS. 1 and 2. Such a written pixel row 51a may assume a lighting state in the current mirror pixel configuration shown in FIG. 38 or the like. In the present description, however, the pixel configuration shown in FIG. 1 is mainly exemplified for easy explanation. The method illustrated in FIG. 13 or 16 or the like, which includes programming with a current higher than the predetermined driving current Iw and intermittent driving, will be referred to as an N-fold pulse driving method.

In this display state, a display based on image data and a black display (non-lighting state) alternate with each on a 1F basis. That is, such a display based on image data appears at time intervals (intermittent display). Since liquid crystal display panels (and EL display panels other than the EL display panels of the present invention) are configured to hold data at pixels for a 1F period, an image on a motion picture display cannot keep up with image data changing, resulting in blurred motion picture (blurred image outline). According to the present invention, however, an image is displayed intermittently and, hence, satisfactory display state with no blurred outline can be realized. Thus, the intermittent display method can realize a motion picture display close to that realized by a CRT.

Figure 14:
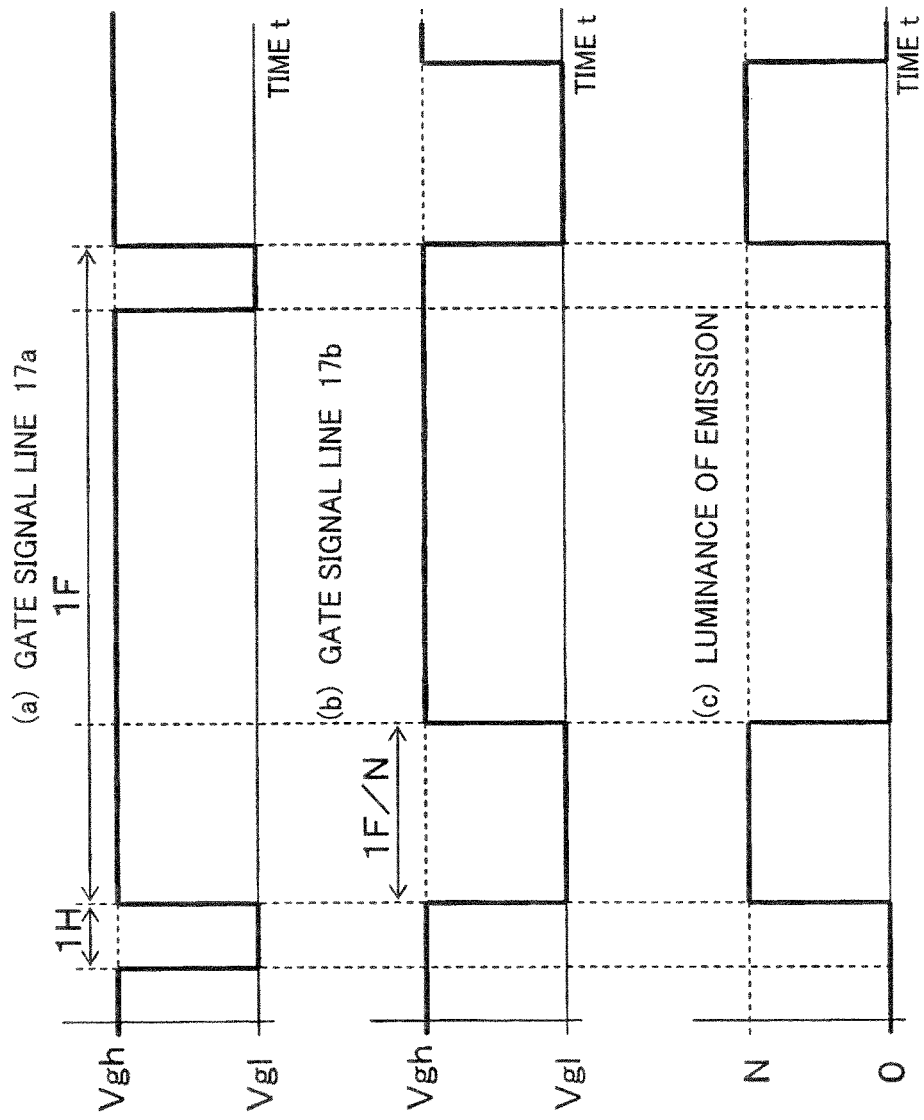
FIG. 14 is an explanatory chart illustrating a method of driving an EL display apparatus according to the present invention.

The timing chart of such intermittent display is shown in FIG. 14. The pixel configuration shown in FIG. 1 is exemplified in the present invention unless otherwise particularly specified. As seen from FIG. 14, in each selected pixel row (selecting period is 1H), gate signal line 17b is under application of off-voltage (Vgh) (see FIG. 14(b)) while gate signal line 17a is being applied with on-voltage (Vgl) (see FIG. 14(a).) During this period, EL device 15 is not fed with current (in a non-lighting state). In an unselected pixel row, on the other hand, gate signal line 17a is under application of off-voltage (Vgh) and gate signal line 17b is under application of on-voltage (Vgl). During this period, EL device 15 is fed with current (in a lighting state). In the lighting state, EL device lights at a luminance N times as high as a predetermined value (N·B) for a time period of 1F/N. Thus, a means display luminance of the display panel throughout a 1F period can be found from the equation: (N·B)×(1/N)=B (predetermined luminance).

Figure 15:
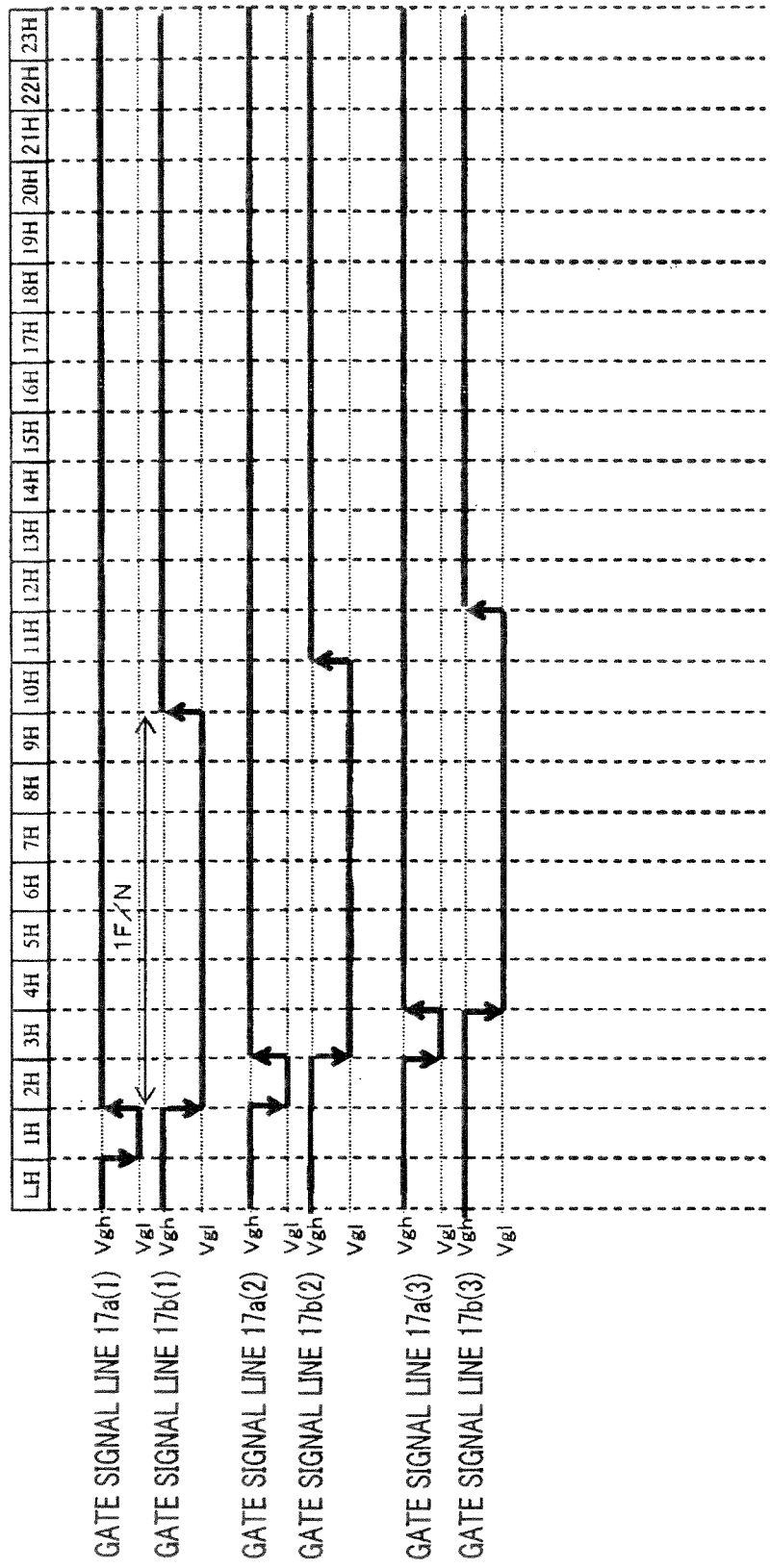
FIG. 15 is an explanatory chart illustrating a method of driving an EL display apparatus according to the present invention.

FIG. 15 illustrates an embodiment in which the operation illustrated in FIG. 14 is applied to pixel rows. Specifically, voltage waveforms to be applied to respective gate signal lines 17 are shown. Each voltage waveform comprises off-voltage Vgh (H level) and on-voltage Vgl (L level). Additional numerals such as (1) and (2) indicate the row numbers of selected pixel rows.

In FIG. 15, when gate signal line 17a(1) is selected (at voltage Vgl), a programming current is passed through source signal line 18 from transistor 11a of the selected pixel row toward source driver 14. This programming current is N times as high as a predetermined value. (Description is made with N=10 for easy explanation. Since the predetermined value is the value of a data current causing an image to be displayed, the predetermined value is not a fixed value unless white raster display is given.) Accordingly, capacitor 19 is programmed so that a 10-fold current will pass through transistor 11a. When pixel row (1) is in the selected state, gate signal line 17b(1) of the pixel configuration of FIG. 1 is under application of off-voltage (Vgl), thus preventing current from passing through EL device 15.

After lapse of 1H, gate signal line 17a(2) is selected (at voltage Vgl) and a programming current is passed through source signal line 18 from transistor 11a of the selected pixel row toward source driver 14. This programming current is N times as high as a predetermined value. (Description is made with N=10 for easy explanation.) Accordingly, capacitor 19 is programmed so that a 10-fold current will pass through transistor 11a. When pixel row (2) is in the selected state, gate signal line 17b(2) of the pixel configuration of FIG. 1 is under application of off-voltage (Vgl), thus preventing current from passing through EL device 15. On the other hand, the preceding pixel row (1) assumes a lighting state because gate signal line 17a(1) and gate signal line 17b(1) of pixel row (1) are applied with off-voltage (Vgh) and on-voltage (Vgl), respectively.

After lapse of another 1H, gate signal line 17a(3) is selected and gate signal line 17b(3) is applied with off-voltage (Vgh) to prevent current from passing through EL device 15 of pixel row (3). On the other hand, the preceding pixel rows (1) and (2) assume the lighting state because gate signal lines 17a(1) and 17a(2) thereof are applied with off-voltage (Vgl) and gate signal lines 17b(1) and 17b(2) thereof are applied with on-voltage (Vgl).

The above-described operation is synchronized with a 1H synchronizing signal. With the driving method of FIG. 15, however, a 10-fold current passes through El device 15 and, accordingly, display screen 50 displays an image at a luminance having about a 10-fold value. Of course, it is needless to say that the programming current should be decreased to 1/10 in order to realize a display at the predetermined luminance. With such a 1/10 current, however, insufficient writing occurs due to parasitic capacitance and the like. The basic concept of the present invention is that programming is made with a high current to avoid such insufficient writing while black display 52 is inserted to obtain the predetermined luminance.

An important feature of the driving method of the present invention resides in that a current higher than the predetermined current is caused to pass through EL device 15 thereby sufficiently charging/discharging the parasitic capacitance of source signal line 18. Therefore, EL device 15 need not necessarily be fed with a current N times as high as the predetermined current. For example, a configuration may be employed such that a current path is formed in parallel with EL device 15 (specifically, a dummy EL device is formed which has been subjected to such processing as to prevent the dummy EL device from emitting light, for example, formation of a light-shielding film thereover) and a current is dividedly fed to the dummy EL device and EL device 15. When the signal current is 0.2 pA for example, the programming current adjusted to 2.2 pA is passed through transistor 11a. Of this current, the signal current of 0.2 µA is fed to EL device 15 while the remaining current of 2.0 pA fed to the dummy EL device. Such a driving method is exemplified. That is, dummy pixel row 281 shown in FIG. 27 is made constantly selected. The dummy pixel row is made to fail to emit light or formed with a light-shielding film to prevent emission of light from being recognized visually.

With such an arrangement, programming can be made so that a current N times as high as the predetermined current will pass through driving transistor 11a by increasing the current to pass through source signal line 18 N times, while at the same time a current sufficiently lower than the N-fold current can be passed through EL device 15. The above-described method does not need to provide non-lighting region 52 shown in FIG. 5 and hence can allow the whole display region 50 to be used as image display region 53.

FIG. 13(a) illustrates a written state of display screen 50. Reference character 51a used in FIG. 13(a) designates a written pixel row. Source driver 14 feeds the programming current to each source signal line 18. In FIG. 3 or the like, writing is made to a single pixel row in a 1H period. However, there is no particular limitation to 1H but it is possible to employ a 0.5H period or a 2H period. Though the programming current is written to source signal line 18 according to the above description, the present invention is not limited to such a current-based programming method but may employ a voltage-based programming method (illustrated in FIG. 62 or the like) in which source signal line 18 is written with a voltage.

In FIG. 13(a), when gate signal line 17a is selected, transistor 11a is programmed with a current passing through source signal line 18. At that time, gate signal line 17b is applied with off-voltage and, as a result, EL device 15 is not fed with a current. This is because when transistor 11d is in on-state, a capacitance component of EL device 15 is seen from source signal line 18 and capacitor 19 cannot sufficiently accurately be programmed with current because of the influence of the capacitance. Accordingly, in the configuration of FIG. 1 for example, a pixel row written with current forms non-lighting region 52, as shown in 13(b).

If programming is made with an N-fold current (here, N=10 as described earlier), the luminance of the screen is increased 10 times. Therefore, non-lighting region 52 should cover 90% of display region 50. Specifically, if an image display region has 220 horizontal scanning lines (S=220) in Quarter Common Intermediate Format (QCIF), 22 lines should form display region 53, with the rest (220−22=198) forming non-display region 52. Generally speaking, if the number of horizontal scanning lines (the number of pixel rows) is S, an S/N region is used as display region 53 which is caused to emit light at an N-fold luminance. This display region 53 is scanned vertically of the screen. Thus, the remaining S(N−1)/N region is used as non-lighting region 52. This non-lighting region forms a black display (luminescenceless region.) Such a luminescenceless region 52 is realized by turning transistor 11d off. Though the display region 53 has been described to light at an N-fold luminance, it is needless to say that the value of N can be controlled by brightness adjustment or gamma adjustment, as a matter of course.

In the above-described embodiment, non-lighting region 52 should cover 90% of display region 50 because if programming is made with an N-fold current, the luminance of the screen is increased 10 times. However, this feature is not limited to an arrangement where R, G and B pixels form non-lighting regions 52 in the same manner. For example, the proportion of non-display region 52 may be varied depending on R, G and B; for example, R pixel provides non-lighting region 52 covering 118 of display region 50, G pixel provides non-lighting region 52 covering ⅙ of display region 50, and B pixel provides non-lighting region 52 covering 1/10 of display region 50. Alternatively, it is possible to employ an arrangement such as to adjust non-lighting region 52 (or lighting region 53) in individual R, G and B pixels. To realize these arrangements, gate signal lines 17b for respective of R, G and B need to be provided. By making individual adjustment of R, G and B possible, it becomes possible to control white balance as well as to ease color balance adjustment at each gray level (see FIG. 41.)

As shown in FIG. 13(b), pixel rows including written pixel row 51a form non-lighting region 52, while an S/N region (which is 1F/N in terms of time) in a screen portion above written pixel row 51a forms lighting region 53. (In the case of scanning upwardly from the lower side of the screen, lighting region 53 is situated on the opposite side.) In this image display state, band-like display region 53 shifts downwardly from the upper side of the screen.

In the display shown in FIG. 13, one display region 53 shifts downwardly from the upper side of the screen. If the frame rate is low, shifting of display region 53 is visually recognized. This is likely particularly when the viewer blinks his or her eyes or moves his or her face up and down.

Figure 16:
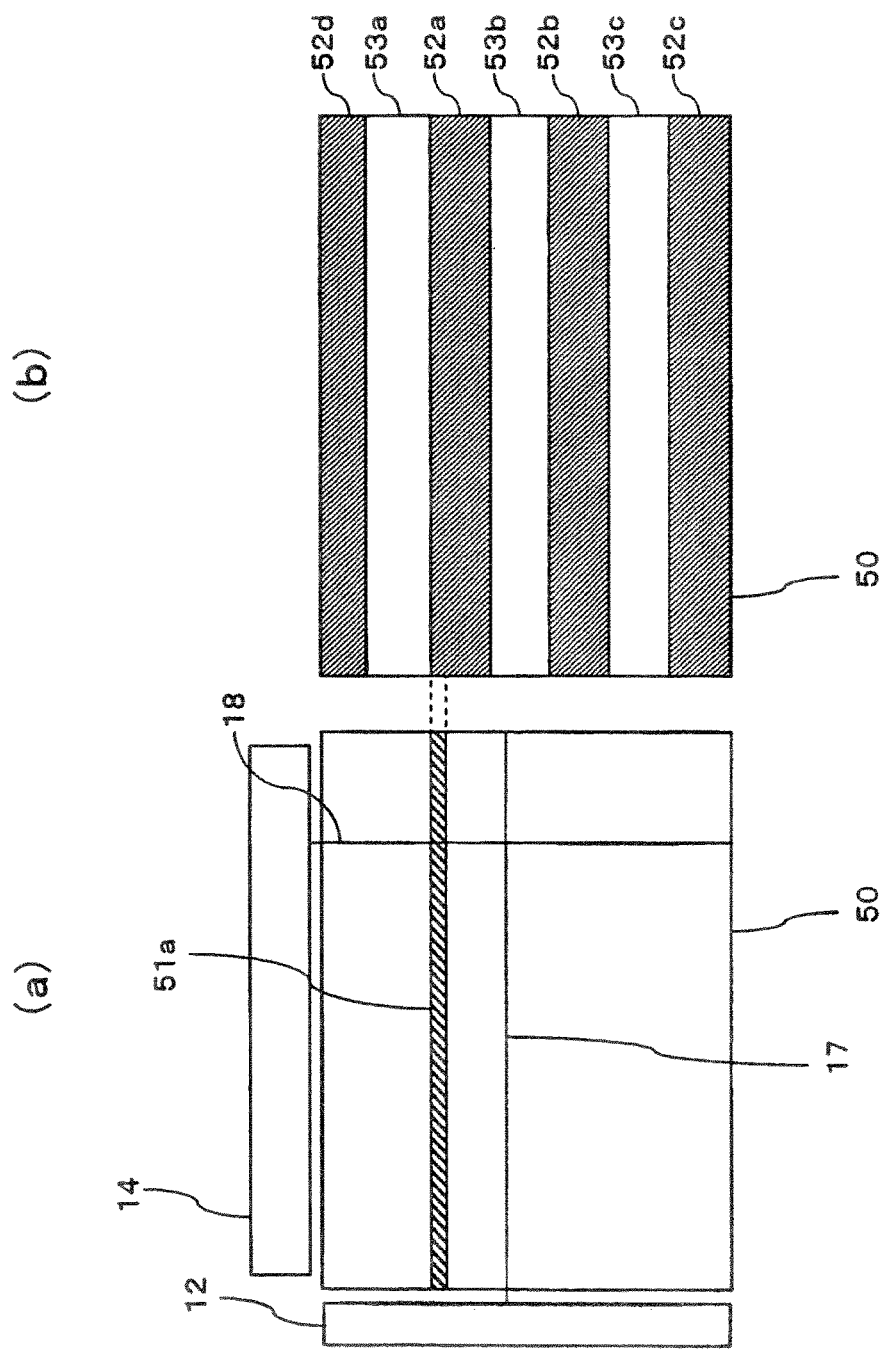
FIG. 16 is an explanatory view illustrating a method of driving an EL display apparatus according to the present invention.

To solve this problem, display region 53 should be split into plural sections as shown in FIG. 16. If the total sum of the areas of the sections is equal to the area of an S(N−1)/N region, the brightness of this display is equal to that of the display shown in FIG. 13. Display region 53 need not necessarily be split equally. Similarly, sections of non-display region 52 split need not necessarily be uniform.

By thus splitting display region 53 into plural sections, the screen provides a display with reduced flitter. Thus, favorable image display free of flicker can be realized. Display region 53 may be split into smaller sections. However, with finer splitting, the motion picture display performance lowers.

Figure 17:
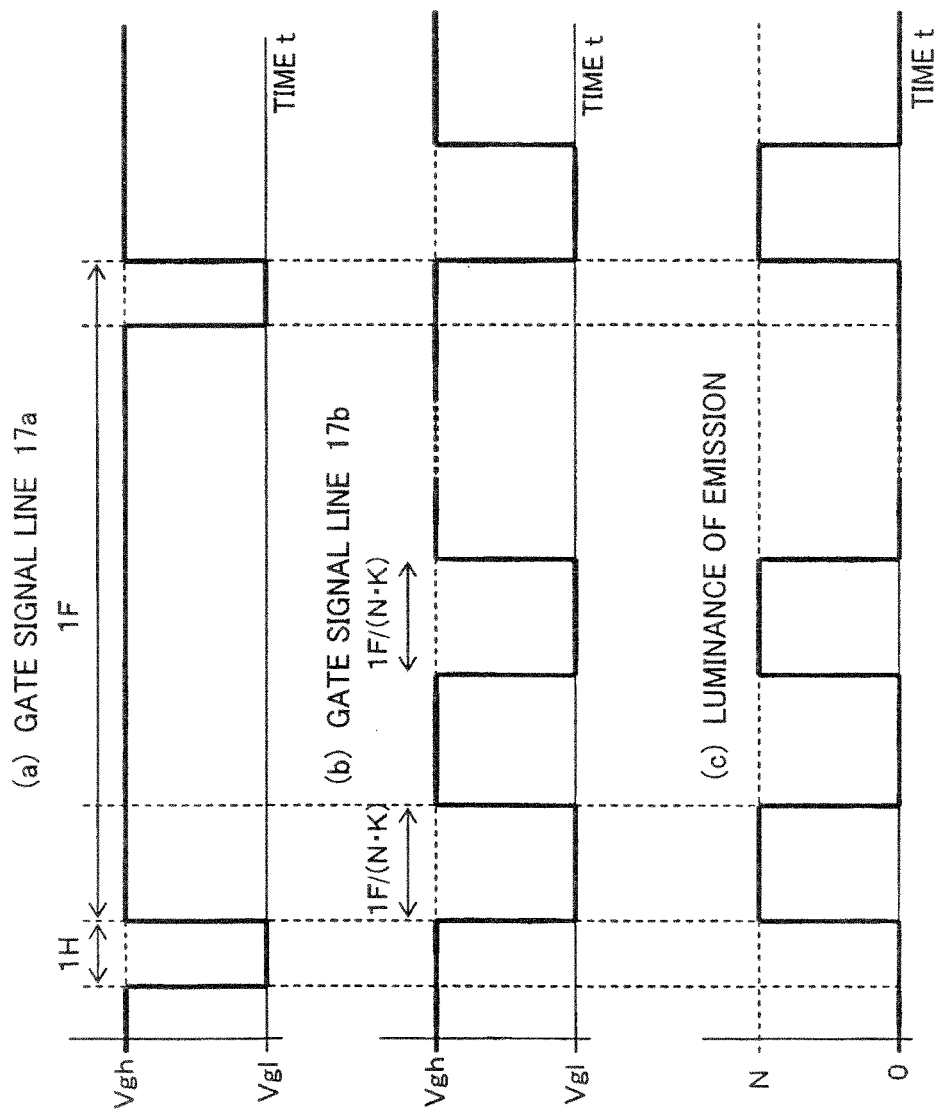
FIG. 17 is an explanatory chart illustrating a method of driving an EL display apparatus according to the present invention.

FIG. 17 shows a voltage waveform applied to each gate signal line 17 and the luminance of the EL device emitting light. As can be clearly seen from FIG. 17, the (1F/N) period for which gate signal line 17b is applied with Vgl is divided into plural subperiods (the number of subperiods is K.) That is, gate signal line 17b is applied with Vgl for a 1F/(K·N) period K times. Such a control can inhibit the occurrence of flicker and realize image display with a low frame rate. It is also preferable to employ such an arrangement as to allow the number of such image divisions to be varied. For example, an arrangement is possible such as to detect a change resulting from depressing of a brightness adjuster switch or turning of a brightness adjuster volume and then vary the value of K. Another possible arrangement allows the user to adjust the luminance. Yet another possible arrangement allows the user to vary the number of K depending on the details of or data on an image to be displayed manually or is capable of varying the number of K automatically.

While description has been made of the feature that the (1F/N) period for which gate signal line 17b is applied with Vgl is divided into plural subperiods (the number of subperiods is K) and gate signal line 17b is applied with Vgl for a 1F/(K·N) period K times, there is no limitation to this feature. Gate signal line 17b may be applied with Vgl for the 1F/(K·N) period L times (L≠K). Thus, the present invention has the feature that an image is displayed by controlling the period (time) for which EL device 15 is fed with current. Therefore, the art of repeating the 1F/(K·N) period L times (L≠K) is included in the technical concept of the present invention. The luminance of image 50 can be varied digitally by varying the value of L. For example, the difference between L=2 and L=3 corresponds to a 50% change in luminance (contrast). In splitting display region 53, the period for which gate signal line 17b is applied with Vgl is not necessarily constant.

The above-described embodiment is an embodiment in which display screen 50 is turned on/off (into lighting state/non-lighting state) by cutting of the current to be passed through EL device or passing the current through EL device. That is, the embodiment is configured to pass generally equal current through transistor 11a plural times by the charge held in capacitor 19. However, the present invention is not limited thereto. The present invention may employ such a configuration as to turn display screen 50 on/off (into lighting state/non-lighting state) by charging/discharging capacitor 19.

Figure 18:
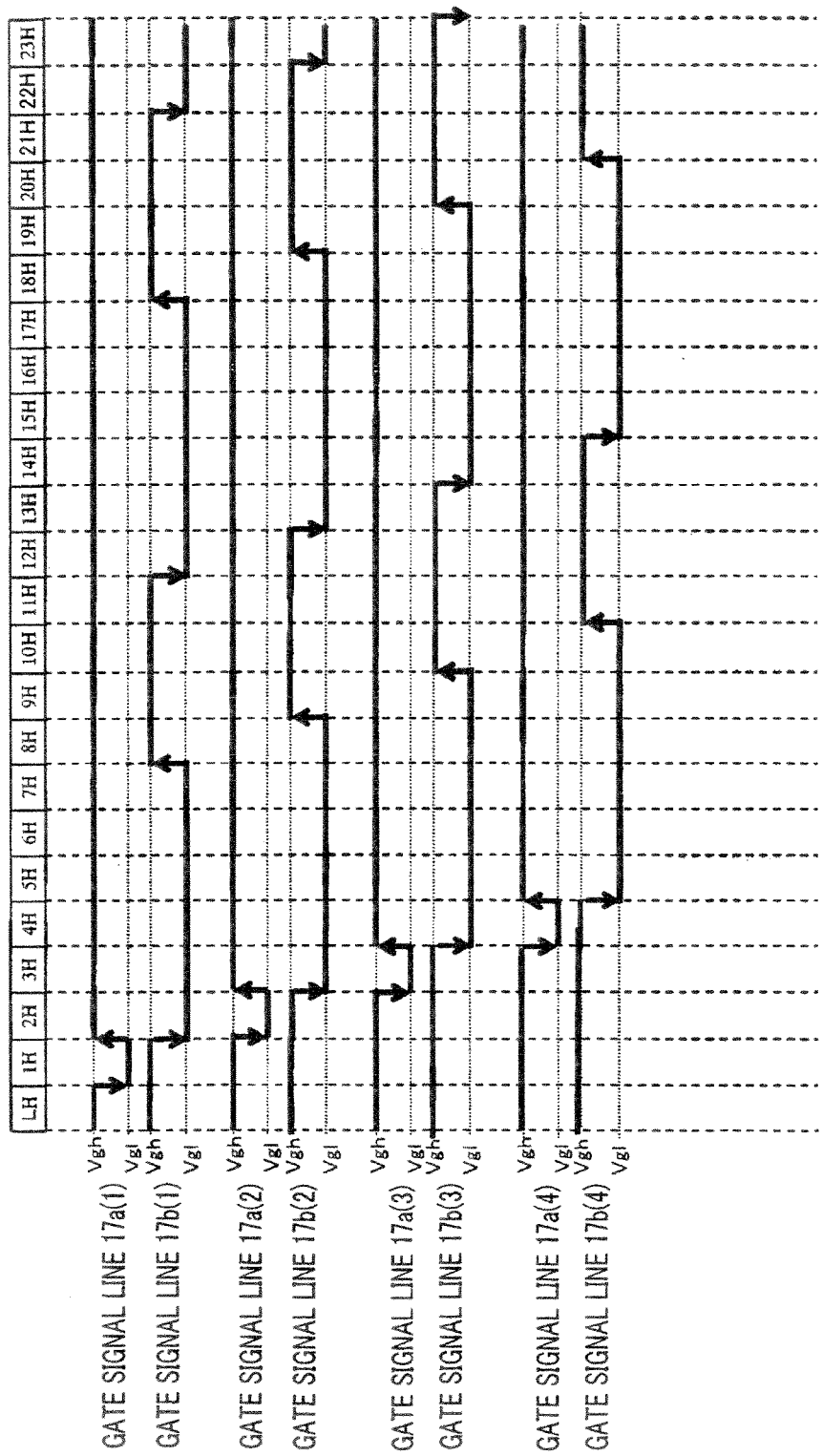
FIG. 18 is an explanatory chart illustrating a method of driving an EL display apparatus according to the present invention.

FIG. 18 shows a voltage waveform applied to each gate signal line 17 for realizing the image display state shown in FIG. 16. The difference between FIG. 18 and FIG. 15 resides in the operation of gate signal line 17b. Gate signal line 17b is turned on/off (with Vgl or Vgh) plural times, the number of times corresponding to the number of split sections of the screen. Since other features are the same as the corresponding features of FIG. 15, description thereof will be omitted.

Since the EL display apparatus assumes a completely non-lighting state to provide a black display, a drop in contrast, which is essential to intermittent display performed by a liquid crystal display panel, does not occur. With the configuration shown in FIG. 1, intermittent display can be realized by merely on-off controlling transistor 11d. With each of the configurations shown in FIGS. 38 and 51, intermittent display can be realized by merely on-off controlling transistor 11e. This is because capacitor 19 stores image data. (The number of gray levels is infinite since such stored image data is an analog value.) Specifically, each pixel 16 stores image data for a 1F period. Whether or not EL device 15 is to be fed with a current corresponding to image data stored in each pixel 16 is controlled by control over transistors 11d and 11e. Thus, the above-described driving method is applicable not only to the current-driven configuration but also to the voltage-driven configuration.

Stated otherwise, the driving method can realize intermittent driving of a configuration where each pixel is adapted to store a current to be passed through EL device 15 by turning on/off the driving transistor 11 on the current path between EL devices 15.

It is critical to maintain the terminal voltage of capacitor 19. This is because when the terminal voltage of capacitor 19 varies (i.e., capacitor 19 is charged/discharged) during a one-field (frame) period, the luminance of the screen varies, which results in flitter (flicker or the like) when the frame rate is lowered. It is required that the current to be passed through EL device 15 during a one-frame (field) period should not lower to 65% or less. The value of 65% means that assuming the first current written to pixel 16 and passed through EL device 15 is 100%, the current to be passed through EL device 15 just before writing to the pixel 16 in the next frame (or field) is set to 65% or more.

In the configuration shown in FIG. 1, the number of transistors 11 forming one pixel is not varied irrespective of whether or not intermittent display is realized. That is, satisfactory current-based programming is realized by eliminating the influence of the parasitic capacitance of source signal line 18 without changing the pixel configuration. In addition, picture motion display close to that provided by a CRT can be realized.

Since the clock for operating gate driver 12 is sufficiently slow as compared to the clock for operating source driver 14, the main clock of the circuit does not rise. Further, the value of N can be varied easily.

It is possible that the image displaying direction (image writing direction) at the first field (frame) is the direction from the upper side to the lower side of the screen while the image displaying direction at the second field (frame) is the direction from the lower side to the upper side of the screen. That is, the downwardly displaying direction and the upwardly displaying direction may alternate with each other repeatedly.

It is also possible that the image displaying direction at the first field (frame) is the direction from the upper side to the lower side of the screen and after the whole screen has been temporarily turned into a black display (into a non-display state), the image displaying direction is switched to the direction from the lower side to the upper side of the screen at the subsequent second field (frame). The whole screen may present a black display once.

Though the aforementioned driving method has been described to perform the writing to the screen in the direction from the upper side to the lower side of the screen or from the lower side to the upper side of the screen, there is no limitation to this feature. It is possible that the direction of writing to the screen from the upper side to the lower side or from the lower side to the upper side is fixed whereas non-display region 52 shifts in the direction from the upper side to the lower side of the screen at a first field (frame) while shifting in the direction from the lower side to the upper side of the screen at a subsequent second field. It is also possible that one frame is divided into three fields, the first, second and third ones of which are allocated to R, B and G, respectively, and, hence, three fields constitute one frame. It is also possible that R, G and B are switched one to another on a one horizontal scanning period (1H) basis. The above-described matters hold true for other embodiments of the present invention.

Non-display region 52 need not necessarily assume a completely non-lighting state. There arises no practical problem even when faint luminescence or faint image display occurs. Such faint luminescence or faint image display should be construed as a region having a lower display luminance than image display region 53. The "non-display region 52" is meant to include even the case where one or two of R, G and B image display pixels are in the non-display state.

Basically speaking, with the luminance (brightness) of display region 53 being maintained to a predetermined value, the luminance of screen 50 rises with increasing area of display region 53. For example, with display region 53 having a luminance of 100 (nt), an increase in the proportion of display region 53 relative to the whole screen 50 from 10% to 20% raises the screen luminance twice. Thus, the display luminance of the screen can vary with varying area of display region 53 in the whole screen 50.

The area of display region 53 can be set as desired by controlling data pulse (ST2) to be fed to shift register 61. Further, the display state shown in FIG. 16 and the display state shown in FIG. 13 can be switched to each other by varying the data pulse input timing and the data pulse input cycle. An increase in the number of data pulses per 1F period causes screen 50 to become brighter, whereas a decrease in the number of data pulses causes screen 50 to become darker. Continuous application of data pulses results in the display state shown in FIG. 13, while intermittent inputting of data pulses results in the display state shown in FIG. 16.

Figure 19:
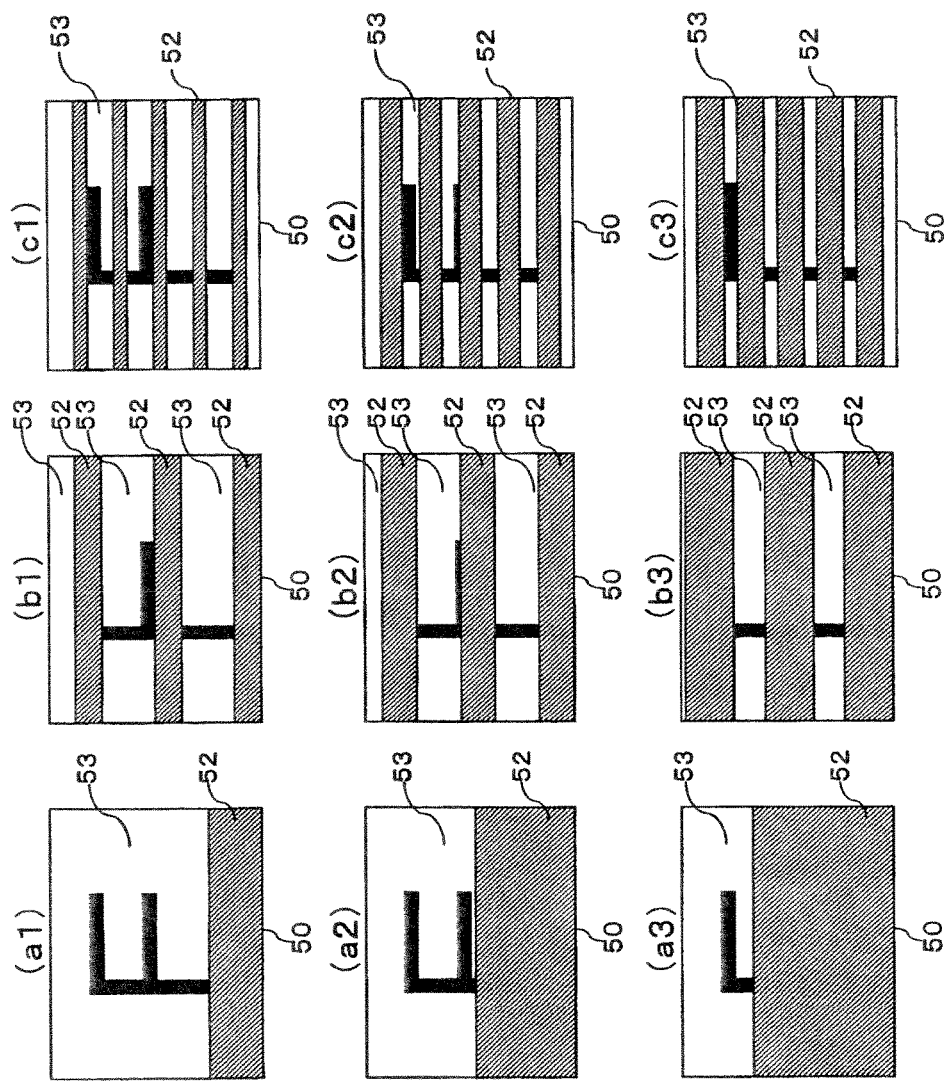
FIG. 19 is an explanatory view illustrating a method of driving an EL display apparatus according to the present invention.

FIG. 19(*a*) illustrates a method of brightness adjustment applicable to the case where display region 53 is continuous as shown in FIG. 13. The screen 50 at FIG. 19(*a*1) has the highest display luminance. The display luminance of the screen 50 at FIG. (a2) is next to the highest, whereas that of the screen 50 at FIG. (a3) is the lowest. The change in state from FIG. 19(*a*1) to FIG. 19(*a*3) and vice versa can be easily realized by control over the shifter register 61 of gate driver 12 and the like as described above. At that time, the voltage Vdd in FIG. 1 need not be varied. That is, the luminance of display screen 50 can be varied without varying the supply voltage. The gamma characteristic of the screen does not vary at all with the change in state from FIG. 19(*a*1) to FIG. 19(*a*3). Thus, the contrast and the gray scale characteristic of a displayed image are maintained irrespective of the luminance of screen 50. This is an effect characteristic of the present invention. With the conventional screen luminance adjustment, the gray scale performance is low when the luminance of screen 50 is low. Specifically, though a 64-level gray scale display can be realized at a high luminance display, the number of displayable gray levels is decreased to a half or less at a low luminance display in most cases. In contrast, the driving method of the present invention is capable of realizing the maximum 64-level gray scale display without dependence on the display luminance of the screen.

FIG. 19(*b*) illustrates a method of brightness adjustment applicable to the case where display region 53 is dispersed as shown in FIG. 16. The screen 50 at FIG. 19(*b*1) has the highest display luminance. The display luminance of the screen 50 at FIG. (b2) is next to the highest, whereas that of the screen 50 at FIG. (b3) is the lowest. The change in state from FIG. 19(*b*1) to FIG. 19(*b*3) and vice versa can be easily realized by control over the shifter register 61 of gate driver 12 and the like as described above. If display region 53 is dispersed as shown in FIG. 19(*b*), flicker does not occur even at a low frame rate.

In order to further lessen the occurrence of flicker at a low frame rate, display region 53 should be dispersed more finely as shown in FIG. 19(*c*). In this case, however, the motion picture display performance lowers. Therefore, the driving method illustrated in FIG. 19(*a*) is suitable for motion picture display. The driving method illustrated in FIG. 19(c) is suitable for the case where a stationary image is displayed with low power consumption demanded. Switching from the FIG. 19(a) method to the FIG. 19(c) method can be easily realized by control over shift register 61.

Figure 20:
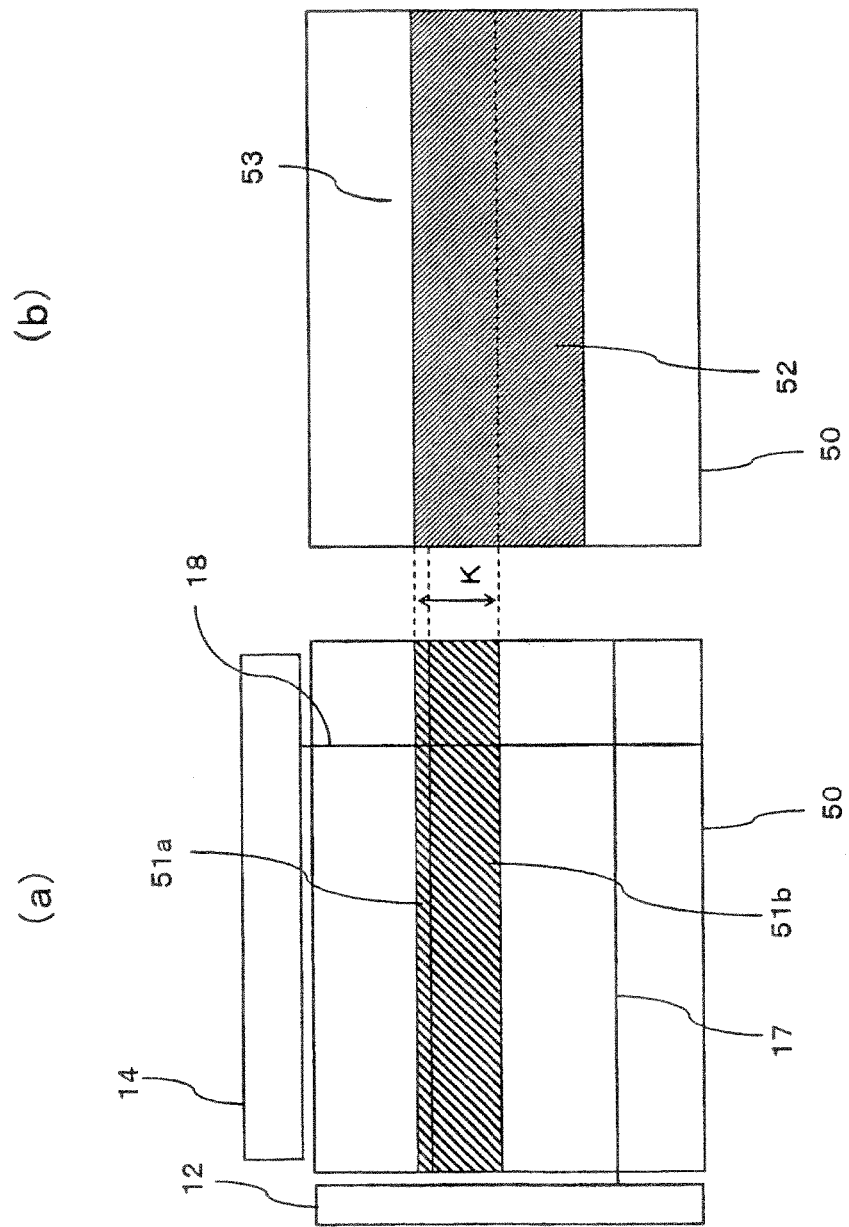
FIG. 20 is an explanatory view illustrating a method of driving an EL display apparatus according to the present invention.

FIG. 20 is an explanatory view illustrating another embodiment for increasing the current to be fed to source signal line 18. This embodiment is a method of significantly improving insufficient writing with current, which basically comprises selecting plural pixel rows at a time and charging/discharging the parasitic capacitance of source signal line 18 and the like with a current which is the sum of currents required by the plural pixel rows. Since plural pixel rows are selected at a time, the current for driving one pixel can be decreased. Hence, the current to be fed to EL device 15 can be decreased. Here, for easy explanation, the case of N=10 (in which a 10-fold current is passed through source signal line 18) will be described as an example.

As shown in FIG. 20, K pixel rows are selected according to the present invention. Source signal line 18 is applied with a current N times as high as a predetermined current from source driver 14. Each pixel is programmed with a current N/K times as high as the current to be passed through the EL device 15. The time period for which the ET, device 15 is fed with the current is set to K/N of a one-frame (field) period. Such a driving method makes it possible to charge/discharge the parasitic capacitance of source signal line 18 sufficiently as well as to obtain satisfactory resolution and a predetermined luminance of emission.

Specifically, EL device 15 is fed with current for K/N of a one-frame (field) period and is not fed with current for the rest (1F(N−1)K/N) of the one-frame period. In this display state, a display based on image data and a black display (non-lighting state) alternate with each other repeatedly 1F by 1F. That is, such a display based on image data appears at time intervals (intermittent display). Thus, a motion picture display of high quality with no blurred outline can be realized. Further, since source signal line 18 is driven with an N-fold current, the parasitic capacitance does not affect the display and, hence, the driving method of the present invention is applicable to high-resolution display panels.

Figure 21:
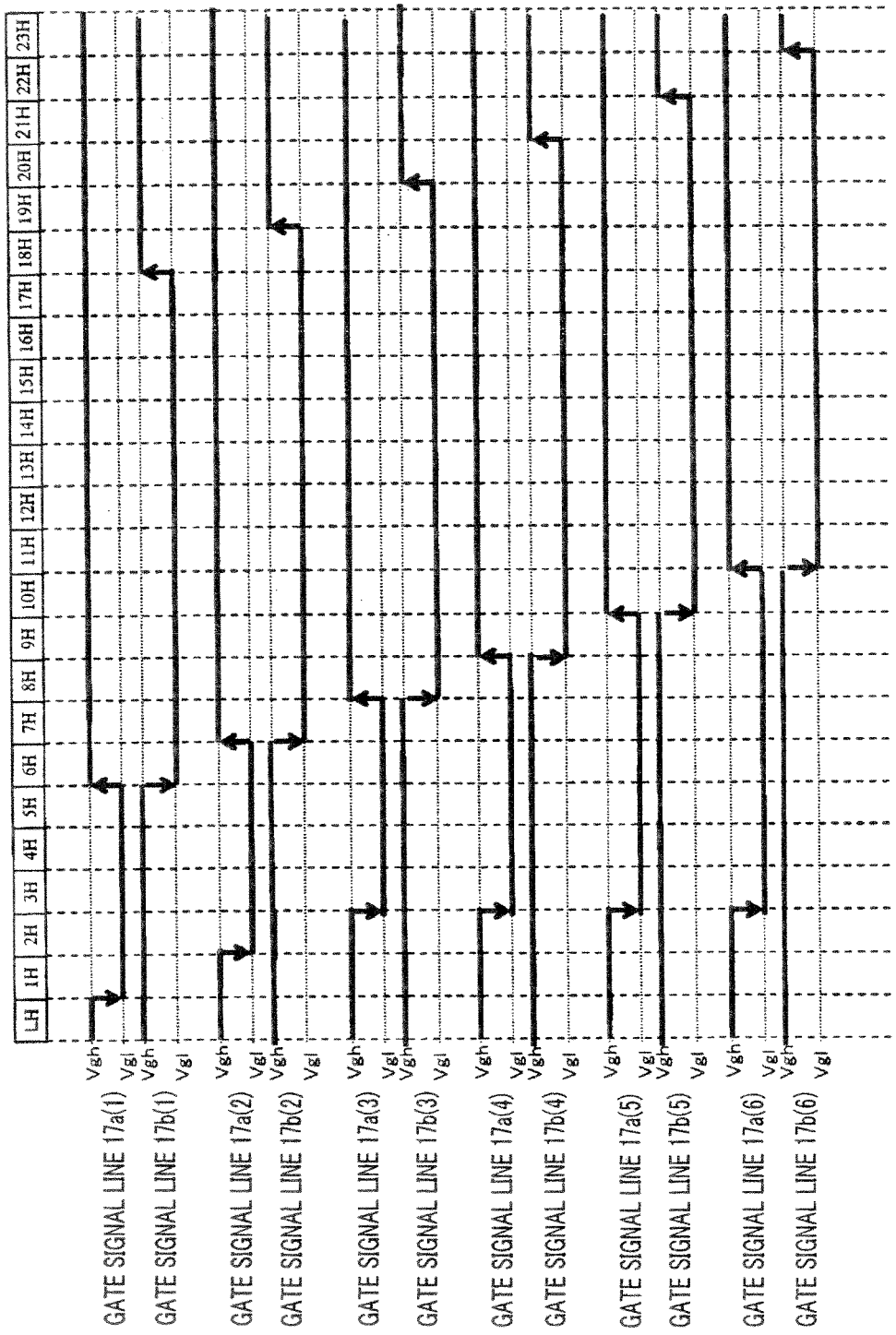
FIG. 21 is an explanatory chart illustrating a method of driving an EL display apparatus according to the present invention.

FIG. 21 is an explanatory diagram of driving voltage waveforms used for realizing the driving method illustrated in FIG. 20. In this figure, a signal waveform comprises off-voltage Vgh (H level) and on-voltage Vgl (L level). The numeral added to each signal line, such as (1), (2) or (3), indicates the row number of each pixel row. It should be noted that a QCIF display panel has 220 rows while a VGA panel has 480 rows.

In FIG. 21, when gate signal line 17a(1) is selected (at voltage Vgl), a programming current is passed through source signal line 18 from transistor 11a of the selected pixel row toward source driver 14. For easy explanation, description will be made of the case where pixel row 51a to be written is the first pixel row.

The programming current to be passed through source signal line 18 is N times as high as a predetermined value. (Description is made with N=10 for easy explanation. Since the predetermined value is the value of a data current causing an image to be displayed, the predetermined value is not a fixed value unless a white raster display is provided.) Further, description will be made of the case where five pixel rows are to be selected at a time (K=5.) Accordingly, the capacitor 19 of one pixel is programmed so that, ideally, a 2-fold current (N/K=10/5=2) will pass through transistor 11a.

When the written pixel row is the first pixel row (1), gate signal lines 17a(1) to 17a(5) are in the selected state. That is, the switching transistors 11b and 11c of each of pixels rows (1) to (5) are in on-state. Also, gate signal line 17b is in reversed phase with gate signal line 17a. Accordingly, the switching transistor 11d of each of the pixel rows (1) to (5) is in off-state, thus preventing current from passing through EL devices 15 of the associated pixel row. That is, these EL devices are in the non-lighting state 52.

Ideally, the transistors 11a of five pixels each pass a current of Iw×2 through source signal line 18. (That is, a current of Iw×2×N=Iw×2×5=Iw×10 is passed through source signal line 18. Therefore, assuming that the current to be passed through source signal line 18 in the case where the N-fold pulse driving method of the present invention is not employed is the predetermined current Iw, a current 10 times as high as Iw is to be passed through source signal line 18.)

The operation (driving method) described above causes the capacitor 19 of each pixel 16 to be programmed with a 2-fold current. Here, description is made on the assumption that transistors 11a are uniform in characteristics (Vt and S value) for easy understanding.

Since the number of pixel rows selected at a time is five (K=5), five driving transistors 11a operate. That is, a 2-fold (10/5=2) current passes through transistor 11a per pixel. Source signal line 18 is fed with a current as the sum of programming currents for the five transistors 11a. For example, assuming that the current to be conventionally passed through pixel row 51a to be written is Iw, a current of Iw×10 is to be passed through source signal line 18 according to the present invention. Pixel rows 51b to be written with image data after writing to pixel row (1) are now used as auxiliary pixel rows for increasing the amount of current to be fed to source signal line 18. However, there arises no problem because the pixel rows 51b will be written with correct image data thereafter.

Therefore, the four pixel rows 51b provide the same display as the pixel row 51a during a 1H period. For this reason, at least the written pixel row 51a and the pixel rows 51b selected for increasing the current are made to assume the non-lighting state 52. However, such pixel rows in a current mirror pixel configuration as shown in FIG. 38 or other pixel configurations adapted for voltage-based programming may be made to assume the lighting state.

After lapse of 1H, gate signal line 17a(1) assumes the unselected state while gate signal line 17b is applied with on-voltage (Vgl). At the same time, gate signal line 17a(6) is selected (applied with Vgl voltage) and transistor 11a of the selected pixel row (6) passes the programming current through source signal line 18 toward source driver 14. Such an operation allows pixel row (1) to hold regular image data.

After lapse of another 1H, gate signal line 17a(2) assumes the unselected state while gate signal line 17b is applied with on-voltage (Vgl). At the same time, gate signal line 17a(7) is selected (applied with Vgl voltage) and transistor 11a of the selected pixel row (7) passes the programming current through source signal line 18 toward source driver 14. Such an operation allows pixel row (2) to hold regular image data. By performing the above-described operation with scanning shifting pixel row by pixel row, one screen is wholly rewritten.

With the driving method of FIG. 20, each pixel is programmed with a 2-fold current (voltage) and, hence, ideally the EL device 15 of each pixel emits light at a 2-fold luminance. Therefore, the luminance of the display screen is twice as high as the predetermined value. In order for the display screen to display at the predetermined luminance, a region including written pixel row 51 and occupying ½ of display region 50 should be used as non-display region 52.

As in the case of FIG. 13, when one display region 53 shifts downwardly from the upper side of the screen as shown in FIG. 20, the shifting of display region 53 is visually recognized if the frame rate is low. This is likely particularly when the viewer blinks his or her eyes or moves his or her face up and down.

Figure 22:
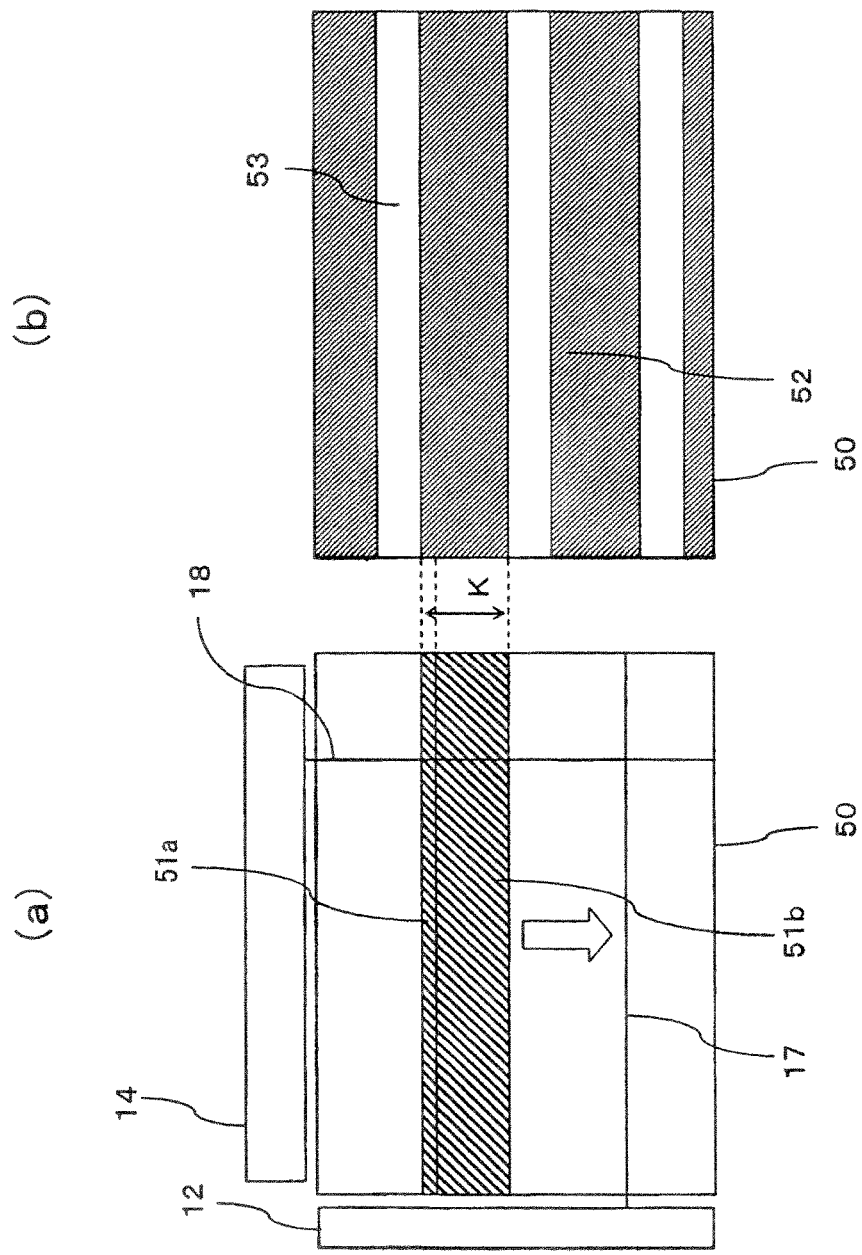
FIG. 22 is an explanatory view illustrating a method of driving an EL display apparatus according to the present invention.

To solve this problem, display region 53 should be split into plural sections as shown in FIG. 22. If the total sum of the areas of these sections is equal to the area of an S(N−1)/N region, the brightness of this display is equal to that of the display provided without splitting of display region 53.

Figure 23:
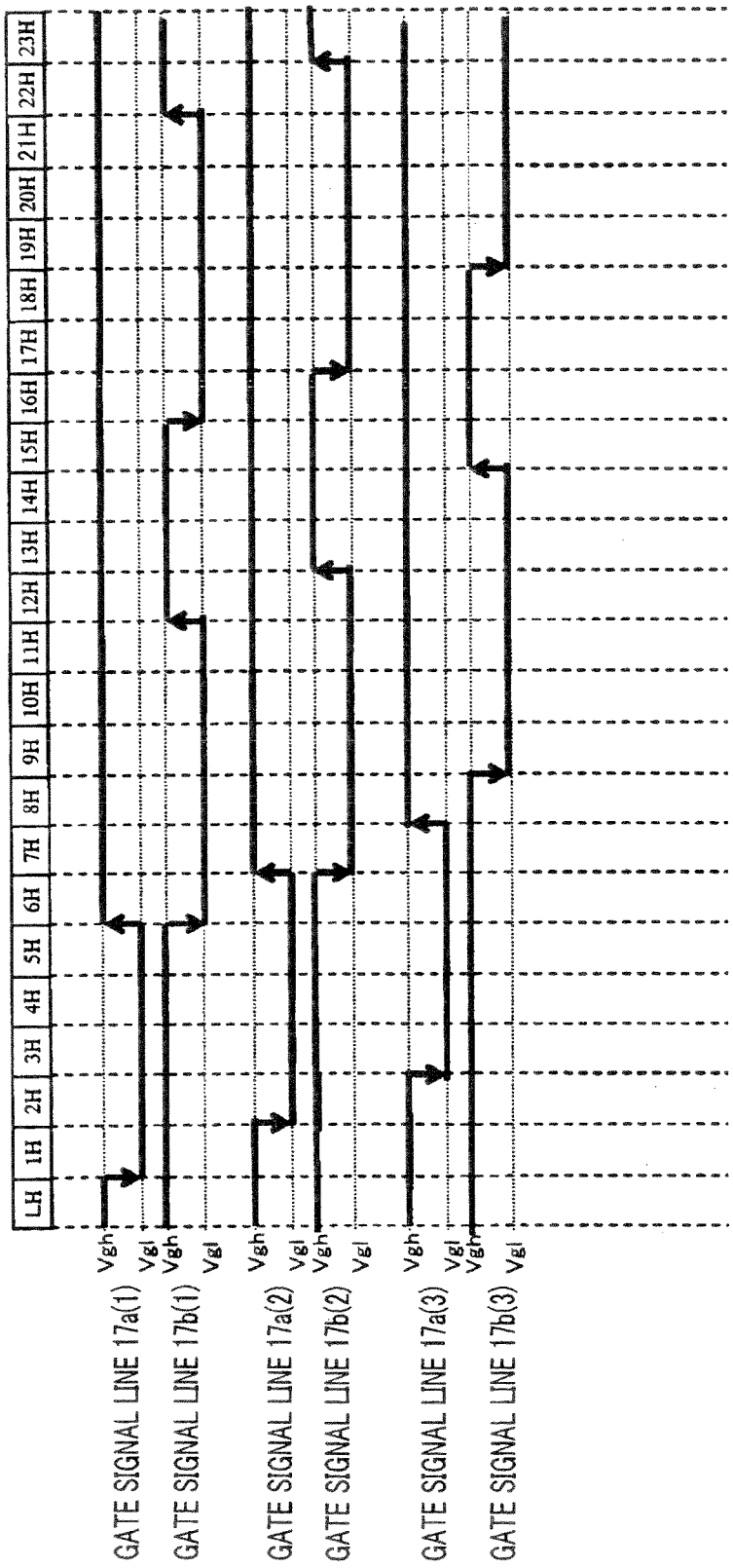
FIG. 23 is an explanatory chart illustrating a method of driving an EL display apparatus according to the present invention.

FIG. 23 shows a voltage waveform applied to each gate signal line 17. The difference between FIG. 21 and FIG. 23 resides in the operation of gate signal line 17*b*. Gate signal line 17*b* is turned on/off (with Vgl and Vgh) plural times, the number of times corresponding to the number of split sections of the screen. Since other features are substantially the same as or analogous to the corresponding features of FIG. 21, description thereof will be omitted.

By thus splitting display region 53 into plural sections, the screen provides a display with reduced flitter. Thus, satisfactory image display free of flicker can be realized. Display region 53 may be split into smaller sections. With finer splitting, flicker can be more reduced. Since the responsiveness of EL device 15 is particularly high, the display luminance will not lower even if EL device 15 is turned on/off at a time interval shorter than 5 μsec.

In the driving method of the present invention, EL device 15 can be on-off controlled by turning on/off the signal to be applied to gate signal line 17*b*. For this reason, such control can be achieved with a clock having a low frequency on the KHz order. Further, image memory or the like is not needed for inserting a black display (i.e., non-display region 52). Therefore, the driving circuit or method of the present invention can be implemented with reduced cost.

Figure 24:
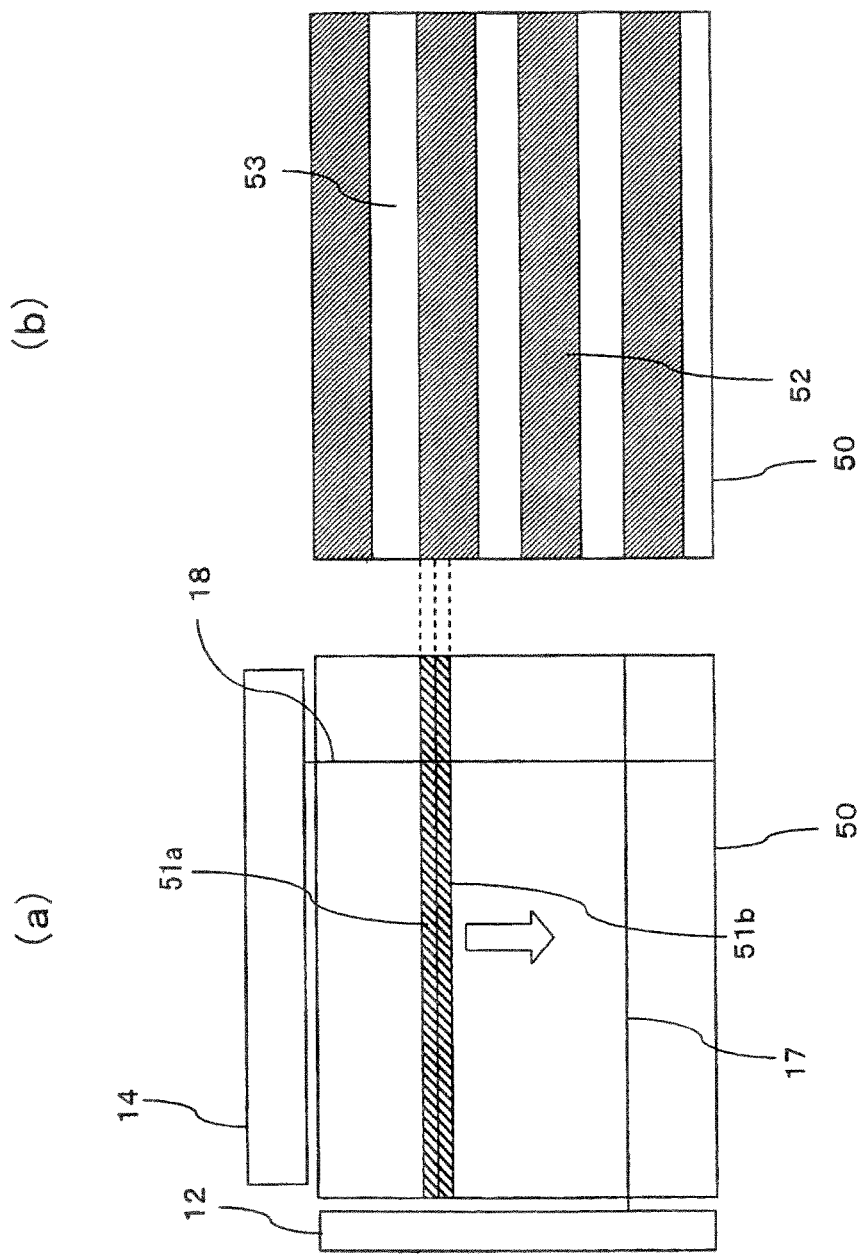
FIG. 24 is an explanatory view illustrating a method of driving an EL display apparatus according to the present invention.

FIG. 24 illustrates the case where the number of pixel rows to be selected at a time is two. According to the results of study made by the inventors et al., the method including selection of two pixel rows at a time realized practical display uniformity when applied to display panels formed by the low temperature polysilicon technology. Presumably, this is because driving transistors 11*a* of adjacent pixels were very uniform in their characteristics. Good results were obtained by performing striped laser irradiation parallel with source signal line 18 in laser annealing.

This is because portions of a semiconductor film in a region annealed at the same time are uniform in characteristics. Stated otherwise, this is because a semiconductor film is formed uniformly in a striped region irradiated with laser light and transistors formed using this semiconductor film are substantially uniform in Vt and mobility. Thus, pixels arranged along source signal line 18 (i.e., a pixel column extending vertically of the screen) are made substantially uniform in characteristics by irradiation with striped laser shot in parallel with the source signal line 18 forming direction and shifting the irradiating position. Therefore, when plural pixel rows are turned on at a time so as to be programmed with current, the plural pixel rows selected at a time are programmed with a substantially equal current having a value which is the quotient obtained by dividing the programming current by the number of the selected pixel rows. Thus, it is possible to realize current-based programming with a current value close to a target value, hence, realize a uniform display. For this reason, the laser shot direction and the driving method illustrated in FIG. 24 or the like provide a synergetic effect.

As described above, transistors 11*a* of vertically arranged pixels are made substantially uniform in characteristics by making the direction of laser shot substantially coincident with the direction in which source signal line 18 is formed, thus resulting in satisfactory current-based programming. (In this case, transistors 11*a* of horizontally arranged pixels need not necessarily be uniform in characteristics.) The operation thus described is performed, while the position of pixel rows to be selected is shifted one pixel row by one pixel row or plural pixel rows by plural pixel rows in synchronism with 1H (one-horizontal period). Though the laser shot direction described is made parallel with source signal line 18 according to the above description, the present invention is not limited to the laser shot direction parallel with source signal line 18. This is because irradiation with laser shot in an oblique direction with respect to source signal line 18 allows transistors 11*a* of vertically arranged pixels along one source signal line 18 to be made substantially uniform in characteristics. Therefore, the "irradiation with laser shot parallel with source signal line" is meant to form any adjacent pixels to be arranged along the wiring direction of source signal line 18 (in the vertical direction) in a manner to locate them within one laser irradiation region. The "source signal line 18" generally means wiring for transmission of programming currents or voltages serving as image signals.

According to the above-described embodiment of the present invention, the position of pixel rows to be written is shifted 1H by 1H. However, the present invention is not limited to this feature. It is possible to shift the position 2H by 2H or on the basis of more pixel rows. Alternatively, shifting may be performed based on any unit time. The shifting time interval may be varied with varying position on the screen. For example, it is possible that the shifting time interval is shortened at a central portion of the screen and prolonged at upper and lower portions of the screen. Also, the shifting time interval may be varied frame by frame. The present invention is not limited to selection of plural pixel rows arranged adjacent to each other. For example, it is possible to select pixel rows located across one intervening pixel row. Specifically, a driving method may be employed such that the first and third pixel rows are selected in the first horizontal scanning period, the second and fourth pixel rows selected in the second horizontal scanning period, the third and fifth pixel rows selected in the third horizontal scanning period, and the fourth and sixth pixel rows selected in the fourth horizontal scanning period. Of course, the technical scope of the present invention includes a driving method such as to select the first, third and fifth pixel rows in the first horizontal scanning period. It is, of course, possible to select pixel row positions across plural intervening pixel rows.

Figure 32:
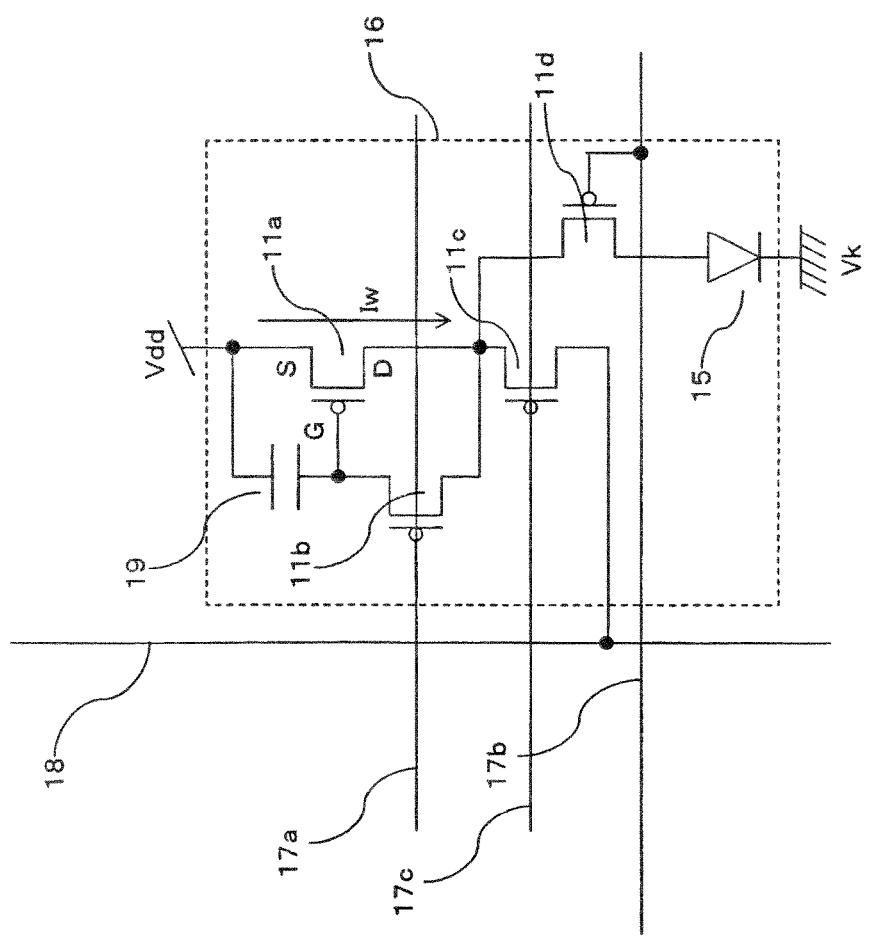
FIG. 32 is a diagram illustrating a pixel configuration of an EL display panel according to the present invention.
Figure 42:
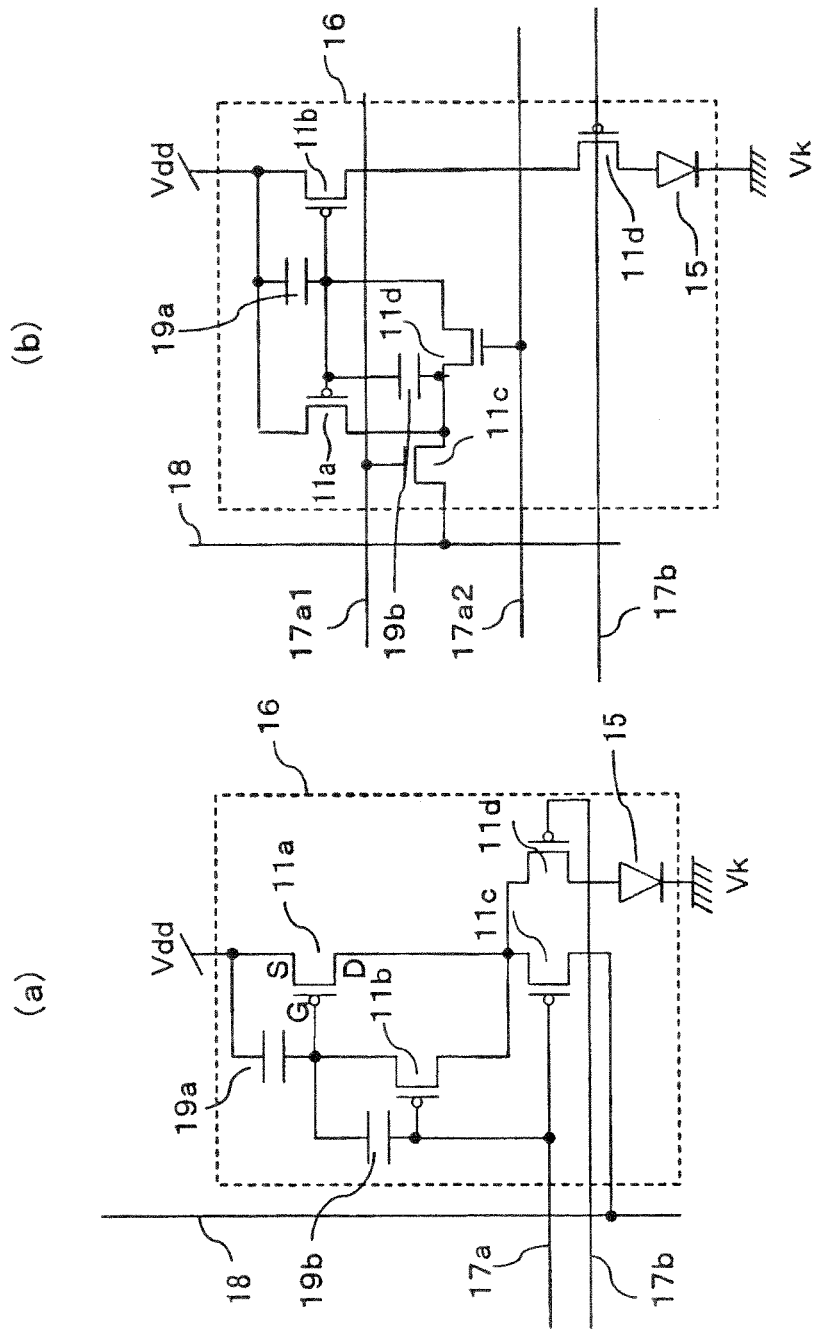
FIG. 42 is a diagram illustrating a pixel configuration of an EL display panel according to the present invention.
Figure 50:
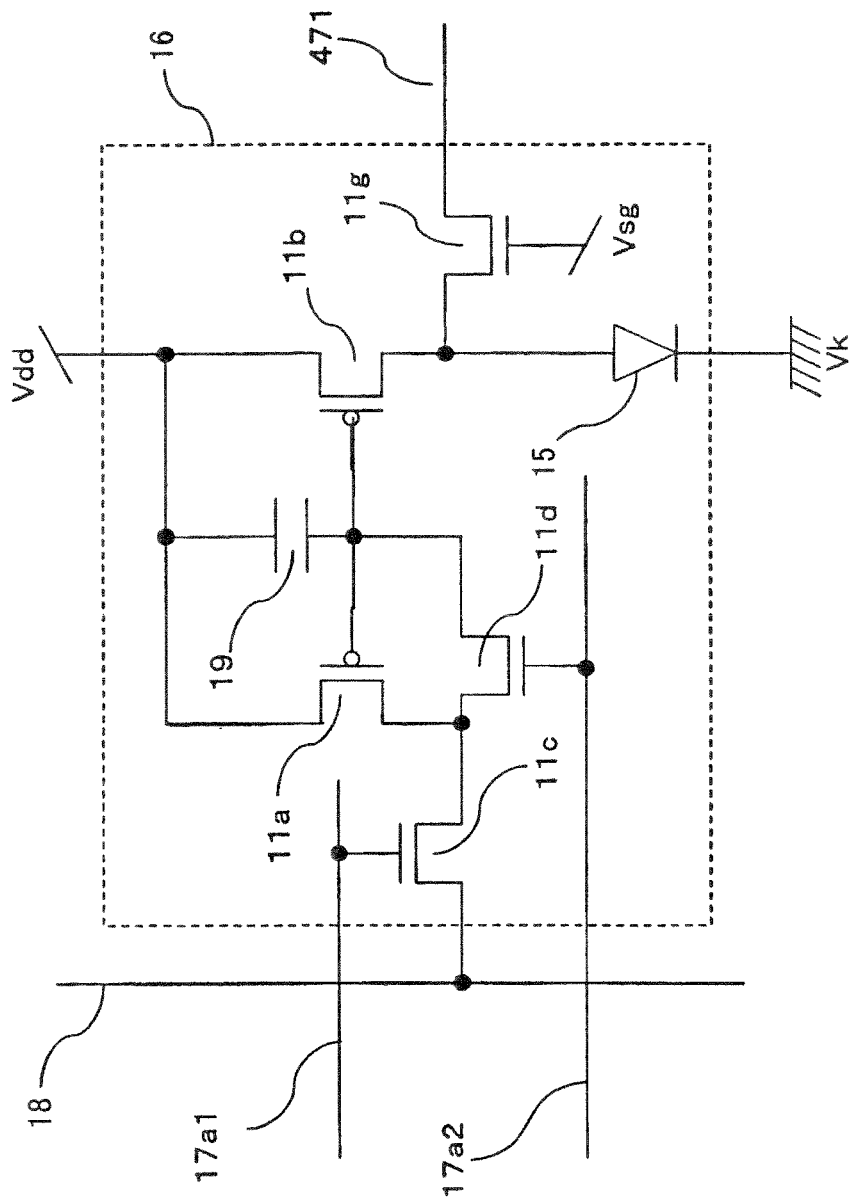
FIG. 50 is a diagram illustrating a pixel configuration of an EL display panel according to the present invention.

It is needless to say that the combination of the feature of the laser shot direction setting and the feature of the simultaneous selection of plural pixel rows is applicable not only to the pixel configurations shown in FIGS. 1, 2 and 32 but also to other current-driven pixel configurations as shown in FIGS. 38, 42 and 50 including the current mirror pixel configuration shown in FIG. 38. The combination is also applicable to voltage-driven pixel configurations as shown in FIGS. 43, 51, 54 and 62. This is because if the transistors of pixels arranged adjacent to each other vertically are uniform in characteristics, satisfactory voltage-based programming can be realized with a voltage applied to a common source signal line 18.

Figure 25:
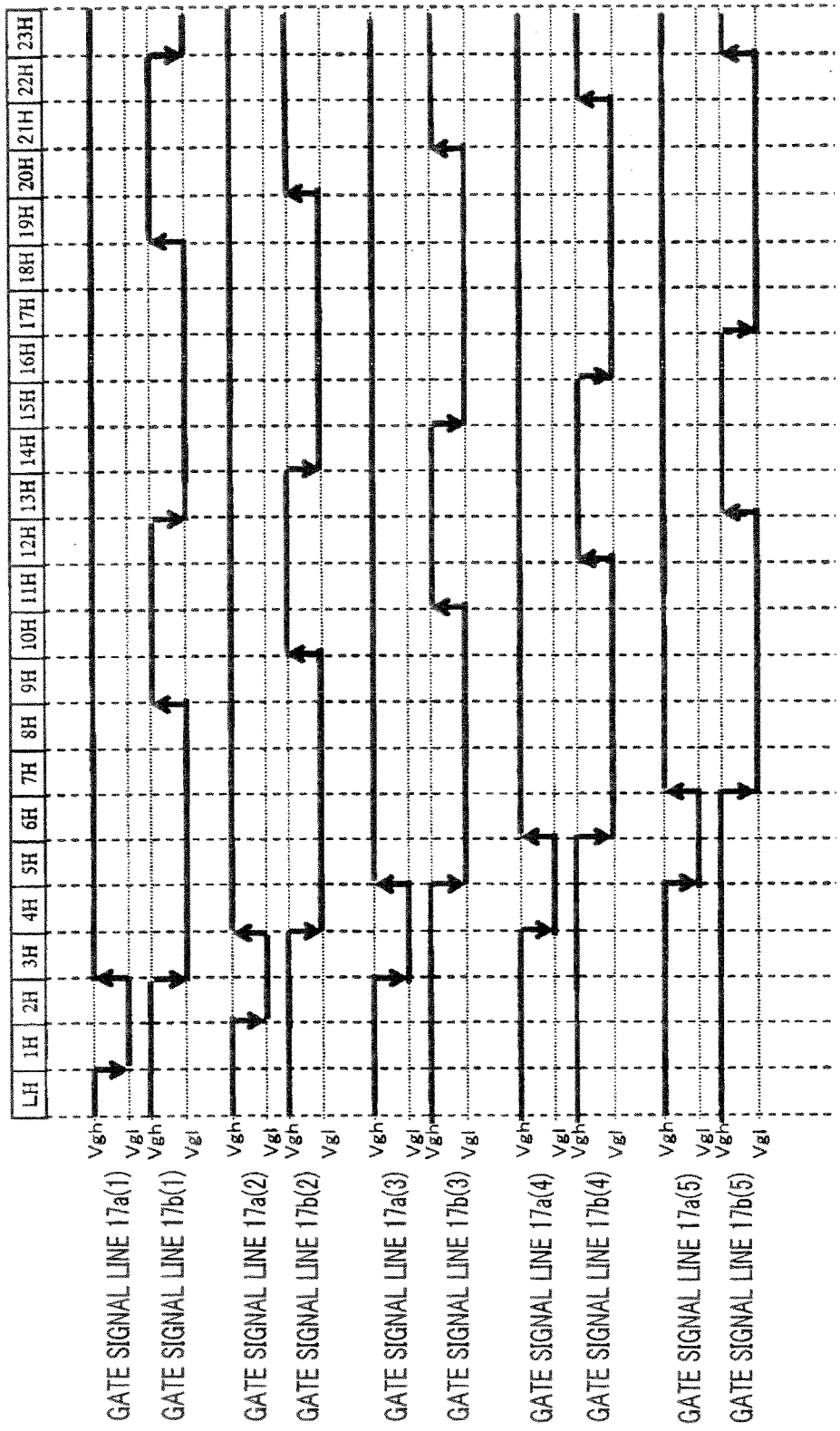
FIG. 25 is an explanatory chart illustrating a method of driving an EL display apparatus according to the present invention.

When the first pixel row is written in the configuration shown FIG. 24, gate signal lines 17a(1) and 17a(2) are selected (see FIG. 25.) That is, the switching transistors 11b and transistors 11c of pixel rows (1) and (2) are in on-state. Each gate signal line 17b is in reversed phase with each gate signal line 17a. Accordingly, the switching transistors 11d of at least the pixel rows (1) and (2) are in off-state, thus preventing current from passing through EL devices 15 of the associated pixel rows. That is, these pixel rows are in the non-lighting state 52. It should be noted that in the arrangement shown in FIG. 24, display region 53 is split into five sections in order to reduce the occurrence of flicker.

Ideally, the transistors 11a of two pixels (pixel rows) each pass a current of Iw×5 (N=10) through source signal line 18. (That is, since K=2, a current of Iw×K×5=Iw×10 is passed through source signal line 18.) Therefore, the capacitor 19 of each pixel 16 is programmed with a 5-fold current.

Since the number of pixel rows selected at a time is two (K=2), two driving transistors 11a operate. That is, a 5-fold (10/2=5) current passes through each transistor 11a. Source signal line 18 is fed with a current as the sum of programming currents for the two transistors 11a.

For example, pixel row 51a to be written is fed with current Id, which is to be conventionally fed to pixel row 51a, while source signal line 18 is fed with a current of Iw×10. However, there arises no problem because the pixel row 51b will be written with regular image data thereafter. The pixel row 51b provides the same display as the pixel row 51a during a 1H period. For this reason, at least the written pixel row 51a and the pixel row 51b selected for increasing the current are made to assume the non-lighting state 52.

After lapse of 1H, gate signal line 17a(1) assumes the unselected state while gate signal line 17b is applied with on-voltage (Vgl). At the same time, gate signal line 17a(3) is selected (applied with Vgl voltage) and the transistor 11a of the selected pixel row (3) passes the programming current through source signal line 18 toward source driver 14. Such an operation allows pixel row (1) to hold regular image data.

After lapse of another 1H, gate signal line 17a(2) assumes the unselected state while gate signal line 17b is applied with on-voltage (Vgl). At the same time, gate signal line 17a(4) is selected (applied with Vgl voltage) and the transistor 11a of the selected pixel row (4) passes the programming current through source signal line 18 toward source driver 14. Such an operation allows pixel row (2) to hold regular image data. By performing the above-described operation with scanning shifting pixel row by pixel row, one screen is wholly rewritten. (Of course, scanning may be shifted plural pixel rows by plural pixel rows. For example, a pseudo-interlaced driving method will shift scanning two rows by two rows. In terms of image display, there will be some cases where the same image is written to plural pixel rows.)

Similarly to the case of FIG. 16, the driving method illustrated in FIG. 24 programs each pixel with a 5-fold current (voltage) and, hence, ideally the EL device 15 of each pixel emits light at a 5-fold luminance. Therefore, the luminance of display region 53 is 5 times as high as the predetermined value. In order for the display region 53 to display at the predetermined luminance, a region including written pixel rows 51 and occupying ⅕ of display screen 50 should be used as non-display region 52.

Figure 26:
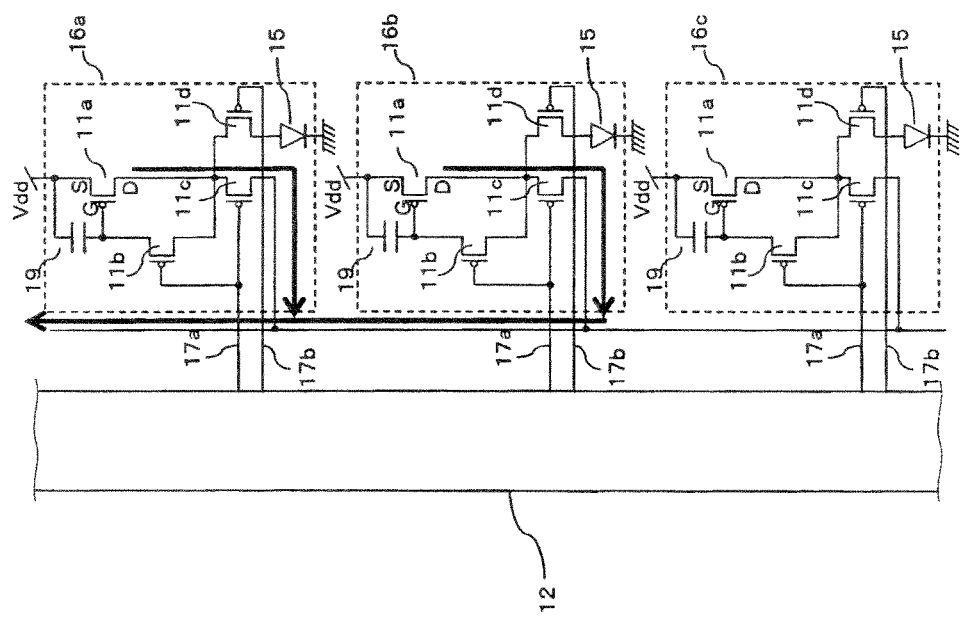
FIG. 26 is an explanatory diagram illustrating a method of driving an EL display apparatus according to the present invention.
Figure 27:
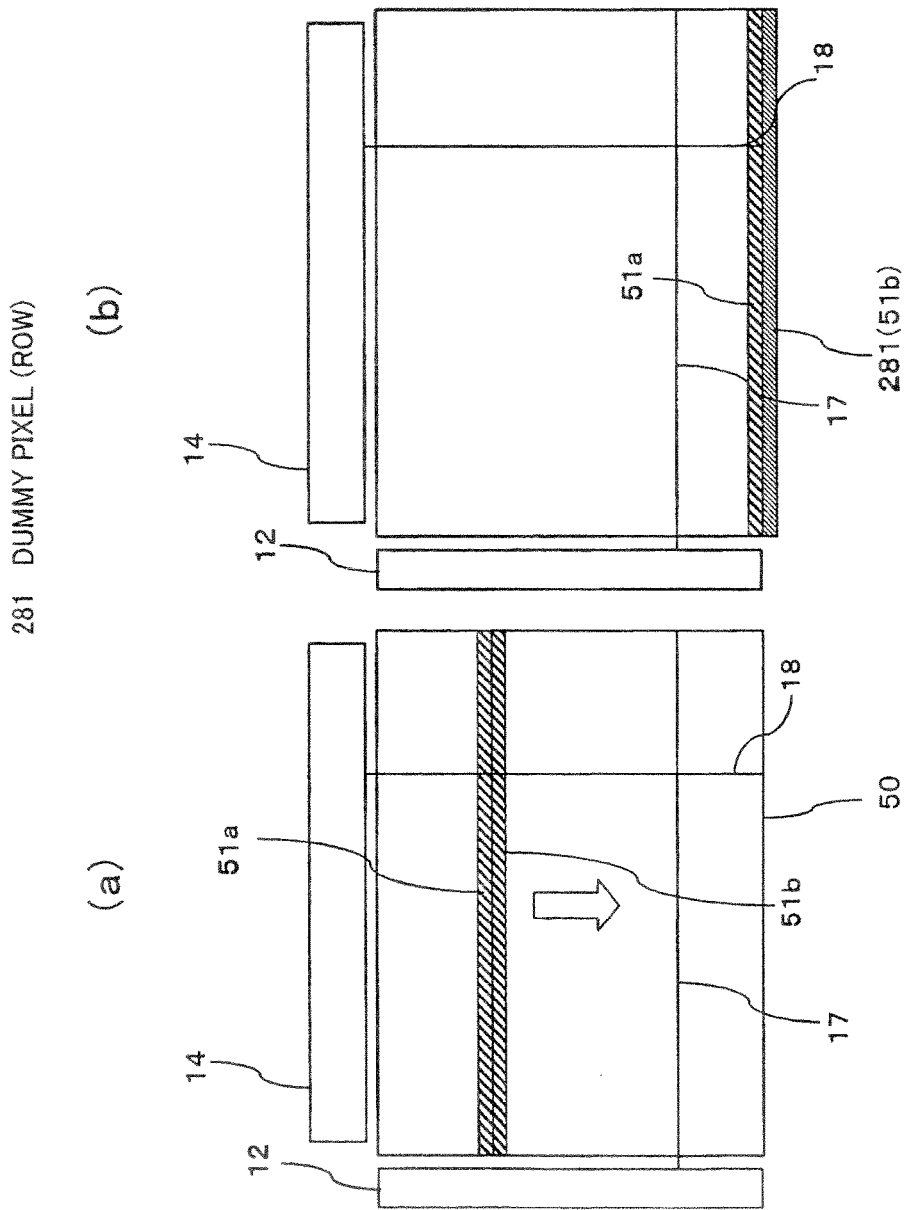
FIG. 27 is an explanatory view illustrating a method of driving an EL display apparatus according to the present invention.

As shown in FIG. 27, two pixel rows to be written 51 (51a and 51b) are selected and such selection is made sequentially from the upper side to the lower side of screen 50. (See FIG. 26 also. In FIG. 26, pixel rows 16a and 16b are selected.) When selection is made down to the lower side of the screen, pixel row 51b to be written disappears, though pixel row 51a to be written is present. That is, only one pixel row is left for selection. For this reason, the current applied to source signal line 18 is wholly written to pixel row 51a. Accordingly, pixel row 51 to be written now is undesirably programmed with a current twice as high as the current with which the preceding pixel rows 51a have been priorly programmed.

In order to solve this problem, the present invention uses a dummy pixel row 281 formed (located) on the lower side of screen 50, as shown in FIG. 27(b). Therefore, when selection of pixel rows to be written reaches the lower side of screen 50, the final pixel row on screen 50 and the dummy pixel row 281 are selected. For this reason, the final pixel row shown in FIG. 27(b) is written with the regular current. Though the dummy pixel row 281 is shown to locate adjacent to the upper or lower edge of display region 50, there is no limitation to this arrangement. The dummy pixel row 281 may be formed at a location spaced apart from display region 50. The dummy pixel row 281 need not be formed with switching transistor 11d, EL device 15 and the like shown in FIG. 1. The absence of these components enables the dummy pixel row 281 to be reduced in size.

Figure 28:
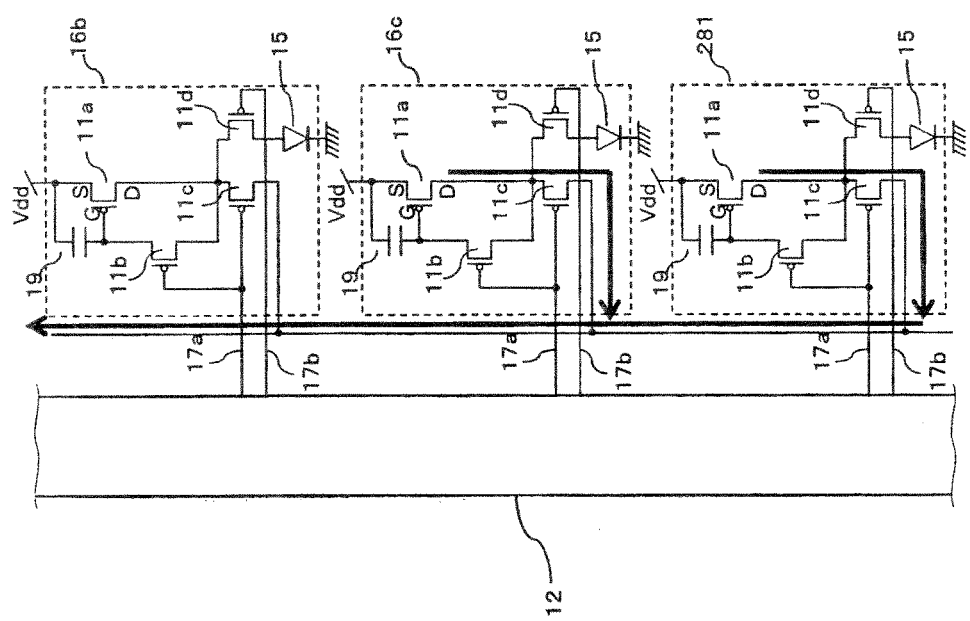
FIG. 28 is an explanatory diagram illustrating a method of driving an EL display apparatus according to the present invention.

FIG. 28 illustrates the state shown in FIG. 27(b). As apparent from FIG. 28, when selection of pixel rows reaches pixel 16c on the lower side of screen 50, the final pixel row 281 on screen 50 is selected. The dummy pixel row 281 is located outside display region 50. That is, the dummy pixel row 281 is configured to fail to light or not to be allowed to light, or not to be seen as a display even when it lights. This can be made by, for example, elimination of the contact hole between the pixel electrode and transistor 11 or failure to form EL film at the dummy pixel row.

Figure 29:
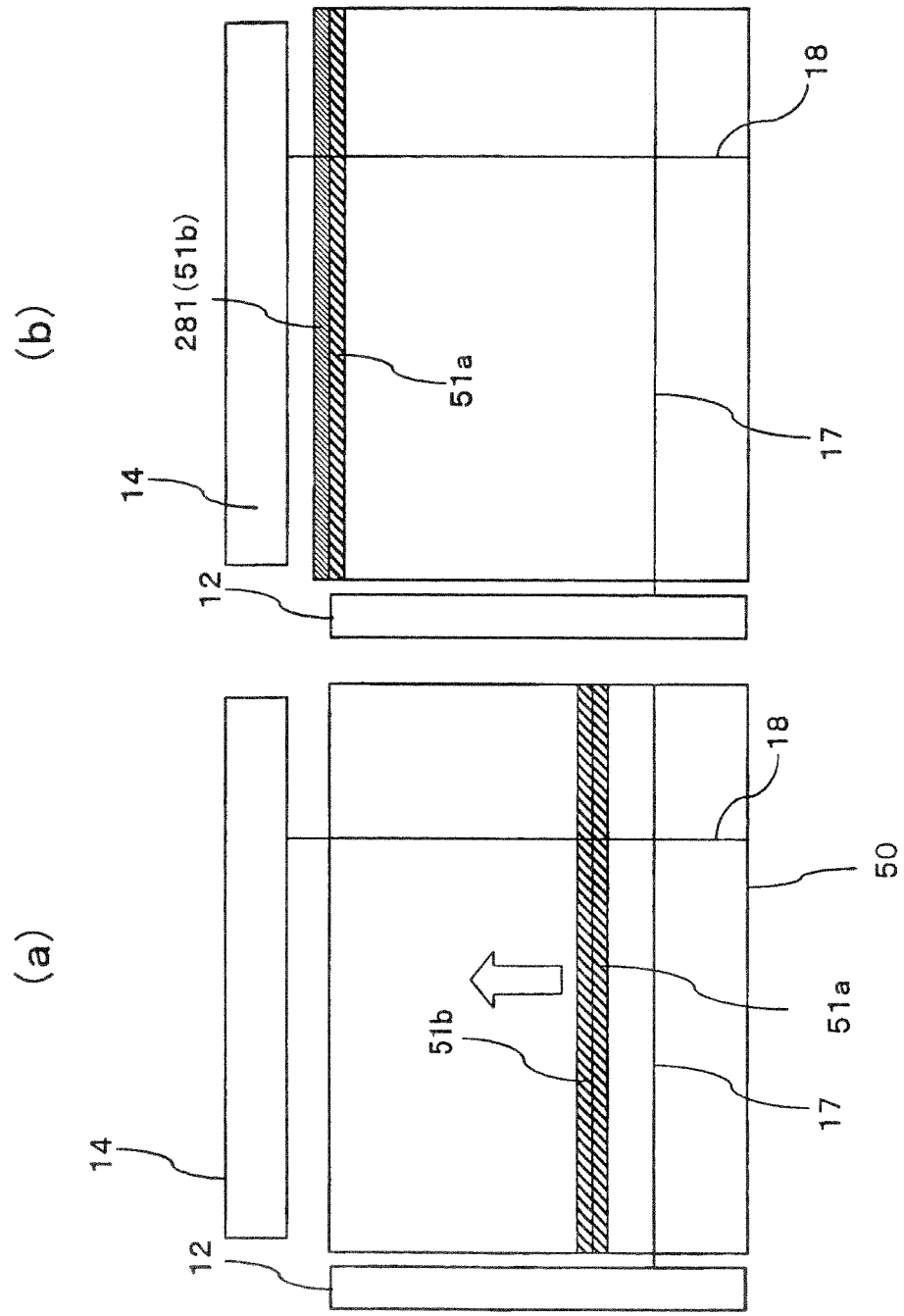
FIG. 29 is an explanatory view illustrating a method of driving an EL display apparatus according to the present invention.

Though the dummy pixel (row) 281 is provided (formed or located) on the lower side of screen 50 in the arrangement shown in FIG. 27, there is no limitation to this arrangement. For example, in the case where scanning is performed from the lower side to the upper side of screen 50 (reverse scanning) as shown in FIG. 29(a), dummy pixel row 281 should be formed also on the upper side of screen 50, as shown in FIG. 29(b). That is, the upper side and the lower side of screen 50 are formed (provided) with respective dummy pixel rows 281. Such an arrangement can accommodate to vertical reversal of scanning over the screen.

The above-described embodiment is configured to select two pixel rows at a time. However, the present invention is not limited to this configuration but may employ a configuration for selection of, for example, five pixel rows at a time (see FIG. 23.) That is, where five pixel rows are driven at a time, four dummy pixel rows 281 should be formed. The dummy pixel row configuration or the dummy pixel row driving method according to the present invention is of the type using at least one dummy pixel row. Of course, it is preferable to combine the dummy pixel row driving method with the N-fold pulse driving method.

With the driving method in which plural pixel rows are selected at a time, it becomes more difficult to accommodate variations in the characteristics of transistors 11a as the number of pixel rows to be selected at a time increases. However, with increasing number of pixel rows to be selected, the programming current for each pixel becomes higher and, hence, a higher current is to be passed through EL device 15. If the current passing through EL device 15 is high, EL device 15 is easy to deteriorate.

Figure 30:
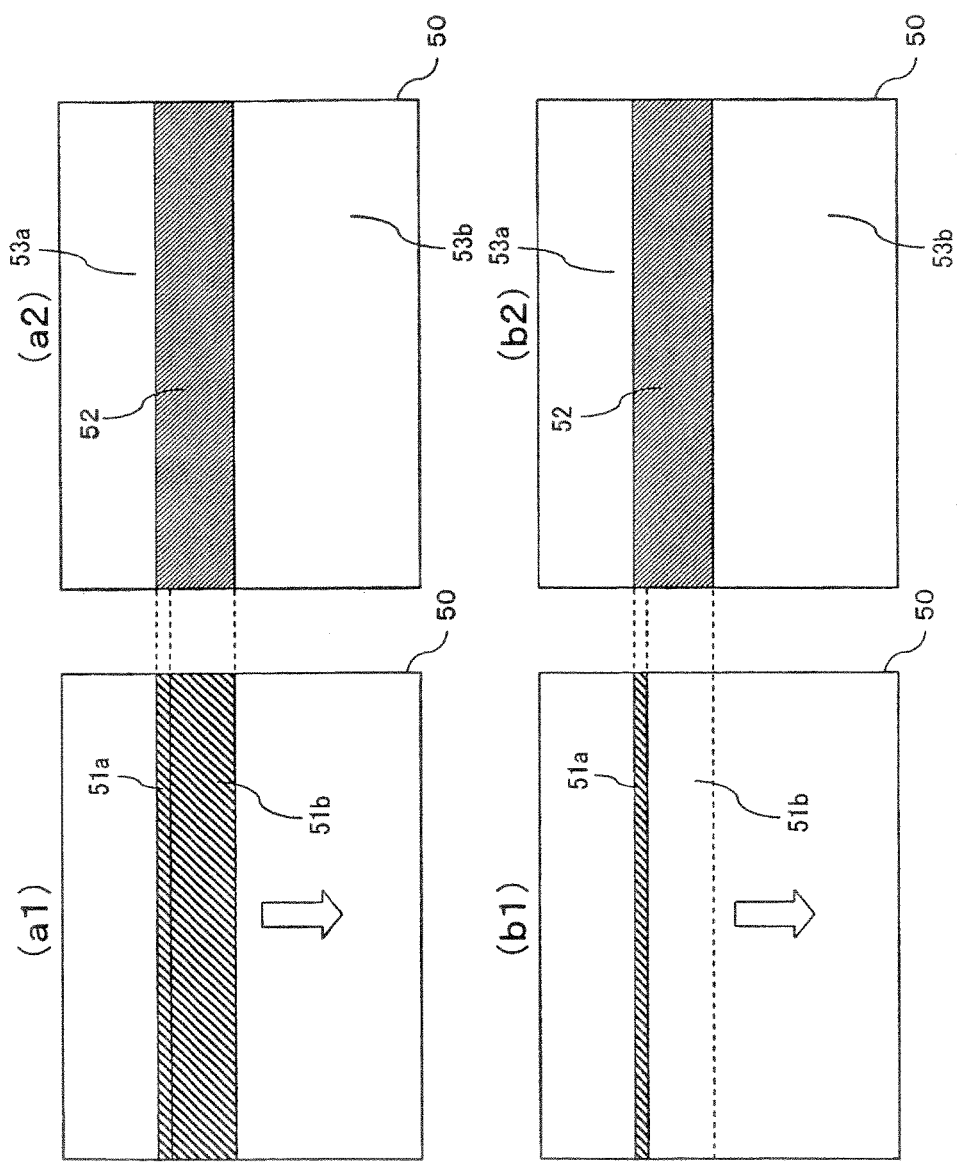
FIG. 30 is an explanatory view illustrating a method of driving an EL display apparatus according to the present invention.

The method illustrated in FIG. 30 is capable of solving this problem. The basic concept of the method illustrated in FIG. 30 according to the present invention is a combination of a method such as to select plural pixel rows at a time in a ½H period (½ of a horizontal scanning period), similarly to the methods described in relation to FIGS. 22 and 29, and a method such as to select one pixel row in the subsequent ½H period (½ of a horizontal scanning period), similarly to the methods described in relation to FIGS. 5 and 13. Such a combination accommodates variations in the characteristics of transistors 11*a* and hence is capable of making the responsiveness high and the in-plane uniformity satisfactory.

For easy explanation, description will be made of such a combined method including selecting five pixel rows at a time in a first period and then selecting one pixel row in a second period. In the first period (the first ½H), five pixel rows are selected at a time as shown in FIG. 30(*a*1). Since this operation has already been described with reference to FIG. 22, description thereof will be omitted. The current to be passed through source signal line 18 is, for example, 25 times as high as the predetermined value. Accordingly, the transistor 11*a* of each pixel (in the case of the pixel configuration shown in FIG. 1) is to be programmed with a 5-fold current (25/5 pixel rows=5.) Since source signal line 18 is to be fed with a 25-fold current, the parasitic capacitance occurring in source signal line 18 and the like can be charged/discharged in a very short time. Therefore, the potential of source signal line 18 becomes a target potential in a short time and the capacitor 19 of each pixel 16 is programmed to have such a terminal voltage as to pass the five-fold current. The period for which the 25-fold current is applied is the first ½H (½ of one horizontal scanning period.)

As a matter of course, since five pixel rows are to be written with the same image data, the transistors 11*d* of these five pixel rows are made to assume off-state so that the five pixel rows do not display. Thus, the resulting display state is as shown in FIG. 30(*a*2).

In the latter ½H period, one pixel row is selected and current-based (voltage-based) programming is performed. This state is illustrated in FIG. 30(*b*1). The pixel row 51*a* written is programmed with a current (voltage) so that a 5-fold current will pass as in the first period. The current to be passed through each pixel in the case of FIG. 30(*a*1) and that in the case of FIG. 30(*b*1) are equalized to each other because a variation in the terminal voltage of capacitor 19 is reduced to allow a current of a target value to pass more promptly.

Specifically, in the operation illustrated in FIG. 30(*a*1), plural pixels are fed with a current so that the terminal voltage of each capacitor 19 can rapidly reach a value causing an approximate current to pass. At this first step, programming is made at plural transistors 11*a* and, hence, errors in regard to a target value occur due to variations in the characteristics of the transistors. At the subsequent second step, only the pixel row to be written with data and hold the data is selected so that programming is completed with a current having the predetermined target value varied from the approximate target value.

Since the operation of scanning non-lighting region 52 as well as pixel row 51*a* to be written downwardly of the screen is the same as in the case of FIG. 13 or the like, description thereof will be omitted.

Figure 31:
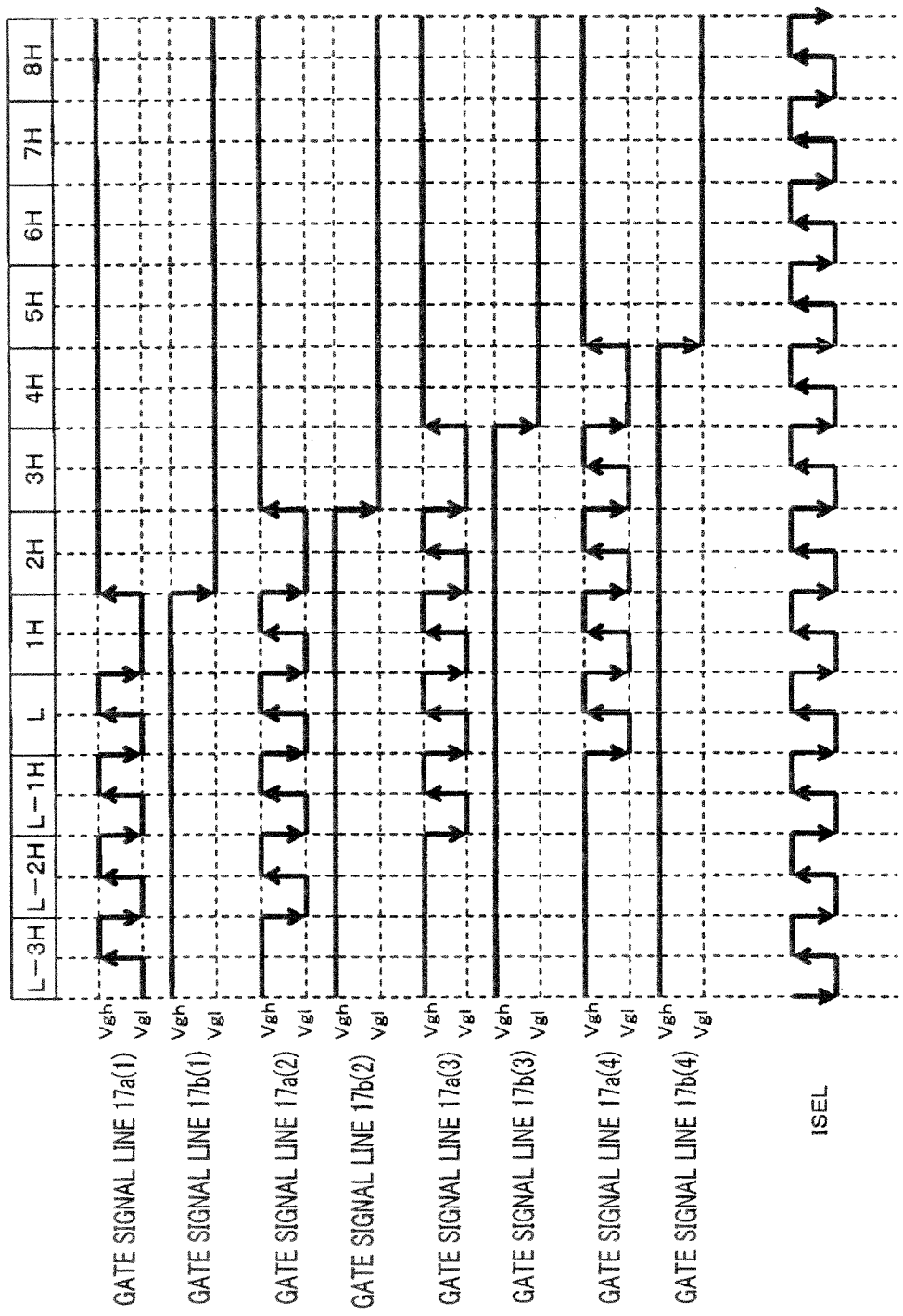
FIG. 31 is an explanatory chart illustrating a method of driving an EL display apparatus according to the present invention.

FIG. 31 shows driving waveforms for realizing the driving method illustrated in FIG. 30. As can be seen from FIG. 31, a 1H period (one horizontal scanning period) comprises two phases. Switching between these two phases is made using ISEL signal, which is shown in FIG. 31.

Reference is first made to such ISEL signal. The driver circuit 14 for carrying out the method illustrated in FIG. 30 has first and second current output circuits. These first and second current output circuits each comprise a DA circuit for DA conversion of 8-bit gray scale data, an operational amplifier, and the like. In the embodiment of FIG. 30, the first current output circuit is configured to output a 25-fold current, while the second current output circuit configured to output a 5-fold current. Outputs of the respective first and second current output circuits are applied to source signal line 18 by control over a switching circuit formed (located) in a current output section with the ISEL signal. Each source signal line is provided with the first and second current output circuits.

When the ISEL signal assumes an L level, the first current output circuit adapted to output a 25-fold current is selected so that source driver 14 absorbs the current from source signal line 18 (more exactly, the first current output circuit formed in source driver 14 absorbs the current.) The magnitude of the current to be outputted from each of the first and second current output circuits can be adjusted to a 25-fold value, 5-fold value or the like easily, because each current output circuit can be formed using plural resistors and an analog switch.

When the pixel row to be written is the first pixel row (see the column of 1H in FIG. 30) as shown in FIG. 30, gate signal lines 17*a*(1) to 17*a*(5) are in the selected state (in the case of the pixel configuration shown in FIG. 1.) That is, the switching transistors 11*b* and transistors 11*c* of pixels rows (1) to (5) are in on-state. Since the ISEL is assuming the L level, the first current output circuit for outputting a 25-fold current is selected and connected to source signal line 18. Further, gate signal line 17*b* is under application of off-voltage (Vgh). Accordingly, the switching transistors 11*d* of the pixel rows (1) to (5) are in off-state, thus preventing current from passing through the EL devices 15 of the respective pixel rows. That is, these ET, devices are in the non-lighting state 52.

Ideally, the transistors 11*a* of five pixels each pass a current of Iw×2 through source signal line 18. Then, the capacitor 19 of each pixel 16 is programmed with a 5-fold current. Here, description is made on the assumption that transistors 11*a* are uniform in characteristics (Vt and S value) for easy understanding.

Since the number of pixel rows selected at a time is five (K=5), five driving transistors 11*a* operate. That is, a 5-fold (25/5=5) current passes through transistor 11*a* per pixel. Source signal line 18 is fed with a current as the sum of programming currents for the five transistors 11*a*. For example, assuming that the current to be passed through pixel row 51*a* to be written is Iw according to the conventional driving method, a current of Iw×25 is passed through source signal line 18. Pixel rows 51*b* to be written with image data after writing to pixel row (1) are now used as auxiliary pixel rows for increasing the amount of current to be fed to source signal line 18. However, there arises no problem because the pixel rows 51*b* will be written with regular image data thereafter.

Therefore, the pixel rows 51*b* each provide the same display as the pixel row 51*a* during a 1H period. For this reason, at least the written pixel row 51*a* and the pixel rows 51*b* selected for increasing the current are made to assume the non-lighting state 52.

In the subsequent ½H period (½ of the horizontal scanning period), only pixel row 51*a* to be written is selected. That is, only the first pixel row is selected. As apparent from FIG. 31, only gate signal line 17*a*(1) is applied with on-voltage (Vgl) while gate signal lines 17*a* (2) to 17*a*(5) applied with off-voltage (Vgh). Therefore, the transistor 11*a* of pixel row (1) is in an operating state (the state feeding current to source signal line 18), while the switching transistors 11b and transistors 11c of the pixel rows (2) to (5) are in off-state, or in the unselected state. Since the ISEL signal is assuming an H level, the current output circuit B for outputting a 5-fold current is selected and connected to source signal line 18. The state of gate signal line 17b is not changed from the state assumed in the first ½H period and hence is under application of off-voltage (Vgh). Accordingly, the switching transistors 11d of the pixel rows (1) to (5) are in off-state, thus preventing current from passing through the EL devices 15 of the respective pixel rows. That is, these pixel rows are in the non-lighting state 52.

The above-described operation causes the transistor 11a of the pixel row (1) to pass a current of Iw×5 through source signal line 18. Then, the capacitor 19 of each pixel row (1) is programmed with the 5-fold current.

In the next horizontal scanning period, the pixel row to be written is shifted by one pixel row. That is, the pixel row to be written is changed to pixel row (2). In the first ½H period, when the pixel row to be written is the second pixel row as shown in FIG. 31, gate signal lines 17a(2) to 17a(6) are in the selected state. That is, the switching transistors 11b and transistors 11c of pixels rows (2) to (6) are in on-state. Since the ISEL is assuming the L level, the first current output circuit for outputting a 25-fold current is selected and connected to source signal line 18. Further, gate signal line 17b is under application of off-voltage (Vgh). Accordingly, the switching transistors 11d of the pixel rows (2) to (6) are in off-state, thus preventing current from passing through the EL devices 15 of the respective pixel rows. That is, these pixel rows are in the non-lighting state 52. On the other hand, since the gate signal line 17b(1) of the pixel row (1) is under application of voltage Vgl, the transistor 11d of the pixel row (1) is in on-state and the EL device 15 of the pixel row (1) is in the lighting state.

Since the number of pixel rows selected at a time is five (K=5), five driving transistors 11a operate. That is, a 5-fold (25/5=5) current passes through transistor 11a per pixel. Source signal line 18 is fed with a current as the sum of programming currents for the five transistors 11a.

In the subsequent ½H period (½ of the horizontal scanning period), only pixel row 51a to be written is selected. That is, only the second pixel row is selected. As apparent from FIG. 31, only gate signal line 17a(2) is applied with on-voltage (Vgl) while gate signal lines 17a (3) to 17a(6) applied with off-voltage (Vgh). Therefore, the transistors 11a of the pixel rows (1) and (2) is in the operating state (the state where the pixel row (1) passes current through EL device 15 while the pixel row (2) feeds current to source signal line 18), while the switching transistors 11b and transistors 11c of the pixel rows (3) to (6) are in off state, or in the unselected state. Since the ISEL signal is assuming the H level, the second current output circuit for outputting the 5-fold current is selected. The state of gate signal line 17b is not changed from the state assumed in the first ½H period and hence is under application of off-voltage (Vgh). Accordingly, the switching transistors 11d of the pixel rows (2) to (6) are in off-state, thus preventing current from passing through the EL devices 15 of the respective pixel rows. That is, these pixel rows are in the non-lighting state 52.

The above-described operation causes the transistor 11a of the pixel row (2) to pass a current of Iw×5 through source signal line 18. Then, the capacitor 19 of the pixel row (2) is programmed with the 5-fold current. Display over one whole screen can be made by sequentially performing the above-described operations.

According to the driving method described in relation to FIG. 30, G pixel rows (G is 2 or more) are selected in the first period and each of the pixel rows is programmed so that an N-fold current will pass therethrough. In the second period subsequent to the first period, B pixel rows (B is not less than 1 and less than G) are selected and each of the pixel rows is programmed so that the N-fold current will pass therethrough.

However, another way is possible. G pixel rows (G is 2 or more) are selected in the first period and programming is made so that the total sum of currents to pass through the respective pixel rows assumes the N-fold value. In the second period subsequent to the first period, B pixel rows (B is not less than 1 and less than G) are selected and programming is made so that the total sum of currents to pass through the respective pixel rows assumes the N-fold value. (When one pixel row is selected, programming is made so that the current to pass therethrough assumes the N-fold value.) For example, five pixel rows are selected at a time in FIG. 30(a1) and a 2-fold current is passed through the transistor 11a of each pixel. By so doing, source signal line 18 is fed with a 10-fold (5×2) current. In the subsequent second period, one pixel row is selected in FIG. 30(b1). The 10-fold current is passed through transistor 11a of this pixel row. In the foregoing description related to FIG. 31, the period for selecting plural pixel rows at a time is set to ½H and the period for selecting one pixel row set to ½H. However, the present invention is not limited thereto. It is possible that the period for selecting plural pixel rows at a time is set to ¼H and the period for selecting one pixel row set to ¾H. Further, the sum of the period for selecting plural pixel rows at a time and the period for selecting one pixel row is set to 1H. However, the present invention is not limited thereto. For example, the sum of these periods may be set to a 2H period or a 1.5H period.

In the method of FIG. 30, it is possible that the period for selecting five pixel rows at a time is set to ½H and two pixel rows are selected at a time in the subsequent second period. In this case also, image display without no practical trouble can be realized.

In the foregoing description related to FIG. 30, two stages are provided consisting of the first period for selecting five pixel rows at a time, which is set to ½H, and the second period for selecting one pixel row, which is set to ½H. However, the present invention is not limited thereto. For example, three stages may be provided consisting of the first period for selecting five pixel rows at a time, the second period for selecting two of the five pixel rows, and the third period for selecting one pixel row. That is, it is possible to write image data to a pixel row at plural stages.

The above-described N-fold pulse driving method according to the present invention applies the same waveform to gate signal lines 17b of respective pixel rows while shifting the scanning at 1H intervals. Such a manner of scanning makes it possible to shift a pixel row to light to another sequentially with the lighting duration of each EL device 15 set to 1F/N. Such application of the same waveform to gate signal lines 17b of respective pixel rows and shifting of the scanning, can be easily realized. This is because it is sufficient to control data ST1 and data ST2 to be applied to shift register circuits 61a and 61b, respectively, shown in FIG. 6. Assuming that Vgl is outputted to gate signal line 17b when inputted ST2 assumes L level while Vgh is outputted to gate signal line 17b when inputted ST2 assumes H level, ST2 to be applied to shift register 17b is inputted at L level for a 1F/N period and at H level for the rest of the period. ST2 thus inputted should be shifted with clock CLK2 synchronizing to 1H.

The on-off cycle of EL device 15 needs to be set to 0.5 msec or longer. If this cycle is too short, complete black display is not realized due to human eyes having the afterimage property and, hence, the image displayed is seen to blur as if the resolution is lowered. Such a display state is the same as the display state of a display panel of the data holding type. On the other hand, if the on-off cycle is set to 100 msec or longer, the resulting display is seen to blink. For this reason, the on-off cycle of ET, device 15 has to be not less than 0.5 msec and not more than 100 msec, more preferably not less than 2 msec and not more than 30 msec, much more preferably not less than 3 msec and not more than 20 msec.

As described earlier, satisfactory motion picture display can be realized when the number by which black display screen 152 is divided (split) is one. However, flitter is likely seen on the screen. Therefore, it is preferable to split an inserted black display portion into plural blocks. However, too much increase in the number of such blocks results in a blurred motion picture. The number of blocks resulting from splitting has to be not less than 1 and not more than 8, preferably not less than 1 and not more than 5.

It is preferable to employ an arrangement capable of varying the number of split blocks of a black display depending on whether a stationary image or a motion picture image is to be displayed. When N=4, a black display occupies 75% of the screen and an image display occupies 25% of the screen. In this case, when the number of split blocks is one, the black display portion occupying 75% is scanned vertically of the screen so as to be viewed as a black band occupying 75%. When the number of split blocks is 3, scanning is made so that a black display occupying 25% of the screen is split into three black display blocks each occupying 25/3% of the screen. The number of split blocks is increased for stationary image display, whereas it is decreased for motion picture display Switching may be made either automatically in accordance with images inputted (through detection of a motion picture image or the like) or by a manual operation by the user. Alternatively, it is possible to employ an arrangement capable of switching in accordance with input contents corresponding to types of video images to be displayed by the display apparatus.

In a mobile phone for example, the number of split blocks is 10 or more when the screen is in a wallpaper display state or in an input screen state. (In an extreme case, on/off may be made 1H by 1H. In NTSC motion picture display the number of split blocks is not less than 1 and not more than 5. It is preferable to employ an arrangement capable of changing the number of split blocks in multiple stages, the number of which is 3 or more. For example, the number of blocks is changed stepwise like 0, 2, 4, 8.

The proportion of a black display relative to the whole display screen which is assumed to be 1 is preferably not less than 0.2 and not more than 0.9 (i.e., not less than 1.2 and not more than 9 in the units of N), particularly preferably not less than 0.25 and not more than 0.6 (i.e., not less than 1.25 and not more than 6 in the units of N.) If it is less than 0.20, the effect of improving motion picture display is low. If it is more than 0.9, the display portion exhibits an increased luminance and, hence, the vertical shifting of the display portion is easy to recognize visually.

The number of frames per second is preferably not less than 10 and not more than 100 (i.e., not less than 10 Hz and not more than 100 Hz), more preferably not less than 12 and not more than 65 (i.e., not less than 12 Hz and not more than 65 Hz.) If the number of frames is too small, screen flitter becomes conspicuous, while if it is too large, writing from the driver circuit 14 or the like becomes difficult, which results in a degraded resolution.

Anyway, the present invention is capable of varying the brightness of an image by control over gate signal line 17. It is needless to say that the brightness of an image may be varied with varying current (voltage) to be applied to source signal line 18. Also, it is needless to say that the control over gate signal line 17 described earlier (with reference to FIG. 33 or 35 or the like) may be combined with the art of varying the current (voltage) to be applied to source signal line 18.

Figure 43:
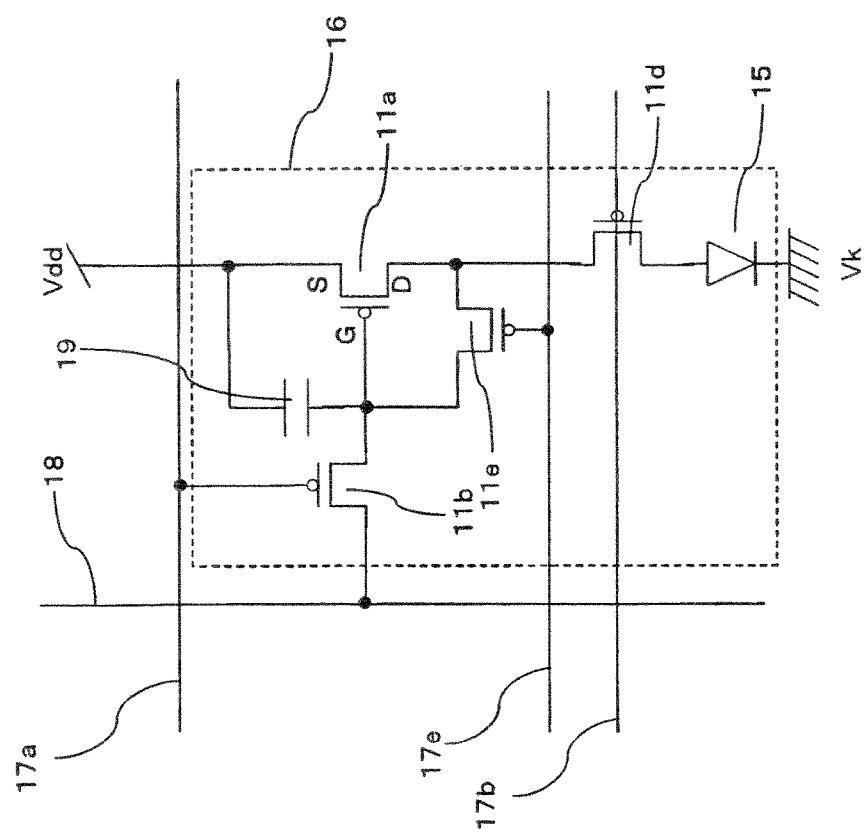
FIG. 43 is a diagram illustrating a pixel configuration of an EL display panel according to the present invention.
Figure 54:
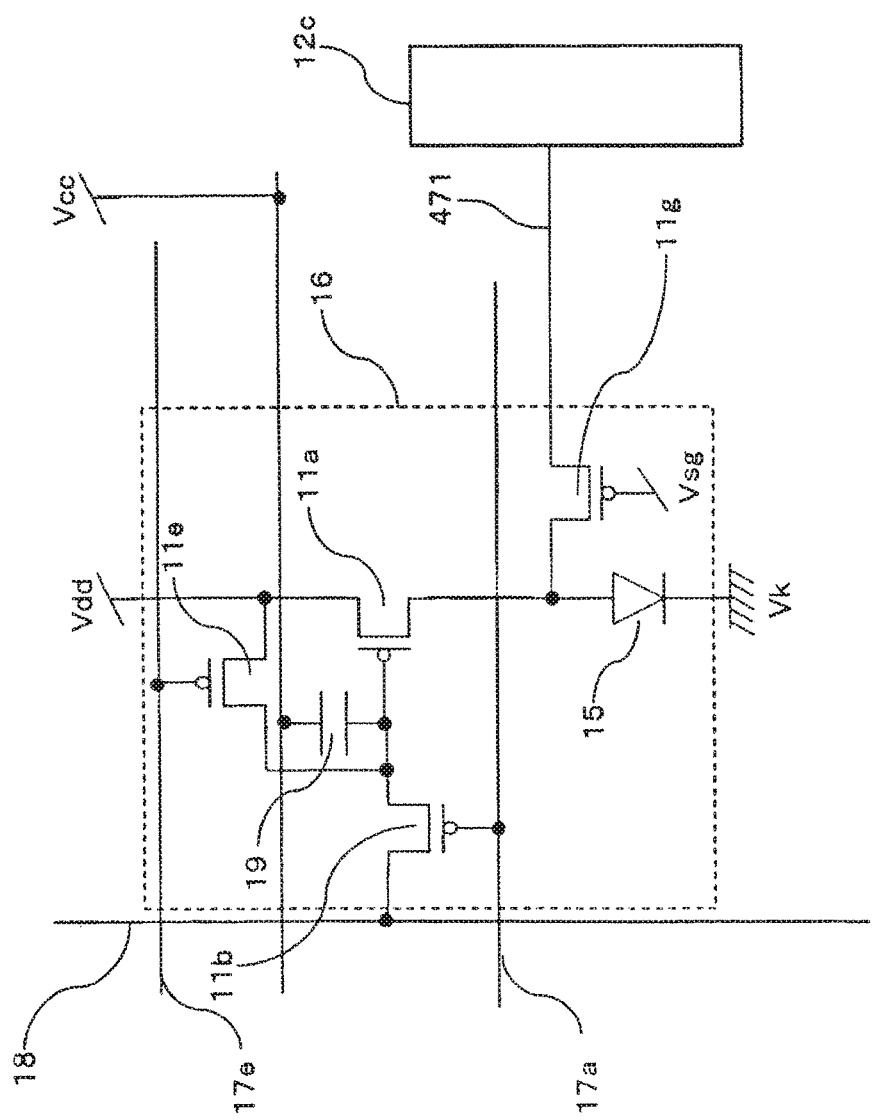
FIG. 54 is a diagram illustrating a pixel configuration of an EL display panel according to the present invention.

It is needless to say that the above-described matters are applicable to the current-based programming pixel configurations shown in FIG. 38 and the like and the voltage-based programming pixel configurations shown in FIGS. 43, 51 and 54 and the like. It is sufficient for the transistor 11*d* in each of FIGS. 38, 43 and 51 to be on-off controlled. By thus turning on/off the wiring for feeding EL device 15 with current, the N-fold pulse driving method according to the present invention can be realized easily.

Application of Vgl to gate signal line 17*b* for a 1F/N period may start at any time point in a 1F period (which is not limited and may be any unit period.) This is because the purpose of such application is to obtain a predetermined mean luminance by making EL device 15 assume on-state for a predetermined period of a unit time. However, EL device 15 had better be caused to emit light by application of Vgl to gate signal line 17*b* immediately after lapse of a current-based programming period (1H). This is because EL device 15 becomes less susceptible to the influence from the current holding characteristic of capacitor 19 in FIG. 1.

It is also preferable to employ an arrangement capable of varying the number by which an image is to be split. For example, when the user depresses a brightness adjustor switch or turns a brightness adjustor volume, the value of K is varied depending on this change detected. Alternatively, it is possible to employ an arrangement such as to vary the number either manually or automatically in accordance with the particulars of or data on an image to be displayed.

Such an arrangement for varying the value of K (i.e., the number by which image display portion 53 is to be split) can be realized easily. This is because it is sufficient to provide an arrangement capable of controlling or varying the timing at which data is applied to ST in FIG. 6 (i.e., the timing at which ST is made to assume L level in a 1F period.)

While description in relation to FIG. 16 and the like has been made of the feature that a (1F/N) period for which gate signal line 17*b* is applied with Vgl is divided into plural subperiods (the number of subperiods is K) and gate signal line 17*b* is applied with Vgl for a 1F/(K·N) period K times, there is no limitation to this feature. Gate signal line 17*b* may be applied with Vgl for a 1F/(K·N) period L times (L≠K). That is, the present invention has the feature that image 50 is displayed by controlling the period (time) for which EL device 15 is fed with current. Therefore, the art of repeating the 1F/(K·N) period L times (L≠K) is included in the technical concept of the present invention. The luminance of image 50 can be varied digitally with a variation in the value of L. For example, the difference between the case of L=2 and the case of L=3 corresponds to a 50% change in luminance (contrast). It is needless to say that these controls are applicable to other embodiments of the present invention. (Of course, they are applicable to embodiments of the present invention to be described hereinafter.) Such controls are included in the scope of the N-fold pulse driving method according to the present invention.

The foregoing embodiments are each configured to cause the display of screen 50 to be turned on/off by controlling transistor 11d serving as a switching device located (or formed) between EL device 15 and driving transistor 11a. This driving method solves the problem of insufficient writing with current in a black display state of a current-based programming configuration, thereby realizing a satisfactory resolution or black display. That is, the current-based programming is highly advantageous in that a satisfactory black display can be realized. The driving method to be described next is a method capable of realizing a satisfactory black display by resetting driving transistor 11a. Hereinafter, this embodiment will be described with reference to FIG. 32.

The pixel configuration shown in FIG. 32 is basically the same as that shown is FIG. 1. In the pixel configuration shown in FIG. 32, current Iw as programmed is passed through EL device 15 to cause EL device 15 to emit light. That is, driving transistor 11a becomes capable of holding the ability to pass the current when programmed. The driving method applied to the FIG. 32 configuration is a method which utilizes the ability to pass current to reset (or turn off) transistor 11a. Hereinafter, this type of driving will be referred to as "reset driving".

In order to realize the reset driving with the pixel configuration of FIG. 1, an arrangement capable of on-off controlling transistors 11b and 11c independently of each other is needed. Specifically, such an arrangement is capable of controlling gate signal line 17a (gate signal line WR) for on-off controlling transistor 11b and signal line 17c (gate signal line EL) for on-off controlling transistor 11c, independently of each other. Controls over gate signal lines 17a and 17c can be achieved using two independent shift registers 61 as shown in FIG. 6.

The driving voltage for gate signal line WR and that for gate signal line EL preferably are made different from each other. The amplitude of the driving voltage for gate signal line WR (the difference between on-voltage and off-voltage) is made smaller than that of the driving voltage for gate signal line EL. Basically, if the amplitude of the driving voltage for a gate signal line is large, a punch-through voltage across the gate signal line and the pixel becomes high, which causes black in relief to occur. The amplitude of the driving voltage for a gate signal line WR can be adjusted by controlling the potential of source signal line 18 not to be applied (or to be applied in the selected state) to pixel 16. Since fluctuations in the potential of source signal line 18 are small, the amplitude of the driving voltage for gate signal line WR can be decreased. On the other hand, gate signal line EL is required to on-off control the ET, device. Therefore, the amplitude of the driving voltage for gate signal line EL is large. As a measure to deal with this inconvenience, the output voltages of the respective shift registers 61a and 61b are made different from each other. In the case where each pixel comprises p-channel transistors, the off-voltages Vgh of the respective shift registers 61a and 61b are substantially equalized to each other, while the on-voltage Vgl of shift register 61a is made lower than that of shift register 61b.

Figure 33:
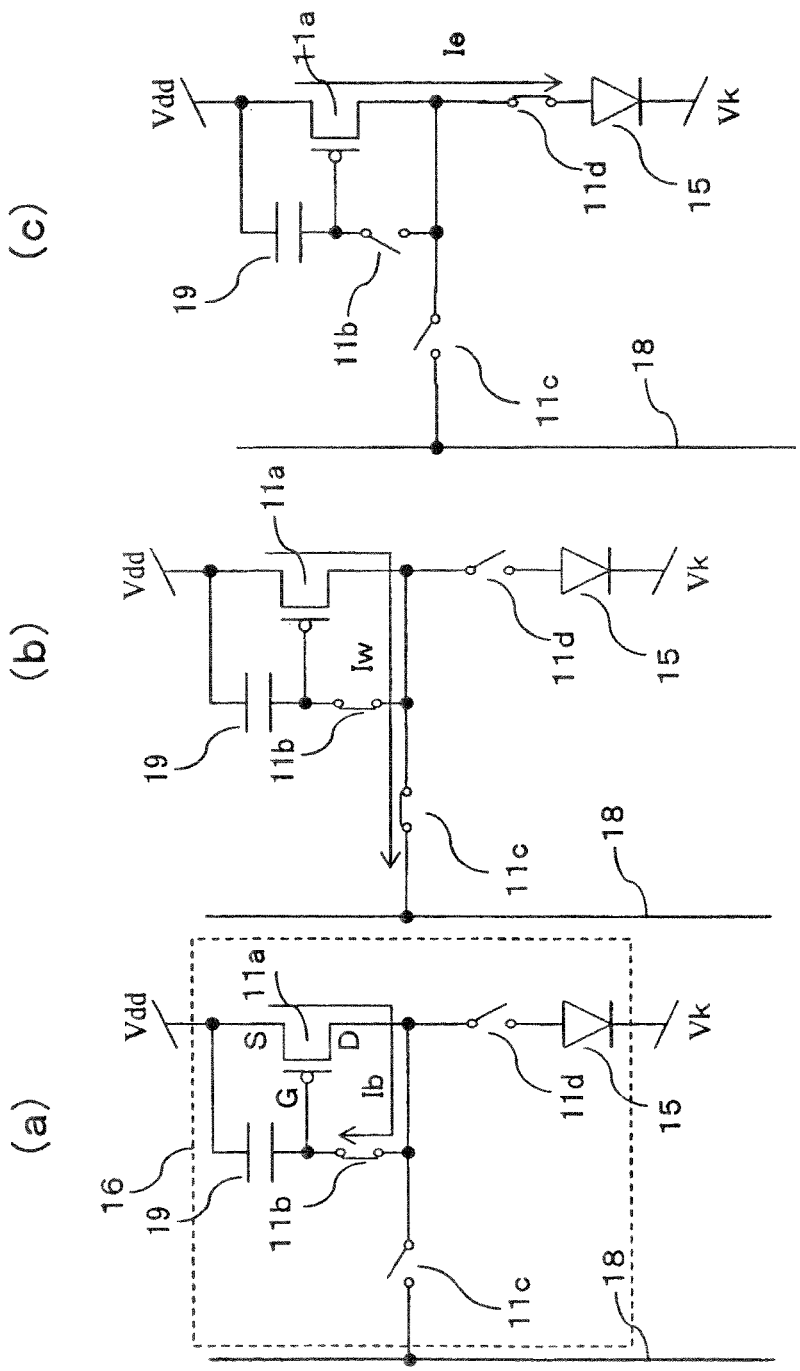
FIG. 33 is an explanatory diagram illustrating a method of driving an EL display apparatus according to the present invention.

Hereinafter, the reset driving method will be described with reference to FIG. 33. FIG. 33 is an explanatory diagram illustrating the principle of the reset driving method. First, as shown in FIG. 33(a), transistors 11c and 11d are turned off, while transistor 11b turned on. Then, the drain terminal (D) and the gate terminal (G) of driving transistor 11a are shortcircuited, thus allowing current Ib to pass therethrough. Generally, transistor 11a has been programmed with current in the immediately preceding field (frame) and hence has the ability to pass current. When transistors 11d and 11b assume off-state and on-state, respectively, with transistor 11a in that condition, driving current Ib is passed to the gate terminal (G) of transistor 11a, so that the potential at the gate terminal (G) and that at the drain terminal (D) are equalized to each other, thus resetting transistor 11a (to a state not allowing current to pass therethrough).

The reset state (the state not allowing current to pass) of transistor 11a is equivalent to an offset voltage holding state of a voltage offset canceller configuration, which will be described later with reference to FIG. 51 and the like. That is, in the state shown in FIG. 33(a), an offset voltage is held across the terminals of capacitor 19. This offset voltage has a voltage value which varies with variations in the characteristics of transistor 11a. Therefore, when the operation illustrated in FIG. 33(a) is performed, transistor 11a does not pass current to capacitor 19 of each pixel 19. (That is, a black display current (substantially equal to zero) is held.)

It is preferable to perform an operation of turning transistors 11b and 11c off and transistor 11d on to pass the driving current through driving transistor 11a prior to the operation illustrated in FIG. 33(a). Preferably, this operation is completed in a very short time. This is because current might pass through EL device 15 to cause it to light thereby causing the display contrast to lower. The time period for this operation is preferably not less than 0.1% and not more than 10% of a 1H period (one horizontal scanning period), more preferably not less than 0.2% and not more than 2% of a 1H period. Stated otherwise, the time period is preferably not less than 0.2 μsec and not more than 5 μsec. The aforementioned operation (the operation to be performed before the operation of FIG. 33(a)) may be performed on all the pixels 16 present in the whole screen collectively. The operations described above can cause the drain terminal (D) voltage of driving transistor 11a to lower thereby allowing current Ib to pass smoothly in the state shown in FIG. 33(a). The above-described matters are applicable to other reset driving methods of the present invention.

As the state shown in FIG. 33(a) continues for a longer time, the terminal voltage of capacitor 19 tends to become lower due to passage of current Ib. Therefore, the time period for which the state shown in FIG. 33(a) continues needs to be fixed. According to the experiment and study conducted by the inventors et al, the time period for which the state shown in FIG. 33(a) continues is preferably not less than 1H and not more than 5H. Preferably, this period is varied depending on R, G and B pixels. This is because these different color pixels employ different EL materials, which are different in threshold voltage and the like from each other. The optimum periods for the respective R, G and B pixels are established depending on the respective EL materials. Though this period is set not less than 1H and not more than 5H in this embodiment, it is needless to say that the period may be set to 5H or more in a driving method based mainly on insertion of a black display (writing of a black display to the screen.) It should be noted that the black display state of each pixel becomes better as this period becomes longer.

After the state shown in FIG. 33(a) continued for the time period not less than 1H and not more than 5H, the pixel configuration is turned into the state shown in FIG. 33(b). In the state shown in FIG. 33(b), transistors 11c and 11b are in on-state, while transistor 11d in off-state. As described earlier, the state shown in FIG. 33(b) is a state where current-based programming is being performed. That is, source driver 14 outputs (or absorbs) programming current Iw to driving transistor 11a. Driving transistor 11a is programmed to have such a gate terminal (G) potential as to cause current Iw to pass. (The potential thus set is held in capacitor 19.)

If the programming current Iw is 0 (A), transistor 11a is kept in the state shown in FIG. 33(a) which does not allow current to pass, thus realizing a satisfactory black display. In the case of current-based programming for a white display by the state shown in FIG. 33(b), perfect current-based programming can be achieved from the offset voltage providing a black display even when there are variations in the characteristics of driving transistors of pixels. Therefore, the times required for respective driving transistors to be programmed with a target value are equalized to each other for each gray level. For this reason, there occurs no gray scale error due to variations in the characteristics of transistors 11a and, hence, satisfactory image display can be realized.

After the current-based programming in the state shown in FIG. 33(b), transistors 11b and 11c are turned off and transistor 11d turned on to cause driving transistor 11a to pass programming current Iw (=Ie) through EL device 15, thereby causing EL device 15 to emit light. Description of the details of the state shown in FIG. 33(c) will be omitted since similar description has bee made earlier with reference to FIG. 1 and the like.

The driving method (reset driving) illustrated in FIG. 33 comprises: a first operation in which driving transistor 11a and EL device 15 are disconnected from each other (or turned into a state preventing current from passing therebetween), while the drain terminal (D) and the gate terminal (G) of driving transistor 11a (alternatively, the source terminal (5) and the gate terminal (G) of driving transistor 11a; in more general term, two terminals of driving transistor 11a including the gate terminal (G)) are shortcircuited; and a second operation in which driving transistor 11a is programmed with current (voltage) after the first operation. It is at least required that the second operation be performed after the first operation. For the reset driving to be effected, it is necessary to provide an arrangement capable of controlling transistors 11b and 11c independently of each other as shown in FIG. 32.

The image display state changes as follows (provided instantaneous changes can be observed.) First, a pixel row to be programmed with current is turned into a reset state (i.e., black display state). After lapse of 1H, current-based programming is performed. (At this time, image display is still in the black display state because transistor 11d is in off-state.) Subsequently, each EL device 15 is fed with current, so that the pixel row emits light at a predetermined luminance (with a current as programmed). Specifically, it should be seen that the pixel row displaying black moves downwardly of the screen and the image displayed is rewritten at a position that the pixel row has just passed. Though the current-based programming is performed 1H after the resetting according to the above description, the period between the programming and the resetting may be about 5H or less. This is because a relatively long time is required for the resetting operation shown in FIG. 33(a) to be completed. If this period is set to 5H, five pixel rows will display black. (If the pixel row programmed with current is taken into account, six pixel rows will display black.)

There is no limitation to the feature that resetting is made pixel row by pixel row, but a set of plural pixel rows may be reset at a time; that is, resetting may made plural pixel rows by plural pixel rows. Alternatively, it is possible to perform resetting plural pixel rows by plural pixel rows while performing overlapped scanning. For example, if four pixel rows are to be reset at a time, an exemplary manner of driving is as follows: pixel rows (1) to (4) are reset in the first horizontal scanning period (one unit); subsequently, pixel rows (3) to (6) reset in the second horizontal scanning period; subsequently, pixel rows (5) to (8) reset in the third horizontal scanning period; and then, pixel rows (7) to (10) reset in the fourth horizontal scanning period. Of course, the driving operations shown in FIGS. 33(b) and 33(c) are performed in synchronism with the driving operation shown in FIG. 33(a).

It is needless to say that the driving operations shown in FIGS. 33(b) and 33(c) may be performed after all of the pixels present in one screen have been reset either at a time or in a scanned fashion. It is also needless to say that interlaced driving (scanning every other pixel row or every other set of plural pixel rows) may be effected to reset every other pixel row or every other set of plural pixel rows. Random resetting is also possible. The reset driving according to the present invention described above is a method adapted to operate pixel rows. (That is, control is made vertically of the screen.) The concept of the reset driving is not limited to the control in the direction in which pixel rows are arranged. It is needless to say that the reset driving may be performed in the direction in which pixel columns are arranged for example.

The reset driving method illustrated in FIG. 33 can realize better image display if combined with the N-fold pulse driving method or a like method according to the present invention or with the interlaced driving method. The method illustrated in FIG. 22, in particular, can easily realize an intermittent N/K-fold pulse driving method. (This is a driving method including providing plural lighting regions on one screen. This driving method can be easily practiced if gate signal line 17b is controlled so as to turn transistor 11d on/off. This feature has been described earlier.) Therefore, satisfactory image display free of flicker can be realized. This is an excellent characteristic of the method illustrated in FIG. 22 or its variations. It is also needless to say that the reset driving method can realize much better image display if combined with other driving methods including, for example, the reverse bias driving method, precharge driving method and punch-through voltage driving method to be described later. Thus, it is needless to say that the reset driving method can be implemented in combination with other embodiments herein described.

Figure 34:
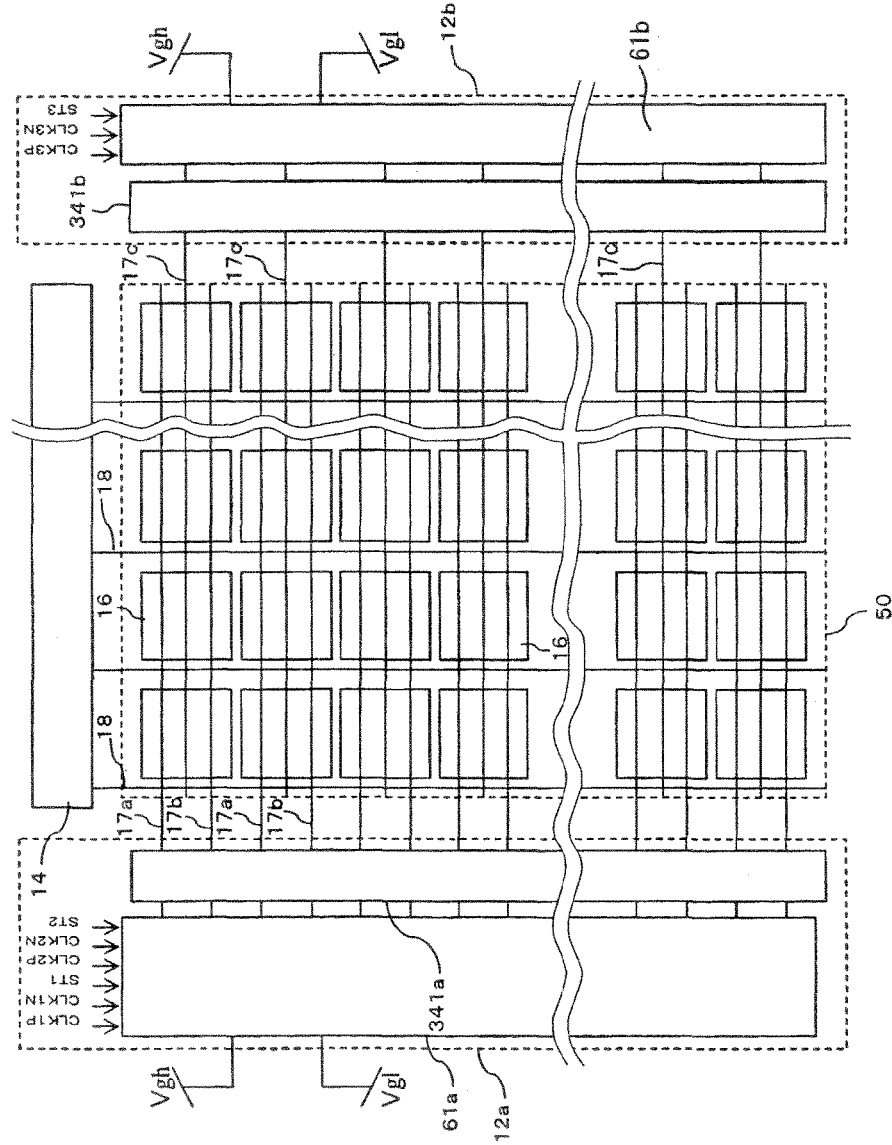
FIG. 34 is a diagram illustrating a configuration of an EL display apparatus according to the present invention.

FIG. 34 is a diagram showing the configuration of a display apparatus for realizing the reset driving. Gate driver 12a controls gate signal lines 17a and 17b of FIG. 32. Application of on-voltage and off-voltage to gate signal line 17a allows transistor 11b to be on-off controlled. Application of on-voltage and off-voltage to gate signal line 17b allows transistor 11d to be on-off controlled. Gate driver 12b controls gate signal line 17c of FIG. 32. Application of on-voltage and off-voltage to gate signal line 17c allows transistor 11c to be on-off controlled.

Thus, gate signal lines 17a and 17c are operated by gate drivers 12a and 12b, respectively. For this reason, it is possible to freely control the timing at which transistor 11b is turned on to reset driving transistor 11a and the timing at which transistor 11c is turned on to program driving transistor 11a with current. Reference character 341a in FIG. 34 designates the circuit of an output section. Since other features and the like are identical with or similar to the features described earlier, description thereof will be omitted.

Figure 35:
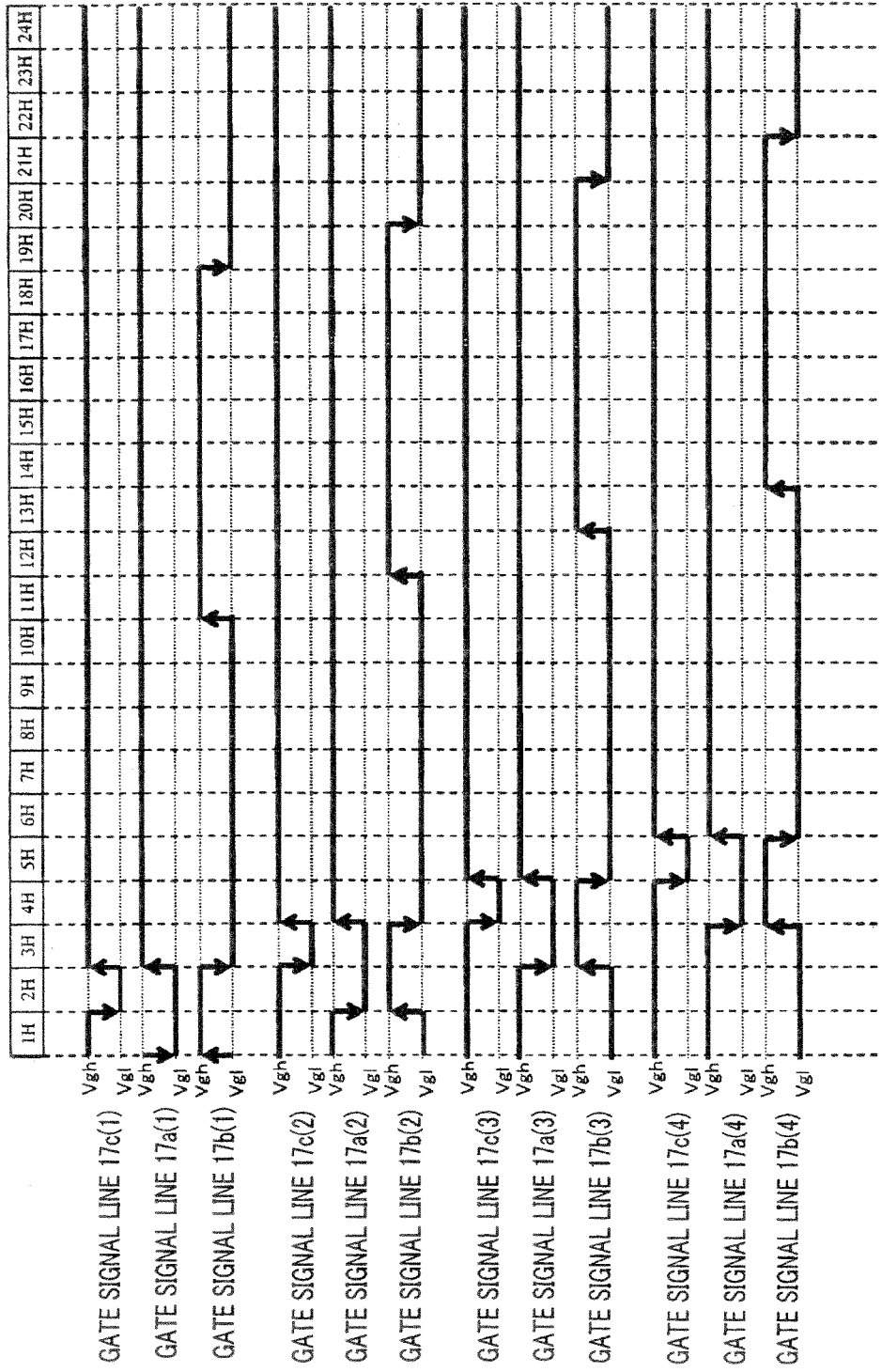
FIG. 35 is an explanatory chart illustrating a method of driving an EL display apparatus according to the present invention.

FIG. 35 is a timing chart of the reset driving. When transistor 11a is reset by applying on-voltage to gate signal line 17a to turn transistor 11b on, transistor 11d is turned off by application of off-voltage to gate signal line 17b. Thus, the configuration assumes the state shown in FIG. 32(a). During this period, current Ib is passed.

According to the timing chart of FIG. 35, reset time is set to 2H (during which gate signal line is under application of on-voltage and hence transistor 11b is in on-state.) However, there is no limitation to this feature, but the reset time may be 2H or more. In the case where resetting can be made very rapidly the rest time may be less than 1H. The reset time can be varied to any desired H period easily by varying the pulse period of DATA (ST) to be inputted to gate driver 12. For example, if DATA to be inputted to ST terminal assumes H level for a 2H period, the reset time outputted from each gate signal line 17a is a 2H period. Similarly, if DATA to be inputted to ST terminal assumes H level for a 5H period, the reset time outputted from each gate signal line 17a is a 5H period.

After the reset state for a 1H period, gate signal line 17c(1) of pixel row (1) is applied with on-voltage. When transistor 11c is turned on, driving transistor 11a is written with the programming current applied to source signal line 18 via transistor 11c.

After the current-based programming, gate signal line 17c of pixel row (1) is applied with off-voltage to turn transistor 11c off, thereby disconnecting each pixel from source signal line 18. At the same time, gate signal line 17a is also applied with off-voltage to release driving transistor 11a from the reset state. (In this period, the expression "current-based programmed state" is more proper than the expression "reset state".) Further, gate signal line 17b is applied with on-voltage to turn transistor 11d on, thereby causing the current programmed at driving transistor 11a to be passed through EL device 15. Since the operation on pixel row (2) and the succeeding pixel rows is the same as that on pixel row (1) and since that operation is obvious from FIG. 35, description thereof will be omitted.

Figure 36:
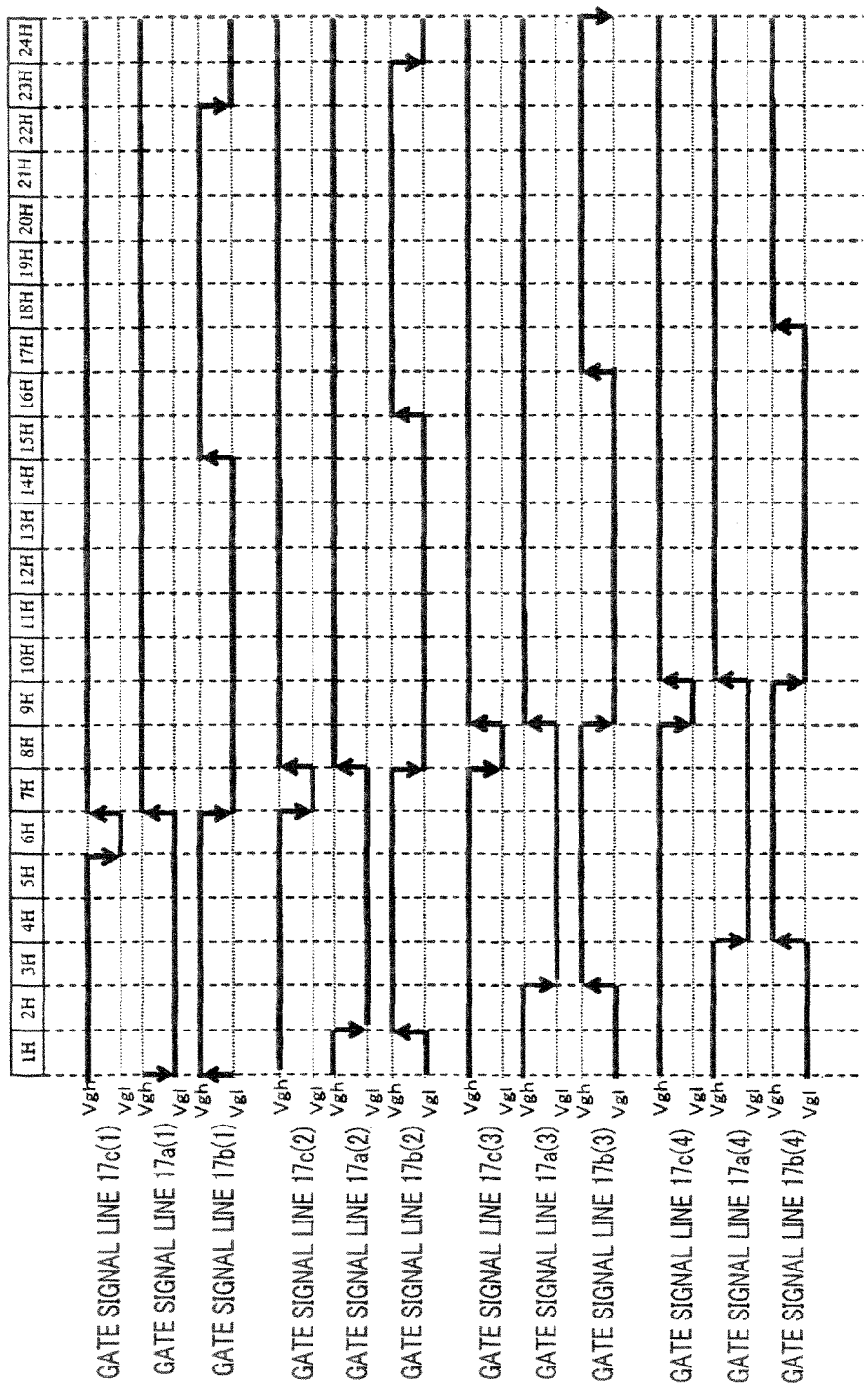
FIG. 36 is an explanatory chart illustrating a method of driving an EL display apparatus according to the present invention.

In FIG. 35, the reset period is a 1H period. FIG. 36 illustrates an embodiment having a reset period of 5H. The reset period can be varied to any desired H period easily by varying the pulse period of DATA (ST) to be inputted to gate driver 12. FIG. 36 is directed to the embodiment having settings such that DATA to be inputted to ST1 terminal of gate driver 12a assumes H level for a 5H period and the reset period outputted from each gate signal line 17a is a 5H period. As the reset period becomes longer, more perfect resetting is achieved, thus realizing better black display. However, the display luminance is lowered by a degree corresponding to the proportion of the reset period.

In the embodiment of FIG. 36, the reset period is set to 5H and the reset state is continuous. However, there is no limitation to such a continuous reset state. For example, it is possible to turn on/off the signal outputted from each gate signal line 17a on a 1H basis. Such an on-off operation can be easily realized by operating an enabling circuit (not shown) formed in the output section of the shift register or controlling the DATA (ST) pulse to be inputted to gate driver 12.

Figure 37:
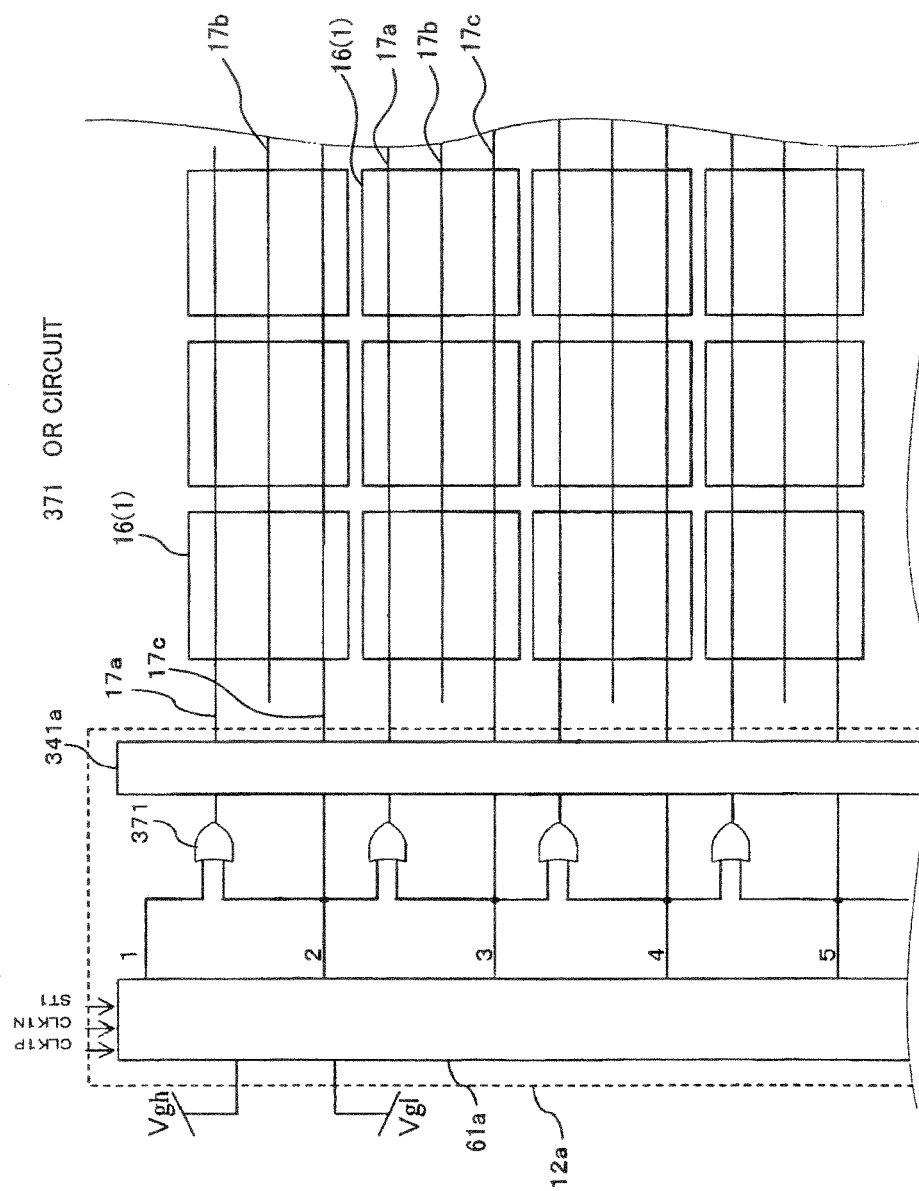
FIG. 37 is a diagram illustrating a configuration of an EL display apparatus according to the present invention.

The circuit configuration shown in FIG. 34 requires at least two shift register circuits (one for controlling gate signal line 17a and the other for controlling gate signal line 17b.) For this reason, there arises a problem of gate driver 12a having an increased circuit scale. FIG. 37 shows an embodiment wherein gate driver 12a has a single shift register. The timing chart of output signals in the operation of the circuit of FIG. 37 is as shown in FIG. 35. Attention should be given to FIGS. 35 and 37 which use different signs to designate each of gate signal lines 17 extending from gate drivers 12a and 12b.

As can be clearly understood from the configuration of FIG. 37 which additionally includes OR circuit 371, OR is taken from the output of the current stage and the output of the preceding stage of shift register circuit 61a and outputted to each gate signal 17a. That is, gate signal line 17a outputs on-voltage for a 2H period. On the other hand, the output of shift register 61a, as it is, is outputted to gate signal line 17c. Therefore, gate signal line 17c is under application of on-voltage for a 1H period.

For example, when an H level signal is outputted to the second stage of shift register circuit 61a, on-voltage is outputted to gate signal line 17c of pixel 16(1), thus making pixel 16(1) programmed with current (or voltage). At the same time, on-voltage is also outputted to gate signal line 17a of pixel 16(2) to turn on transistor 11b of pixel 16(2), thus resetting driving transistor 11a of pixel 16(2).

Similarly, when an H level signal is outputted to the third stage of shift register circuit 61a, on-voltage is outputted to gate signal line 17c of pixel 16(2), thus making pixel 16(2) programmed with current (or voltage). At the same time, on-voltage is also outputted to gate signal line 17a of pixel 16(3) to turn on transistor 11b of pixel 16(3), thus resetting driving transistor 11a of pixel 16(3). That is, gate signal line 17a continues to output on-voltage for a 2H period, while gate signal line 17c continues to be applied with on-voltage for a 1H period.

Transistors 11b and 11c assume on-state (see FIG. 33(b)) at the same time when each pixel is programmed (see FIG. 33(b)). For this reason, if transistor 11c is turned into off-state prior to transistor 11b in switching the pixel to an unprogrammed state, transistor 11a assumes the reset state shown in FIG. 33(b) undesirably. To avoid this inconvenience, transistor 11c needs to be turned off after the turning-off of transistor 11b. Accordingly, it is required that control be performed so that gate signal line 17a can be applied with on-voltage prior to the application of on-voltage to gate signal line 17c.

Figure 39:
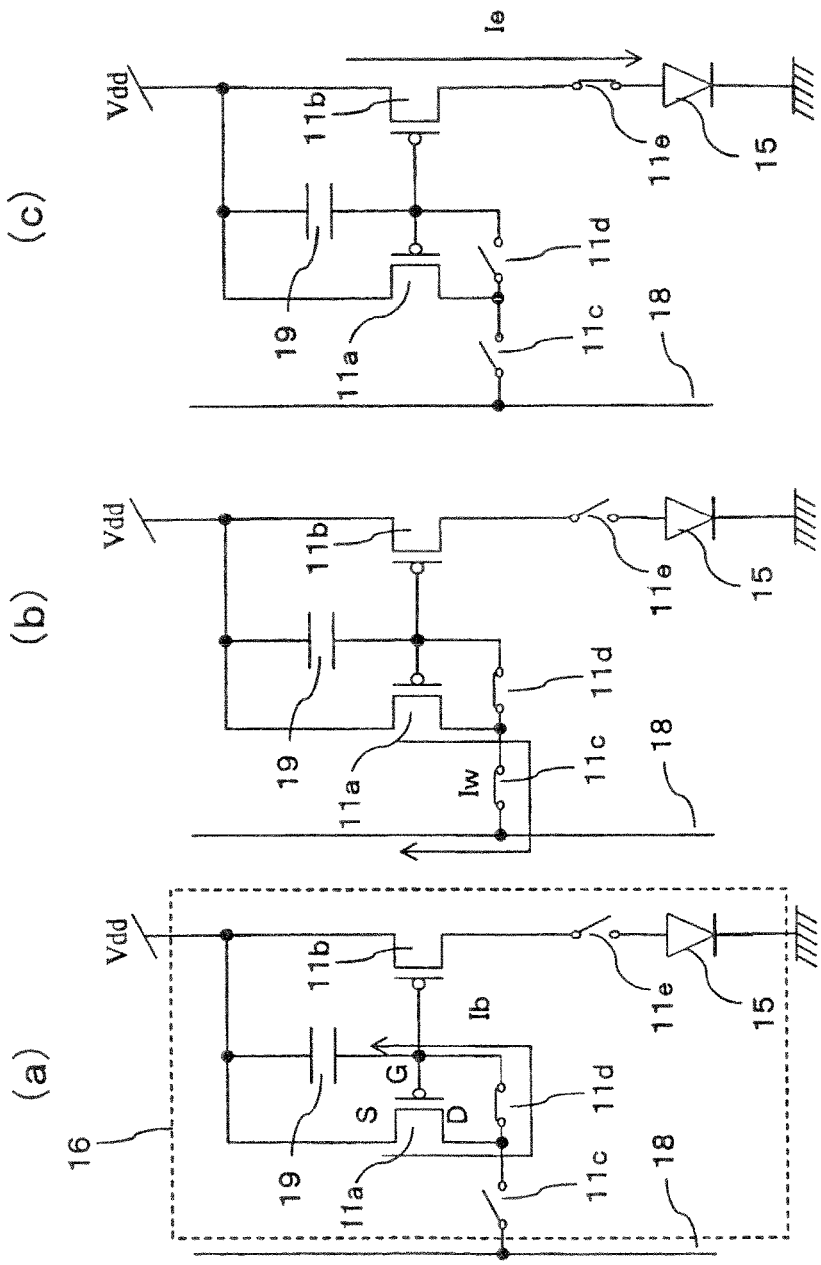
FIG. 39 is an explanatory diagram illustrating a method of driving an EL display apparatus according to the present invention.

The foregoing embodiment is applied to the pixel configuration shown in FIG. 32 (basically FIG. 1). However, the present invention is not limited thereto. For example, this embodiment is applicable to a current mirror pixel configuration as shown in FIG. 38. With the pixel configuration of FIG. 38, the N-fold pulse driving method as illustrated in FIG. 13 or 15 or the like can be practiced by on-off control over transistor 11e. FIG. 39 is an explanatory diagram illustrating an embodiment based on the current mirror pixel configuration shown in FIG. 38. Hereinafter, a reset driving method applied to the current mirror pixel configuration will be described with reference to FIG. 39.

As shown in FIG. 39(a), transistors 11c and 11e are turned off, while transistor 11d turned on. Then, the drain terminal (D) and the gate terminal (G) of current-based programming transistor 11b are shortcircuited, thus allowing current Ib to pass therethrough. Generally, transistor 11b has been programmed with current in an immediately preceding field (frame) and hence has the ability to pass current. (This is natural because the gate potential is held by capacitor 19 for a 1F period to perform image display. However, current is not passed in the case of perfect black display.) When transistors 11e and 11d assume off-state and on-state, respectively, with transistor 11b in that condition, driving current Ib is passed toward the gate terminal (G) of transistor 11a. (That is, gate terminal (G) and drain terminal (D) become shortcircuited.) Accordingly, the potential at the gate terminal (G) and that at the drain terminal (D) are equalized to each other, thus resetting transistor 11a (to a state not allowing current to pass). Since the gate terminal (G) of driving transistor 11b and that of current-based programming transistor 11a are common, driving transistor 11b is also reset.

Each of the reset states (the state not allowing current to pass) of respective transistors 11a and 11b is equivalent to an offset voltage holding state of the voltage offset canceller configuration, which will be described later with reference to FIG. 51 and the like. That is, in the state shown in FIG. 39(a), an offset voltage is held across the terminals of capacitor 19. (The offset voltage is an initiating voltage causing current to start passing. Application of a voltage having an absolute value equal to or larger than the absolute value of the offset voltage causes current to pass through transistor 11.) This offset voltage has a voltage value which is variable in accordance with the characteristics of transistors 11a and 11b. Therefore, when the operation illustrated in FIG. 39(a) is performed, transistors 11a and 11b do not pass current to capacitor 19 of each pixel. (That is, a black display current (substantially equal to zero) state is kept; stated otherwise, resetting to the initiating voltage causing current to start passing is made.)

As in the case of FIG. 33(a), as the reset state shown in FIG. 39(a) continues for a longer time, the terminal voltage of capacitor 19 tends to become lower due to passage of current Ib. Therefore, the time period for which the state shown in FIG. 39(a) continues needs to be fixed. According to the experiment and study conducted by the inventors et al., the time period for which the state shown in FIG. 33(a) continues is preferably not less than 1H and not more than 10H (10 horizontal scanning periods), more preferably not less than 1H and not more than 5H. Specifically, the time period is preferably not less than 20 μsec and not more than 2 msec. This holds true for the driving method illustrated in FIG. 33.

As in the case of FIG. 33(a), when the operation is performed so that the reset state shown in FIG. 39(a) synchronizes to the current-based programmed state shown in FIG. 39(a), the time period required for the current-based programmed state shown in FIG. 39(b) to be reached from the reset state shown in FIG. 39(a) has a fixed value (constant value) and, therefore, there arises no problem. That is, the time period from the reset state shown in FIG. 33(a) or 39(a) to the current-based programmed state shown in FIG. 33(b) or 39(b) is preferably not less than 1H and not more than 10H (10 horizontal scanning periods), more preferably not less than 1H and not more than 5H. Specifically, the time period is preferably not less than 20 μsec and not more than 2 msec. If this time period is too short, driving transistor 11 is not completely reset, while if it is too long, driving transistor 11 assumes complete off-state, which in turn results in the current-based programming taking a longer time. In addition, the luminance of screen 50 is lowered.

Subsequently to the state shown in FIG. 39(a), the pixel configuration is turned into the state shown in FIG. 39(b) where transistors 11c and 11b are in on-state, while transistor 11d in off-state. The state shown in FIG. 39(b) is a state where current-based programming is being performed. That is, source driver 14 outputs (or absorbs) programming current Iw and passes the programming current Iw to driving transistor 11a. Capacitor 19 is programmed with the gate terminal (G) potential of driving transistor 11b so that current Iw will pass through driving transistor 11a.

If the programming current Iw is 0 (A) (black display), transistor 11b is kept in the state shown in FIG. 33(a) which does not allow current to pass, thus realizing a favorable black display. In the case of current-based programming for white display by the state shown in FIG. 39(b), perfect current-based programming can be achieved from the offset voltage providing a black display (the initiating voltage causing the current set in accordance with the characteristics of driving transistors to start passing) even when there are variations in the characteristics of driving transistors of respective pixels. Therefore, the times required for respective driving transistors to be programmed with a current of a target value are equalized to each other for each gray level. For this reason, there occurs no gray scale error due to variations in the characteristics of transistors 11a or 11b and, hence, satisfactory image display can be realized.

After the current-based programming in the state shown in FIG. 39(b), transistors 11b and 11c are turned off and transistor 11e turned on to cause driving transistor 11b to pass programming current Iw (=Ie) through EL device 15, thereby causing EL device 15 to emit light. Description of the details of the state shown in FIG. 39(c) will be omitted since similar description has bee made earlier.

The driving method (reset driving) illustrated in FIG. 33 or 39 comprises: a first operation in which driving transistor 11a or 11b and EL device 15 are disconnected from each other (or turned into a state preventing current from passing therebetween by transistor 11e or 11d), while the drain terminal (D) and the gate terminal (G) of the driving transistor (alternatively, the source terminal (S) and the gate terminal (G) of the driving transistor, more generally, two terminals of the driving transistor including gate terminal (G)) are shortcircuited; and a second operation in which the driving transistor is programmed with current (or voltage) after the first operation. It is at least required that the second operation be performed after the first operation. The operation of disconnecting driving transistor 11a or 11b and EL device 15 from each other is not necessarily indispensable. Even if the first operation of shortcircuiting the drain terminal (D) and the gate terminal (G) of the driving transistor is performed without disconnecting driving transistor 11a or 11b and EL device 15 from each other, it is possible that variations in the reset state are not so serious in some cases. Whether driving transistor 11a or 11b is to be disconnected from EL device 15 or not is decided based on examination of the transistor characteristics of the array manufactured.

The current mirror pixel configuration shown in FIG. 39 is a driving method including resetting the current-based programming transistor 11a, which results in the resetting of the driving transistor 11b.

With the current mirror pixel configuration of FIG. 39, the operation of disconnecting driving transistor 11b and EL device 15 from each other need not necessarily be performed in the reset state. Thus, the driving method comprises: a first operation in which the drain terminal (D) and the gate terminal (G) of the current-based programming transistor (alternatively, the source terminal (S) and the gate terminal (G) of the current-based programming transistor, more generally, two terminals of the current-based programming transistor or the driving transistor including gate terminal (G)) are shortcircuited; and a second operation in which the current-based programming transistor is programmed with current (or voltage) after the first operation. It is at least required that the second operation be performed after the first operation.

The image display state changes as follows (provided instantaneous changes can be observed.) First, a pixel row to be programmed with current is turned into a reset state (i.e., black display state). After lapse of 1H, current-based programming is performed. Specifically, it should be seen that the pixel row displaying black moves downwardly of the screen and the image displayed is rewritten at a position that the pixel row has just passed.

Though the foregoing description of the embodiment is directed mainly to the current-based programming pixel configuration, the reset driving according to the present invention is applicable to voltage-based programming pixel configurations. FIG. 43 is an explanatory diagram illustrating a pixel configuration (panel configuration) according to the present invention for practicing a reset driving method with a voltage-based programming pixel configuration.

In the pixel configuration shown in FIG. 43, there is formed transistor 11*e* for causing driving transistor 11*a* to be reset. When gate signal line 17*e* is applied with on-voltage to turn transistor 11*e* on, which causes the gate terminal (G) and the drain terminal (D) of driving transistor 11*a* to become shortcircuited. The pixel configuration is also formed with transistor 11*d* for cutting off the current path between EL device 15 and driving transistor 11*d*. Hereinafter, the reset driving method applied to the voltage-based programming pixel configuration will be described with reference to FIG. 44.

Figure 44:
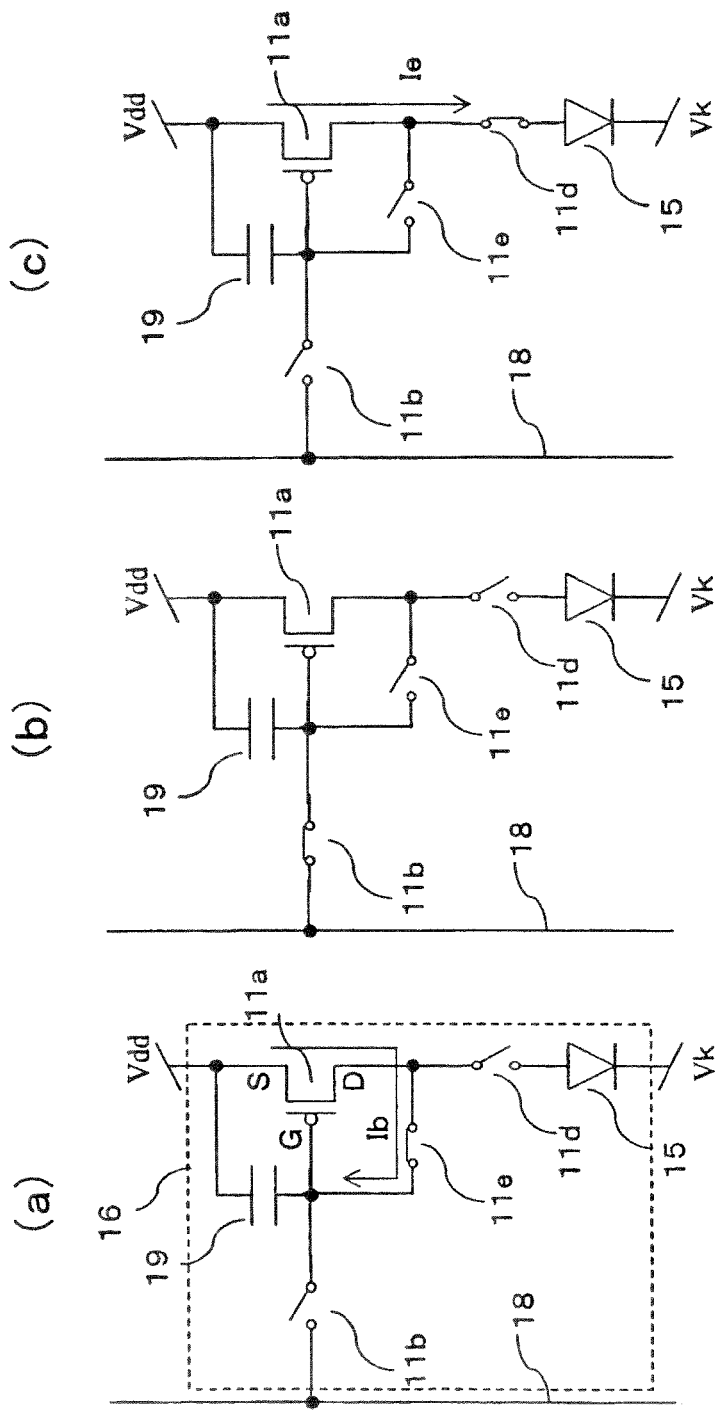
FIG. 44 is an explanatory diagram illustrating a method of driving an EL display apparatus according to the present invention.

As shown in FIG. 44(*a*), transistors 11*b* and 11*c* are turned off, while transistor 11*e* turned on. Then, the drain terminal (D) and the gate terminal (G) of driving transistor 11*a* become shortcircuited, thus allowing current Ib to pass as shown. Accordingly, the potential at the gate terminal (G) and that at the drain terminal (D) of driving transistor 11*a* are equalized to each other, thus resetting transistor 11*a* (to a state not allowing current to pass therethrough.) Before the resetting of transistor 11*a*, current has been made passing through transistor 11*a* by initially turning transistors 11*d* and 11*e* on and off, respectively, in synchronism with an HD synchronizing signal, as described with reference to FIG. 33 or 39. Thereafter, the operation illustrated in FIG. 44 is performed.

Figure 41:
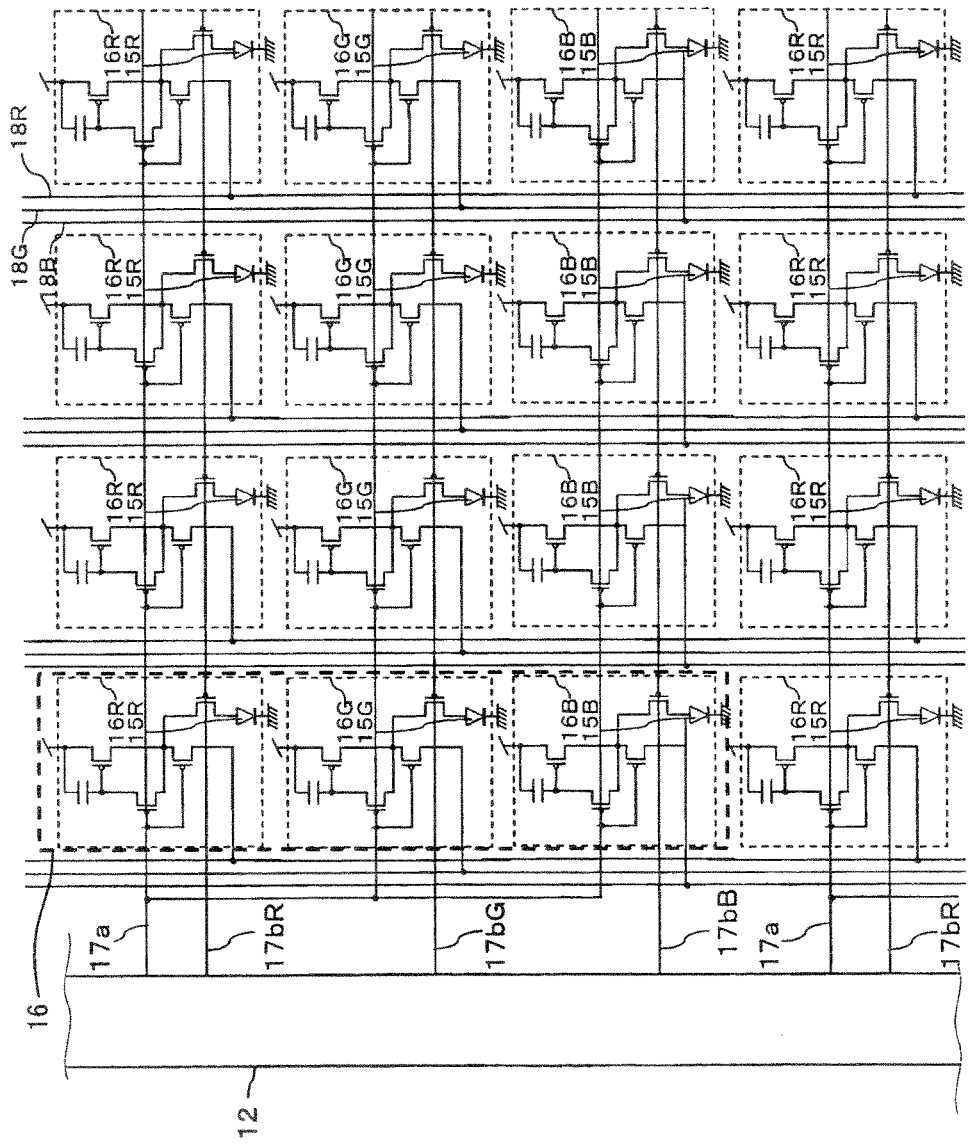
FIG. 41 is a diagram illustrating a configuration of an EL display apparatus according to the present invention.

Each of the reset states (the state not allowing current to pass) of respective transistors 11*a* and 11*b* is equivalent to the offset voltage holding state of the voltage offset canceller configuration described in relation to FIG. 41 or the like. That is, in the state shown in FIG. 44(*a*), an offset voltage (reset voltage) is held across the terminals of capacitor 19. This offset voltage has a voltage value which is variable in accordance with the characteristics of transistor 11*a*. Therefore, when the operation illustrated in FIG. 44(*a*) is performed, transistor 11*a* does not pass current to capacitor 19 of each pixel. (That is, a black display current (substantially equal to zero) state is kept; stated otherwise, resetting to the initiating voltage causing current to start passing is made.)

As in the current-based programming pixel configuration, as the reset state shown in FIG. 44(*a*) of the voltage-based programming pixel configuration continues for a longer time, the terminal voltage of capacitor 19 tends to become lower due to passage of current Ib. Therefore, the time period for which the state shown in FIG. 44(*a*) continues needs to be fixed. This time period is preferably not less than 0.2H and not more than 5H (five horizontal scanning periods), more preferably not less than 0.5H and not more than 4H. Specifically, the time period is preferably not less than 2 μsec and not more than 400 μsec.

It is preferable that gate signal line 17*e* and the gate signal line 17*a* of an antecedent pixel row form a common line. That is, gate signal line 17*e* is formed as shortcircuited to gate signal line 17 *a* of the antecedent pixel row. This configuration is referred to as "antecedent gate control method". The antecedent gate control method uses a waveform applied to the gate signal line of a pixel row having been selected at least 1H before the selection of a pixel row concerned. Therefore, the antecedent pixel row is not limited to the immediately preceding pixel row. For example, transistor 11*a* of a pixel row concerned may be reset by using the signal waveform applied to the gate signal of the pixel row next to the immediately preceding pixel row.

More specifically, the antecedent gate control method is as follows. It is assumed that: a pixel row concerned is the (N)th pixel row having gate signal lines 17*e*(N) and 17*a*(N); a pixel row selected 1H before is the (N−1)th pixel row having gate signal lines 17*e*(N−1) and 17*a*(N−1); and a pixel row to be selected 1H after the selection of the pixel row concerned is the (N+1)th pixel row having gate signal lines 17*e*(N+1) and 17*a*(N+1).

In the (N−1)th H period, when gate signal line 17*a*(N−1) of the (N−1)th pixel row is applied with on-voltage, gate signal line 17*e*(N) of the (N)th pixel row is also applied with on-voltage. This is because gate signal line 17*e*(N) is formed as shortcircuited to gate signal line 17*a*(N−1) of the antecedent pixel row. Accordingly, transistor 11*b*(N−1) of each pixel of the (N−1)th pixel row is turned on to write the voltage of source signal line 18 to the gate terminal (G) of driving transistor 11*a*(N−1). At the same time, transistor 11*e*(N) of the (N)th pixel row is turned on to shortcircuit the gate terminal (G) and the drain terminal (D) of driving transistor 11*a*(N), thereby resetting driving transistor 11*a* (N).

In the (N)th period following the (N−1)th H period, when gate signal line 17*a*(N) of the (N)th pixel row is applied with on-voltage, gate signal line 17*e*(N+1) of the (N+1)th pixel row is also applied with on-voltage. Accordingly, transistor 11*b*(N) of each pixel of the (N)th pixel row is turned on to write the voltage applied to source signal line 18 to the gate terminal (G) of driving transistor 11*a*(N). At the same time, transistor 11*e*(N+1) of each pixel of the (N+1)th pixel row is turned on to shortcircuit the gate terminal (G) and the drain terminal (D) of driving transistor 11*a*(N+1), thereby resetting driving transistor 11*a*(N+1).

A similar operation proceeds for the following pixel rows. In the (N+1)th H period following the (N)th H period, when gate signal line 17*a*(N+1) of the (N+1)th pixel row is applied with on-voltage, gate signal line 17*e*(N+2) of the (N+2)th pixel row is also applied with on-voltage. Accordingly, transistor 11*b*(N+1) of each pixel of the (N+1)th pixel row is turned on to write the voltage applied to source signal line 18 to the gate terminal (G) of driving transistor 11*a*(N+1). At the same time, transistor 11*e*(N+2) of each pixel of the (N+2)th pixel row is turned on to shortcircuit the gate terminal (G) and the drain terminal (D) of driving transistor 11*a*(N+2), thereby resetting driving transistor 11*a*(N+2).

With the antecedent gate control method according to the present invention, driving transistor 11*a* is reset for a 1H period, followed by voltage-based programming.

As in the case of FIG. 33(*a*), when the operation is performed so that the reset state shown in FIG. 44(*a*) synchronizes to the current-based programmed state shown in FIG. 44(*a*), the time period required for the current-based programming state shown in FIG. 44(*b*) to be reached has a fixed value (constant value) and, therefore, there arises no problem. If this time period is too short, driving transistor 11*a* is not completely reset, while if it is too long, driving transistor 11*a* assumes complete off-state, which in turn results in the current-based programming taking a longer time. Further, the luminance of screen 12 is lowered.

Subsequently to the state shown in FIG. 44(a), the pixel configuration is turned into the state shown in FIG. 44(b) where transistors 11b is in on-state, while transistors 11e and 11d in off-state. The state shown in FIG. 44(b) is a state where current-based programming is being performed. That is, source driver 14 outputs the programming current, which is then written to the gate terminal (G) of driving transistor 11a (i.e., capacitor 19 is programmed with the potential of the gate terminal (G) of driving transistor 11a.) In the case of voltage-based programming, transistor 11d need not necessarily be turned off at the time of voltage-based programming. Transistor 11e will not be needed if the combination with the N-fold pulse driving method as shown in FIG. 13 or 15 or the like is unnecessary or if the intermittent N/K pulse driving method does not need to be practiced. (The intermittent NK-fold pulse driving method is a driving method including providing plural lighting regions on one screen. This driving method can be easily practiced if transistor 11e is caused to turn on/off.) Since this feature has been described earlier, description thereof will be omitted.

In the case where a white display is provided by voltage-based programming using the configuration shown in FIG. 43 or the driving method illustrated in FIG. 44, perfect voltage-based programming can be achieved from the offset voltage providing a black display (the initiating voltage causing the current set in accordance with the characteristics of driving transistors to pass) even when there are variations in the characteristics of driving transistors of respective pixels. Therefore, the times required for respective driving transistors to be programmed with a target value are equalized to each other for each gray level. For this reason, there occurs no gray scale error due to variations in the characteristics of transistors 11a and, hence, satisfactory image display can be realized.

After the voltage-based programming illustrated in FIG. 44(b), transistors 11b is turned off and transistor 11d turned on to cause driving transistor 11a to pass the programming current through EL device 15, thereby causing EL device 15 to emit light.

Thus, the reset driving method based on the voltage-based programming illustrated in FIG. 43 comprises: a first operation in which transistor 11d is turned on and transistor 11e turned off in synchronism with an HD synchronizing signal to pass current to transistor 11a; a second operation in which driving transistor 11a and EL device 15 are disconnected from each other, while the drain terminal (D) and the gate terminal (G) of the driving transistor 11a (alternatively, the source terminal (5) and the gate terminal (G) of the driving transistor 11a, more generally, two terminals of the driving transistor including gate terminal (G)) are shortcircuited; and a third operation in which the driving transistor 11a is programmed with voltage after the second operation.

In the embodiment described above, transistor 11d is on-off controlled to control the current to be passed from driving transistor 11a (in the case of the pixel configuration shown in FIG. 1) to ET, device 15. In order for transistor 11d to be on-off controlled, gate signal lines 17b need to be scanned. Such scanning requires shift register 61 (gate circuit 12). Since shift register 61 is large in size, use of shift register 61 for control over gate signal lines 17b will prevent the frame from being narrowed. The method to be described with reference to FIG. 40 solves this problem.

Though the present invention is described by reference mainly to examples of current-based programming pixel configuration as shown in FIG. 1 and the like, the present invention is not limited to these examples. It is needless to say that the present invention is applicable even to other current-based programming pixel configurations (including a current mirror pixel configuration) as described with reference to FIG. 38 and the like. It is also needless to say that the technical concept of on-off control on a block-by-block basis is applicable to voltage-based programming pixel configurations as shown in FIG. 41 and the like. Since the present invention is directed to a method of intermittently passing current through EL device 15, it is needless to say that the present invention can be combined with a method of application of reverse bias voltage to be described with reference to FIG. 50 or the like. Thus, the present invention can be practiced in combination with other embodiments.

Figure 40:
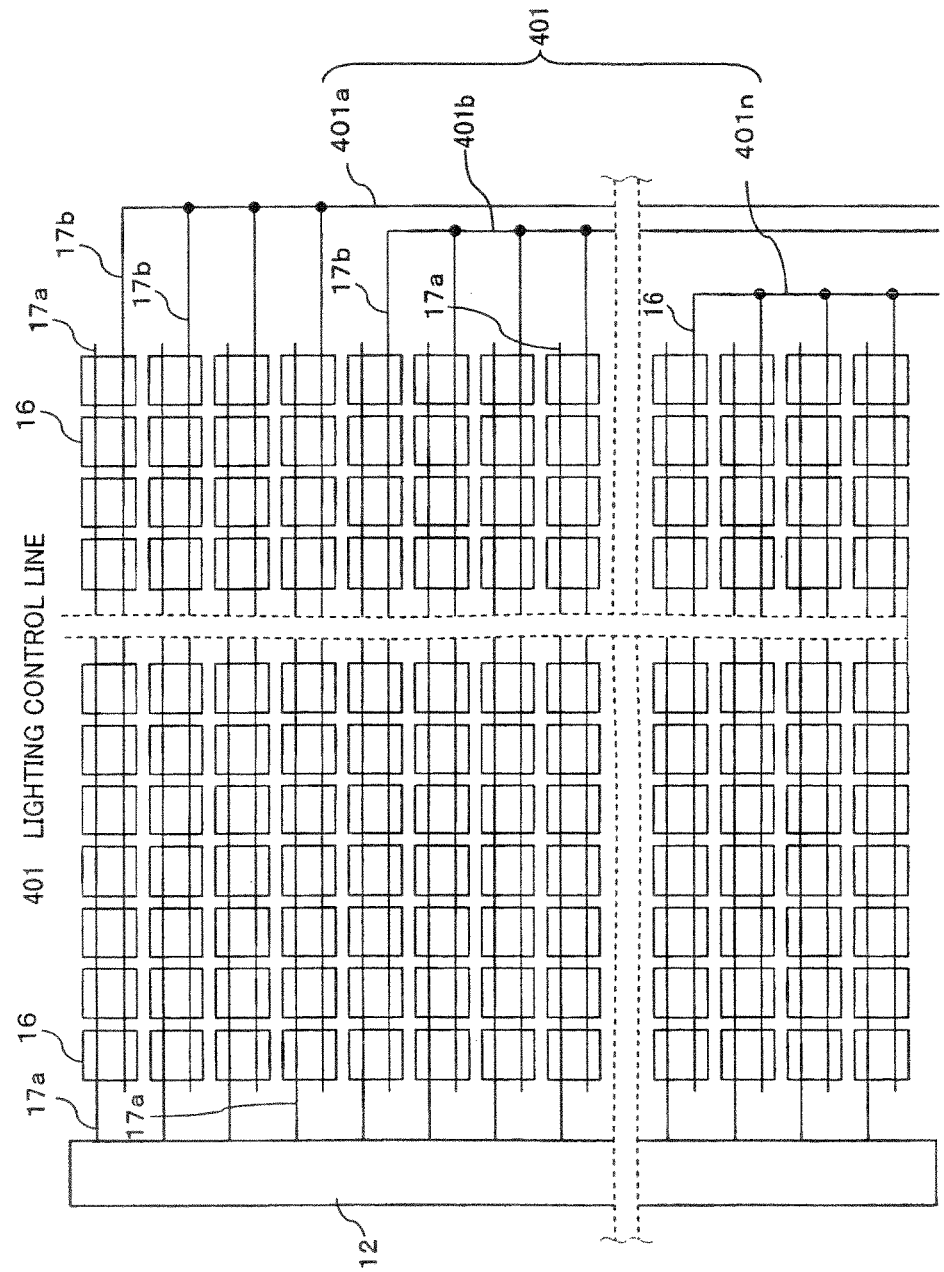
FIG. 40 is a diagram illustrating a configuration of an EL display apparatus according to the present invention.

FIG. 40 illustrates an embodiment of a block driving method. For easy explanation, it is assumed that gate driver 12 is formed directly on substrate 71 or gate driver 12 in a silicon chip form is mounted on substrate 71. Further, source driver 14 and source signal lines are omitted from the figure to avoid complicated drawing.

In FIG. 40, gate signal line 17a is connected to gate driver 12. On the other hand, gate signal line 17b associated with each pixel is connected to lighting control line 401. In FIG. 40, four gate signal lines 17b are connected to one lighting control line 401.

Though four gate signal lines 17b form one block in the configuration, there is no limitation thereto but it is needless to say that one block may consist of more than four gate signal lines 17b. Generally, display region 50 is preferably divided into 5 or more, more preferably 10 or more, much more preferably 20 or more. If the number by which display region 50 is divided is too small, flicker is likely to become conspicuous. On the other hand, if the number is too large, the number of lighting control lines 401 becomes large, which makes it difficult to layout such control lines 401.

Since a QCIF display panel has 220 vertical scanning lines, these lines need to be divided into blocks by at least 5 (i.e., 220/5=44), preferably 10 or more (220/10=11). There are some cases where two blocks are sufficient because less flicker occurs in display region 50 which is divided into two blocks, one consisting of odd number rows, the other consisting of even number rows.

In the embodiment shown in FIG. 40, lighting control lines 401a, 401b, 401c, 401d, . . . , 401n are sequentially applied with on-voltage (Vgl) or off-voltage (Vgh) to turn EL devices 15 on/off block by block.

In the embodiment shown in FIG. 40, gate signal line 17b and lighting control line 401 do not cross each other. Therefore, the embodiment is free from such a failure that gate signal line 17b and lighting control line 401 become shortcircuited. Further, since there is no capacitive coupling between gate signal line 17b and lighting control line 401, a very small capacitance is added when the gate signal line 17d side is viewed from lighting control line 401. Therefore, lighting control line 401 can be driven easily.

Gate driver 12 is connected to gate signal line 17a. When gate signal line 17a is applied with on-voltage, the pixel row associated therewith is selected and transistors 11b and 11c of each of the selected pixels are turned on to program capacitor 19 of each pixel with the current (voltage) applied to source signal line 18. On the other hand, gate signal line 17b is connected to the gate terminal (G) of transistor 11d of each pixel. Accordingly, when lighting control line 401 is applied with on-voltage (Vgl), a current path is formed between driving transistor 11a and EL device 15, whereas when it is applied with off-voltage (Vgh), the anode terminal of EL device 15 is opened.

It is preferable that the control timing at which on-voltage and off-voltage are applied to lighting control line 401 and the timing at which gate driver 12 outputs pixel row selecting voltage (Vgl) to gate signal line 17a synchronize to one horizontal scanning clock (1H). However, there is not limitation thereto.

The signal to be applied to lighting control line 401 merely on-off controls the current to be passed to EL device 15. That signal need not synchronize to image data to be outputted from source driver 14. This is because the signal to be applied to lighting control line 401 functions to control the current programmed at capacitor 19 of each pixel 16. Therefore, this signal need not necessarily synchronize to the pixel row selecting signal. Even if they synchronize to each other, the clock is not limited to 1H but may be ½H or ¼H.

In the case of the current mirror pixel configuration shown in FIG. 38, transistor 11e can be on-off controlled if gate signal line 17b is connected to lighting control line 401. Thus, the block driving can be realized.

The pixel configuration shown in FIG. 32 can realize the block driving if gate signal line 17a is connected to lighting control signal 401 and the reset driving is performed. In this case, the block driving method according to the present invention is a driving method in which plural pixel rows are turned into the non-lighting state (or the black display state) at a time using one control line.

The embodiment described above has an arrangement where one pixel row selecting gate signal line is provided (formed) for each pixel row. The present invention is not limited to this arrangement but may have such an arrangement that one selecting gate signal line is provided (formed) for each set of plural pixel rows.

FIG. 41 illustrates an embodiment of that arrangement. For easy explanation, the pixel configuration shown in FIG. 1 will be mainly exemplified. In FIG. 41, gate signal line 17a is designed to select three pixels (16R, 16G and 16B) at a time. The signs "R", "G" and "B" are meant to relate to red pixel, green pixel and blue pixel, respectively.

Accordingly, selection of gate signal line 17a causes pixels 16R, 16G and 16B to be selected and written with data at a time. Pixel 16R writes data from source signal line 18R to capacitor 19R, pixel 16G writes data from source signal line 18G to capacitor 19G, and pixel 16B writes data from source signal line 18B to capacitor 19B.

Transistor 11d of pixel 16R is connected to gate signal line 17bR. Similarly, transistor 11d of pixel 16G is connected to gate signal line 17bG, while transistor 11d of pixel 16B is connected to gate signal line 17bB. Accordingly, EL device 15R of pixel 16R, EL device 15G of pixel 16G and EL device 15B of pixel 16B can be on-off controlled independently of each other. That is, EL device 15R, EL device 15G and EL device 15B can be individually controlled as to their lighting time and lighting cycle by individual control over gate signal lines 17bR, 17bG and 17bB.

In realizing this operation, it is suitable that the configuration shown in FIG. 6 is formed (provided) with the four shift register circuits: shift register circuit 61 for scanning gate signal line 17a, shift register circuit 61 for scanning gate signal line 17bR, shift register circuit 61 for scanning gate signal line 17bG, and shift register circuit 61 for scanning gate signal line 17bB.

In spite of the foregoing description of the feature that a current N times as high as the predetermined current is passed through source signal line 18 to feed EL device 15 with the current N times as high as the predetermined current for a 1/N period, this feature cannot be realized practically. This is because actually the signal pulse applied to gate signal line 17 punches through capacitor 19 thereby making it impossible to set a desired voltage value (or current value) at capacitor 19. Generally, a voltage value (or current value) lower than a desired voltage value (or current value) is set at capacitor 19. For example, even when driving is performed so as to set a 10-fold current value, a current having about 5-fold value at most can be set at capacitor 19. Even when N=10, EL device 15 is actually fed with a current equal to the current that is fed thereto when N=5. Thus, the present invention is directed to a driving method including setting an N-fold current value so that EL device can be fed with a current that is proportional to or corresponding to the N-fold value, or a driving method including application of a current in a pulse form having a value higher than a desired value to EL device 15.

The present invention is also directed to the driving method including: programming driving transistor 11a (in the case of FIG. 1) with a current (or a voltage) having a value higher than a desired value (i.e., a current such as to cause EL device 15 to exhibit a luminance higher than a desired luminance when the current, as it is, is continuously passed through EL device 15); and intermittently feeding the current to EL device 15 to cause EL device to emit light at the desired luminance.

It should be noted that a circuit compensating for the punch-through voltage reaching capacitor 19 is incorporated in source driver 14. This feature will be described later.

It is preferable that switching transistors 11b and 11c of FIG. 1 each comprise an n-channel transistor. This is because the punch-through voltage reaching capacitor 19 can be lowered by such an arrangement. Further, since off leakage at capacitor 19 is reduced, this arrangement is applicable to a low frame rate not higher than 10 Hz.

In some pixel configurations, the punch-through voltage may act to increase the current to be fed to EL device 15. In such cases, white peak current increases thereby to make the contrast of image display higher. Thus, it is possible to realize satisfactory image display.

Conversely, such a method is effective as to improve black display by using a p-channel transistor for each of switching transistors 11b and 11c to allow punch through to occur. In this case, voltage Vgh is used to turn p-channel transistor 11b off. For this reason, the terminal voltage of capacitor 19 slightly shifts toward the Vdd side. Thus, the gate terminal (G) voltage of transistor 11a rises, thus leading to a more satisfactory black display. Further, since the value of current for realizing a first-level gray scale display can be increased (i.e., a given base current can be passed until gray level 1 is reached), the occurrence of insufficient writing with current in current-based programming can be reduced.

Other effective arrangements include an arrangement in which capacitor 19b is intentionally formed between gate signal line 17a and the gate terminal (G) of transistor 11a to increase punch-through voltage (see FIG. 42(a).) This capacitor 19b preferably has a capacitance not less than ⅟₅₀ and mot more than ⅟₁₀ as large as the capacitance of the regularly-provided capacitor 19a. More preferably, this value is set not less than ⅟₄₀ and mot more than ⅟₁₅ as large as the capacitance of the regularly-provided capacitor 19a or not less than 1 and not more than 10 times as large as the capacitance of the source-gate (SG) (or source-drain (SD) or gate-drain (GD)) of transistor 11b. Much more preferably, the value of the capacitance is set not less than 2 and not more than 6 times as high as the capacitance of SG. The capacitor 19b may be formed or located between one terminal of capacitor 19a (or gate terminal (G) of transistor 11a) and the source terminal (5) of transistor 11d. The aforementioned value of capacitance holds true for this case.

The capacitance (Cb (pF)) of capacitor 19b for generating punch-through voltage has a relationship with the capacitance (Ca (pF)) of capacitor 19a for storing charge, gate terminal (G) voltage Vw (V) of transistor 11a at which white peak current is passed (or at which a white raster display having the highest luminance of image display is provided), and gate terminal (G) voltage Vb (V) at which a current for providing a black display (which current assumes a value of substantially 0 for a black display in image display) is passed. Preferably, the relationship satisfies the condition:

$$Ca/(200Cb) \leq |Vw-Vb| \leq Ca/(8Cb)$$

wherein |Vw−Vb| is the absolute value of the difference between a terminal voltage of the driving transistor providing a white display and a terminal voltage of the driving transistor providing a black display (that is, a varying amplitude of voltage.)

More preferably, the relationship satisfies the condition:

$$Ca/(100Cb) \leq |Vw-Vb| \leq Ca/(10Cb).$$

Transistor 11b should comprise a p-channel transistor which is at least double-gated, more preferably triple-gated or more, much more preferably quadruple-gated or more. It is preferable to form or locate capacitors in parallel, each of the capacitors having a capacitance not less than 1 and not more than 10 times as large as the capacitance of the source-gate SG (or gate-drain (GD)) of transistor 11b (in on-state.)

The feature described above is effective for not only the pixel configuration shown in FIG. 1 but also other pixel configurations. For example, in the case of a current mirror pixel configuration as shown in FIG. 42(b), a capacitor for causing punch through is located or formed between gate signal line 17a or 17b and the gate terminal (G) of transistor 11a. In this case, the n-channel of switching transistor 11c is double-gated or more. Alternatively, switching transistors 11c and 11d each comprise a p-channel transistor which is triple-gated or more.

In the case of the voltage-based programming configuration shown in FIG. 41, a capacitor 19c for causing punch through is formed or located between gate signal line 17c and the gate terminal (G) of driving transistor 11a. Further, switching transistor 11c is triple-gated or more. The capacitor 19c for causing punch through may be located between the drain terminal (D) of transistor 11c (on the capacitor 19b side) and gate signal line 17a. Alternatively, the capacitor 19c for causing punch through may be located between the gate terminal (G) of transistor 11a and gate signal line 17a. Yet alternatively, the capacitor 19c for causing punch through may be located between the drain terminal (D) of transistor 11c (on the capacitor 19b side) and gate signal line 17c.

A satisfactory black display can be realized by an arrangement which satisfies the condition:

$$0.05(V) \leq (Vgh-Vgl) \times (Cc/Ca) \leq 0.8(V)$$

wherein Ca (pF) is the capacitance of capacitor 19a for storing charge, Cc (pF) is the source-gate capacitance of switching transistor 11c or 11d (Cc is the sum of the source-gate capacitance and the capacitance of a capacitor for causing punch through if the capacitor is present), Vgh (V) is the high-voltage signal to be applied to a gate signal line, and Vgl (V) is the low-voltage signal to be applied to the gate signal line.

Preferably, the condition: $0.1(V) \leq (Vgh-Vgl) \times (Cc/Ca) \leq 0.5(V)$ is satisfied.

The feature described above is also effective for the pixel configurations shown in FIG. 43 and the like. In the case of the voltage-based programming pixel configuration shown in FIG. 43, a capacitor 19b for causing punch through is formed or located between the gate terminal (G) of transistor 11a and gate signal line 17a.

The capacitor 19b for causing punch through is formed of source wiring and gate wiring. However, since the capacitor 19b is formed by superposition of gate signal line 17 and widened source signal line of transistor 11 on each other, the capacitor cannot be separated distinctively from the transistor in some practical cases.

An arrangement in which switching transistors 11b and 11c (in the case of the configuration shown in FIG. 1) are each formed to have a larger size than necessary as if capacitor 19b for causing punch through is apparently formed thereby, is also included in the scope of the present invention. In many cases, switching transistors 11b and 11c are each formed to have a channel width W/channel length ratio of 6/6 μm. The capacitor 19b for causing punch through can also be formed by increasing the ratio of W to L. For example, the W:L ratio is set not less than 2:1 and not more than 20:1, more preferably not less than 3:1 and not more than 10:1.

Preferably, the capacitor 19b for causing punch through has a magnitude (capacitance) varying depending on R, G and B modulated by pixels. This is because EL devices 15 for R, G and B are different from each other in driving current and in cut-off voltage. For this reason, the gate terminals (G) of respective driving transistors 11a associated with these EL devices 15 are programmed with different voltages (currents). For example, when the capacitor 11bR of R pixel has a capacitance of 0.02 pF, the capacitors 11bG and 11bB of pixels for other colors (G pixel and B pixel) are each set to have a capacitance of 0.025 pF. When the capacitor 11bR of R pixel has a capacitance of 0.02 pF, the capacitor 11bG of G pixel and the capacitor 11bB of B pixel are set to have a capacitance of 0.03 pF and a capacitance of 0.025 pF, respectively. In this way, the offset driving current can be adjusted for each of R, G and B by varying the capacitance of capacitor 11b depending on R, G and B pixels. Thus, it is possible to optimize the black display level of each of R, G and B pixels.

While it has been described that the capacitance of the capacitor 19b for generating punch-through voltage is varied, the punch-through voltage is generated due to the relativity between the capacitance of capacitor 19a for storing charge and that of capacitor 19b for generating punch-through voltage. Therefore, there is no limitation to the feature that the capacitance of capacitor 19b is varied depending on R, G and B pixels. The capacitance of storage capacitor 19a may be varied. For example, when the capacitor 11aR of R pixel has a capacitance of 1.0 pF, the capacitor 11aG of G pixel and the capacitor 11aB of B pixel are set to have a capacitance of 1.2 pF and a capacitance of 0.9 pF, respectively. In this case, the capacitors 19b of the respective R, G and B pixels are set to have capacitances of equal value. Thus, according to the present invention, at least one of R, G and B pixels is made different from the others in the capacitance ratio between storage capacitor 19a and capacitor 19b for generating punch-through voltage. It is to be noted that both the capacitance of storage capacitor 19a and that of capacitor 19b for generating punch-through voltage may be varied depending on R, G and B pixels.

It is also possible to vary the capacitance of capacitor 19b for generating punch-through voltage as the screen extends laterally. Since the gate signal rises rapidly at each pixel 16 located close to gate driver 12 (because the through rate is high), the punch-through voltage becomes high. At the pixel located (formed) at the end of each gate signal line 17, on the other hand, the signal waveform becomes dulled (due to the capacitance of gate signal line 17.) This is because the punch-through voltage becomes low due to the gate signal rising slow (because of a low through rate.) For this reason, the capacitance of capacitor 19b for generating punch-through voltage is made low at each pixel close to the connection side of gate driver 12. On the other hand, the capacitance of capacitor 19b is made high at the end of each gate signal line 17. For example, a variation of about 10% in the capacitance of capacitor is provided between the right-hand extremity and the left-hand extremity of the screen.

The punch-through voltage to be generated is determined from the capacitance ratio between storage capacitor 19a and capacitor 19b for generating punch-through voltage. Therefore, there is no limitation to the aforementioned feature that the capacitance of capacitor 19b for generating punch-through voltage is varied as the screen extends laterally. It is possible that the capacitance of storage capacitor 19a is varied depending on the lateral position of capacitor 19a on the screen with the capacitance of capacitor 19b for generating punch-through voltage being fixed in the lateral direction of the screen. It is needless to say that both the capacitance of capacitor 19b for generating punch-through voltage and that of storage capacitor 19a may be varied as the screen extends laterally.

The N-fold pulse driving method according to the present invention has a problem that the current to be applied to EL device 15 becomes N times as high as in the prior art though this phenomenon is instantaneous. In some cases, such a high current shortens the lifetime of EL device 15. Application of reverse bias voltage Vm to EL device 15 is effective in solving the problem.

In EL device 15, electrons are injected into the electron transport layer through the cathode, while at the same time positive holes injected into the positive hole transport layer through the anode. The electrons and positive holes thus injected travel to the opposite poles. At that time, they are trapped in the organic layer and carriers are accumulated due to an energy level difference at the interface with the luminescent layer.

It is known that when space-charge is accumulated in the organic layer, molecules are oxidized or reduced to produce unstable radical anionic molecules and radical cationic molecules, which deteriorate the film quality thereby lowering the luminance and causing a rise in driving voltage during constant-current driving. An example of means to prevent this phenomenon is a modification of the device structure for reverse voltage to be applied.

When reverse bias voltage is applied, reverse current is applied, which causes the electrons and positive holes injected to be withdrawn toward the cathode and the anode, respectively. Thus, the generation of space-charge in the organic layer is cancelled, whereby electrochemical deterioration of molecules can be inhibited, which ensures the EL device having a prolonged lifetime.

Figure 45:
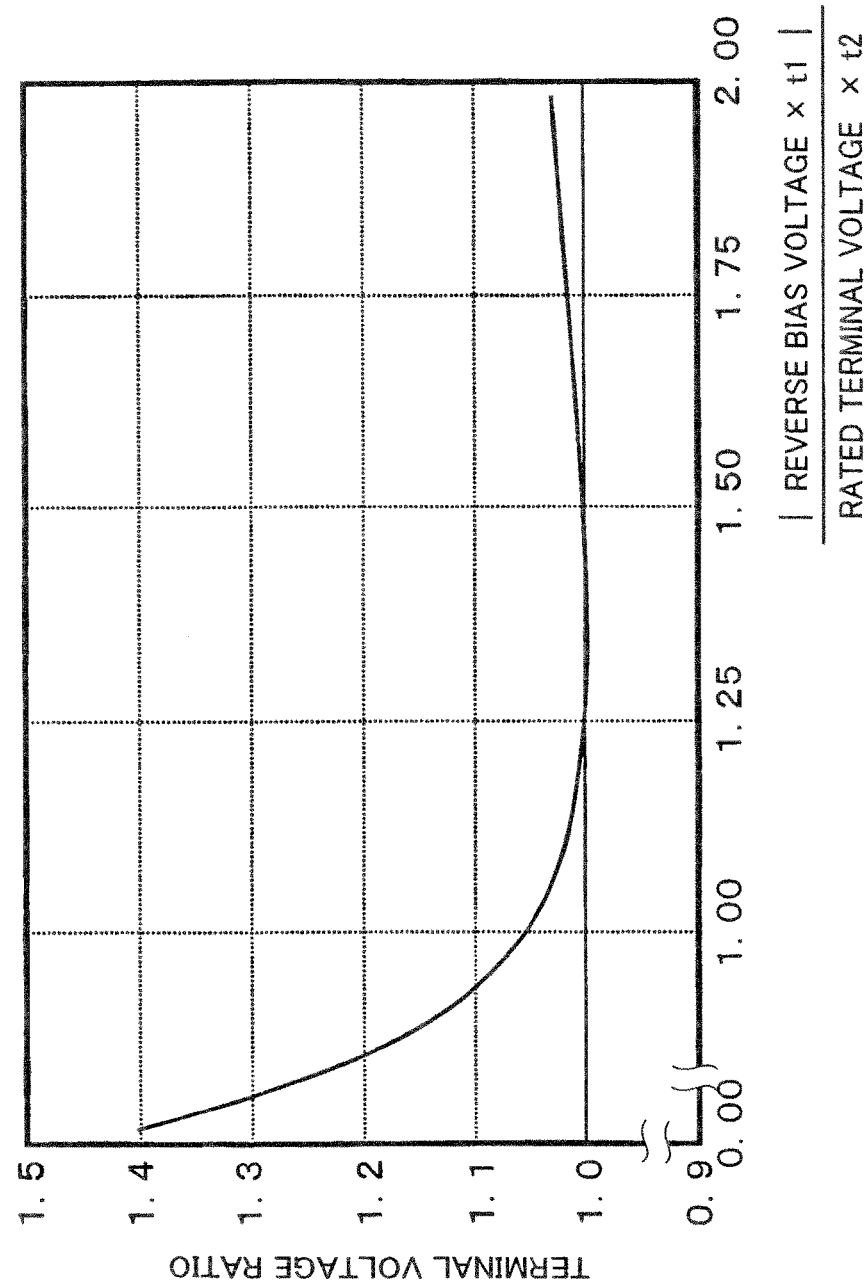
FIG. 45 is an explanatory chart illustrating a method of driving an EL display apparatus according to the present invention.

FIG. 45 plots a variation in reverse bias voltage Vm with varying terminal voltage of EL device 15. The "terminal voltage", as used here, is a voltage generated when EL device 15 is fed with a rated current. The variation shown in FIG. 45, which resulted from the case where the current passed through EL device 15 had a current density of 100 A/m$^2$, had a tendency having little difference from that of the case where the current passed through EL device 15 had a current density of from 50 to 100 A/m$^2$. Therefore, the reverse bias voltage application method is estimated to be effective over a wide range of current density.

The ordinate represents the ratio of the terminal voltage of EL device 15 resulting 2,500 hours after the starting of application of current to the initial terminal voltage of EL device 15. Assuming, for example, that the terminal voltage resulting at the time 0 hour after the starting of application of a current having a current density of 100 A/m$^2$ is 8 (V) while the terminal voltage resulting at the time 2,500 hours after the starting of application of the current having a current density of 100 A/m$^2$ is 10 (V), the terminal voltage ratio is 10/8=1.25.

The abscissa represents the ratio of rated terminal voltage V0 to the product of reverse bias voltage Vm by time t1 for which reverse bias voltage was applied in one cycle. For example, if the time for application of reverse bias voltage Vm of 60 Hz (60 Hz has no particular meaning) is ½ (a half), t1 is equal to 0.5. Assuming that the terminal voltage resulting at the time 0 hour after the starting of application of a current having a current density of 100 A/m$^2$ is 8 (V) while reverse bias voltage is 8 (V), it follows that |reverse bias voltage×t1|/(rated terminal voltage×t2)=|−8(V)×0.5|/(8 (V)×0.5)=1.0.

According to FIG. 45, when |reverse bias voltage×t1|/ (rated terminal voltage×t2) is 1.0 or more, the terminal voltage ratio does not vary (that is, the terminal voltage does not vary from the initial terminal voltage.) Application of reverse bias voltage works effectively. However, when |reverse bias voltage×t1|/(rated terminal voltage×t2) is 1.75 or more, the terminal voltage ratio tends to rise. Accordingly, the magnitude of reverse bias voltage Vm and the application time ratio t1 (or t2, or the ratio between t1 and t2) should be determined so that |reverse bias voltage×t1|/(rated terminal voltage×t2) may assume 1.0 or more. Preferably, the magnitude of reverse bias voltage Vm, the application time ratio t1 and the like are determined so that |reverse bias voltage×t1|/(rated terminal voltage×t2) may assume 1.75 or less.

Figure 46:
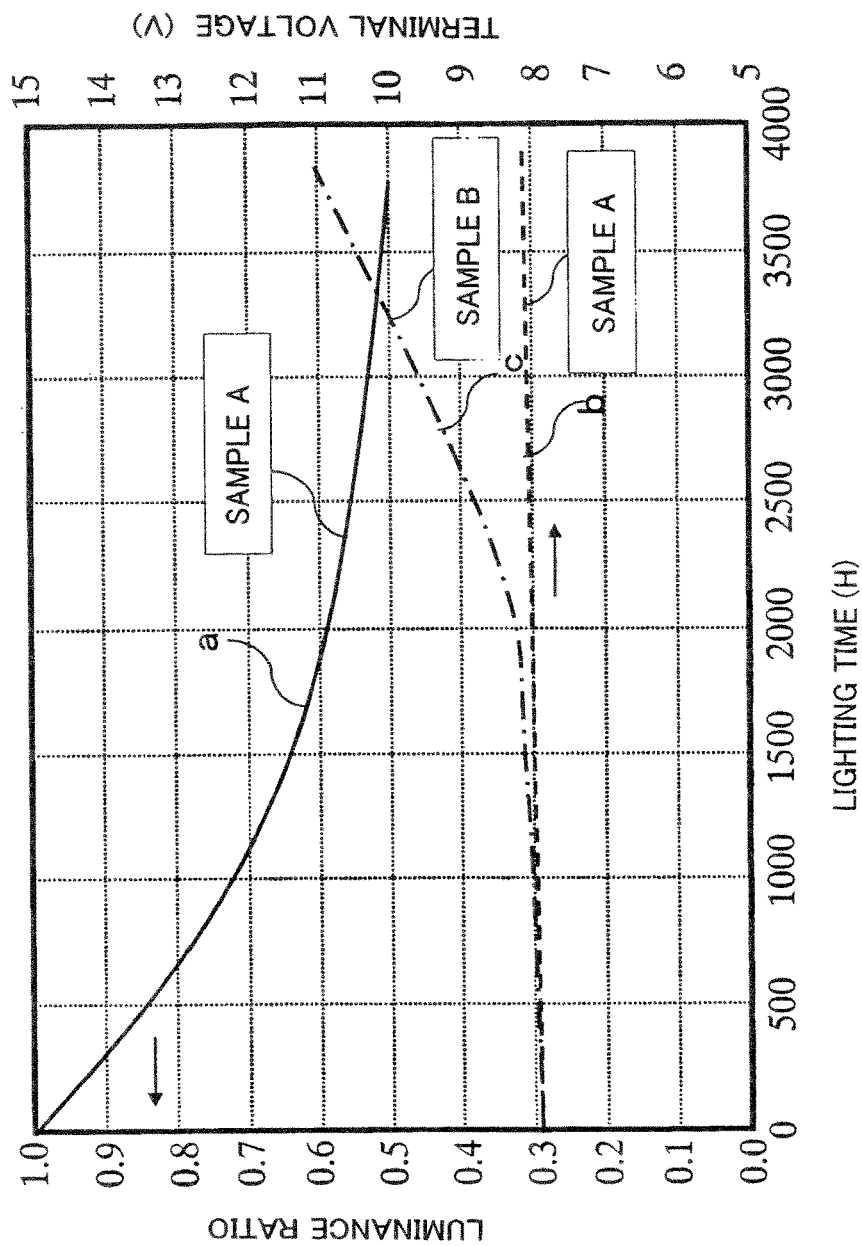
FIG. 46 is an explanatory chart illustrating a method of driving an EL display apparatus according to the present invention.

Such a bias driving method requires alternate application of reverse bias voltage and rated current. In the case of FIG. 46, in order to equalize the mean luminance of sample A and that of sample B per unit time, a current that instantaneously becomes higher than in the case where there is no application of reverse bias voltage Vm, has to be passed in the case where there is application of reverse bias voltage Vm. For this reason, the terminal voltage of EL device 15 also becomes higher in the case where there is application of reverse bias voltage Vm (sample A of FIG. 46.)

However, even in the driving method including application of reverse bias voltage, the rated terminal voltage V0 of FIG. 45 is such a terminal voltage as to satisfy the mean luminance (that is, such a terminal voltage as to cause EL device 15 to light.) (According to the specific example mentioned herein, the rated terminal voltage V0 is a terminal voltage resulting when a current having a current density of 200 A/m$^2$ is applied. Since the duty ratio is 1/2, the mean luminance throughout one cycle is a luminance at a current density of 200 A/m$^2$.

The matter described above lies on the assumption that EL device 15 is caused to provide a white raster display (i.e., ET, device 15 is fed with a maximum current.) When the EL display apparatus displays a picture image, it performs gray scale display since the picture image is a natural image.

Therefore, a white peak current is not constantly passed through EL device 15. (The white peak current is a current passing at a maximum white display. In the case of the specific example mentioned herein, the white peak current is a current having a mean current density of 100 A/m$^2$.)

In the case of picture image display, in general, the current to be applied to (passed through) each EL device 15 is about 0.2 times as high as the white peak current. (The white peak current is a current passing under application of the rated terminal voltage. According to the specific example mentioned herein, the white peak current is a current having a current density of 100 A/m$^2$.)

Accordingly, when a picture image is displayed with the embodiment shown in FIG. 45, any value on the abscissa needs to be multiplied by 0.2. Thus, the magnitude of reverse bias voltage Vm and the application time ratio t1 (or t2, or the ratio between t1 and t2) should be determined so that |reverse bias voltage×t1|/(rated terminal voltage×t2) may assume 0.2 or more. Preferably, the magnitude of reverse bias voltage Vm, the application time ratio t1 and the like are determined so that |reverse bias voltage×t1|/(rated terminal voltage×t2) may assume 0.35 (=1.75×0.2) or less.

That is, a value of 1.0 on the abscissa (|reverse bias voltage×t1|/(rated terminal voltage×t2) in FIG. 45 needs to be changed to 0.2. Accordingly, when the display panel displays a picture image (this state of use seems to be usual because a white raster display seems not to be performed usually), reverse bias voltage Vm should be applied for predetermined time t1 so that |reverse bias voltage×t1|/(rated terminal voltage×t2) may assume 0.2 or more. Even when the value of |reverse bias voltage×t1|/(rated terminal voltage×t2) increases, the increase in the terminal voltage ratio is not very large, as seen from FIG. 45. In view of the case where white raster display is performed, the upper limit value of |reverse bias voltage×t1|/(rated terminal voltage×t2) should be adjusted to 1.75 or less.

Hereinafter, the reverse bias method according to the present invention will be described with reference to the relevant drawings. The method of the present invention is based on application of reverse bias voltage Vm (or current) during a time period in which current is not passed through EL device 15. However, there is no limitation thereto. For example, it is possible to apply reverse bias voltage Vm forcibly while current is passing through EL device 15. This case will result in the current fed to EL device 15 stopped, hence, EL device 15 turned into the non-lighting state (black display state.) Though the method of the present invention will be described focusing mainly on the feature that a current-based programming pixel configuration is applied with reverse bias voltage, there is no limitation to this feature.

Figure 47:
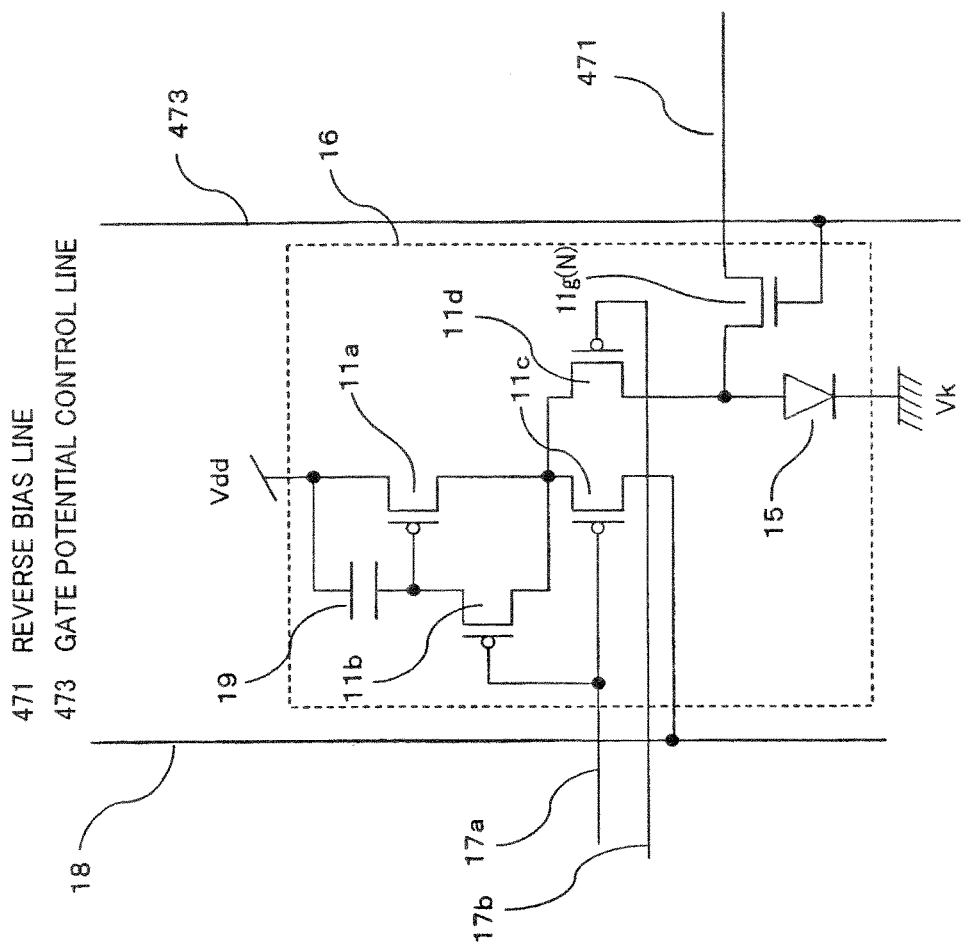
FIG. 47 is a diagram illustrating a pixel configuration of an EL display panel according to the present invention.

In a pixel configuration adapted for reverse bias driving, transistor 11g is an n-channel transistor as shown in FIG. 47. Of course, transistor 11g may be a p-channel transistor.

In FIG. 47, when gate potential control line 473 is applied with a voltage higher than the voltage applied to reverse bias line 471, transistor 11g(N) is turned on to apply reverse bias voltage Vm to the anode of EL device 15.

In the pixel configuration of FIG. 47 or the like, gate potential control line 473 may be operated with its potential always fixed. For example, when voltage Vk in FIG. 47 is 0 (V), the potential of gate potential control line 473 is fixed to 0 (V) or more (preferably 2 (V) or more). This potential is indicated at Vsg. With gate potential control line 473 in this state, when the potential of reverse bias line 471 is adjusted to reverse bias voltage Vm (0 (V) or lower, preferably a voltage lower than Vk by 5 (V) or more), transistor 11g(N) is turned on to apply reverse bias voltage Vm to the anode of EL device 15. When the voltage of reverse bias line 471 is made higher than the voltage of gate potential control line 473 (that is, the gate terminal (G) voltage of transistor 11g), transistor 11g is turned off to stop application of reverse bias voltage Vm to EL device 15. Of course, it is needless to say that reverse bias line 471 may assume a high-impedance state (open state or the like) at that time.

Figure 48:
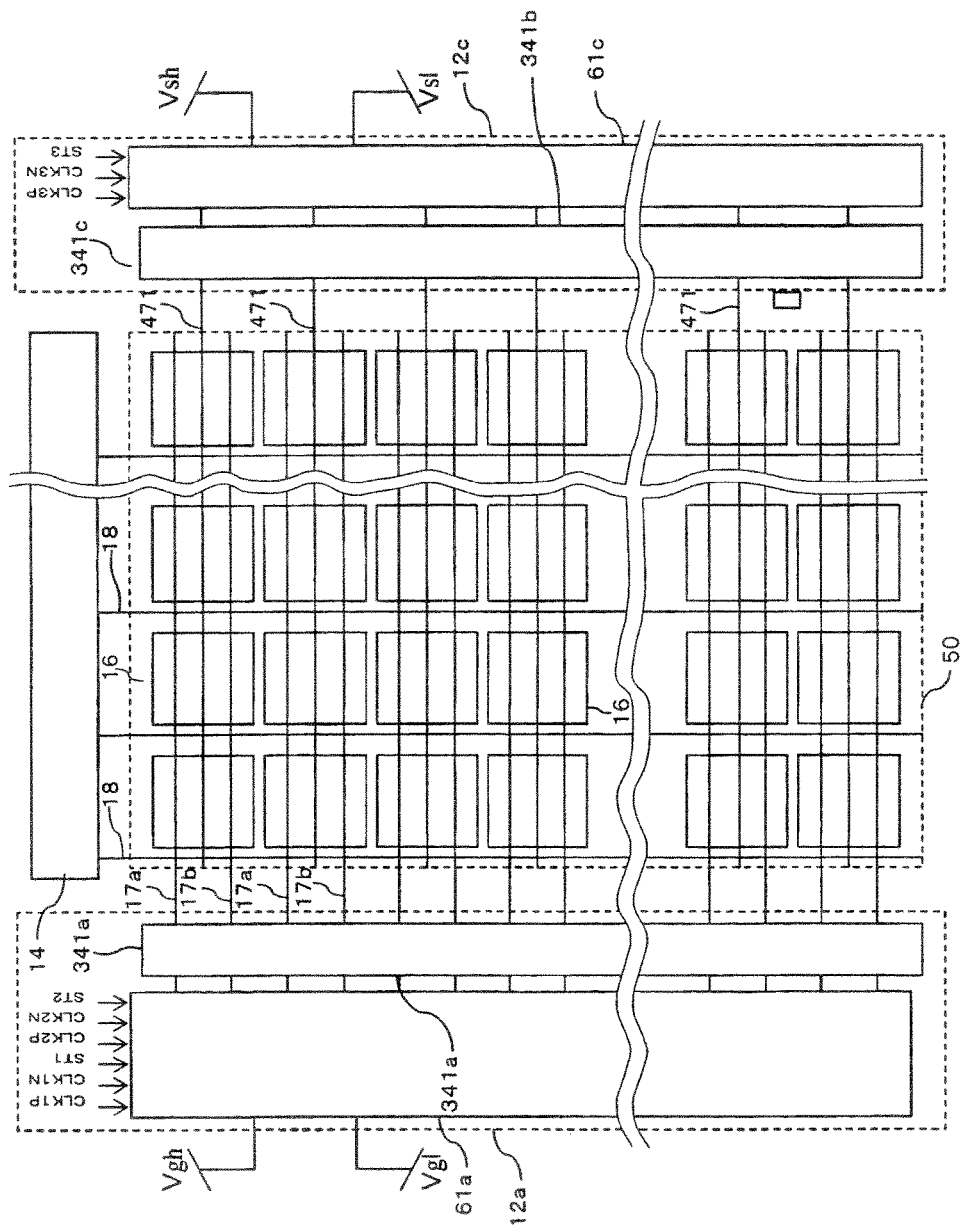
FIG. 48 is a diagram illustrating a configuration of an EL display apparatus according to the present invention.

As shown in FIG. 48, gate driver 12c for controlling reverse bias line 471 may be formed or disposed separately. Like gate driver 12a, gate driver 12c operates shiftingly in sequence, so that the position to be applied with reverse bias voltage is shifted synchronously with this shifting operation.

The driving method described above is capable of applying reverse bias voltage Vm to EL device 15 by merely varying the potential of reverse bias line 471 with the gate terminal (G) voltage of transistor 11g fixed. Thus, application of reverse bias voltage Vm can be controlled easily. Further, the driving method can lower the voltage to be applied across the gate terminal (G) and the source terminal (5) of transistor 11g. This holds true for the case where transistor 11g is a p-channel transistor.

Application of reverse bias voltage Vm is performed when EL device 15 is not fed with current. Therefore, it is sufficient for transistor 11g to be turned on while transistor 11d is off. That is, gate potential control line 473 should be applied with voltage in a manner reverse of the on-off logic of transistor 11d. For example, it is sufficient for gate signal line 17b to be connected to the gate terminals (G) of respective transistors 11d and 11g. Since transistor 11d is of the p-channel type while transistor 11g is of the n-channel type, their respective on-off operations are opposite to each other.

Figure 49:
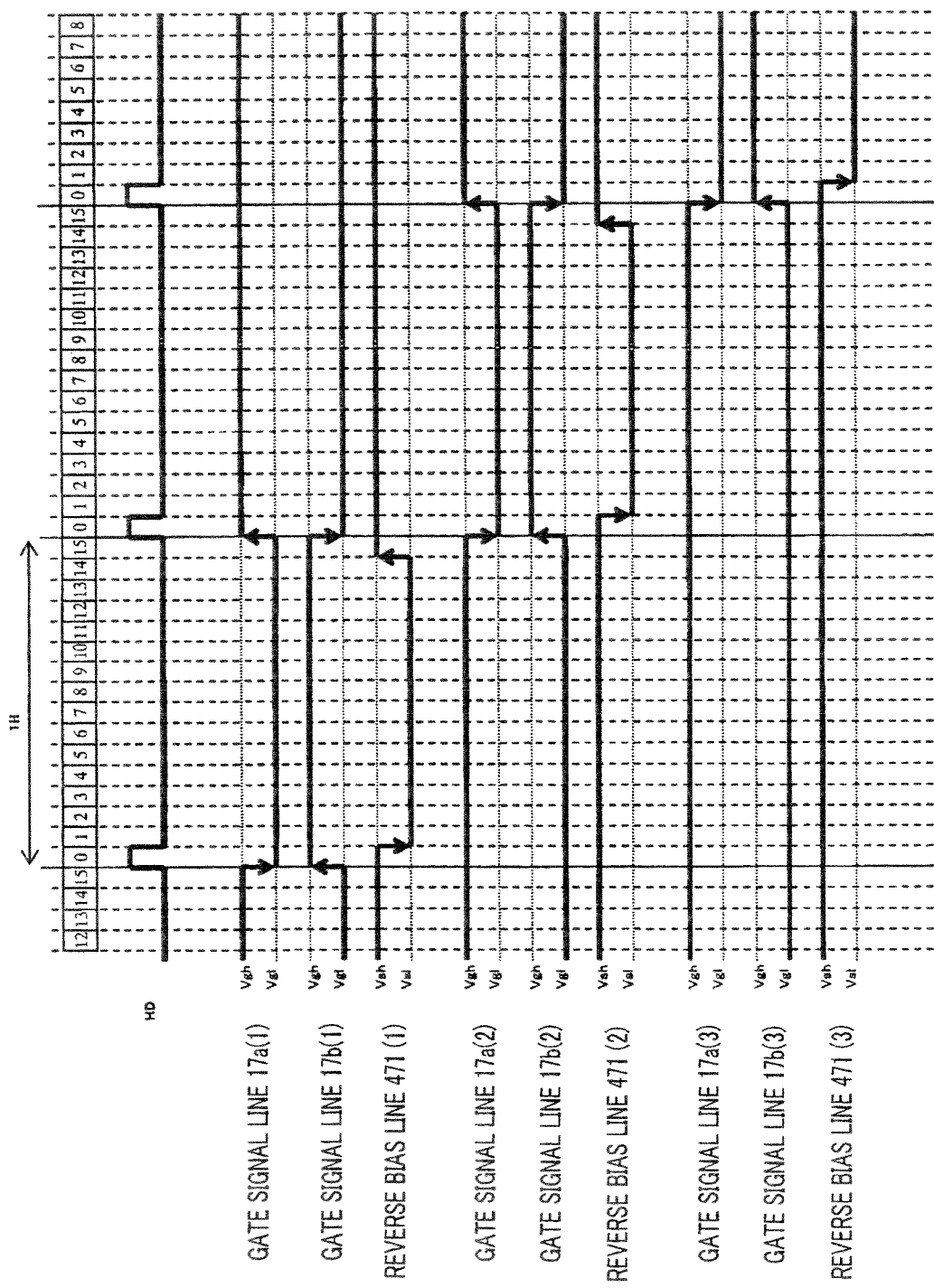
FIG. 49 is an explanatory chart illustrating a method of driving an EL display apparatus according to the present invention.

FIG. 49 is a timing chart of the reverse bias driving method. In the chart, an additional number such as (1) or (2) indicates the number of a pixel row. For easy explanation, it is assumed that the first pixel row is indicated at (1) and the second pixel row indicated at (2). However, there is no limitation thereto but it may be considered that (1) indicates the Nth pixel row and (2) indicates the (N+1)th pixel row. This holds true for other embodiments unless otherwise specified. Though the embodiment illustrated in FIG. 49 and the like will be described by reference to the pixel configuration shown in FIG. 1 for example, there is no limitation thereto. For example, the driving method is applicable to the pixel configurations shown in FIGS. 41, 38 and the like.

When gate signal line 17a(1) of the first pixel row is under application of on-voltage (Vgl), gate signal line 17b(1) of the first pixel row is under application of off-voltage (Vgh). That is, transistor 11d is off and EL device 15 is not fed with current.

Reverse bias line 471(1) is applied with voltage Vsl (which causes transistor 11g to turn on.) Accordingly, transistor 11g is turned on to apply reverse bias voltage to EL device 15. After lapse of a predetermined time period (a time period of ½₀₀ or more of 1H, or 0.5 μsec) from application of off-voltage (Vgh) to gate signal line 17b, reverse bias voltage is applied. The predetermined time period (a time period of ½₀₀ or more of 1H, or 0.5 μsec) before application of on-voltage (Vgl) to gate signal line 17b, application of reverse bias voltage is stopped. This operation is to avoid the transistors 11d and 11g turning on at the same time.

In the next horizontal scanning period (1H), off-voltage (Vgh) is applied to gate signal line 17a to select the second pixel row. That is, on-voltage is applied to gate signal line 17b(2). On the other hand, on-voltage (Vgl) is applied to gate signal line 17b to turn transistor 11d on. Accordingly, transistor 11a passes current through EL device 15 to cause EL device 15 to emit light. At the same time, off-voltage (Vsh) is applied to reverse bias line 471(1) so that EL device 15 of the first pixel row (1) will not be applied with reverse bias voltage. On the other hand, reverse bias line 471(2) of the second pixel row is applied with voltage Vsl (reverse bias voltage).

An image displayed over one screen is rewritten by repeating the sequential operations described above. The embodiment described above has the feature that application of reverse bias voltage is performed during the period in which each pixel is programmed. However, the present invention is not limited to the circuit configuration shown in FIG. 48. It is apparent that plural pixel rows can be consecutively applied with reverse bias voltage. It is also apparent that the reverse bias driving method can be combined with block driving (see FIG. 40), N-fold pulse driving, reset driving, dummy pixel driving, or a like driving method.

There is no limitation to the feature that application of reverse bias voltage is performed during image display. Such an arrangement is possible that reverse bias voltage is applied for a predetermined time period after the powering-off of the EL display apparatus.

Though the embodiment described above is applied to the pixel configuration shown in FIG. 1, it is needless to say that the embodiment is applicable to configurations adapted for application of reverse bias voltage as shown in FIGS. 38 and 41. For example, the embodiment is applicable to the current-based programming pixel configuration shown in FIG. 50.

FIG. 50 illustrates a current mirror pixel configuration. Transistor 11c is a pixel selecting device. When on-voltage is applied to gate signal line 17a1, transistor 11c is turned on. Transistor 11d is a switching device having a resetting function and a function of shortcircuiting the drain terminal (D)-gate terminal (G) of driving transistor 11a. Transistor 11d is turned on when gate signal line 17a2 is applied with on-voltage.

Transistor 11d is turned on 1H (one horizontal scanning period, i.e., one pixel row), preferably 3H, before the selection of the associated pixel. If it is 3H, transistor 11d is turned on 3H before to shortcircuit the gate terminal (G) and the drain terminal (D) of transistor 11a, thus turning transistor 11a off. Accordingly, transistor 11b is turned into a state not allowing current to pass therethough, so that EL device 15 assumes the non-lighting state.

When EL device 15 is in the non-lighting state, transistor 11g is turned on to apply reverse bias voltage to EL device 15. Therefore, EL device 15 is under application of reverse bias voltage for a time period for which transistor 11d is on. For this reason, transistors 11d and 11g are turned on at the same time in terms of logic.

The gate terminal (G) voltage of transistor 11g is fixed by application of voltage Vsg. When reverse bias line 471 is applied with a reverse bias voltage that is sufficiently lower than Vsg, transistor 11g is turned on.

Thereafter, when the horizontal scanning period in which an image signal is applied (written) to the pixel of concern comes, on-voltage is applied to gate signal line 17a1 to turn transistor 11c on. Accordingly, the image signal voltage outputted from source driver 14 to source signal line 18 is applied to capacitor 19 (with transistor 11d being kept in the on-state.)

When transistor 11d is turned on, a black display is provided. As the on-time of transistor 11d grows longer in a one-field (one frame) period, the proportion of the black display period becomes higher. Therefore, in order to adjust the means luminance throughout one field (on frame) to a desired value notwithstanding the black display period included, the display luminance during a display period needs to be raised. That is, it is required that EL device 15 be fed with a higher current in the display period. This operation is the N-fold pulse driving according to the present invention. Therefore, an operation characteristic of the present invention is to combine the N-fold pulse driving operation and the driving operation of turning transistor 11d on to provide a black display. Also, application of reverse bias voltage to EL device 15 in the non-lighting state is a feature characteristic of the present invention.

The embodiment described above is of the type which includes application of reverse bias voltage to a pixel assuming the non-lighting state in image display. The method of application of reverse bias voltage is not limited to this type. If application of reverse bias voltage is performed when an image is not displayed, it is not necessary to provide reverse bias transistor 11g for every pixel. The "non-lighting state", as used here, means a state where reverse bias voltage is applied before and after use of the display panel.

In the pixel configuration of FIG. 1, for example, pixel 16 is selected (by turning transistors 11b and 11c on), while source driver (circuit) 14 outputs voltage V0 (for example, voltage GND) as low as the source driver can output and applies voltage V0 to the drain terminal (D) of driving transistor 11a. With transistor 11a in this state, turning transistor 11d on causes the anode of EL device 15 to be applied with voltage V0. At the same time, the cathode Vk of EL device 15 is applied with voltage Vm which is lower than voltage V0 by a value from 5 to 15 (V), whereby reverse bias voltage is applied to EL device 15. Transistor 11a is also turned into off-state when applied with a voltage lower than voltage V0 by a value from 0 to 5 (V) as voltage Vdd. By thus causing source driver 14 to output voltage and controlling gate signal line 17, it is possible to apply reverse bias voltage to EL device 15.

The N-fold pulse driving method is capable of passing a predetermined current (a current programmed by the voltage held at capacitor 19) through EL device 15 again even after a black display has been provided once within a one-field (one-frame) period. With the configuration of FIG. 50, however, once transistor 11d is turned on, capacitor 19 discharges (the meaning of which includes "reduce") electric charge held thereat and, hence, it is not possible to feed EL device 15 with the predetermined current (the current programmed.)

Nevertheless, the circuit of FIG. 50 has a characteristic advantage that it can operate easily.

The embodiment described above is applied to the current-based programming pixel configuration. However, the present invention is not limited to this embodiment but may be applied to other current-based pixel configurations as shown in FIGS. 38 and 50. The present invention is also applicable to voltage-based programming pixel configurations as shown in FIGS. 51, 54 and 62.

FIG. 51 shows a voltage-based programming pixel configuration which is simplest in a general sense. Transistor 11b is a selective switching device, while transistor 11a a driving transistor for feeding current to El device 15. In this configuration, transistor (switching device) 11g for application of reverse bias voltage is located (formed) on the anode side of EL device 15.

In the pixel configuration of FIG. 51, the current to be passed through EL device 15 is fed to source signal line 18 and then fed to the gate terminal (G) of transistor 11a upon selection of transistor 11b.

The basic operation of the configuration shown in FIG. 51 will be described with reference to FIG. 52 for explanation of this configuration. The pixel shown in FIG. 51 is of the configuration called "voltage offset canceller" and performs a four-step operation comprising an initializing operation, a resetting operation, a programming operation, and light-emitting operation.

Following a horizontal synchronizing signal (HD), the initializing operation is performed. On-voltage is applied to gate signal line 17b to turn transistor 11g on. Also, on-voltage is applied to gate signal line 17a to turn transistor 11c on. At that time, source signal line 18 is applied with voltage Vdd. Accordingly, terminal a of capacitor 19b is applied with voltage Vdd. In this state, driving transistor 11a assumes on-state to pass a feeble current through EL device 15. This current causes the drain terminal (D) voltage of driving transistor 11a to have an absolute value larger than at least the operating point of transistor 11a.

Subsequently, the resetting operation is performed. Off-voltage is applied to gate signal line 17b to turn transistor 11e off. On the other hand, on-voltage is applied to gate signal line 17c for a time period T1 to turn transistor 11b on. This time period T1 is a resetting period. Also, gate signal line 17a is continuously applied with on-voltage for a 1H period. The time period T1 is preferably not less than 20% and not more than 90% of a 1H period. Stated otherwise, the time period T1 is preferably not less than 20 μsec and not more than 160 μsec. The ratio of the capacitance of capacitor 19b (Cb) to that of capacitor 19a (Ca), i.e., Cb:Ca, is preferably not less than 6:1 and not more than 1:2.

In the resetting period, transistor 11b is turned on to shortcircuit the gate terminal (G) and the drain terminal (D) of driving transistor 11a. Accordingly, the gate terminal (G) voltage and the drain terminal (D) voltage of driving transistor 11a become equal to each other, thus rendering transistor 11a into an offset state (i.e., reset state: a state not allowing current to pass therethrough). The reset state is a state where the gate terminal (G) voltage of transistor 11a assumes a value close to the initiating voltage at which current starts passing. This gate voltage for keeping the reset state is held at terminal b of capacitor 19b. Accordingly, capacitor 19 holds offset voltage (resetting voltage).

In the subsequent programming operation, off-voltage is applied to gate signal line 17c to turn transistor 11b off. On the other hand, source signal line 18 is applied with DATA voltage for a time period Td. Accordingly, the gate terminal (G) of driving transistor 11a is applied with a voltage as the sum of DATA voltage and offset voltage (resetting voltage.) For this reason, driving transistor 11a becomes able to pass the current programmed.

After the programming period, off-voltage is applied to gate signal line 17a to render transistor 11c into off-state thereby disconnecting driving transistor 11a from source signal line 18. Also, gate signal line 17c is applied with off-voltage to render transistor 11b into off-state which is kept for a 1F period. On the other hand, gate signal line 17b is applied with on-voltage and off-voltage periodically. When combined with the N-fold driving method as shown in FIG. 13 or 15 or the like or with the interlaced driving method, this driving method can realize better image display.

Figure 52:
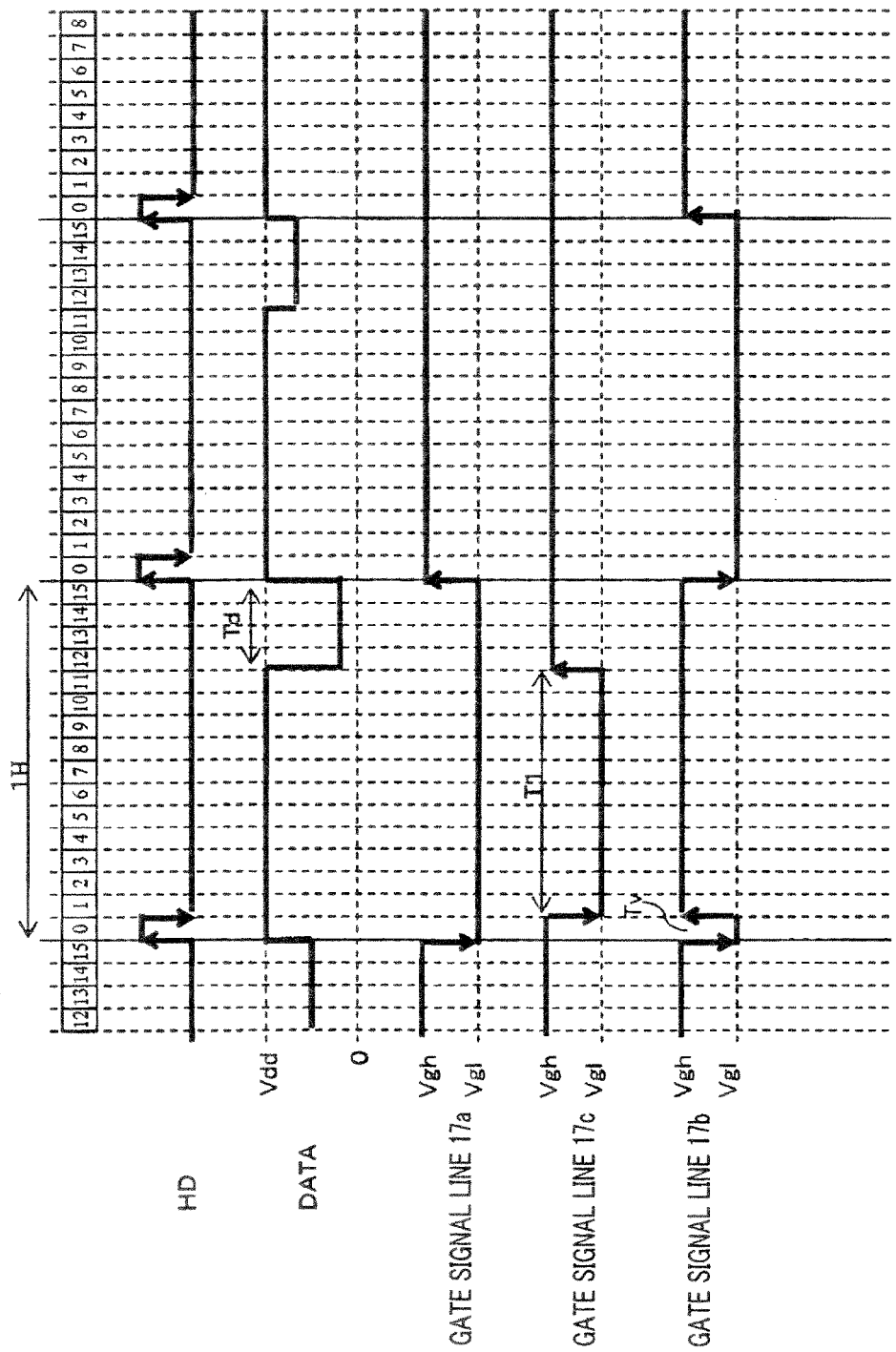
FIG. 52 is an explanatory chart illustrating a method of driving an EL display apparatus according to the present invention.

According to the driving method illustrated in FIG. 52, capacitor 19 in the reset state holds the initiating voltage for causing current to start passing through transistor 11a (offset voltage or resetting voltage). For this reason, when the gate terminal (G) of transistor 11a is under application of the resetting voltage, the pixel is in the darkest black display state. However, black in relief (a drop in contrast) occurs due to the coupling between source signal line 18 and pixel 16, punch-through voltage reaching to capacitor 19 or punch through at transistors. Therefore, the driving method illustrated in FIG. 52 cannot raise the display contrast.

Transistor 11a needs to be turned off in order to apply reverse bias voltage Vm to EL device 15. Shortcircuiting the Vdd terminal and the gate terminal (G) of transistor 11a is sufficient to turn transistor 11a off. This feature will be described later with reference to FIG. 53.

Alternatively, voltage Vdd or a voltage for causing transistor 11a to turn off may be applied to source signal line 18 to turn transistor 11b on, thereby applying such a voltage to the gate terminal (G) of transistor 11a. This voltage turns transistor 11a off (or into a state allowing little current to pass therethrough (i.e., a substantially off-state in which transistor 11a has a high impedance).) Thereafter, transistor 11g is turned on to apply reverse bias voltage to EL device 15. The application of reverse bias voltage Vm may be performed on all the pixels at a time. Specifically, source signal lines 18 are each applied with the voltage for causing transistor 11a to turn substantially off thereby turning on transistors 11b of all (plural) pixel rows. Accordingly, transistors 11a are turned off. Subsequently, transistors 11g are turned on to apply reverse bias voltage to EL devices 15. Thereafter, the pixel rows are sequentially applied with image signal, whereby the display apparatus displays an image.

Figure 53:
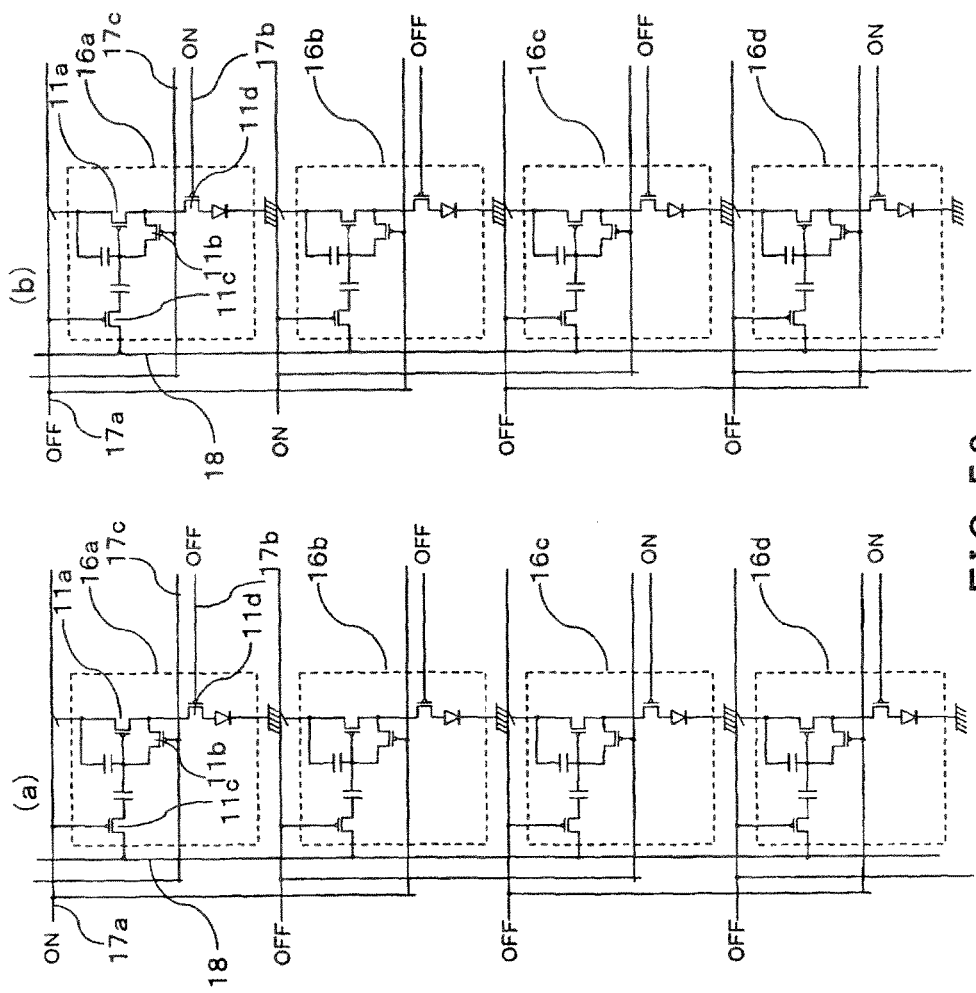
FIG. 53 is an explanatory diagram illustrating a method of driving an EL display apparatus according to the present invention.

The following description is directed to a reset driving method applied to the pixel configuration shown in FIG. 51. FIG. 53 illustrates an embodiment of the reset driving method. As shown in FIG. 53, gate signal line 17a connected to the gate terminal (G) of transistor 11c of pixel 16a is also connected to the gate terminal (G) of resetting transistor 11b of pixel 16b of the succeeding row. Similarly, gate signal line 17a connected to the gate terminal (G) of transistor 11c of pixel 16b is also connected to the gate terminal (G) of resetting transistor 11b of pixel 16c of the succeeding row.

Accordingly, when on-voltage is applied to gate signal line 17a connected to the gate terminal (G) of transistor 11c of pixel 16a, pixel 16a is programmed with voltage, while at the same time the resetting transistor 11b of pixel 16a of the succeeding row is turned on to reset driving transistor 11a of pixel 16b. Similarly, when on-voltage is applied to gate signal line 17a connected to the gate terminal (G) of transistor 11c of pixel 16b, pixel 16b is programmed with current, while at the same time the resetting transistor 11b of pixel 16c of the succeeding row is turned on to reset driving transistor 11a of pixel 16c. In this way, reset driving based on the antecedent gate control method can be realized easily. Further, the number of gate signal lines routed from each pixel can be decreased.

More specific description follows. It is assumed that gate signal lines 17 are applied with respective voltages as shown in FIG. 53(a); that is, gate signal line 17a of pixel 16a is applied with on-voltage, while gate signal lines 17a of other pixels 16 applied with off-voltage. It is also assumed that gate signal lines 17b of pixels 16a and 16b are applied with off-voltage, while gate signal lines 17b of pixels 16c and 16d applied with on-voltage.

Under these conditions, pixel 16a is in a state programmed with voltage and in the non-lighting state; pixel 16b is in a reset state and in the non-lighting state; pixel 16c is in a state holding the programming current and in the lighting state; and pixel 16d is in a state holding the programming current and in the lighting state.

After lapse of 1H, data in shift register circuit 61 of control gate driver 12 shifts by one bit, so that the state shown in FIG. 53(b) results. Specifically, the state shown in FIG. 53(b) is such that: pixel 16a is in a state holding the programming current and in the lighting state; pixel 16b is in a state programmed with current and in the non-lighting state; pixel 16c is in a reset state and in the non-lighting state; and pixel 16d is in a state holding the programming current and in the lighting state.

As can be understood from the above description, the voltage applied to gate signal line 17a of each pixel of a row of concern resets driving transistor 11a of each pixel of the succeeding row thereby rendering the pixel of the succeeding row ready for voltage-based programming in the next horizontal period. Thus, voltage-based programming is performed on pixel rows sequentially.

The antecedent gate control method can be implemented even with the voltage-based programming pixel configuration shown in FIG. 43. FIG. 54 shows an embodiment in which the pixel configuration of FIG. 43 has connections adapted for the antecedent gate control method.

As shown in FIG. 54, gate signal line 17a connected to the gate terminal (G) of transistor 11b of pixel 16a is also connected to the gate terminal (G) of resetting transistor 11e of pixel 16b of the succeeding row. Similarly, gate signal line 17a connected to the gate terminal (G) of transistor 11b of pixel 16b is also connected to the gate terminal (G) of resetting transistor 11e of pixel 16c of the succeeding row.

Accordingly, when on-voltage is applied to gate signal line 17a connected to the gate terminal (G) of transistor 11b of pixel 16a, pixel 16a becomes programmed with voltage, while at the same time resetting transistor 11e of pixel 16b of the succeeding row is turned on to reset driving transistor 11a of pixel 16b. Similarly, when on-voltage is applied to gate signal line 17a connected to the gate terminal (G) of transistor 11b of pixel 16b, pixel 16b becomes programmed with current, while at the same time resetting transistor 11e of pixel 16c of the succeeding row is turned on to reset driving transistor 11a of pixel 16c. In this way, reset driving based on the antecedent gate control method can be realized easily.

Figure 55:
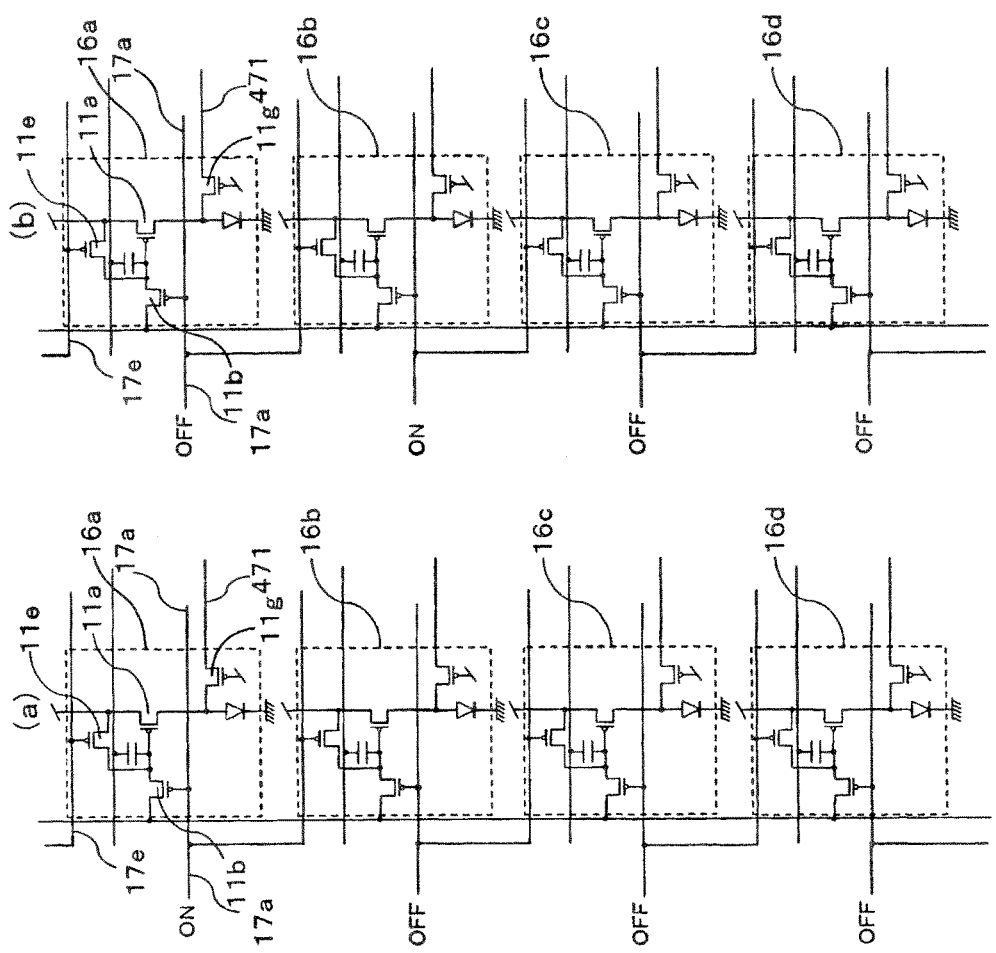
FIG. 55 is an explanatory diagram illustrating a method of driving an EL display apparatus according to the present invention.

More specific description follows. It is assumed that gate signal lines 17 are applied with respective voltages as shown in FIG. 55(a); that is, gate signal line 17a of pixel 16a is applied with on-voltage, while gate signal lines 17a of other pixels 16 applied with off-voltage. It is also assumed that all the reverse bias transistors 11g are off.

Under these conditions, pixel 16a is in a state programmed with voltage; pixel 16b is in a reset state; pixel 16c is in a state holding the programming current; and pixel 16d is in a state holding the programming current.

After lapse of 1H, data in shift register circuit 61 of control gate driver 12 shifts by one bit, so that the state shown in FIG. 55(b) results. Specifically, the state shown in FIG. 55(b) is such that: pixel 16a is in a state holding the programming current; pixel 16b is in a state programmed with current; pixel 16c is in a reset state; and pixel 16d is in a state holding the programming current.

As can be understood from the above description, the voltage applied to gate signal line 17a of each pixel of a row of concern resets driving transistor 11a of each pixel of the succeeding row thereby rendering the pixel of the succeeding row ready for voltage-based programming in the next horizontal period. Thus, voltage-based programming is performed on pixel rows sequentially.

When perfect black display is performed with a current-based driving method, the current programmed at the driving transistor 11 of each pixel is 0. That is, no current is passed from source driver 14. With no current, it is impossible to charge/discharge the parasitic capacitance produced in source signal line 18 as well as to vary the potential of source signal line 18. Accordingly, the gate potential of the driving transistor does not vary and, hence, capacitor 19 keeps on holding the potential as built one frame (field) (1F) before. For example, if a white display is given one frame before, the white display is maintained in the next frame even when a perfect black display is desired in the next frame. In order to solve this problem, the present invention has an arrangement such as to write source signal line 18 with a black-level voltage in the beginning of a one-horizontal scanning period (1H) and then output the programming current to source signal line 18. Assuming, for example, that picture image data has a gray level of from 0th to 7th which is close to the black level, a voltage corresponding to the black level is written for a predetermined time period in the beginning of a one-horizontal period. In this way, it becomes possible to reduce the burden on current-based driving and compensate for insufficient writing. Here, it is assumed that a 64-level gray scale display has the 0th level corresponding to a perfect black display and the 63rd level corresponding to a perfect white display.

The level at which precharge is to be performed has to be limited to within a black display range. Specifically, image data to be written is judged as to whether it has a level within the black display range (low luminance range, that is, the range in which the writing current is low (feeble) in the current-based driving method) and then the black range level is selected for precharge (selective precharge.) If precharge is performed for all levels of gray scale data, a drop in luminance (which means that a target luminance is not reached) occurs in the white display range. In addition, vertical streaks appear in the image displayed.

Preferably, selective precharge is performed within a ⅛ range from level 0 of gray scale data. (For example, if the gray scale data has 64 levels, precharge is performed for image data having a level ranging from the 0th to the 7th before the writing of the image data.) More preferably, selective precharge is performed within a 1/16 range from level 0 of gray scale data. (For example, if the gray scale data has 64 levels, precharge is performed for image data having a level ranging from the 0th to the third before the writing of the image data.)

In raising the contrast with a black display in particular, a method including detection of level 0 only for precharge is also effective. This method provides a very good black display. The problem essential to this method is that the screen is observed to have black in relief when the whole screen is of level 1 or 2. Thus, the selective precharge is performed within a ⅛ range from level 0 of gray scale data and within a fixed range.

It is also effective to vary the precharge voltage and the gray scale level range depending on R, G and B. This is because EL devices 15 for R, G and B are different from each other in luminescence initiating voltage and luminance of emission. For example, in the case of R, the selective precharge is performed within a ⅛ range from level 0 of gray scale data. (For example, if the gray scale data has 64 levels, precharge is performed for image data having a level ranging from the 0th to the 7th before the writing of the image data.) In the case of the other colors (G and B), control is made so that the selective precharge will be performed within a 1/16 range from level 0 of gray scale data. (For example, if the gray scale data has 64 levels, precharge is performed for image data having a level ranging from the 0th to the third before the writing of the image data.) Also, if the precharge voltage for R is 7 (V), a voltage of 7.5 (V) is written to source signal line 18 as the precharge voltage for the other colors (G and B). The optimum precharge voltage often varies depending on production lots of EL display panel. Therefore, it is preferable to employ an arrangement capable of adjusting the precharge voltage by means of an external volume or the like. Such an adjustment circuit can be realized easily by the use of an electronic volume circuit.

Figure 57:
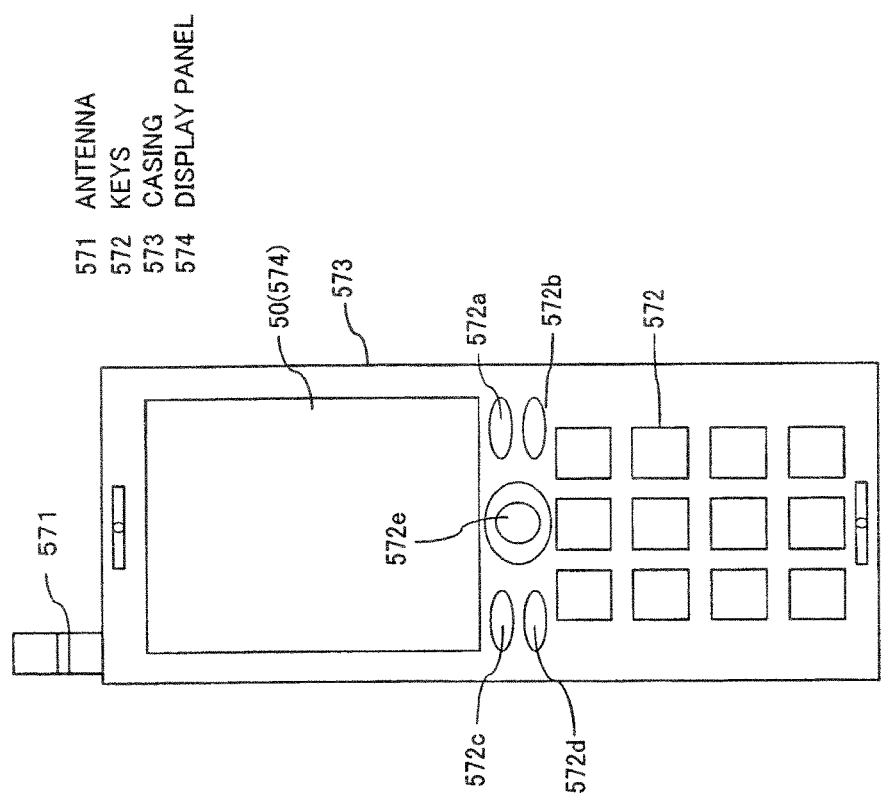
FIG. 57 is an explanatory view illustrating a mobile phone according to the present invention.

Next, description will be made of an embodiment of an electronic apparatus incorporating the EL display panel of the present invention. FIG. 57 is a plan view of a mobile phone as an example of a personal digital assistant. The mobile phone shown includes a receiver and a speaker. Casing 573 is provided with an antenna 571, a numeric key pad 572 and the like. Keys 572*a* to 572*e* include a display color switching key, a power on-off key and a frame rate changing key.

A sequence may be formed such that depressing the display color switching key once will turn the display into a 8-color mode, depressing the same key again subsequently will turn the display into a 256-color mode, and further depressing the same key will turn the display into a 4096-color mode. The key is a toggle switch operative to change the display color mode upon every depression. Change keys corresponding to display colors may be provided separately. In this case, there are three (or more) display color switching keys.

The display color switching key may be another mechanical switch, such as a slide switch, instead of a push switch. Alternatively, it is possible to employ an arrangement for switching the display color based on voice recognition. Such an arrangement is possible that the display color on the display screen 50 of a display panel is changed in response to a voice inputting of, for example, "4096-color display", "high-definition display", "256-color mode" or "low display color mode" to the receiver. This arrangement can be realized easily by utilizing the current voice recognition technology.

The switching of display color may be made using an electrical switch or a touch panel for the user to select a desired item from a menu displayed in the display section 21 of the display panel by touching. Alternatively, it is possible to employ such an arrangement that the display color is changed as the number of depressions on the switch varies or as the rotation and the direction vary like a click ball.

Instead of the aforementioned display color switching key, a key for changing the frame rate or the like may be used. A key for switching between motion picture display and stationary image display may be used. It is possible to employ such an arrangement as to change plural conditions such as the frame rates of motion picture display and stationary image display. Also, it is possible to employ such an arrangement as to gradually vary the frame rate by being continuously depressed. This arrangement can be realized by using a variable resistor or an electronic volume for resistor R of an oscillator comprising capacitor C and the resistor R, or by using a trimmer capacitor for the capacitor C. Such an arrangement may be realized using a circuit in which one or more capacitors selected from plural capacitors formed on a semiconductor chip are connected in parallel.

The technical concept of varying the frame rate based on the display color is applicable not only to mobile phones but also to various apparatus of the type having a display screen such as palm-top computers, notebook PCs, desk-top PCs and portable clocks. This concept is applicable not only to organic EL display panels but also to liquid crystal display panels, transistor panels, PLZT panels, CRTs and the like.

Though not shown in FIG. 57, the mobile phone according to the present invention has a CCD camera on the rear side of the casing 573. An image taken by this CCD camera can be immediately displayed on display screen 50 of the display panel. The data on the image taken by the CCD camera can be displayed on display screen 50. The image data taken by the CCD camera can be displayed in different display color modes such as 24-bit mode (16,700,000 colors), 18-bit mode (260,000 colors), 16-bit mode (65,000 colors), 12-bit mode (4,096 colors), and 8-bit mode (256 colors), which can be switched one from another by inputting through the key 572.

When the display data is data of 12 bits or more, the error diffusion process is performed before it is display. That is, when image data from the CCD camera exceeds the capacity of internal memory, image processing including the error diffusion process and the like is performed so that the number of colors to be displayed will correspond to a capacity lower than the capacity of the internal image memory.

Now, reference is made to the case where source driver 14 is provided with internal RAM adapted for 4,096 colors (4 bits for each of R, G and B) per screen. In the case where image data fed from outside of the module is 4,096-color data, the data is stored directly into the internal image RAM and then read out of the internal image RAM for the image to be displayed on display screen 50.

In the case where image data is 260,000-color data (16-bit data comprising 6 bits for G and 5 bits for each of R and B), the image data is temporarily stored into the operational memory of an error diffusion controller while, at the same time, being subjected to the error diffusion process or dither process performed by an operational circuit. Such an error diffusion process or the like converts the 16-bit image data into 12-bit data, the number of bits of which is equal to that of the internal image RAM. The data thus converted is transferred to source driver 14, which in turn outputs image data having 4 bits for each of R, G and B (4,096 colors) to display the image on display screen 50.

An embodiment employing the EL display panel or EL display apparatus or the driving method according to the present invention will be described with reference to the drawings.

Figure 58:
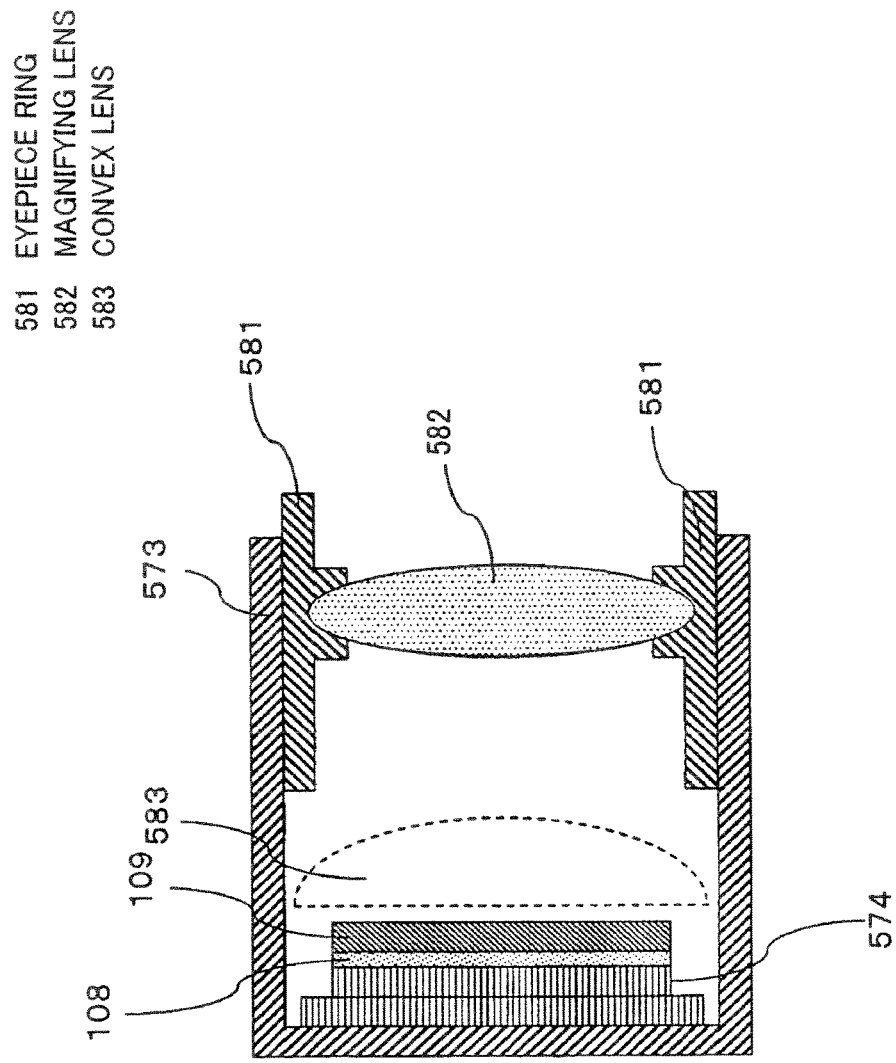
FIG. 58 is an explanatory view illustrating a view finder according to the present invention.

FIG. 58 is a sectional view of a view finder according to the embodiment of the present invention. FIG. 58 illustrates the view finder schematically for easy explanation. In this figure there are portions enlarged or reduced in scale, or omitted. For example, an eyepiece cover is omitted from FIG. 58. This holds true for other figures.

Body 573 has a reverse surface in a dark or black color. This is for preventing stray light emitted from EL display panel (display apparatus) 574 from diffuse reflection at an internal surface of body 573. On the light-emitting side of the display panel are located phase plate (λ/4 plate or the like) 108, sheet polarizer 109 and the like. These components have been described with reference to FIGS. 10 and 11.

Magnifying lens 582 is fitted to eyepiece ring 581. The observer adjusts the position of the eyepiece ring 581 inserted in the body 573 so that image 50 displayed by the display panel 574 may be brought into focus.

If convex lens 583 is disposed on the light-emitting side of the display panel 574 when need arises, a principal ray incident on the magnifying lens 582 can be converged. Therefore, it is possible to reduce the diameter of the magnifying lens 582, hence, downsize the view finder.

Figure 59:
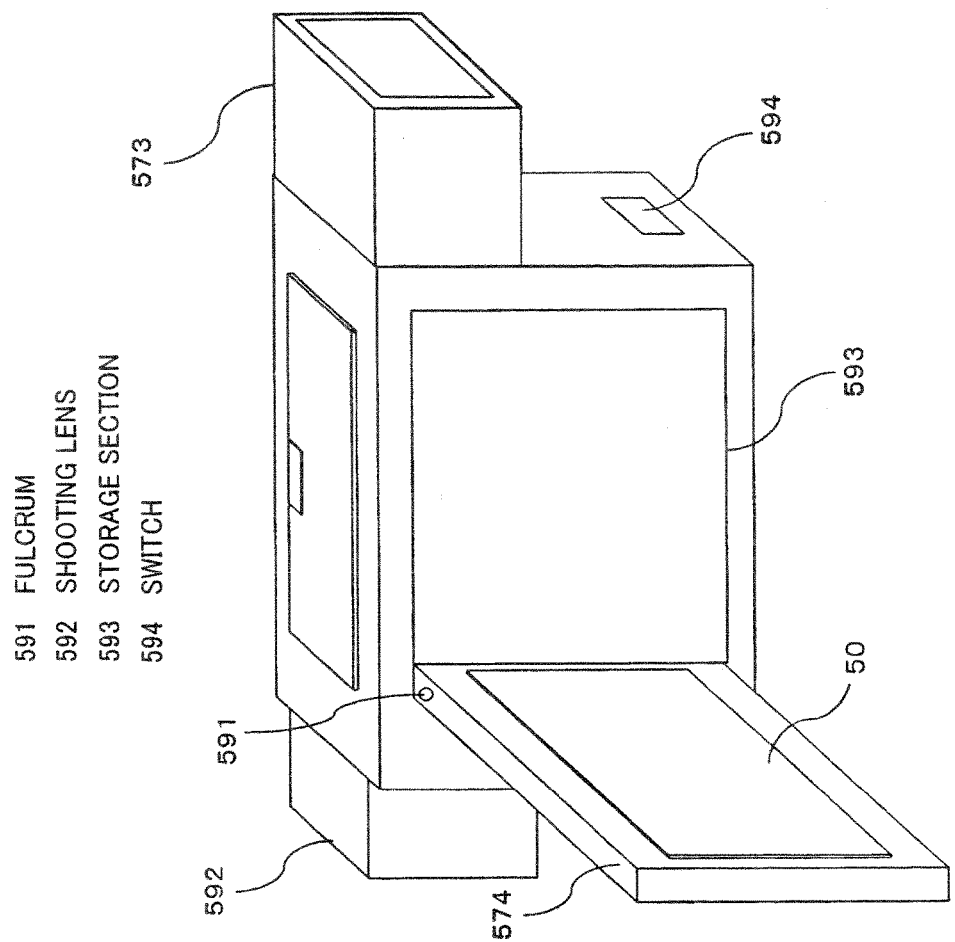
FIG. 59 is an explanatory view illustrating a digital video camera according to the present invention.

FIG. 59 is a perspective view of a digital video camera. The video camera includes shooting (image pickup) lens section 592 and a digital video camera body 573, the shooting lens section 592 and the view finder section 573 being positioned back to back. The view finder 573 (see FIG. 58 also) is fitted with an eyepiece cover. The observer (user) observes display section 50 of the display panel 574 from the eyepiece cover section.

The display section 50, which is the ET, display panel of the present invention, is also used as a display monitor. The angle of the display section 50 can be adjusted about a fulcrum 591 as desired. When not in use, the display section 50 is put in a storage section 593.

A switch 594 is a change-over switch or a control switch for implementing the following functions. The switch 594 is a display mode change-over switch. It is preferable to provide a mobile phone or the like with switch 594. Description will be made of this display mode change-over switch 594.

One of the driving methods according to the present invention includes feeding EL device 15 with an N-fold current for 1/M of a 1F period thereby causing EL device 15 to light for a 1/M period. The brightness of EL device 15 can be varied digitally by varying this lighting period. If N=4 for example, EL device 15 is fed with a 4-fold current. If the 1/M lighting period is varied by varying the value of M from 1 up to 4, the brightness can be varied from 1-fold brightness up to 4-fold brightness. It is possible to employ an arrangement capable of varying the value of M in such a manner as M=1, 1.5, 2, 3, 4, 5, 6.

The above-described change-over operation is utilized for an arrangement such as to make display screen 50 very bright when the mobile phone is powered on and, after lapse of a fixed time, lower the display luminance to save the power. The change-over operation may also be utilized as a function which allows the user to set his or her desired brightness. For example, when in use outdoors, the screen is made very bright, otherwise the screen is difficult to view due to the surrounding which is bright outdoors. However, if such a high-luminance display is continued, EL device will deteriorate rapidly. For this reason, if such a very bright display is provided, an arrangement is employed such as to resume the normal luminance in a short time. Further, if a high-luminance display is needed, an arrangement is employed which allows the user to raise the display luminance by his or her depressing a button.

Thus, it is preferable to employ an arrangement which allows the user to vary the brightness of the screen by button 594, an arrangement which is capable of automatically varying the brightness of the screen according to preset modes, or an arrangement which is capable of detecting the brightness of extraneous light and automatically varying the brightness of the screen depending on the result of detection. Also, it is preferable to employ an arrangement which allows the user or the like to set the display luminance to any value, for example, 50%, 60% or 80%.

Preferably, display screen 50 provides a Gaussian distribution display. The Gaussian distribution display is a display having a central portion made to exhibit a higher luminance and a peripheral portion made relatively dark. Visually, a display having a bright central portion appears to be wholly bright even when the peripheral portion is dark. According to subjective evaluation, the peripheral portion appears not to be visually inferior to the central portion as far as the peripheral portion maintains 70% of the luminance of the central portion. Not so serious a problem arises even when the luminance of the peripheral portion is further lowered to 50% of the luminance of the central portion. In the display panel of the self-luminescence type according to the present invention, a Gaussian distribution is provided vertically of the screen from the upper side to the lower side thereof by utilizing the N-fold pulse driving method (which includes feeding EL device 15 with an N-fold current for 1/M of a 1F period.)

Specifically, the value of M is increased for the upper and lower portions of the screen and decreased for the central portion. This can be realized by modulating the operation speed of the shift register of gate driver 12. The modulation of the brightness of the screen in the lateral direction is made based on multiplication of table data and image data by each other. When the peripheral luminance is lowered to 50% (with an angle of view of 0.9), the operation described above makes it possible to attain about 20% reduction in power consumption as compared to the case of 100% display luminance. When the peripheral luminance is lowered to 70% (with an angle of view of 0.9), the above-described operation makes it possible to attain about 15% reduction in power consumption as compared to the case of 100% display luminance.

It is preferable to provide a change-over switch or the like for turning on/off such a Gaussian distribution display. This is because the peripheral portion of the screen giving the Gaussian distribution display becomes invisible when the apparatus is used outdoors for example. For this reason, it is preferable to employ an arrangement which allows the user to turn on/off the Gaussian distribution display by a button, an arrangement which is capable of automatically switching between on and off according to preset modes, or an arrangement which is capable of detecting the brightness of extraneous light and automatically switching between on and off depending on the result of detection. It is also preferable to employ an arrangement which allows the user to set the luminance of the peripheral portion to any value, for example, 50%, 60% or 80%.

Liquid crystal display panels, in general, use a back light to cause a fixed Gaussian distribution to occur. Therefore, such a Gaussian distribution cannot be turned on/off. The ability to turn on/off a Gassian distribution is the advantage characteristic of self-luminescence type display devices.

In the case where the frame rate is predetermined, it is possible that flicker occurs due to interference between the panel and a lighting state of a fluorescent lamp located indoors or the like. When EL display device 15 operates at a frame rate of 60 Hz while a fluorescent lamp is lighting with an alternating current of 60 Hz, there occurs slight interference, which might make the viewer feel the screen blinking slowly. To avoid this inconvenience, varying the frame rate is sufficient. According to the present invention, the function of varying the frame rate is additionally provided. Further, the N-fold pulse driving method (which includes feeding EL device 15 with an N-fold current for 1/M of a 1F period) according to the present invention is capable of varying the value of N or M.

The above-described functions can be implemented by switch 594. When depressed plural times, switch 594 realizes switching between the above-described functions according to a menu provided on display screen 50.

It is needless to say that the feature described above is applicable not only to mobile phones but also to television sets, monitors and the like. It is preferable that the display screen is provided with icons for the user to be capable of immediately recognizing what display state the current display state is. The matters described above hold true for the matters to be described below.

Figure 60:
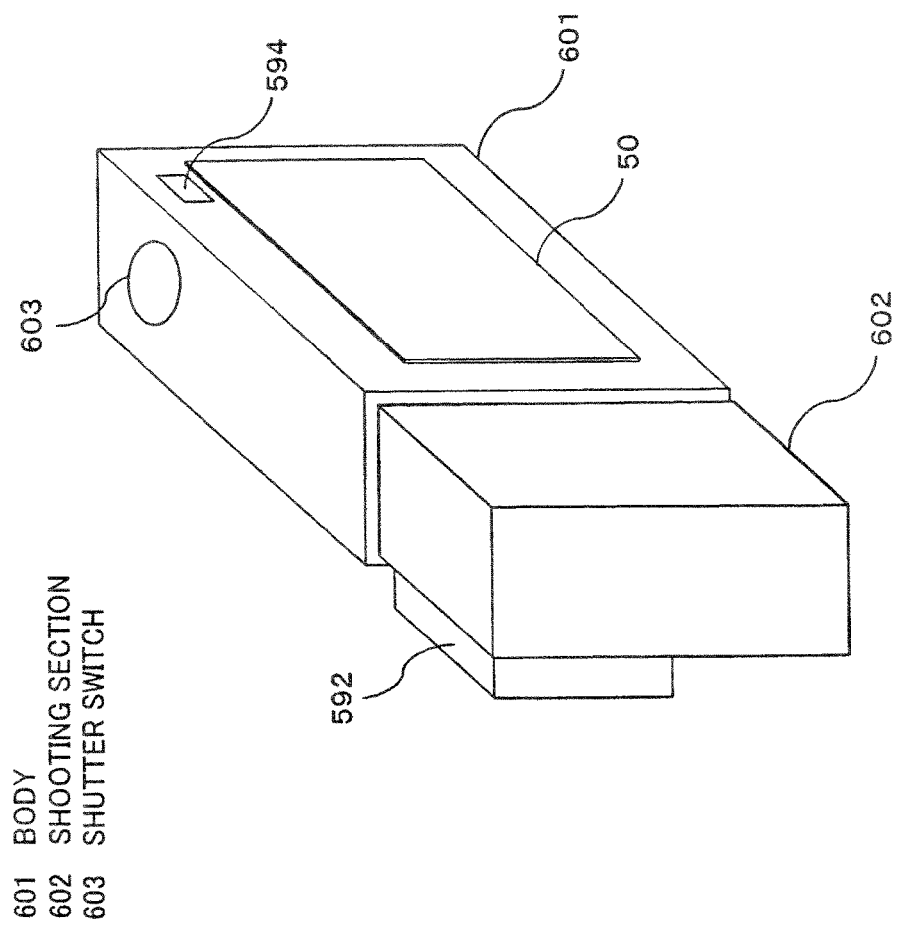
FIG. 60 is an explanatory view illustrating a digital still camera according to the present invention.

The EL display apparatus and the like according to this embodiment are applicable not only to a digital video camera but also to a digital still camera as shown in FIG. 60. The display apparatus is used as a monitor 50 attached to a camera body 601. The camera body 601 is fitted with a shutter 603 as well as switch 594.

Figure 61:
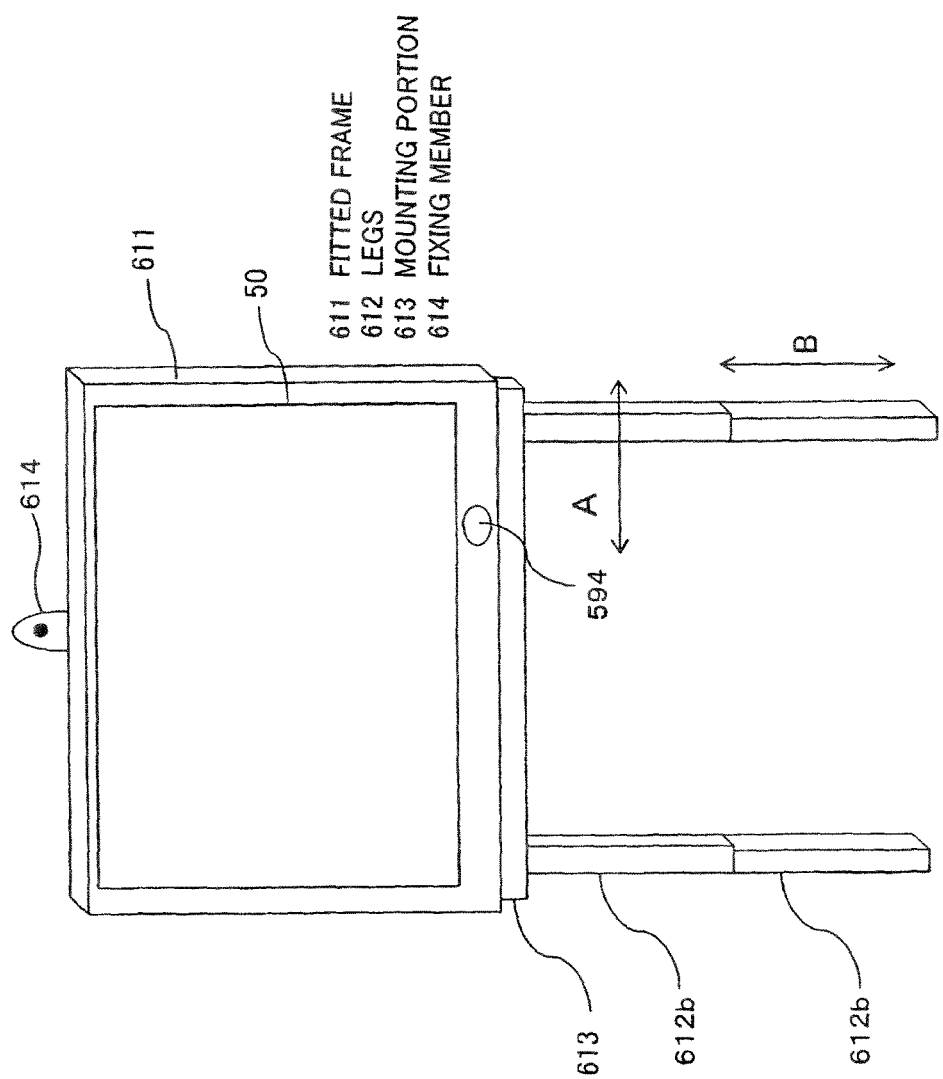
FIG. 61 is an explanatory view illustrating a television set (monitor) according to the present invention.

Though the foregoing description is directed to cases where the display region of a display panel is relatively small, display screen 50 as large as 30 inches or more is likely to warp. To deal with this inconvenience, the present invention provides the display panel with an outer frame 611 fitted therearound and a fixing member 614 for hanging the outer frame 611, as shown in FIG. 61. The display panel is fitted on wall or the like by means of this fixing member 614.

However, the weight of the display panel increases with increasing screen size. For this reason, a leg-mounting portion 613 is provided under the display panel so that plural legs mounted thereon can support the weight of the display panel.

The legs 612 are movable laterally as indicated by arrow A and are expandable/contractible in directions indicated by arrow B. For this reason, the display apparatus can be easily installed even in a narrow place.

A television set shown in FIG. 61 has a screen covered with a protective film (which may be a protective plate.) One object of such coverage is to prevent damage to the surface of the display panel due to a body hitting the surface. The protective film has an obverse surface formed with an AIR coat and embossed to inhibit unwanted reflection of external scene (extraneous light) by the display panel.

A fixed space is provided between the protective film and the display panel by dispersing beads or the like therebetween. Further, the protective film has a reverse surface formed with fine projections for retaining the space between the display panel and the protective film. By thus retaining the space, an impact is inhibited to transfer from the protective film to the display panel.

It is also effective to dispose or inject a light coupling agent such as alcohol or ethylene glycol in a liquid state, an acrylic resin in a gel state, or an epoxy resin which is a solid resin between the protective film and the display panel. This is because interfacial reflection can be prevented and because the light coupling agent functions also as a shock absorber.

Examples of such protective films include polycarbonate film (plate), polypropylene film (plate), acrylic film (plate), polyester film (plate), and PVA film (plate). It is needless to say that besides these films, engineering resin films (such as ABS) can be used. The protective film may be formed from an inorganic material such as strengthened glass. A similar effect will be produced if the surface of the display panel is coated with epoxy resin, phenolic resin, acrylic resin or the like to a thickness of not less than 0.5 mm and not more than 2.0 mm instead of the provision of the protective film. Embossing the surface of such a resin coat or a like process is also effective.

It is also effective that the surface of the protective film or coating layer is coated with fluorine. This is because such a fluorine coat allows stain thereon to be removed easily with a detergent. The protective film may be formed thicker so that a front light may share the protective film.

It is needless to say that combining the display panel according to the embodiment of the present invention with the three-side-free arrangement. The three-side-free arrangement is effective particularly when the pixels are manufactured utilizing the amorphous silicon technology. With the panel formed utilizing the amorphous silicon technology, process control for controlling variations in the characteristics of transistors is impossible. Hence, it is preferable to apply the N-fold pulse driving method, reset driving method, dummy pixel driving method or the like according to the present invention to such a panel. Thus, the transistors used in the present invention may be formed by the amorphous silicon technology without limitation to those formed by the polysilicon technology.

The N-fold pulse driving methods (see FIGS. 13, 16, 19, 20, 22, 24 and 30 and the like) and like methods according to the present invention are effective for display panels of the type having transistors 11 formed by the amorphous silicon technology as well as for display panels of the type having transistors 11 formed by the low temperature polysilicon technology. This is because adjacent transistors 11 formed using amorphous silicon substantially agree to each other in characteristics. Accordingly, driving currents for individual transistors are each substantially equalized to the target value even when the panel is driven with the sum of currents. (The N-fold pulse driving methods illustrated in FIGS. 22, 24 and 30 are particularly effective for pixel configurations of the type having transistors formed utilizing amorphous silicon.)

The technical concept described by way of the embodiments of the present invention is applicable to digital video cameras, projectors, stereoscopic television, projection television, and the like. The concept is also applicable to view finders, mobile phone monitors, PHSs, personal digital assistants and their monitors, and digital still cameras and their monitors.

Also, the technical concept is applicable to electrophotographic systems, head-mounted displays, direct viewing monitors, notebook PCs and desktop PCs. Further, the concept is applicable to monitors for cash dispensers, and public telephones, video phones and watches and their displays.

It is needless to say that the technical concept of the present invention can be utilized in or applied to development of display monitors for household appliances, pocket-size game machines and their monitors, back lights for display panels, lighting instruments for home use or industrial use, and the like. A lighting instrument is preferably configured to be capable of varying the color temperature. The color temperature can be varied by adjustment of currents to be fed to R, G and B pixels if these pixels are arranged in a striped pattern or a dot-matrix pattern. The technical concept is also applicable to display apparatus for displaying advertisements or posters, RGB signals, warning display lights, and the like.

The organic EL display panel is effective as a light source of a scanner. In this case, a dot matrix comprising R, G and B pixels is used as the light source to illuminate a subject with light in reading the image of the subject. Of course, it is needless to say that such a light source may be designed to emit monochromatic light. Such a light source may be of a simple matrix configuration without limitation to an active matrix configuration. The image reading precision will improve if the color temperature can be controlled.

Also, the organic EL display apparatus is effective as the back light of a liquid crystal display device. The color temperature can be varied by adjustment of currents to be fed to R, G and B pixels of the EL display apparatus (back light) if these pixels are arranged in a striped pattern or a dot-matrix pattern. In this case, the brightness can also be controlled easily. Moreover, since the EL display apparatus is a surface-emitting light source, it can easily realize a Gaussian distribution in which a central portion of the screen is made relatively bright whereas a peripheral portion of the screen made relatively dark. The EL display apparatus is also effective as the back light of a liquid crystal display panel of the field sequential type which performs scanning with R, G and B rays alternately. The EL display apparatus can also be used as the back light of a liquid crystal display panel or the like adapted for motion picture display if black is inserted even when the back light blinks.

It should be noted that EL device 15 is regarded as an OLED in the present invention and represented using the symbol of diode in the drawings such as FIG. 1. However, ET, device 15 according to the present invention is not limited to the OLED but may be of any type which controls its luminance based on the amount of current passing through EL device 15. An example of such a device is an inorganic EL device. Other examples include a white light emitting diode comprising a semiconductor, and a common light-emitting diode. A light-emitting transistor can serve the purpose. Device 15 does not necessarily call for rectification. Therefore, device 15 may be a bidirectional diode.

It will be apparent from the foregoing description that many improvements and other embodiments of the present invention occur to those skilled in the art. Therefore, the foregoing description should be construed as an illustration only and is provided for the purpose of teaching the best mode for carrying out the present invention to those skilled in the art. The details of the structure and/or the function of the present invention can be modified substantially without departing from the spirit of the present invention.

INDUSTRIAL APPLICABILITY

The EL display apparatus according to the present invention is useful as the display section of a thin television set, digital video camera, digital still camera, mobile phone or the like.

FIG. 1
12 . . . GATE DRIVER (CIRCUIT), 14 . . . SOURCE DRIVER (CIRCUIT), 15 . . . EL (DEVICE), 16 . . . PIXEL, 17 . . . GATE SIGNAL LINE, 18 . . . SOURCE SIGNAL LINE, 19 . . . STORAGE CAPACITOR (ADDITIONAL CAPACITOR)

FIG. 5
50 . . . DISPLAY SCREEN, 51 . . . WRITTEN PIXEL (ROW), 52 . . . NON-DISPLAY PIXEL (NON-DISPLAY REGION, NON-LIGHTING REGION), 53 . . . DISPLAY PIXEL (DISPLAY REGION, LIGHTING REGION)

FIG. 6
61 . . . SHIFT REGISTER, 62 . . . INVERTER, 63 . . . OUTPUT GATE

FIG. 7
71 . . . ARRAY SUBSTRATE (PANEL), 72 . . . LASER IRRADIATION RANGE, 73 . . . POSITIONING MARKER, 74 . . . GLASS SUBSTRATE

FIG. 8
81 . . . CONTROL IC (CIRCUIT), 82 . . . POWER SUPPLY IC (CIRCUIT), 83 . . . PRINTED CIRCUIT BOARD, 84 . . . FLEXIBLE BOARD, 85 . . . ENCAPSULATING COVER, 86 . . . CATHODE WIRING, 87 . . . ANODE WIRING (Vdd), 88 . . . DATA SIGNAL LINE, 89 . . . GATE CONTROL SIGNAL LINE

FIG. 10
101 . . . RIB, 102 . . . INTERLAYER INSULATOR, 104 . . . CONTACT PORTION, 105 . . . PIXEL ELECTRODE, 106 . . . CATHODE ELECTRODE, 107 . . . DESICCANT, 108 . . . λ/4 PLATE, 109 . . . SHEET POLARIZER

FIG. 12
LUMINANCE (BRIGHTNESS), MAGNIFICATION

FIG. 14
(c) . . . LIMINANCE OF EMISSION

FIG. 27
281 . . . D UMMY PIXEL (ROW)

FIG. 34
341 . . . CIRCUIT OF OUTPUT SECTION

FIG. 37
371 . . . OR CIRCUIT

FIG. 40
401 . . . LIGHTING CONTROL LINE

FIG. 45
TERMINAL VOLTAGE RATIO, REVERSE BIAS VOLTAGE, RATED TERMINAL VOLTAGE

FIG. 46
LUMINANCE RATIO, LIGHTING TIME, TERMINAL VOLTAGE, SAMPLE

FIG. 47
471 . . . REVERSE BIAS LINE, 473 . . . GATE POTENTIAL CONTROL LINE

FIG. 56
561 . . . ELECTRONIC VOLUME CIRCUIT, 562 . . . SD (SOURCE-DRAIN) OF TFT SHORTCIRCUITED

FIG. 57
571 . . . ANTENNA, 572 . . . KEYS, 573 . . . CASING, 574 . . . DISPLAY PANEL

FIG. 58
581 . . . EYEPIECE RING, 582 . . . MAGNIFYING LENS, 583 . . . CONVEX LENS

FIG. 59
591 . . . FULCRUM, 592 . . . SHOOTING LENS, 593 . . . STORAGE SECTION, 594 . . . SWITCH

FIG. 60
601 . . . BODY, 602 . . . SHOOTING SECTION, 603 . . . SHUTTER SWITCH

FIG. 61
611 . . . FITTED FRAME, 612 . . . LEGS, 613 . . . MOUNTING PORTION, 614 . . . FIXING MEMBER

What is claimed is:

1. An EL display apparatus comprising:
a display screen including pixels arranged in a matrix, each of the pixels including an EL device and a pixel circuit;
a source driver circuit configured to output an analog video signal to each of the pixels;
a source signal line through which the analog video signal output from the source driver circuit is transmitted; and
a gate driver circuit which includes a first gate driver circuit, a second gate driver circuit, a first gate signal line through which a first selection voltage or a first non-selection voltage output from the first gate driver circuit is transmitted, and a second gate signal line through which a second selection voltage or a second non-selection voltage output from the second gate driver circuit is transmitted, wherein
the pixel circuit of each of the pixels includes a driving transistor configured to supply a luminescence-causing current to the EL device, a first switching transistor, and a second switching transistor, the first switching transistor is disposed on a path through which the luminescence-causing current flows, the second switching transistor is configured to apply the analog video signal, which is output from the source driver circuit, to the driving transistor, a gate terminal of the first switching transistor is connected to the first gate signal line, a gate terminal of the second switching transistor is connected to the second gate signal line, the first switching transistor and the second switching transistor are independently on/off controlled by the first gate driver circuit and the second gate driver circuit, the source driver circuit is a semiconductor chip and is attached to the EL display apparatus, and an output terminal of the source driver circuit is connected to the source signal line.

2. The EL display apparatus according to claim 1, wherein the gate driver circuit is configured to receive a control signal that is level-shifted by the source driver circuit.

3. The EL display apparatus according to claim 1, wherein each of the pixels further includes an encapsulating film that seals the EL device.

4. The EL display apparatus according to claim 1, wherein
the pixel circuit of each of the pixels further includes a third switching transistor,
a first terminal of the third switching transistor is connected to a gate terminal of the driving transistor,
a second terminal of the third switching transistor is connected to a terminal of the driving transistor other than the gate terminal of the driving transistor, and
a gate terminal of the third switching transistor is connected to the second gate signal line.

5. The EL display apparatus according to claim 4, wherein the third switching transistor includes a multigate structure.

6. The EL display apparatus according to claim 1, wherein
the first gate driver circuit is disposed at a first side of the display screen,
the second gate driver circuit is disposed at a second side of the display screen,
the pixel circuit of each of the pixels further includes the EL device, and
the first switching transistor is configured to control the luminescence-causing current supplied to the EL device.

7. The EL display apparatus according to claim 1, further comprising:
a power supply including a cathode wire and an anode wire, wherein
the power supply is configured to generate a cathode voltage and to supply the cathode voltage to the display screen through the cathode wire, and
the power supply is configured to generate an anode voltage and to supply the anode voltage to the display screen through the anode wire.

8. The EL display apparatus according to claim 1, wherein
the pixels arranged in the matrix on the display screen include at least pixels of a first color and pixels of a second color, and
a size of the pixels of the first color is different from a size of the pixels of the second color.

9. The EL display apparatus according to claim 1, wherein
the gate driver circuit and the driving transistor of the pixel circuit of each of the pixels is formed on a substrate, and
the source driver circuit is mounted on the substrate.

10. The EL display apparatus according to claim 1, wherein the gate driver circuit, the driving transistor, the first switching transistor, and the second switching transistor are formed by a same fabrication process.

11. The EL display apparatus according to claim 10, wherein the gate driver circuit, the driving transistor, the first switching transistor, and the second switching transistor are formed by the same fabrication process using low temperature polysilicon technology.

12. The EL display apparatus according to claim 1, wherein
the source driver circuit is connected to the source signal line,
the source driver circuit is configured to supply a signal voltage to the gate terminal of the driving transistor,
the driving transistor is configured to supply a current to the EL device which is N times as large as a predetermined value, and
N is greater than one.

13. The EL display apparatus according to claim 1, wherein the driving transistor is configured to supply the current to the EL device which is N times as large as the predetermined value to achieve a gray scale display indicated by the analog video signal.

14. The EL display apparatus according to claim 1, wherein
the first gate driver circuit includes first gate signal lines, and
the first gate driver circuit is configured to select a plurality of the first gate signal lines simultaneously.

15. The EL display apparatus according to claim 1, wherein
the first switching transistor and the second switching transistor are independently on/off controlled by the first gate driver circuit and the second gate driver circuit to vary a duty ratio of the EL device of each of the pixels during a display period.

16. An electronic device, comprising:
the EL display apparatus according to claim 1.

17. The EL display apparatus according to claim 1, wherein the first gate driver circuit includes a first shift register circuit, and the second gate driver circuit includes a second shift register circuit.

18. The EL display apparatus according to claim 1, wherein the first gate driver circuit is configured to scan a first gate signal line, and the second gate driver circuit is configured to scan a second gate signal line.

19. A method of controlling an EL display apparatus,
the EL display apparatus comprising:
a display screen including pixels arranged in a matrix, each of the pixels including an EL device and a pixel circuit;
a source driver circuit configured to output an analog video signal to each of the pixels;
a source signal line through which the analog video signal output from the source driver circuit is transmitted; and
a gate driver circuit which includes a first gate driver circuit, a second gate driver circuit, a first gate signal line through which a first selection voltage or a first non-selection voltage output from the first gate driver circuit is transmitted, and a second gate signal line through which a second selection voltage or a second non-selection voltage output from the second gate driver circuit is transmitted,
the pixel circuit of each of the pixels including a driving transistor configured to supply a luminescence-causing current to the EL device, a first switching transistor, and a second switching transistor, the first switching transistor being disposed on a path through which the luminescence-causing current flows, the second switching transistor being configured to apply the analog video signal, which is output from the source driver circuit, to the driving transistor, a gate terminal of the first switching transistor being connected to the first gate signal line, a gate terminal of the second switching transistor being connected to the second gate signal line, the source driver circuit being a semiconductor chip and being attached to the EL display apparatus, an output terminal of the source driver circuit being connected to the source signal line, the method comprising:
independently on/off controlling the first switching transistor and the second switching transistor by the first gate driver circuit and the second gate driver circuit.

20. The method according to claim 19, further comprising:
varying a duty ratio of the EL device of each of the pixels during a display period by the independently on/off controlling of the first switching transistor and the second switching transistor by the first gate driver circuit and the second gate driver circuit.

21. A method of manufacturing an EL display apparatus, the EL display apparatus comprising:
a display screen including pixels arranged in a matrix, each of the pixels including an EL device and a pixel circuit;
a source driver circuit configured to output an analog video signal to each of the pixels;
a source signal line through which the analog video signal output from the source driver circuit is transmitted; and
a gate driver circuit which includes a first gate driver circuit, a second gate driver circuit, a first gate signal line through which a first selection voltage or a first non-selection voltage output from the first gate driver circuit is transmitted, and a second gate signal line through which a second selection voltage or a second non-selection voltage output from the second gate driver circuit is transmitted, the pixel circuit of each of the pixels including a driving transistor configured to supply a luminescence-causing current to the EL device, a first switching transistor, and a second switching transistor, the first switching transistor being disposed on a path through which the luminescence-causing current flows, the second switching transistor being configured to apply the analog video signal, which is output from the source driver circuit, to the driving transistor, a gate terminal of the first switching transistor being connected to the first gate signal line, a gate terminal of the second switching transistor being connected to the second gate signal line, the first switching transistor and the second switching transistor being independently on/off controlled by the first gate driver circuit and the second gate driver circuit, the source driver circuit being a semiconductor chip and being attached to the EL display apparatus, an output terminal of the source driver circuit being connected to the source signal line, the method comprising:
forming the gate driver circuit, the driving transistor, the first switching transistor, and the second switching transistor by a same fabrication process.

22. The method according to claim 21, wherein the gate driver circuit, the driving transistor, the first switching transistor, and the second switching transistor are formed by the same fabrication process using low temperature polysilicon technology.

* * * * *